United States Patent
Ohashi et al.

(10) Patent No.: US 9,164,384 B2
(45) Date of Patent: Oct. 20, 2015

(54) PATTERNING PROCESS AND RESIST COMPOSITION

(71) Applicant: SHIN-ETSU CHEMICAL CO., LTD., Tokyo (JP)

(72) Inventors: Masaki Ohashi, Joetsu (JP); Masahiro Fukushima, Joetsu (JP); Tomohiro Kobayashi, Joetsu (JP); Kazuhiro Katayama, Joetsu (JP); Chuanwen Lin, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/249,396

(22) Filed: Apr. 10, 2014

(65) Prior Publication Data

US 2014/0322650 A1  Oct. 30, 2014

(30) Foreign Application Priority Data

Apr. 26, 2013  (JP) .................................. 2013-093764

(51) Int. Cl.
  *G03F 7/26* (2006.01)
  *G03F 7/038* (2006.01)

(52) U.S. Cl.
  CPC ...................................... *G03F 7/038* (2013.01)

(58) Field of Classification Search
  CPC ... G03F 7/0392; G03F 7/2041; G03F 7/0045; G03F 7/0382; G03F 7/11; G03F 7/2002; G03F 7/38; G03F 7/40; Y10S 430/143; Y10S 430/146; C07C 381/12
  USPC .............................................. 430/322, 270.1
  See application file for complete search history.

(56) References Cited

U.S. PATENT DOCUMENTS

| | | |
|---|---|---|
| 5,650,483 A | 7/1997 | Malik et al. |
| 6,136,500 A | 10/2000 | Kobayashi et al. |
| 6,312,867 B1 | 11/2001 | Kinsho et al. |
| 6,830,866 B2 | 12/2004 | Kobayashi et al. |
| 7,511,169 B2 | 3/2009 | Ohsawa et al. |
| 7,527,912 B2 | 5/2009 | Ohsawa et al. |
| 7,537,880 B2 | 5/2009 | Harada et al. |
| 7,622,242 B2 | 11/2009 | Hatakeyama et al. |
| 7,759,047 B2 | 7/2010 | Hatakeyama et al. |
| 7,771,914 B2 | 8/2010 | Hatakeyama et al. |
| 7,858,289 B2 | 12/2010 | Yamashita |
| 7,919,226 B2 | 4/2011 | Ohsawa et al. |
| 7,998,655 B2 | 8/2011 | Tsubaki |
| 8,034,547 B2 | 10/2011 | Tsubaki et al. |
| 8,057,981 B2 | 11/2011 | Harada et al. |
| 8,088,557 B2 | 1/2012 | Tsubaki |
| 8,101,335 B2 | 1/2012 | Harada et al. |
| 8,114,570 B2 | 2/2012 | Ohsawa et al. |
| 8,114,571 B2 | 2/2012 | Ohashi et al. |
| 8,173,354 B2 | 5/2012 | Ohsawa et al. |
| 8,227,183 B2 | 7/2012 | Tsubaki et al. |
| 8,241,840 B2 | 8/2012 | Tsubaki et al. |
| 8,252,504 B2 | 8/2012 | Harada et al. |
| 8,268,528 B2 | 9/2012 | Harada et al. |
| 8,313,886 B2 | 11/2012 | Harada et al. |
| 8,323,872 B2 | 12/2012 | Hatakeyama et al. |
| 8,394,570 B2 | 3/2013 | Ohashi et al. |
| 8,431,323 B2 | 4/2013 | Watanabe et al. |
| 8,435,717 B2 | 5/2013 | Hagiwara et al. |
| 8,535,869 B2 | 9/2013 | Ohsawa et al. |
| 8,597,869 B2 | 12/2013 | Sagehashi et al. |
| 2008/0153030 A1 | 6/2008 | Kobayashi et al. |
| 2010/0209827 A1 | 8/2010 | Ohashi et al. |
| 2011/0008735 A1* | 1/2011 | Ohsawa et al. ............... 430/326 |
| 2012/0129103 A1 | 5/2012 | Ohsawa et al. |

FOREIGN PATENT DOCUMENTS

| | | | |
|---|---|---|---|
| JP | 07261392 | * | 10/1995 |
| JP | 2000-336121 A | | 12/2000 |
| JP | 2003-66612 A | | 3/2003 |
| JP | 3790649 B2 | | 6/2006 |
| JP | 2007-25634 A | | 2/2007 |
| JP | 2007-145797 A | | 6/2007 |
| JP | 3991462 B2 | | 10/2007 |
| JP | 2008-3569 A | | 1/2008 |
| JP | 2008-106045 A | | 5/2008 |
| JP | 2008-111103 A | | 5/2008 |

PHOTORESIST COATING

PHOTORESIST EXPOSURE

| JP | 2008-122932 A | 5/2008 |
| JP | 2008-158339 A | 7/2008 |
| JP | 2008-281974 A | 11/2008 |
| JP | 2008-281975 A | 11/2008 |
| JP | 2008-309879 A | 12/2008 |
| JP | 2009-7327 A | 1/2009 |
| JP | 2009-98638 A | 5/2009 |
| JP | 2009-109595 A | 5/2009 |
| JP | 2009-191151 A | 8/2009 |
| JP | 2009-192784 A | 8/2009 |
| JP | 2009-258695 A | 11/2009 |
| JP | 2009-269953 A | 11/2009 |
| JP | 2009-276363 A | 11/2009 |
| JP | 2010-107695 A | 5/2010 |
| JP | 2010-134012 A | 6/2010 |
| JP | 2010-155824 A | 7/2010 |
| JP | 2010-215608 A | 9/2010 |
| JP | 4554665 B2 | 9/2010 |
| JP | 2010-250105 A | 11/2010 |
| JP | 4590431 B2 | 12/2010 |
| JP | 2011-16746 A | 1/2011 |
| JP | 2011-42789 A | 3/2011 |
| JP | 2012-41320 A | 3/2012 |
| JP | 2012-46501 A | 3/2012 |
| JP | 2012-106986 A | 6/2012 |
| JP | 2012-107151 A | 6/2012 |
| JP | 2012-153644 A | 8/2012 |
| JP | 2012-189884 A | 10/2012 |
| TW | 201119986 A | 6/2011 |
| TW | 201245879 A | 11/2012 |

OTHER PUBLICATIONS

Taiwanese Office Action dated Mar. 9, 2015, issued in corresponding Taiwanese Patent Application No. 103114724. (6 pages).

\* cited by examiner

*Primary Examiner* — Caleen Sullivan

(74) *Attorney, Agent, or Firm* — Westermann, Hattori, Daniels & Adrian, LLP

(57) ABSTRACT

A negative pattern is formed by coating a resist composition comprising a polymer comprising recurring units of formulae (1) and (2) and a photoacid generator of formula (3) onto a substrate, baking, exposure, PEB and developing in an organic solvent. In formulae (1) and (2), $R^1$ is H, F, $CH_3$ or $CF_3$, Z is a single bond, phenylene, naphthylene, or (backbone)-C(=O)—O—Z'—, Z' is alkylene, phenylene or naphthylene, XA is an acid labile group, YL is H or a polar group. In formula (3), $R^2$ and $R^3$ are a monovalent hydrocarbon group, $R^4$ is a divalent hydrocarbon group, or $R^2$ and $R^3$, or $R^2$ and $R^4$ may form a ring with the sulfur, L is a single bond or a divalent hydrocarbon group, Xa and Xb are H, F or $CF_3$, and k is an integer of 1 to 4.

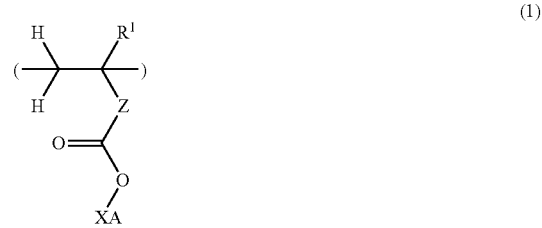

(1)

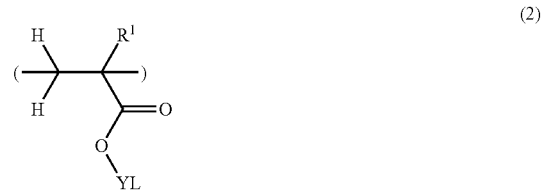

(2)

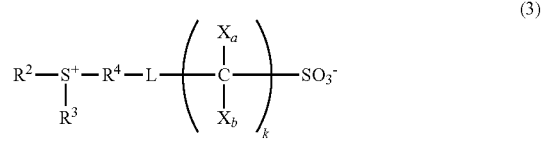

(3)

16 Claims, 27 Drawing Sheets

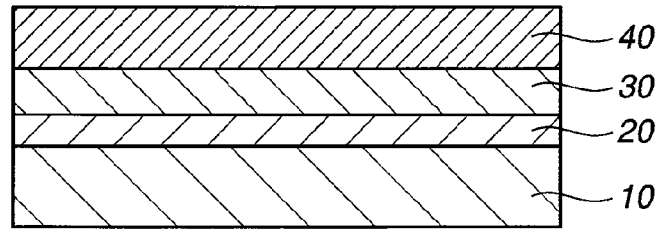
FIG.1A PHOTORESIST COATING
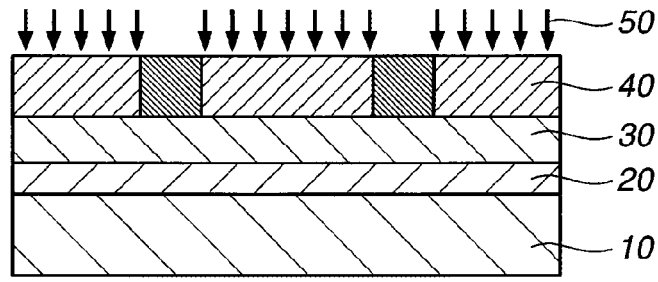
FIG.1B PHOTORESIST EXPOSURE
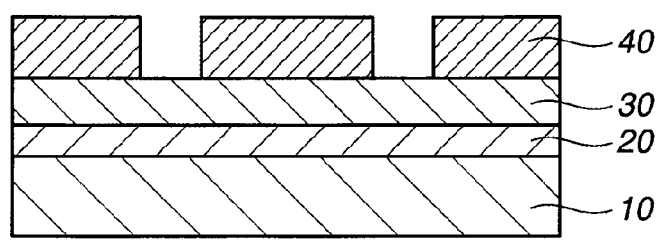
FIG.1C ORGANIC SOLVENT DEVELOPMENT

PATTERNING PROCESS AND RESIST COMPOSITION

CROSS-REFERENCE TO RELATED APPLICATION

This non-provisional application claims priority under 35 U.S.C. §119(a) on Patent Application No. 2013-093764 filed in Japan on Apr. 26, 2013, the entire contents of which are hereby incorporated by reference.

TECHNICAL FIELD

This invention relates to a pattern forming process involving exposure of a resist film, deprotection reaction with the aid of acid and heat, and development in an organic solvent to form a negative tone pattern in which the unexposed region is dissolved and the exposed region is not dissolved, and a resist composition for use in the process.

BACKGROUND ART

In the lithography technology, a highlight is recently put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkaline development and organic solvent development is under study.

As the ArF resist composition for negative tone development with organic solvent, positive ArF resist compositions of the prior art design may be used. Such pattern forming processes are described in Patent Documents 1 to 3. These patent documents disclose resist compositions for organic solvent development comprising a copolymer of hydroxyadamantane methacrylate, a copolymer of norbornane lactone methacrylate, and a copolymer of methacrylate having acidic groups including carboxyl, sulfo, phenol and thiol groups substituted with two or more acid labile groups, and pattern forming processes using the same.

Further, Patent Document 4 discloses a process for forming a pattern through organic solvent development in which a protective film is applied onto a resist film. Patent Document 5 discloses a topcoatless process for forming a pattern through organic solvent development in which an additive is added to a resist composition so that the additive may segregate at the resist film surface after spin coating to provide the surface with improved water repellency.

When trench patterns (isolated space patterns) or hole patterns are formed by the positive tone development process using an alkaline aqueous solution, pattern formation must be done with incident light of a weak intensity as compared with formation of line or dot patterns. Then the contrast of intensity of incident light between exposed and unexposed regions becomes low. The low contrast is likely to impose limits on the pattern forming abilities like resolution, tending to bring difficulty in forming a resist pattern at a high resolution. As opposed to the positive tone development process, the organic solvent development process is believed advantageous for forming trench or hole patterns. This is one of the reasons why a highlight is recently put on the organic solvent development.

However, the organic solvent development process has some problems to be overcome. The positive development system involving deprotection reaction to generate a carboxyl group and subsequent neutralization reaction with aqueous alkaline developer to improve a dissolution rate achieves a high dissolution contrast in that the dissolution rate differs between the unexposed and exposed regions by a factor of more than 1,000. In contrast, the negative development system via organic solvent development provides a low contrast because the dissolution rate in the unexposed region due to solvation is low, and the dissolution rate thus differs between the unexposed and exposed regions by a factor of less than 100. For the negative development system via organic solvent development, it is desired to seek for a novel material which can enhance a dissolution contrast.

CITATION LIST

Patent Document 1: JP-A 2008-281974
Patent Document 2: JP-A 2008-281975
Patent Document 3: JP 4554665
Patent Document 4: JP 4590431
Patent Document 5: JP-A 2008-309879

DISCLOSURE OF INVENTION

The organic solvent development is low in dissolution contrast, as compared with the positive resist system adapted to become dissolvable in alkaline developer when deprotection reaction takes place to produce acidic carboxyl or phenol groups. Specifically, in the case of alkaline developer, the alkali dissolution rate differs more than 1,000 times between unexposed and exposed regions, whereas the difference in the case of organic solvent development is at most 100 times, and only about 10 times for certain materials. No sufficient margin is available. In the case of aqueous alkaline development, the dissolution rate is improved by neutralization reaction with carboxyl groups. In the case of organic solvent development with no accompanying reaction, the dissolution rate is low because dissolution is solely due to solvation. It is necessary not only to improve the dissolution rate of the unexposed region, but also to reduce the dissolution rate of the exposed region that is a remaining portion of resist film. If the dissolution rate of the exposed region is high, the thickness of the remaining film is so reduced that the underlying substrate may not be processed by etching through the pattern as developed.

While Patent Documents 1 to 3 disclose photoresist compositions of the conventional type, i.e., aqueous alkaline solution development type, they are low in dissolution contrast when subjected to organic solvent development. It is thus desired to have a novel material which can provide a significant difference in dissolution rate between exposed and unexposed regions.

When holes are formed by negative development, regions surrounding the holes receive light so that excess acid is generated there. There is a possibility that the holes are not opened if the acid diffuses inside the holes. Thus not only an improvement in dissolution contrast, but also control of acid diffusion are important. Since the improvement in dissolution contrast and control of acid diffusion are correlated to improvements in depth of focus (DOP) and mask error factor (MEF), which are important parameters in photoresist evaluation, and critical dimension uniformity (CDU) in the case of hole patterns, such improvements are essential.

An object of the invention is to provide a resist composition which can offer a significant dissolution contrast and a high level of acid diffusion control, and a pattern forming process using the same, capable of forming a hole or trench pattern via positive/negative reversal by organic solvent development.

The inventors have found that a high dissolution contrast is achieved when a resist composition comprising a polymer comprising specific recurring units and a photoacid generator of specific structure is subjected to exposure, PEB and organic solvent development. By virtue of controlled acid diffusion, the pattern forming process using the resist composition and involving organic solvent development is successful in achieving improvements in DOF, MEF, and CDU.

In one aspect, the invention provides a process for forming a pattern, comprising the steps of applying a resist composition comprising (A) a polymer and (B) a photoacid generator onto a substrate, baking the composition to form a resist film, exposing the resist film to high-energy radiation to define exposed and unexposed regions, baking, and applying an organic solvent developer to form a negative pattern wherein the unexposed region of resist film is dissolved and the exposed region of resist film is not dissolved. The polymer (A) comprises recurring units of the general formula (1) and recurring units of the general formula (2).

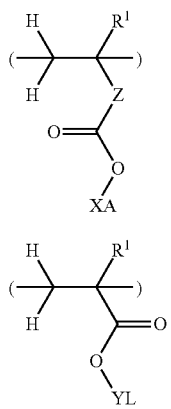

Herein $R^1$ is hydrogen, fluorine, methyl or trifluoromethyl, Z is a single bond, phenylene, naphthylene, or (backbone)-C(=O)—O—Z'—, Z' is a straight, branched or cyclic $C_1$-$C_{10}$ alkylene group which may contain a hydroxyl moiety, ether bond, ester bond or lactone ring, or a phenylene or naphthylene group, XA is an acid labile group, YL is hydrogen or a polar group having at least one structure selected from the group consisting of hydroxyl, cyano, carbonyl, carboxyl, ether bond, ester bond, sulfonic acid ester bond, carbonate, lactone ring, sultone ring and carboxylic anhydride. The photoacid generator (B) has the general formula (3).

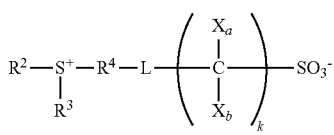

Herein $R^2$ and $R^3$ are each independently a straight, branched or cyclic $C_1$-$C_{20}$ monovalent hydrocarbon group which may be substituted with or separated by a heteroatom, $R^4$ is a straight, branched or cyclic $C_1$-$C_{20}$ divalent hydrocarbon group which may be substituted with or separated by a heteroatom, or a pair of $R^2$ and $R^3$, or $R^2$ and $R^4$ may bond together to form a ring with the sulfur atom, L is a single bond or a straight, branched or cyclic $C_1$-$C_{20}$ divalent hydrocarbon group which may be substituted with or separated by a heteroatom, Xa and Xb are each independently hydrogen, fluorine or trifluoromethyl, and k is an integer of 1 to 4.

Preferably, the photoacid generator of formula (3) has the general formula (4).

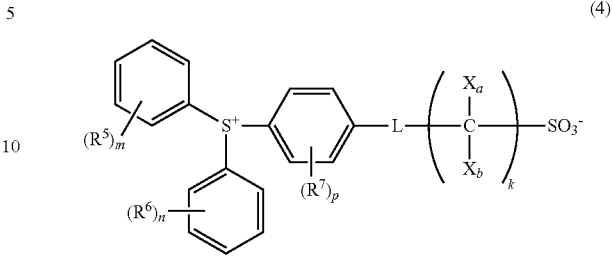

Herein $R^5$, $R^6$ and $R^7$ are each independently hydrogen, or a straight, branched or cyclic $C_1$-$C_{20}$ monovalent hydrocarbon group which may be separated by a heteroatom, m and n each are an integer of 0 to 5, p is an integer of 0 to 4, L, Xa, Xb, and k are as defined above.

More preferably, the photoacid generator of formula (4) has the general formula (5).

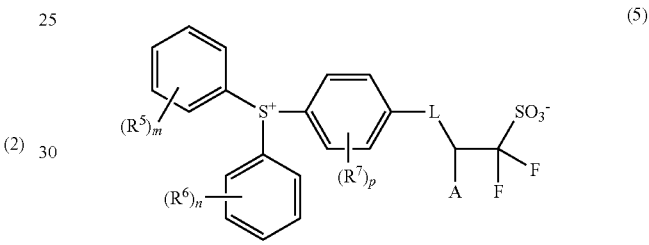

Herein A is hydrogen or trifluoromethyl, $R^5$, $R^6$, $R^7$, m, n, p, and L are as defined above.

In a preferred embodiment, the developer comprises at least one organic solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

In a preferred embodiment, the step of exposing the resist film to high-energy radiation includes KrF excimer laser lithography of wavelength 248 nm, ArF excimer laser lithography of wavelength 193 nm, EUV lithography of wavelength 13.5 nm or EB lithography.

In a preferred embodiment, the exposure step includes immersion lithography with a liquid having a refractive index of at least 1.0 held between the resist film and a projection lens.

In another preferred embodiment, the process may further comprise the step of coating a protective film on the resist film, and the exposure step includes immersion lithography with the liquid held between the protective film and the projection lens.

In another aspect, the invention provides a resist composition comprising (A) a polymer comprising recurring units of the general formula (1) and recurring units of the general formula (2) and (B) a photoacid generator having the general formula (3), all defined above.

In a preferred embodiment, the photoacid generator of formula (3) has the general formula (4), and more preferably the general formula (5).

The resist composition may further comprise a photoacid generator other than formula (3), a quencher, and/or a surfactant which is insoluble in water and soluble in alkaline developer.

ADVANTAGEOUS EFFECTS OF INVENTION

When a resist composition comprising a specific polymer and a photoacid generator of specific structure is subjected to organic solvent development, a high dissolution contrast is available due to fully controlled acid diffusion. This ensures improvements in resist performance factors such as DOF, MEF, and CDU.

BRIEF DESCRIPTION OF DRAWINGS

FIGS. 1A to 1C are cross-sectional views of a patterning process according one embodiment of the invention; FIG. 1A showing a photoresist film disposed on a substrate; FIG. 1B showing the resist film being exposed; and FIG. 1C showing the resist film being developed in an organic solvent.

DESCRIPTION OF EMBODIMENTS

Figure 2:
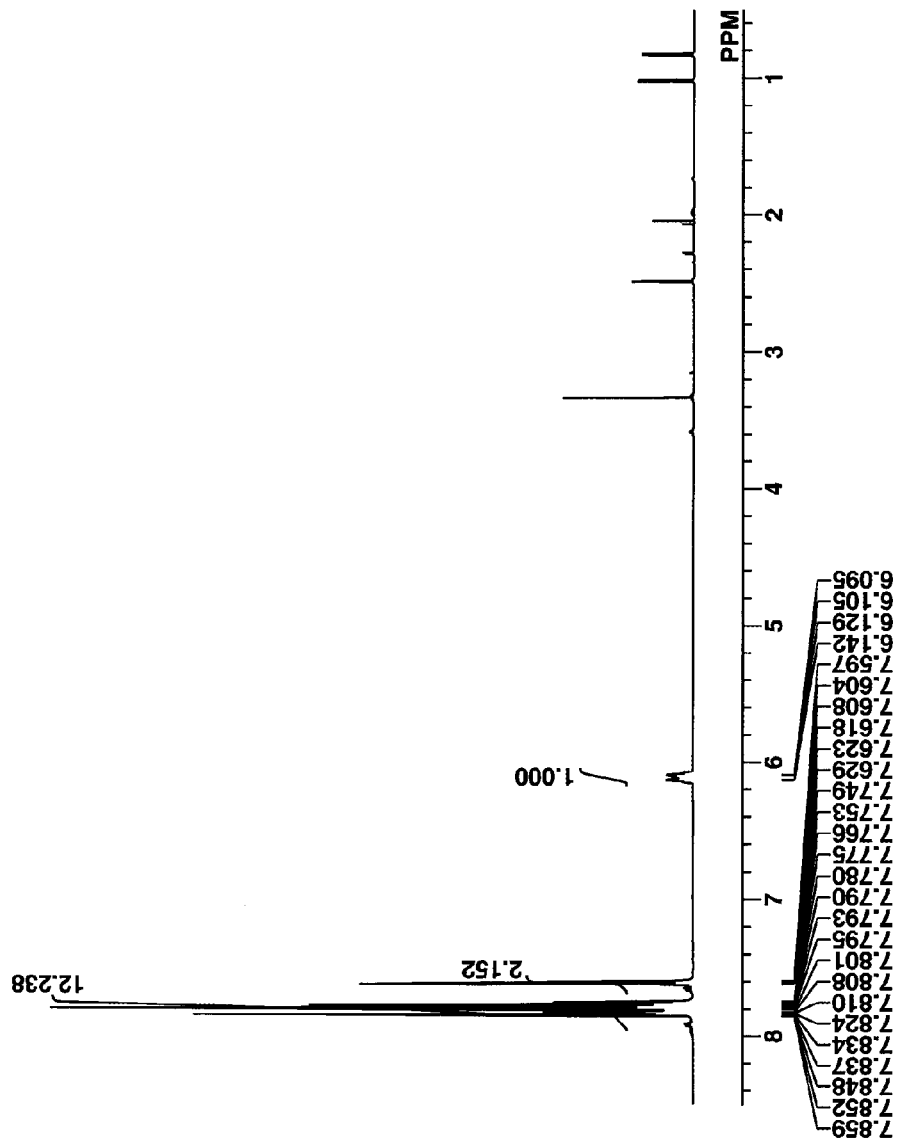
FIGS. 2 and 3 are diagrams showing $^1$H-NMR and $^{19}$F-NMR/DMSO-$d_6$ of PAG-1 in Synthesis Example 1-1.

The terms "a" and "an" herein do not denote a limitation of quantity, but rather denote the presence of at least one of the referenced item. "Optional" or "optionally" means that the subsequently described event or circumstances may or may not occur, and that description includes instances where the event or circumstance occurs and instances where it does not. As used herein, the notation ($C_n$-$C_m$) means a group containing from n to m carbon atoms per group. As used herein, the term "film" is used interchangeably with "coating" or "layer."

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure bake
PAG: photoacid generator
DOF: depth of focus
MEF: mask error factor
CDU: critical dimension uniformity Briefly stated, the resist composition used herein is defined as comprising (A) a polymer or high-molecular-weight compound and (B) a photoacid generator.

Polymer

The polymer (A) should comprise recurring units of the general formula (1) and recurring units of the general formula (2).

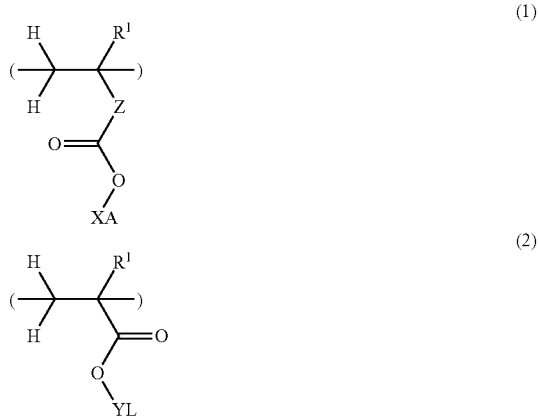

Herein $R^1$ is hydrogen, fluorine, methyl or trifluoromethyl. Z is a single bond, phenylene, naphthylene, or (backbone)-C(=O)—O—Z'—, wherein Z' is a straight, branched or cyclic $C_1$-$C_{10}$ alkylene group which may contain a hydroxyl moiety, ether bond, ester bond or lactone ring, or a phenylene or naphthylene group. XA is an acid labile group. YL is hydrogen or a polar group having at least one structure selected from the group consisting of hydroxyl, cyano, carbonyl, carboxyl, ether bond, ester bond, sulfonic acid ester bond, carbonate, lactone ring, sultone ring and carboxylic anhydride.

Examples of the structure of formula (1) wherein Z is a variant are shown below.

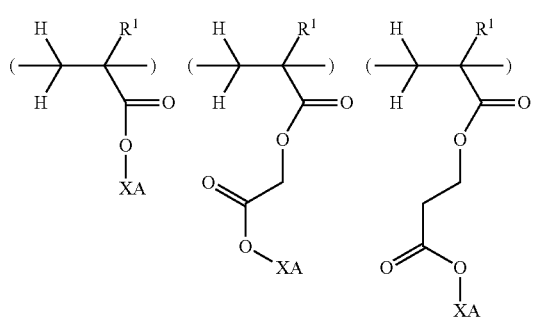

-continued
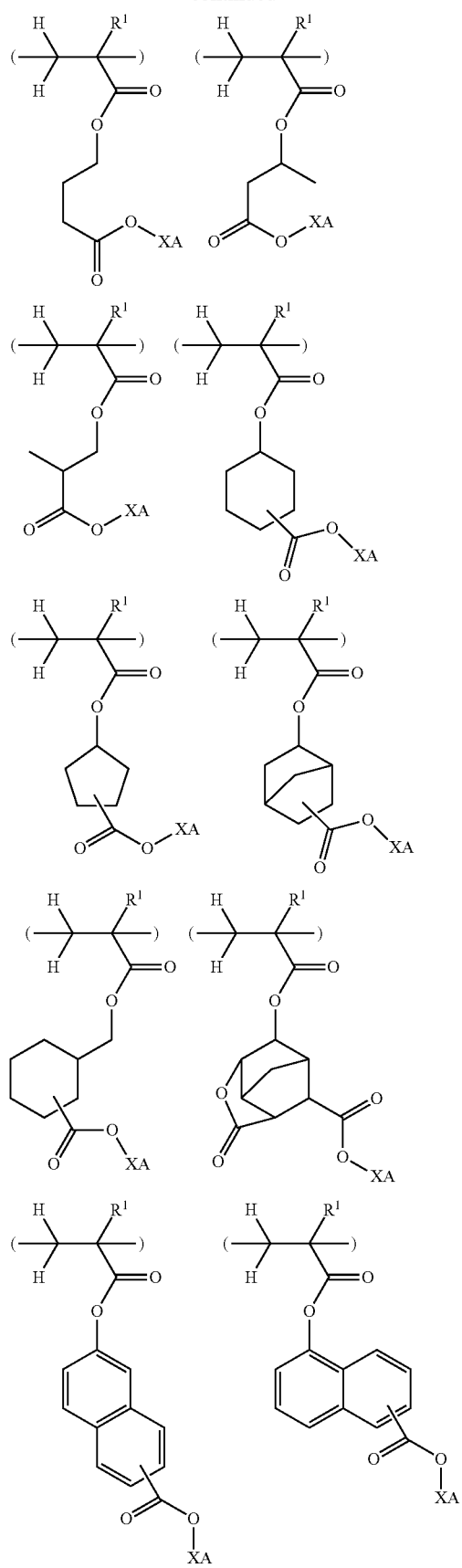
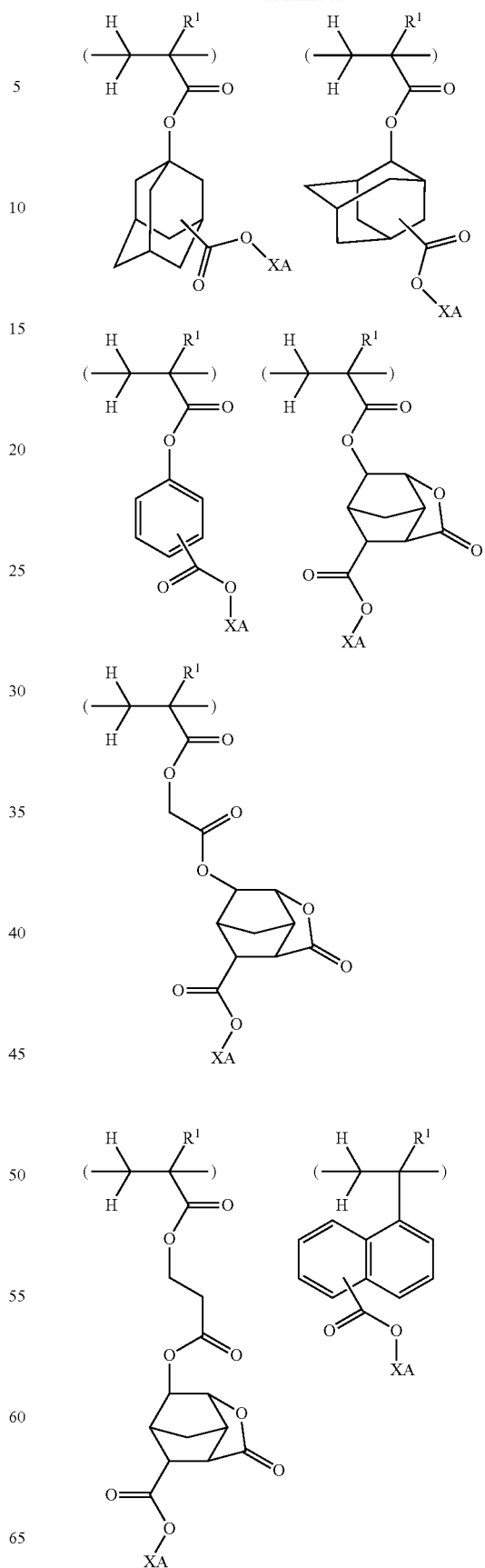

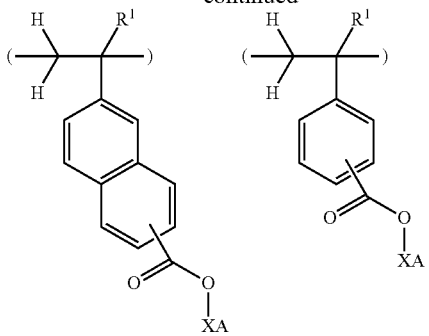

Herein R¹ and XA are as defined above.

A polymer comprising recurring units of formula (1) is decomposed under the action of acid to generate carboxylic acid. The acid labile group XA may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

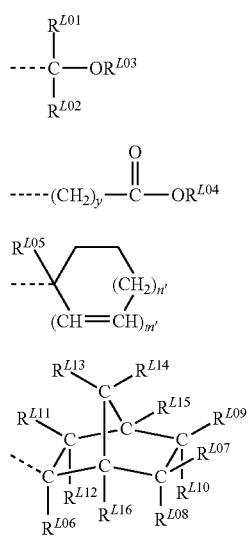

Herein and throughout the specification, the broken line designates a valence bond.

In formula (L1), $R^{L01}$ and $R^{L02}$ are each independently hydrogen or a straight, branched or cyclic alkyl group of 1 to 18 carbon atoms, preferably 1 to 10 carbon atoms. Exemplary groups of $R^{L01}$ and $R^{L02}$ include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl.

$R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups, substituted forms of such alkyl groups in which some hydrogen atoms are replaced by hydroxyl, alkoxy, oxo, amino, alkylamino or the like, and similar groups which are separated by oxygen (that is, oxygen atom intervening between carbon atoms). Exemplary straight, branched or cyclic alkyl groups include methyl, ethyl, propyl, isopropyl, n-butyl, sec-butyl, tert-butyl, cyclo- pentyl, cyclohexyl, 2-ethylhexyl, n-octyl, norbornyl, tricyclodecanyl, tetracyclododecanyl, and adamantyl. Examples of the substituted alkyl groups are as shown below.

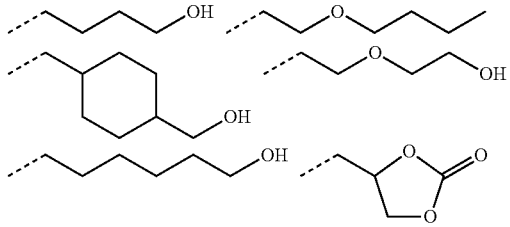

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary of the tertiary alkyl group are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. The subscript y is an integer of 0 to 6.

In formula (L3), $R^{L05}$ is an optionally substituted, straight, branched or cyclic $C_1$-$C_8$ alkyl group or an optionally substituted $C_6$-$C_{20}$ aryl group. Examples of the optionally substituted $C_1$-$C_{10}$ alkyl groups include straight, branched or cyclic alkyl groups such as methyl, ethyl, propyl, isopropyl, n-butyl, sec-butyl, tert-butyl, tert-amyl, n-pentyl, n-hexyl, cyclopentyl, and cyclohexyl, and substituted forms of such groups in which some hydrogen atoms are replaced by hydroxyl, alkoxy, carboxyl, alkoxycarbonyl, oxo, amino, alkylamino, cyano, mercapto, alkylthio, sulfo or the like. Examples of optionally substituted $C_6$-$C_{20}$ aryl groups include phenyl, methylphenyl, naphthyl, anthryl, phenanthryl, and pyrenyl. The subscript m' is equal to 0 or 1, n' is equal to 0, 1, 2 or 3, and 2m'+n' is equal to 2 or 3.

In formula (L4), $R^{L06}$ is an optionally substituted, straight, branched or cyclic $C_1$-$C_8$ alkyl group or an optionally substituted $C_6$-$C_{20}$ aryl group, examples of which are the same as exemplified for $R^{L05}$. $R^{L07}$ to $R^{L16}$ independently represent hydrogen or optionally substituted monovalent hydrocarbon groups of 1 to 15 carbon atoms. Exemplary $C_1$-$C_{15}$ monovalent hydrocarbon groups of $R^{L07}$ to $R^{L16}$ include straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxyl, alkoxycarbonyl, oxo, amino, alkylamino, cyano, mercapto, alkylthio, sulfo or the like. Alternatively, two of $R^{L07}$ to $R^{L16}$ may bond together to form a ring with the carbon atom(s) to which they are attached (for example, a pair of $R^{L07}$ and $R^{L08}$, $R^{L07}$ and $R^{L09}$, $R^{L07}$ and $R^{L10}$, $R^{L08}$ and $R^{L10}$, $R^{L09}$ and $R^{L10}$, $R^{L11}$ and $R^{L12}$, or $R^{L13}$ and $R^{L14}$ form a ring). Each of $R^{L07}$ to $R^{L16}$ represents a $C_1$-$C_{15}$ divalent hydrocarbon group when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or $R^{L14}$ and $R^{L15}$).

Of the acid labile groups of formula (L1), the straight and branched ones are exemplified by the following groups.

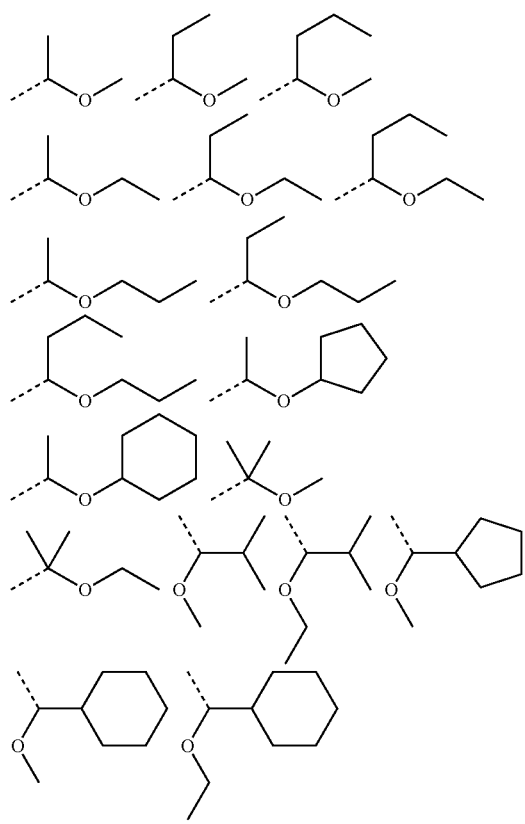

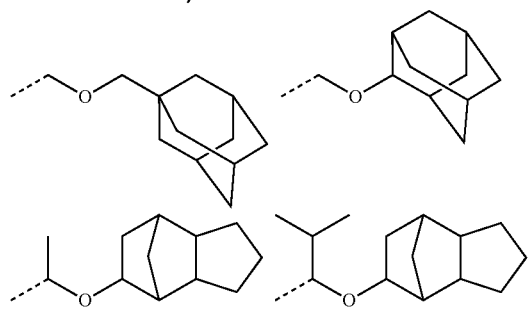

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethyl cyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are preferred.

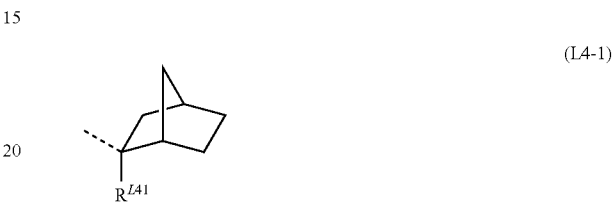
(L4-1)

(L4-2)

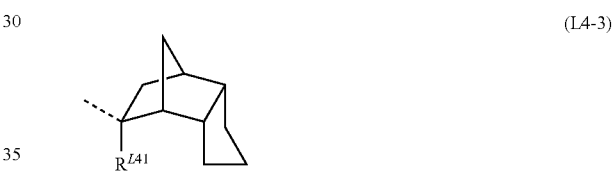
(L4-3)

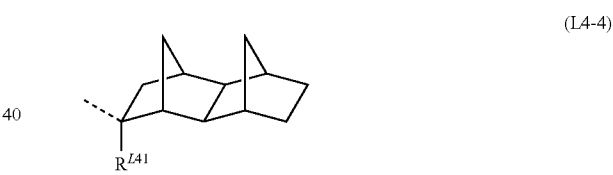
(L4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

(L4-3-1)

-continued

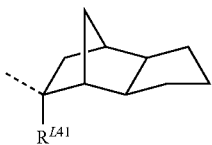
(L4-3-2)

Note that $R^{L41}$ is as defined above.

Similarly, the general formula (L4-4) represents one or a mixture of two or more selected from groups having the following general formulas (L4-4-1) to (L4-4-4).

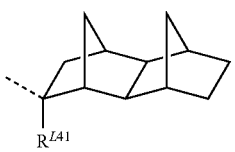
(L4-4-1)

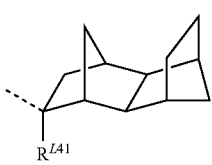
(L4-4-2)

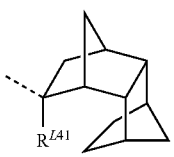
(L4-4-3)

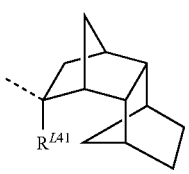
(L4-4-4)

Note that $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo [2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

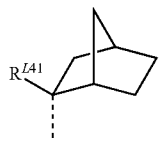
(L4-1-endo)

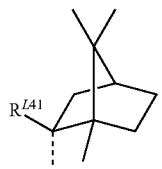
(L4-2-endo)

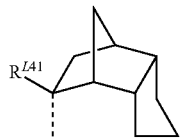
(L4-3-endo)

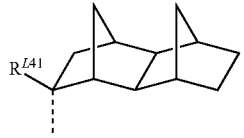
(L4-4-endo)

Note that $R^{L41}$ is as defined above.

Illustrative examples of the acid labile group of formula (L4) are given below.

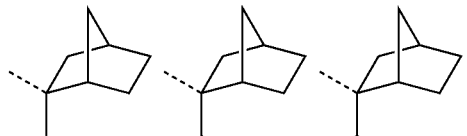

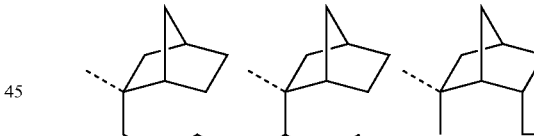

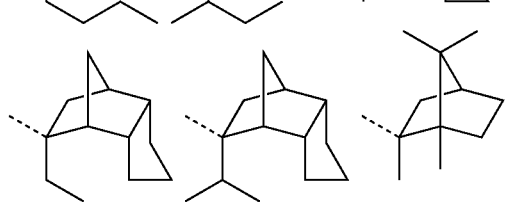

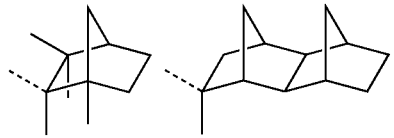

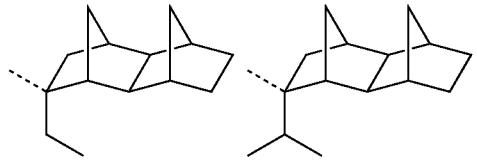

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups, represented by XA, are as exemplified for $R^{L04}$ and the like.
Illustrative examples of the recurring units having formula (1) are given below, but not limited thereto.
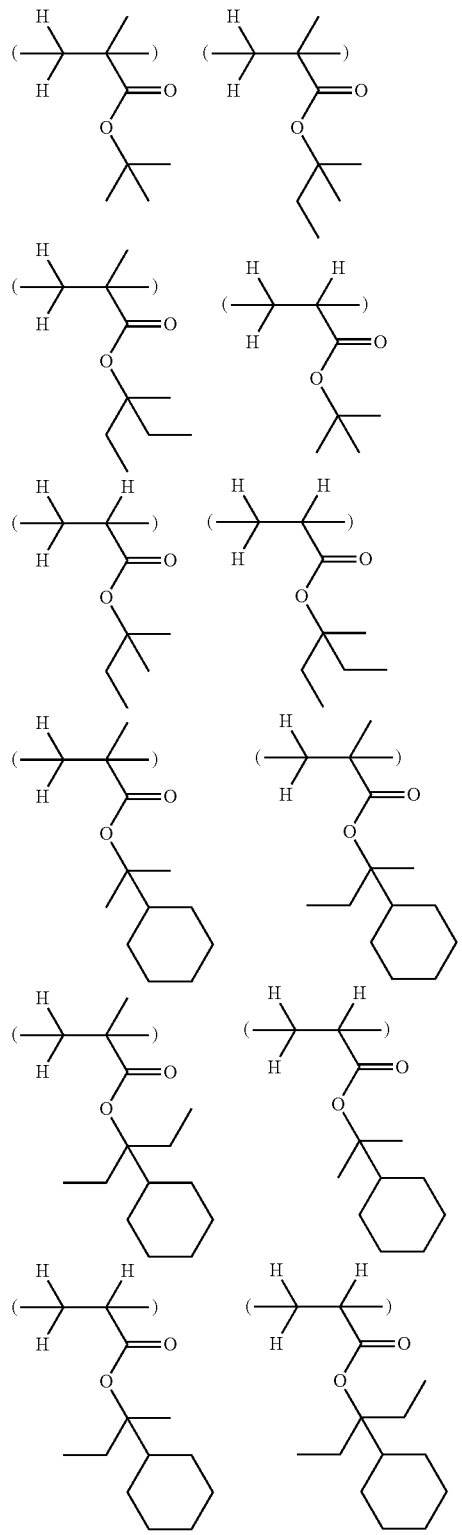
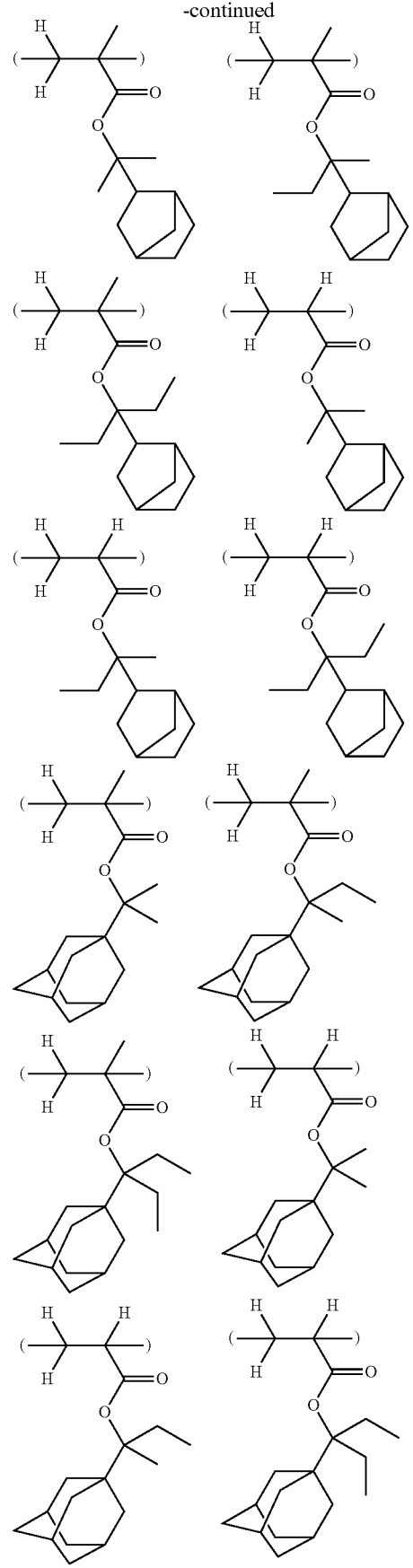

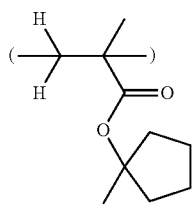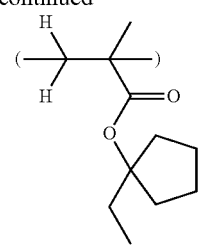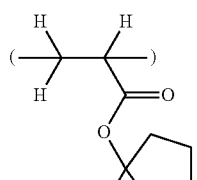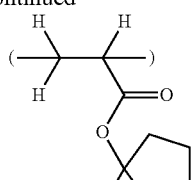
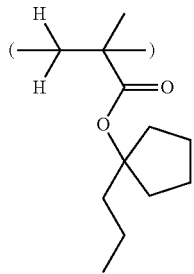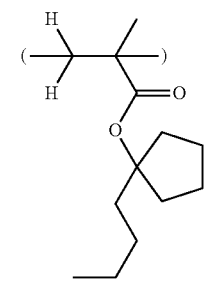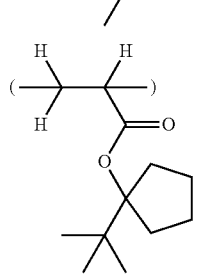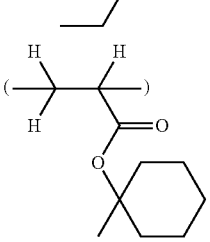
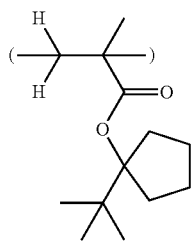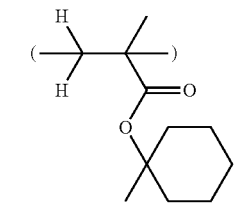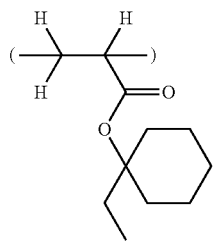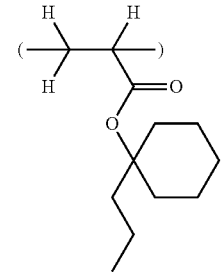
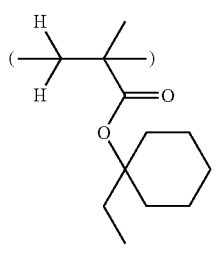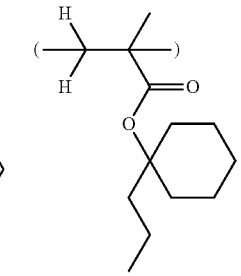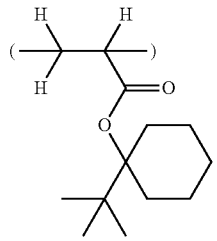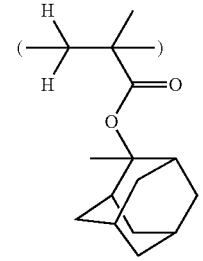
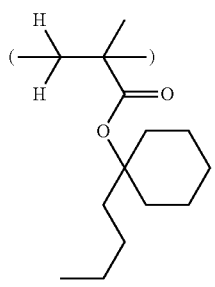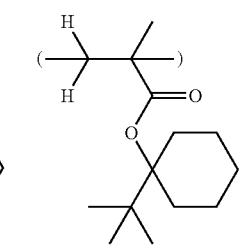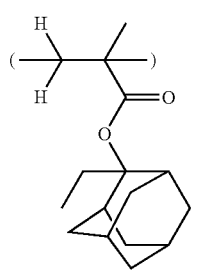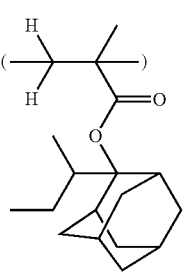
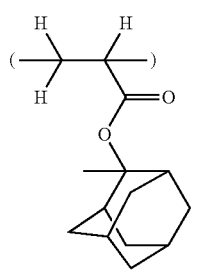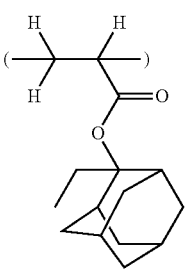

-continued
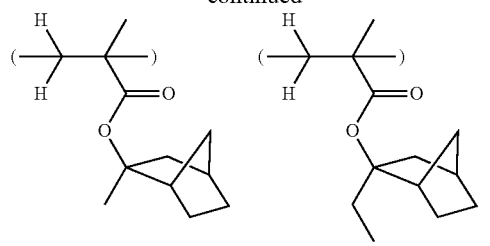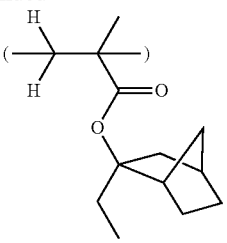
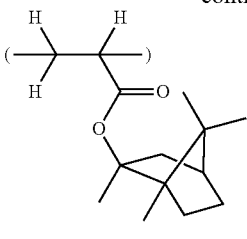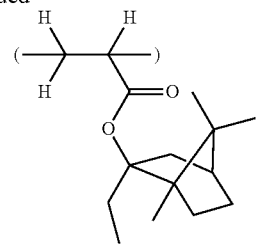
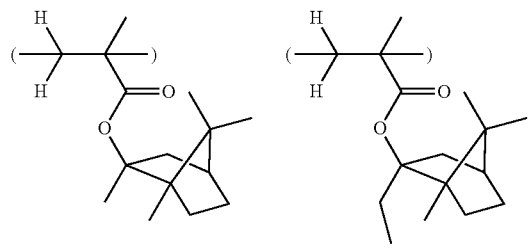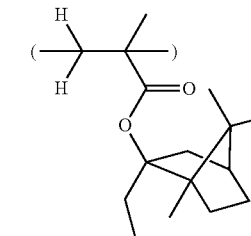
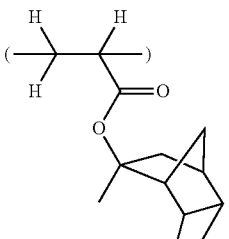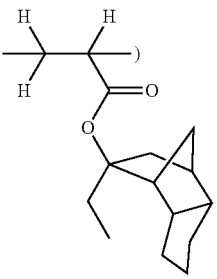
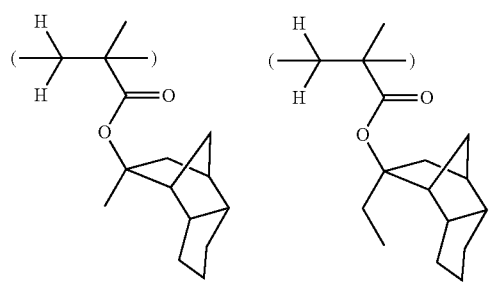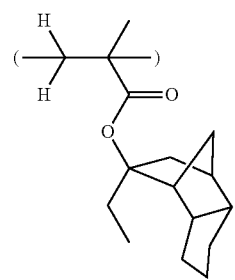
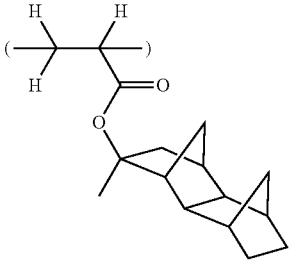
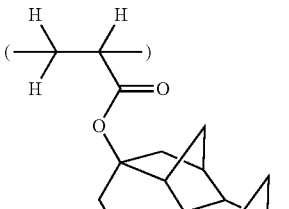
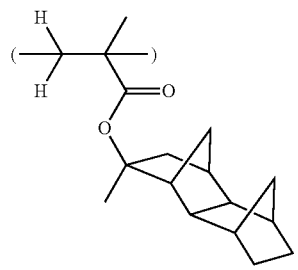
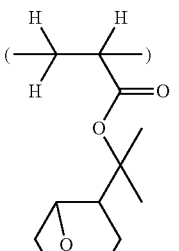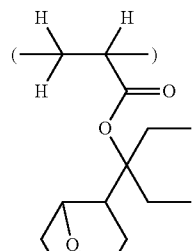
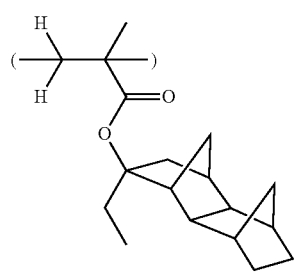
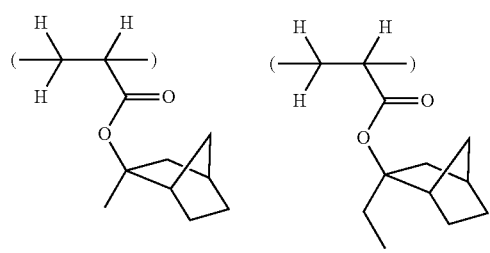
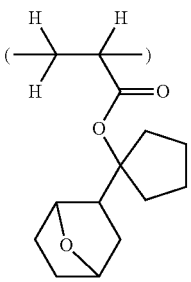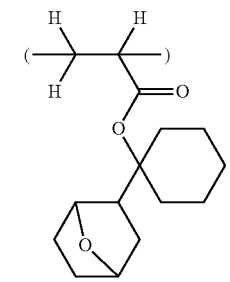

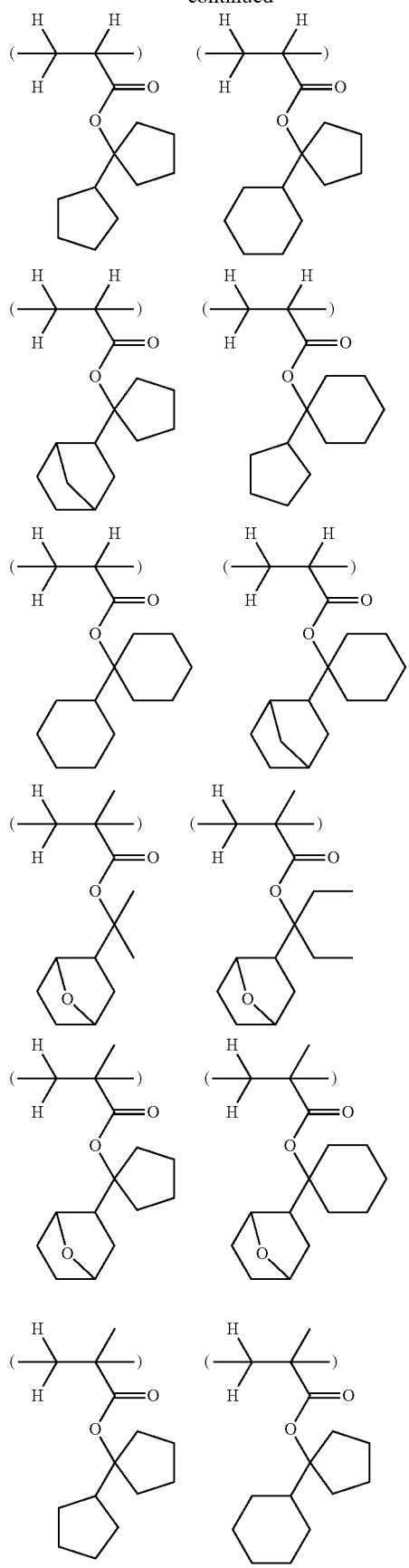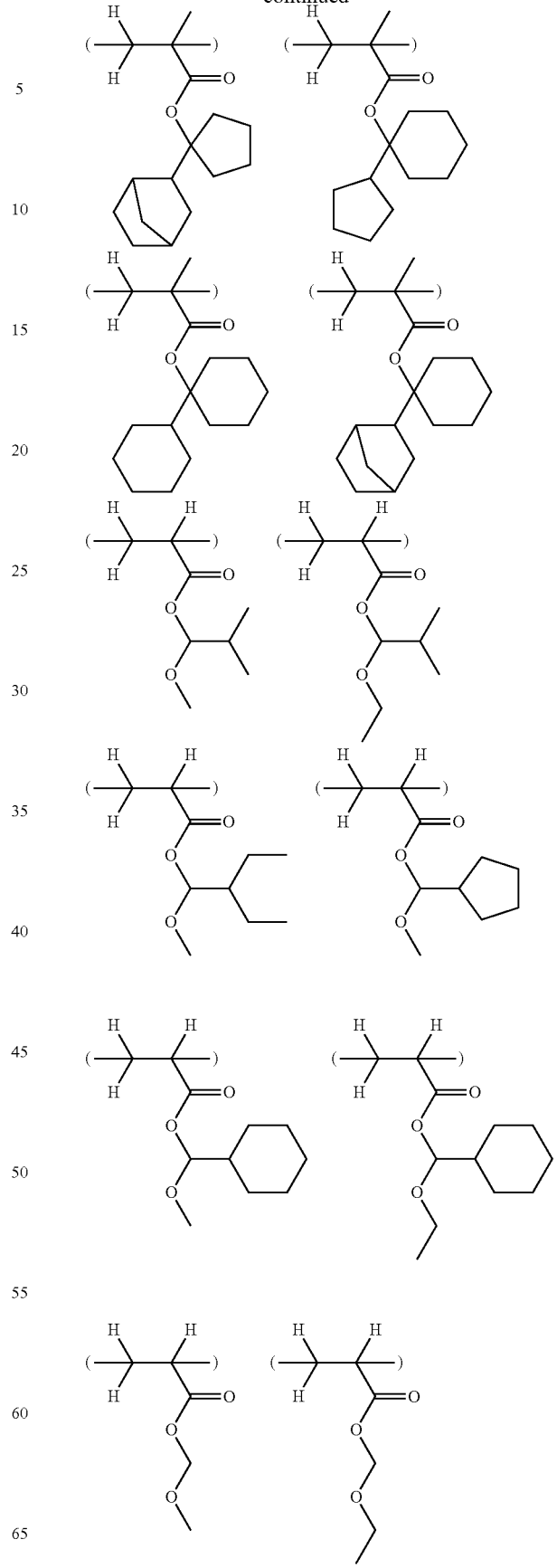

-continued
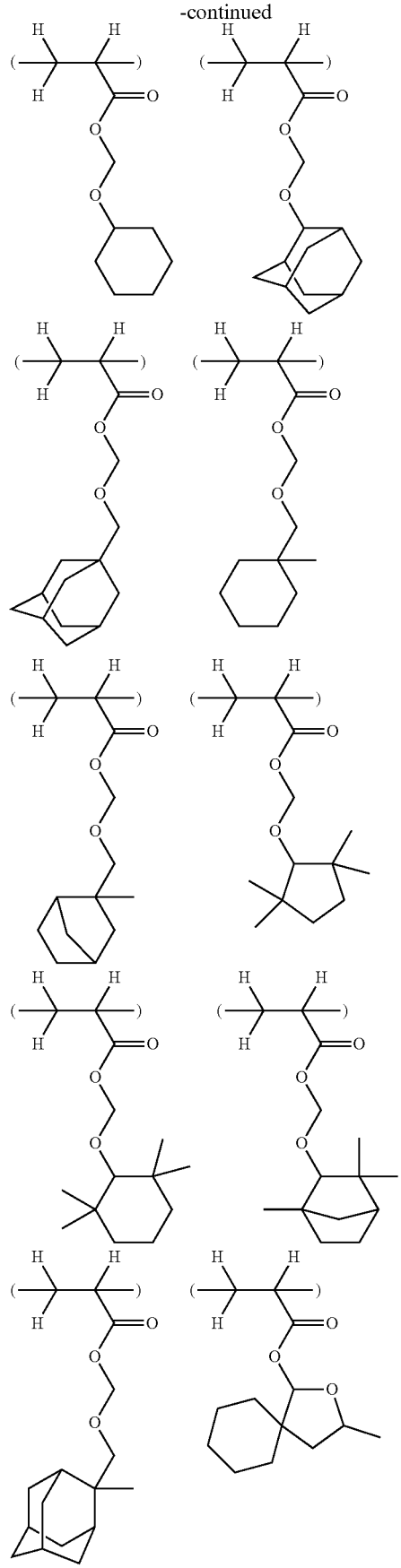
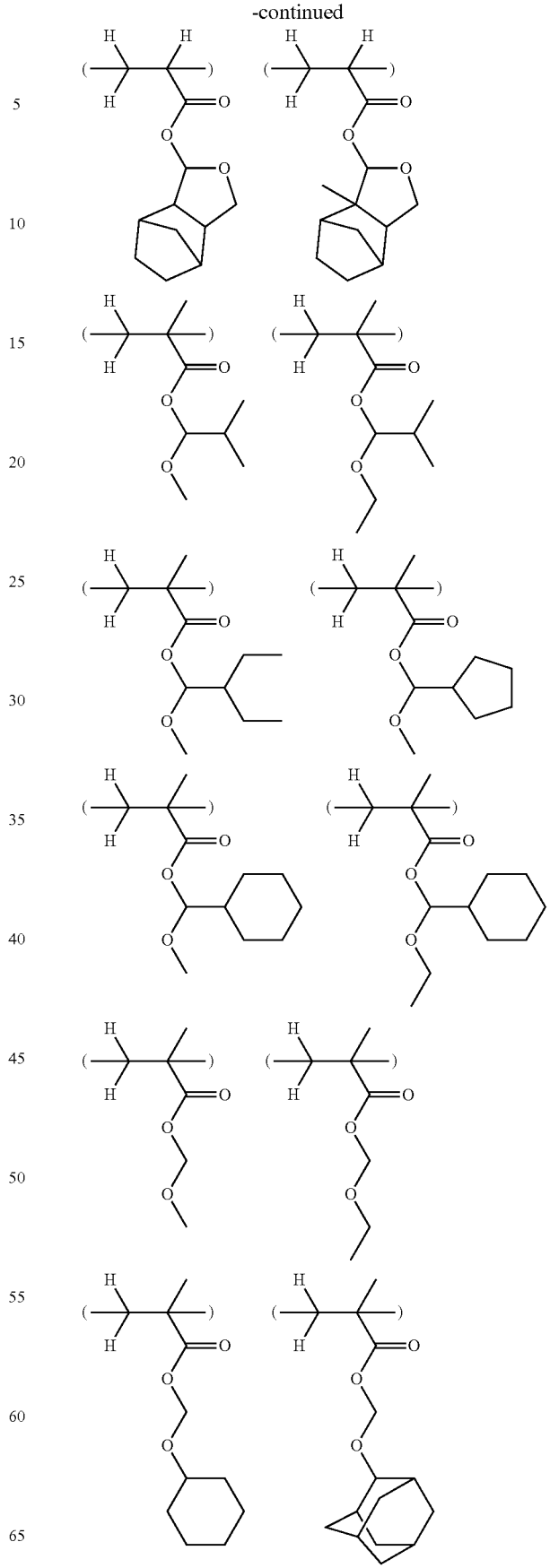

-continued

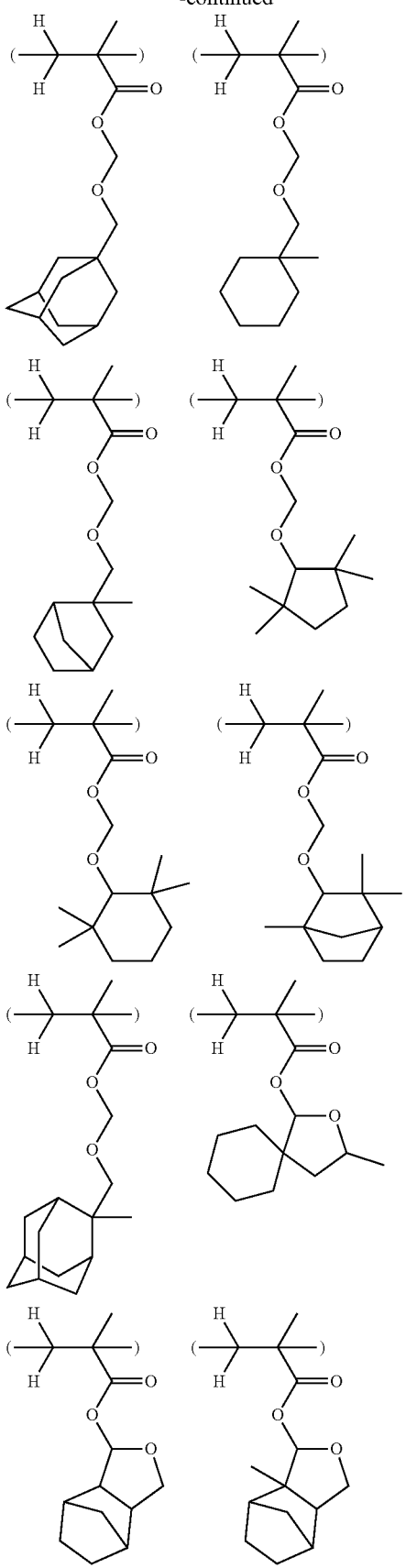

While the foregoing examples correspond to those units wherein Z is a single bond, combinations with similar acid labile groups are possible where Z is other than a single bond. Examples of the units wherein Z is other than a single bond are as illustrated previously.

In addition to the recurring units of formula (1), the polymer should contain recurring units of the general formula (2) illustrated above.

In formula (2), YL is hydrogen or a polar group having one or more structures selected from the group consisting of hydroxyl, cyano, carbonyl, carboxyl, ether bond, ester bond, sulfonic acid ester bond, carbonate, lactone ring, sultone ring and carboxylic anhydride.

Illustrative, non-limiting examples of the recurring units having formula (2) are shown below.

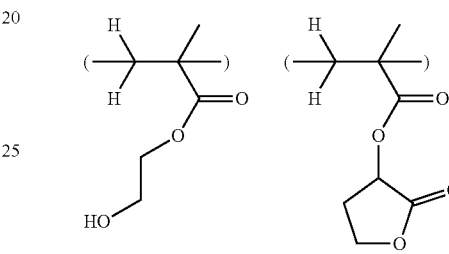

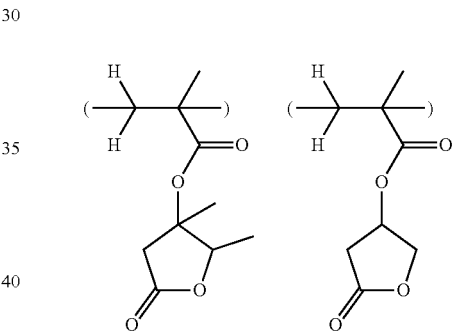

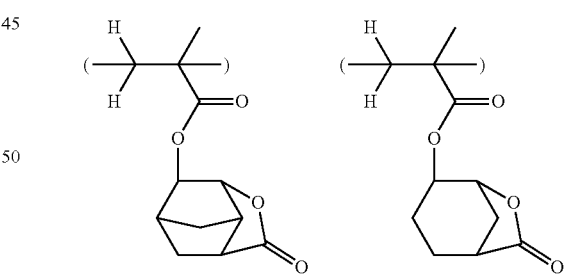

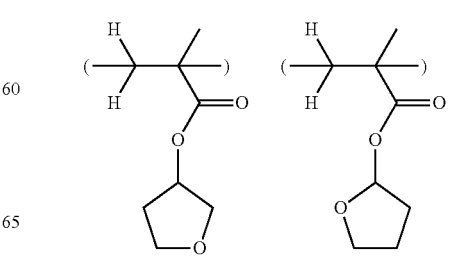

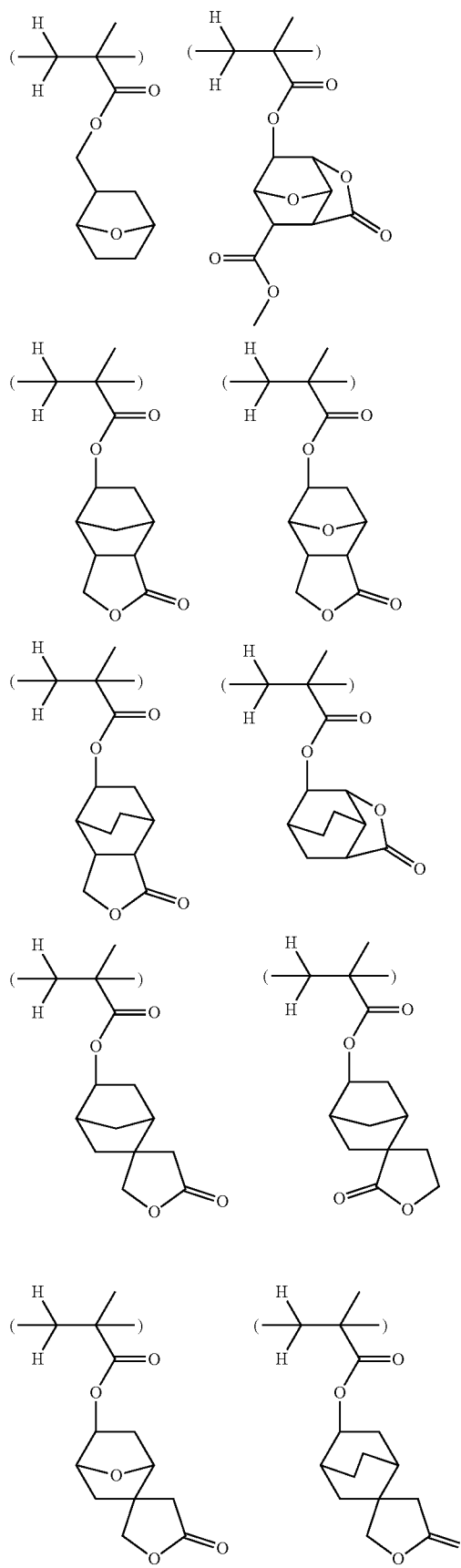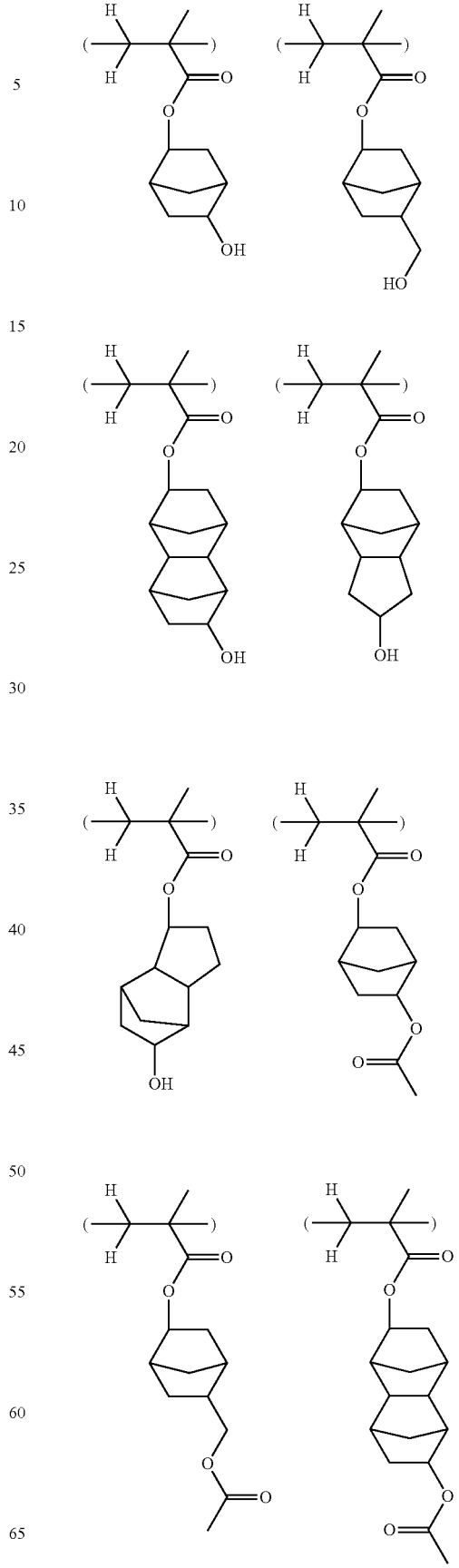

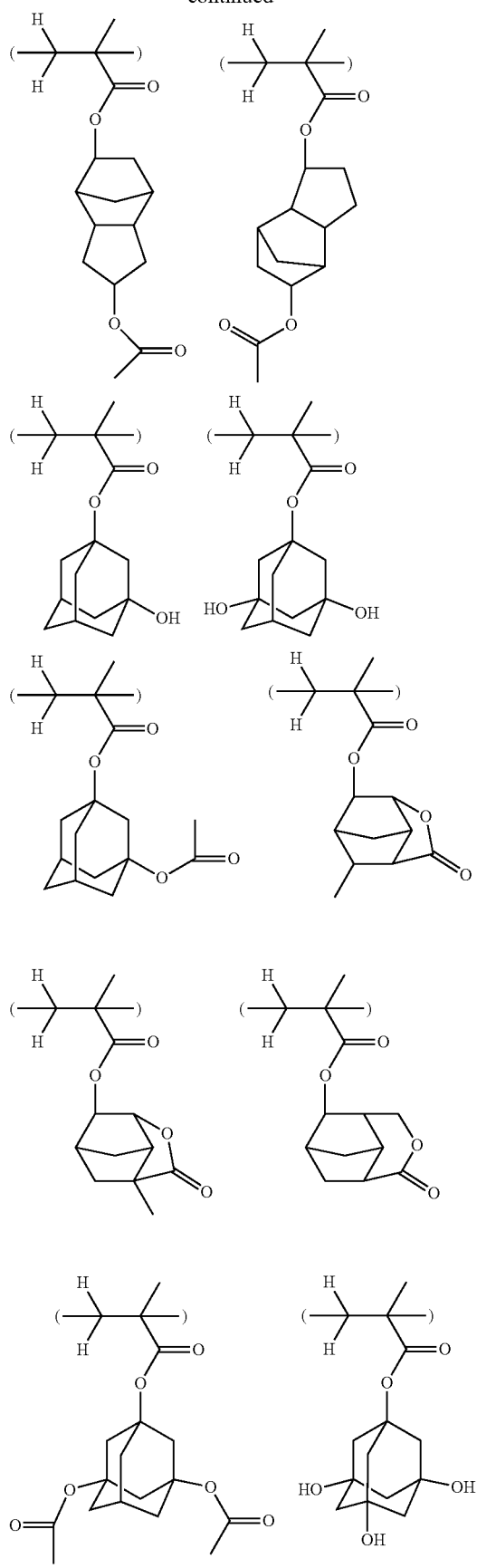
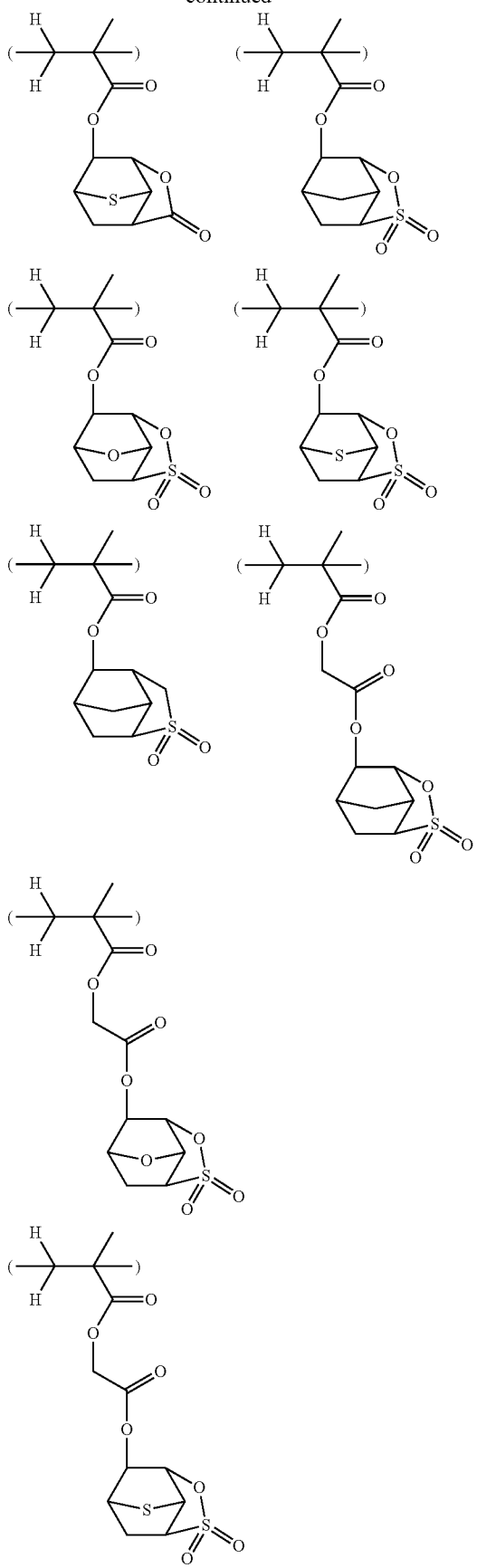

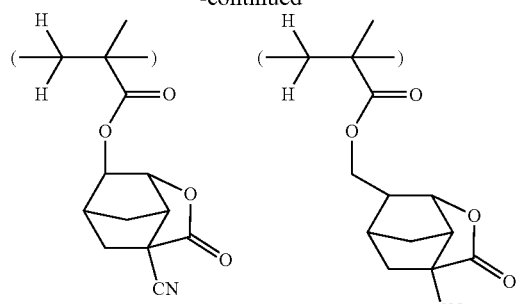
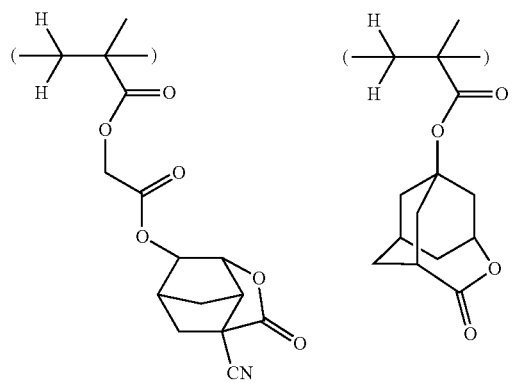
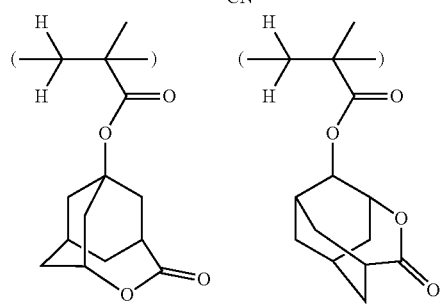
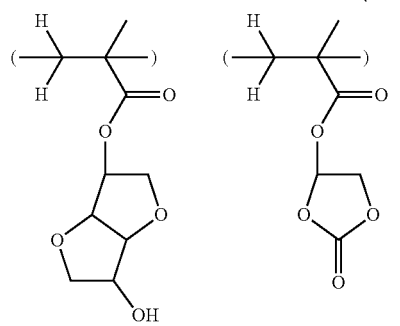
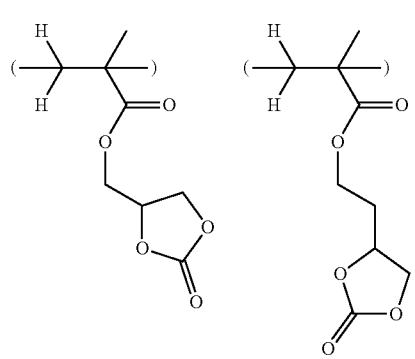
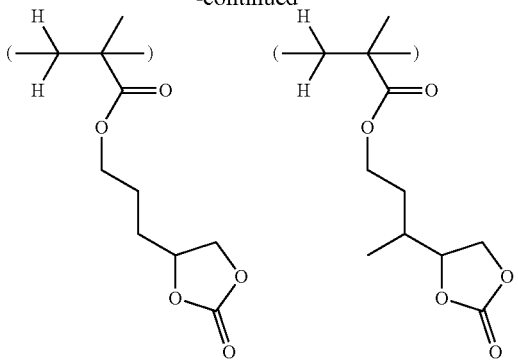
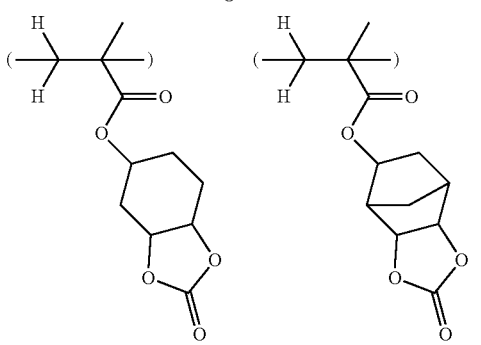
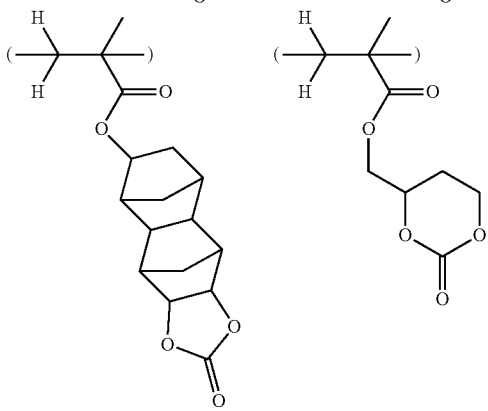
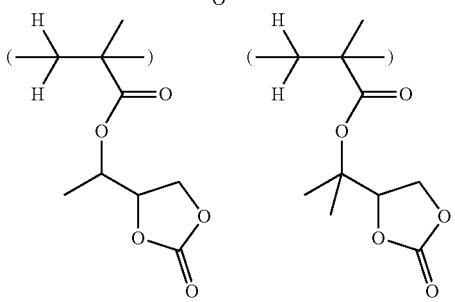
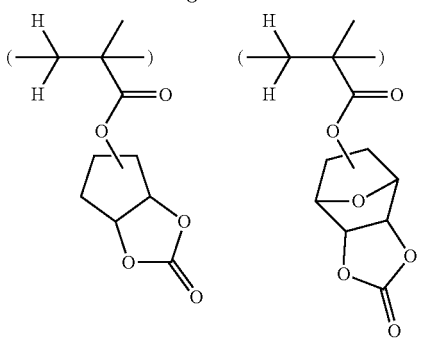

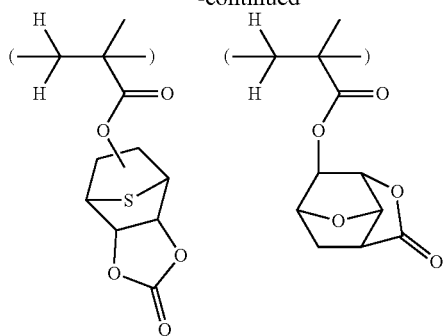
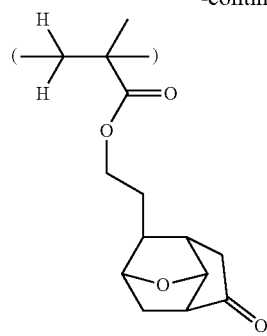
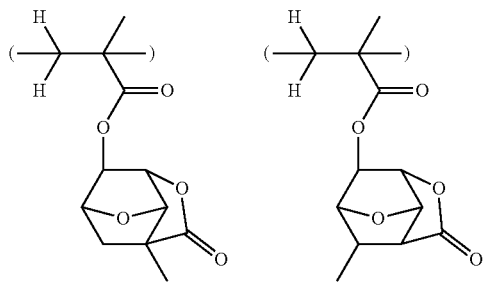
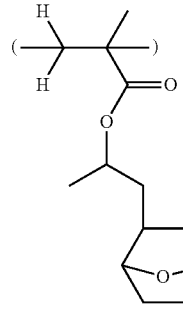
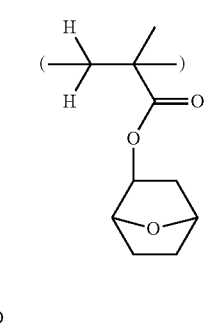
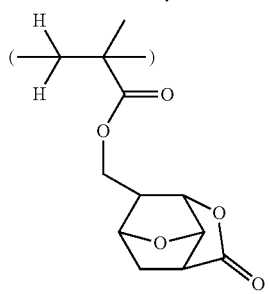
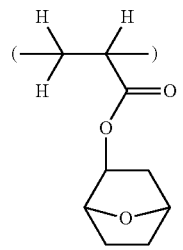
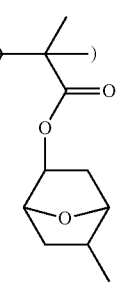
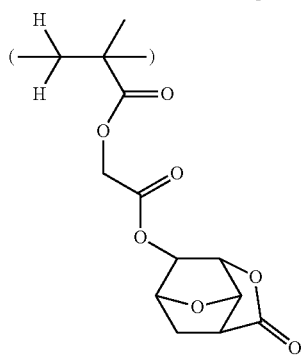
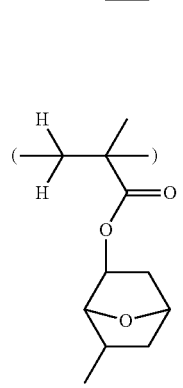
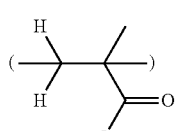
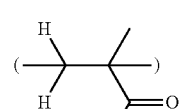
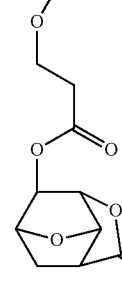
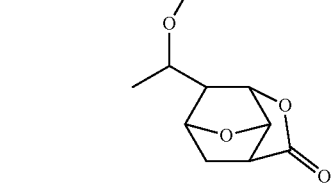
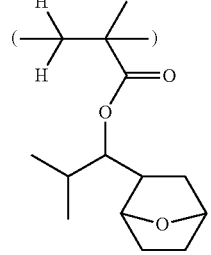

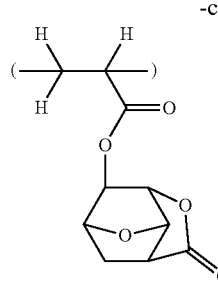
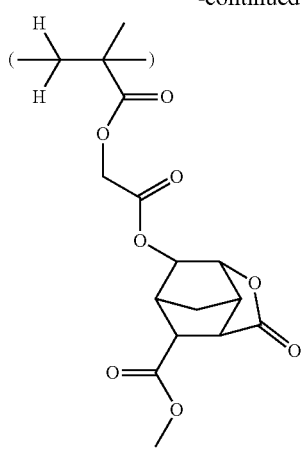
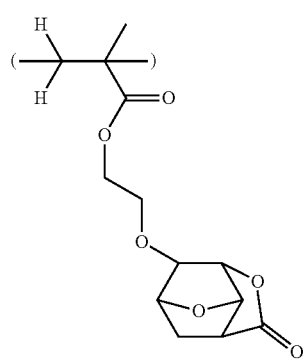
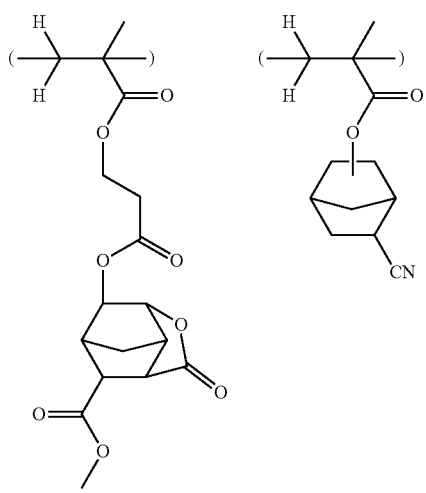
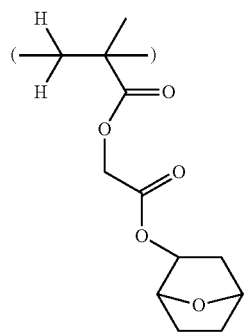
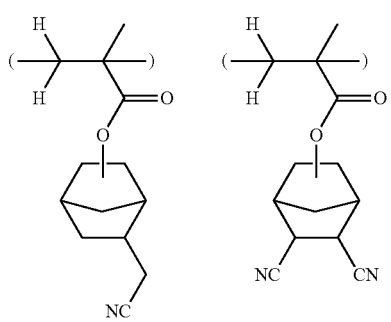
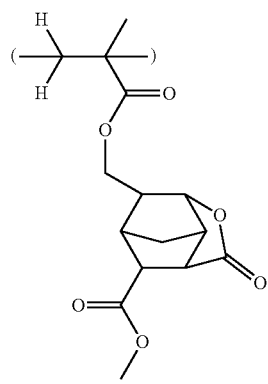
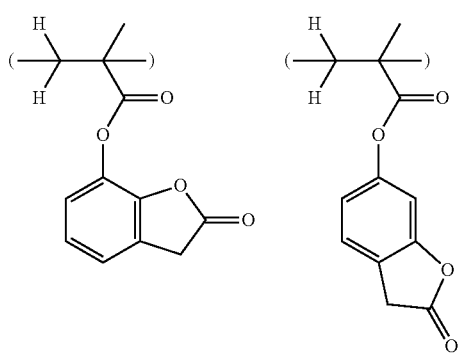

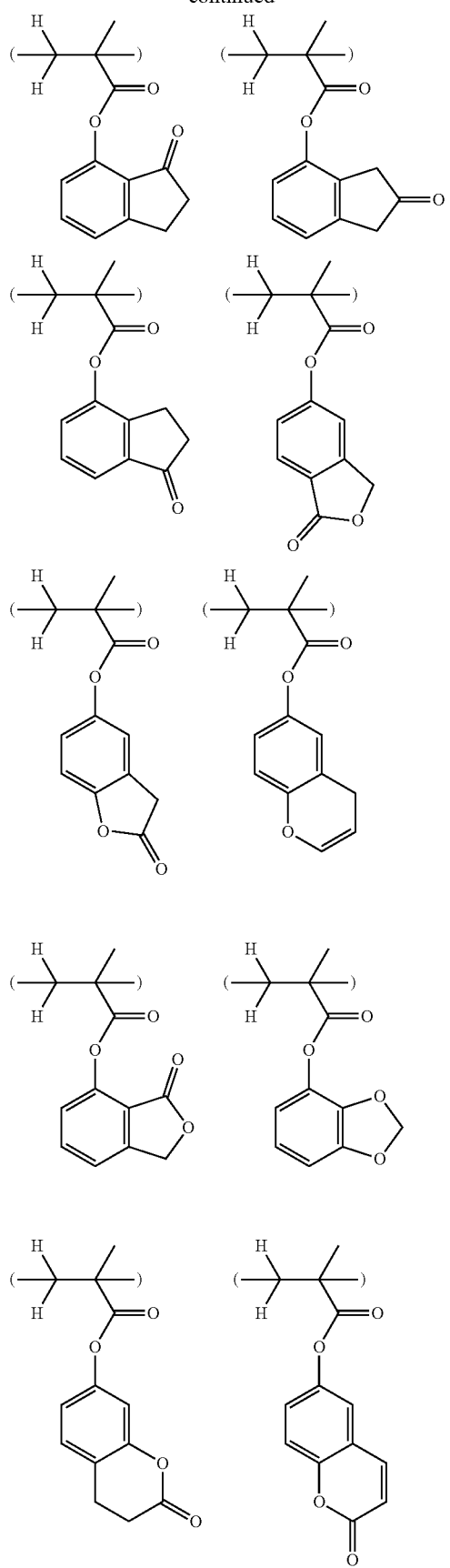
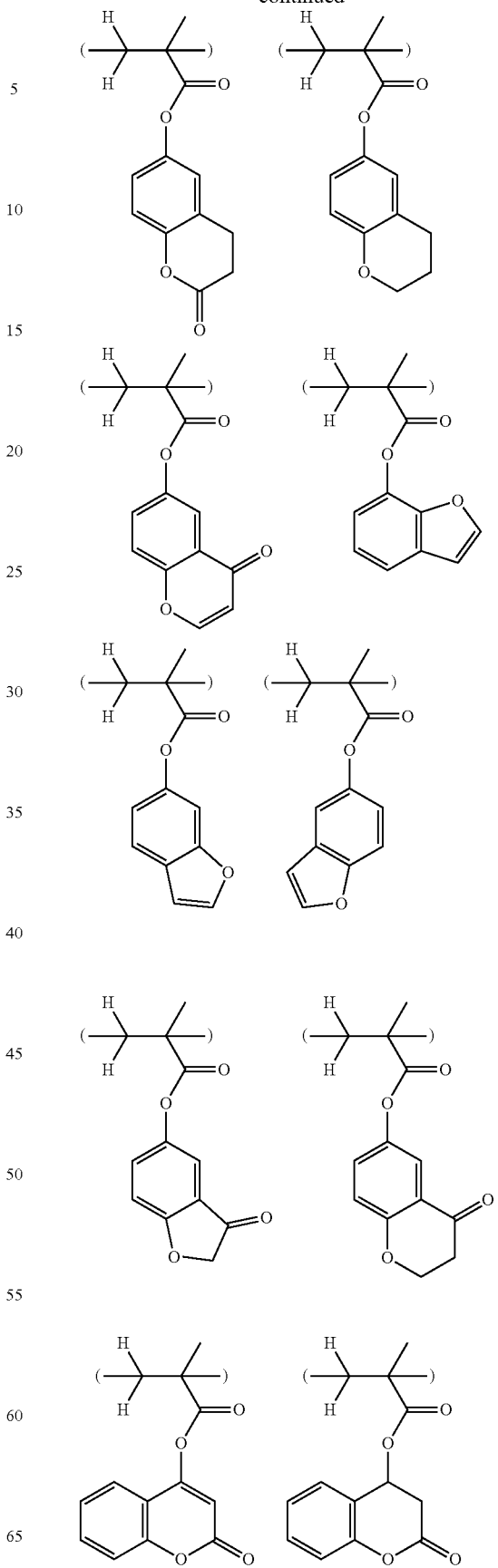

-continued
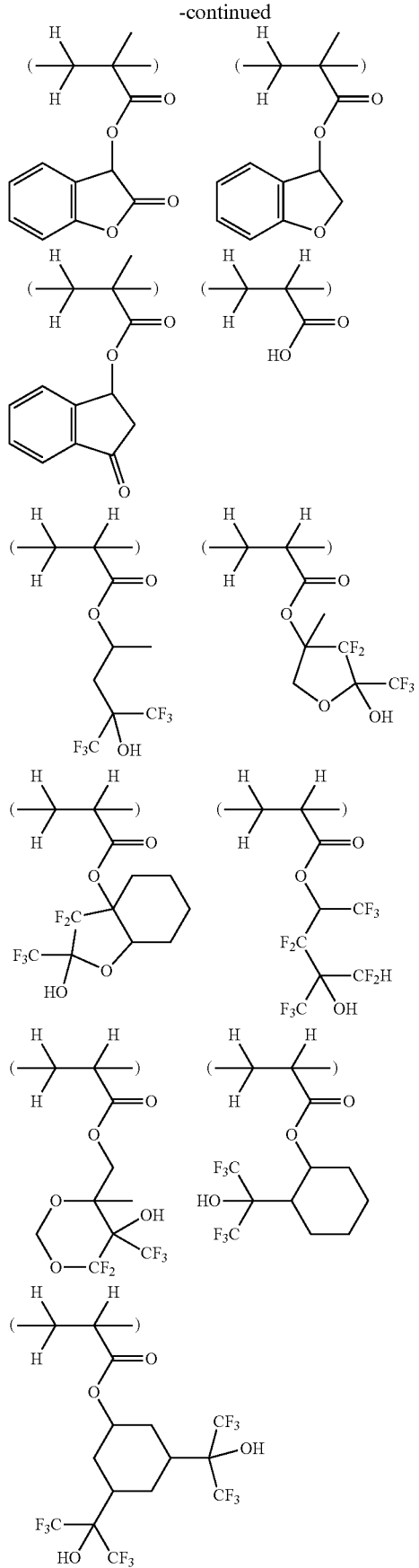
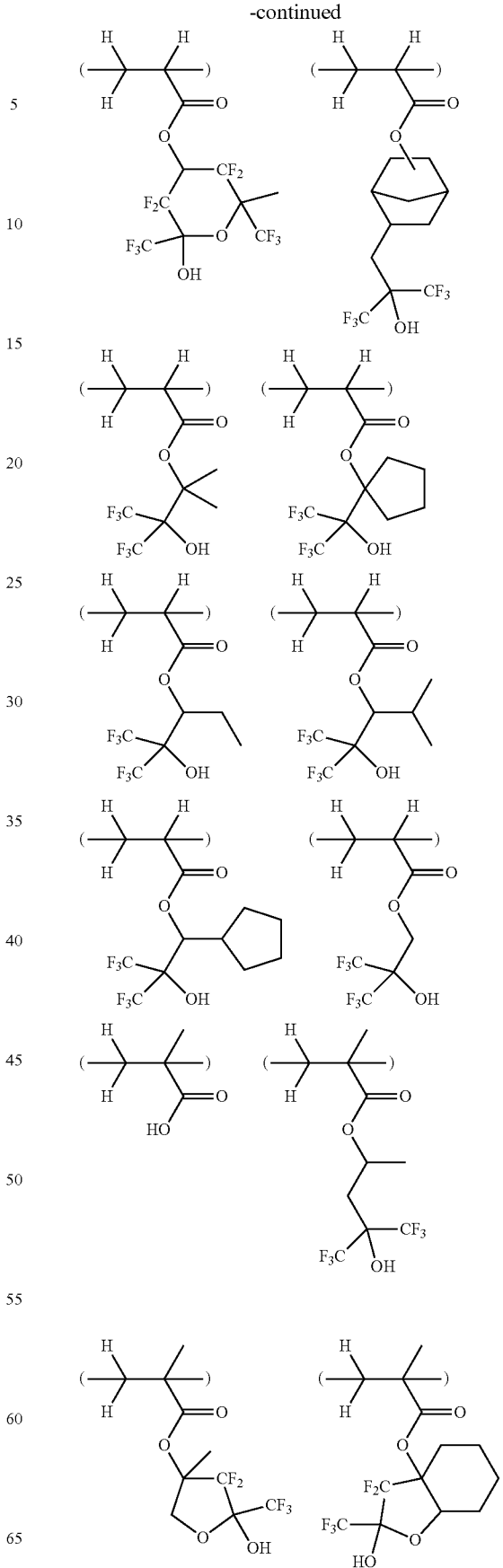

-continued
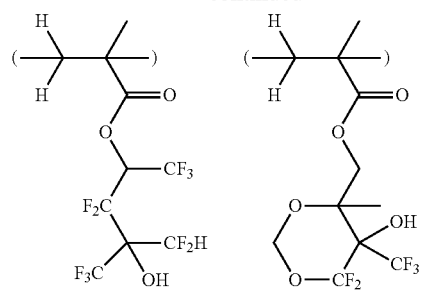
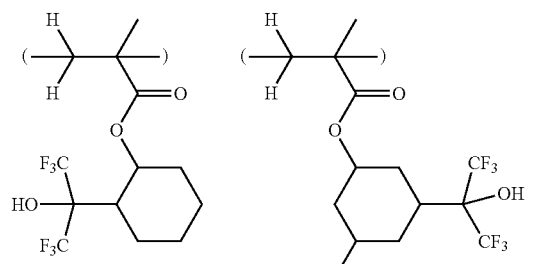
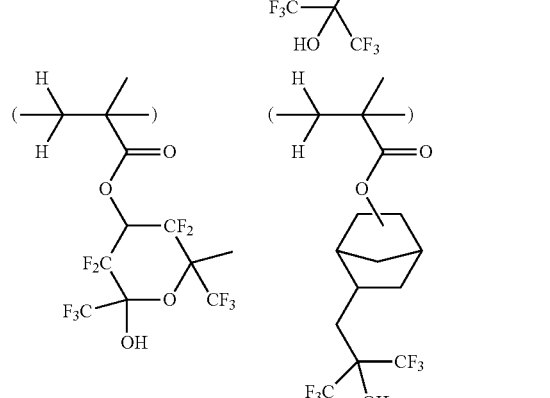
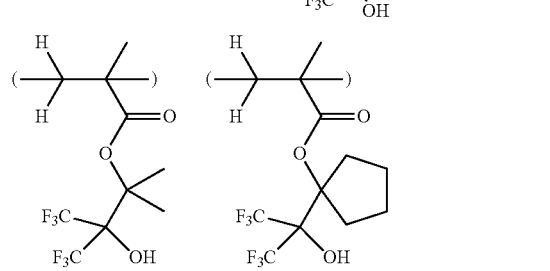
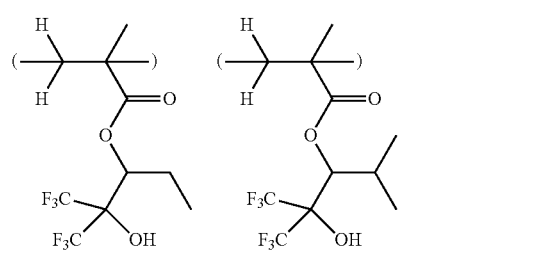
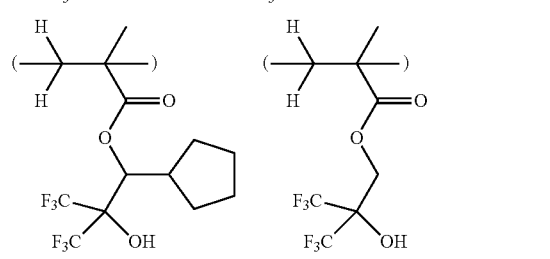
-continued
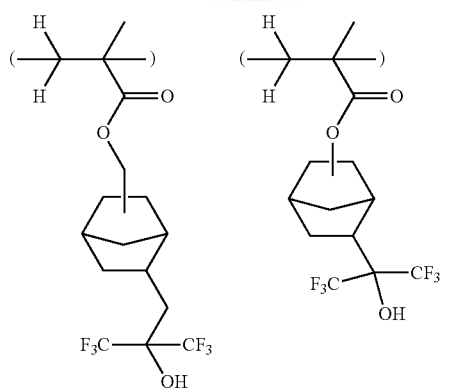
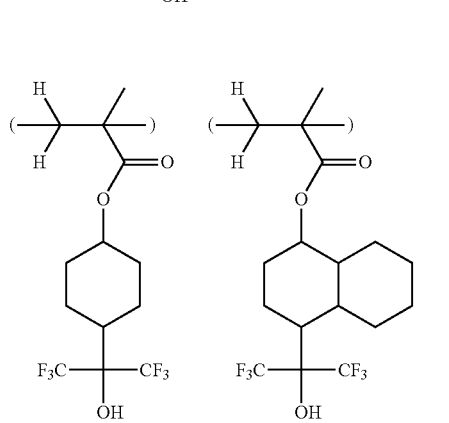
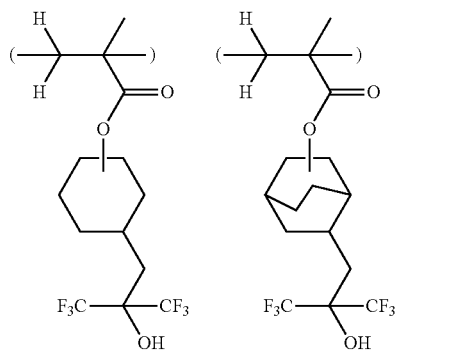
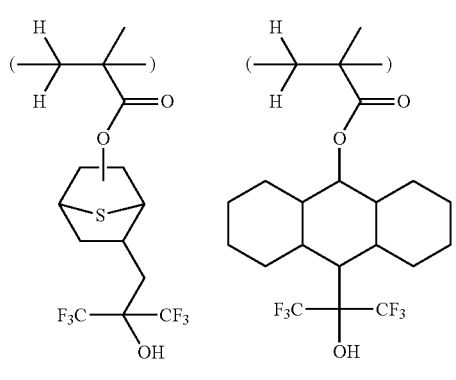

-continued
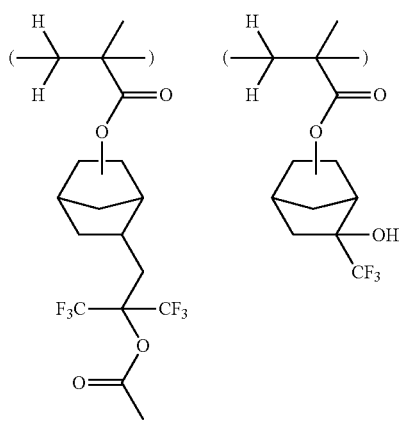
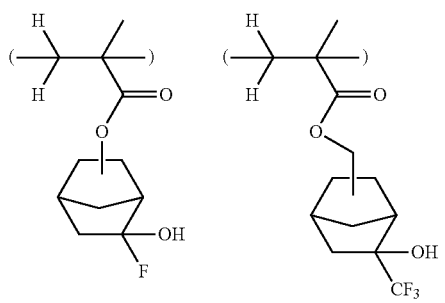
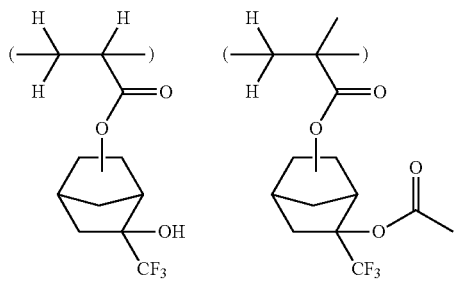
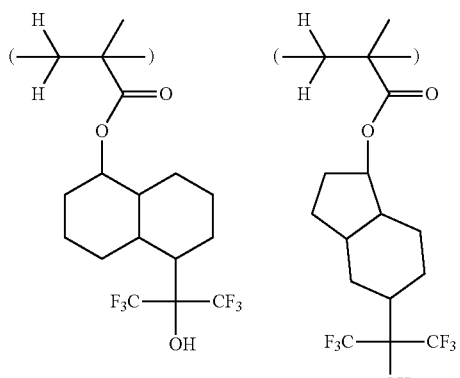
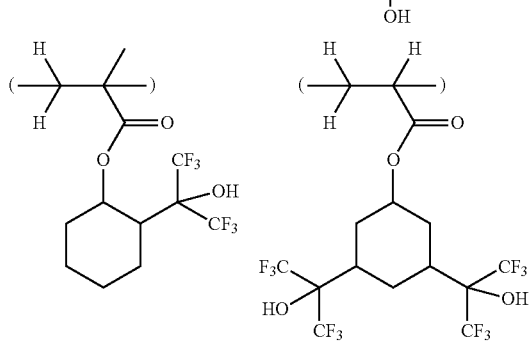
-continued
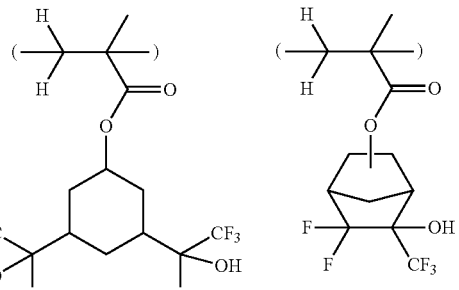
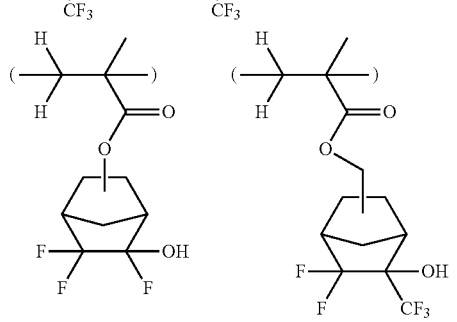
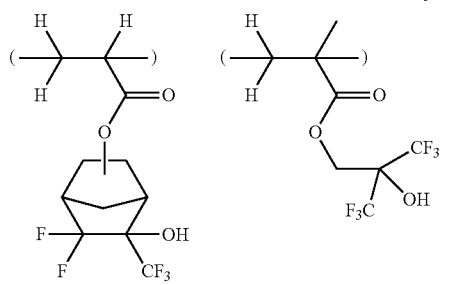
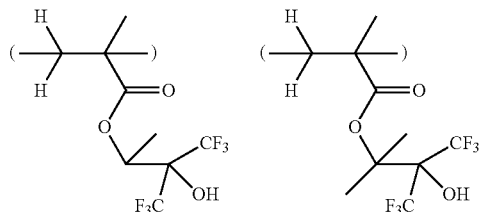
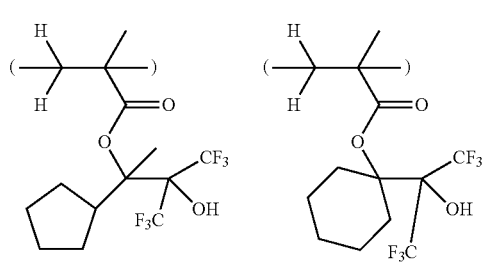
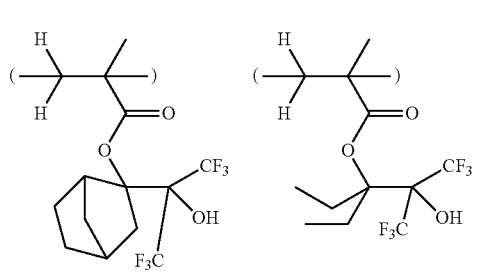

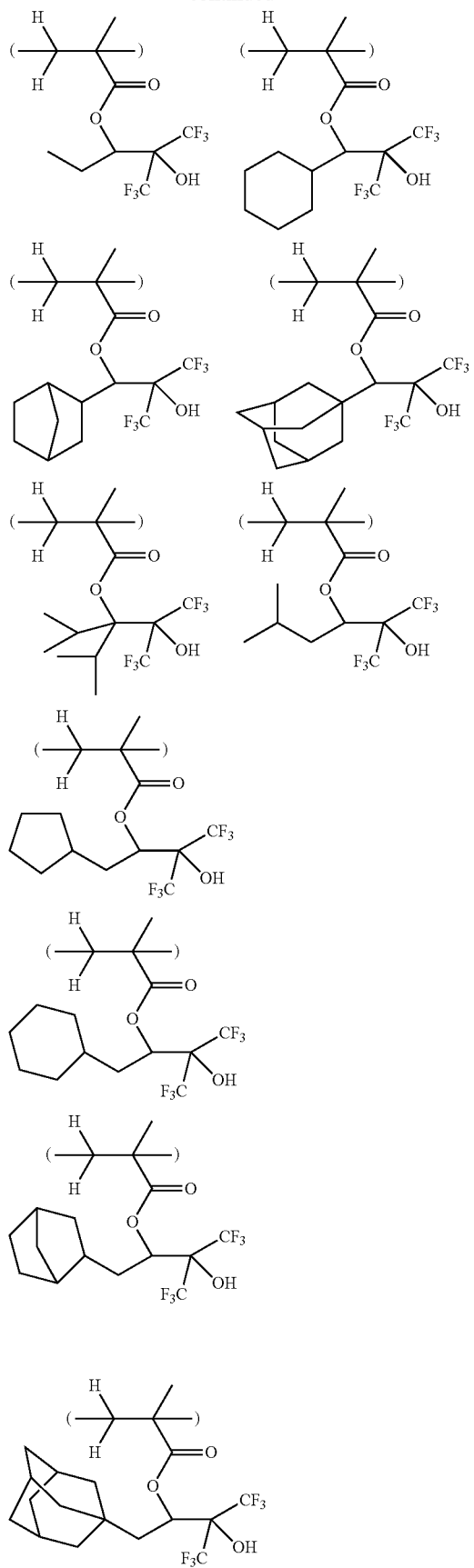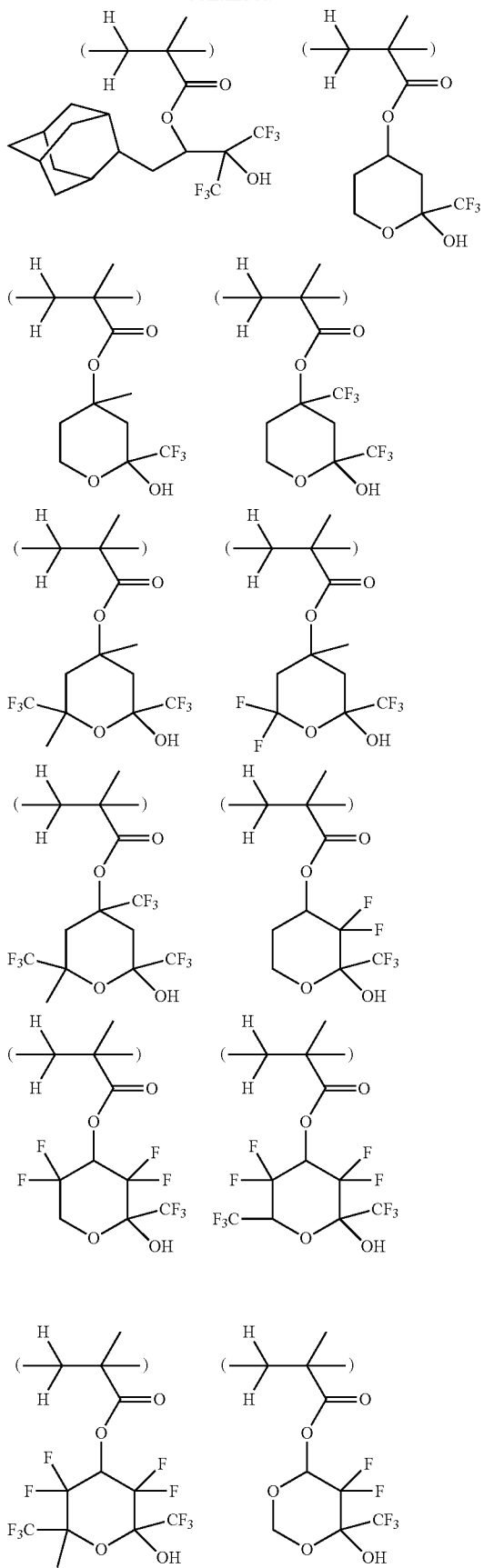

-continued
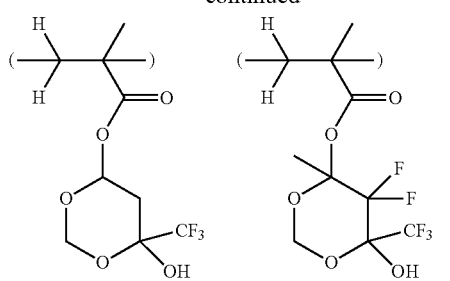
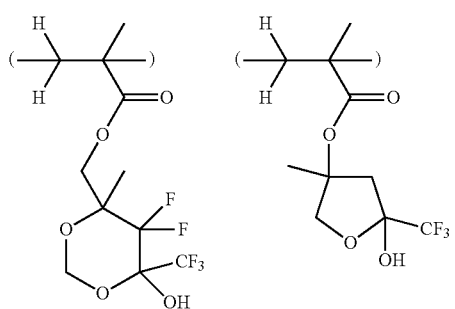
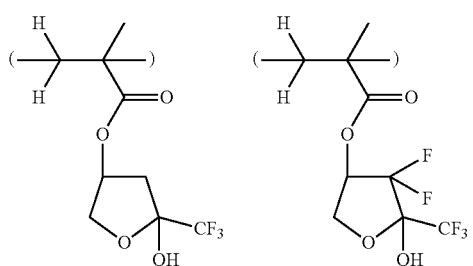
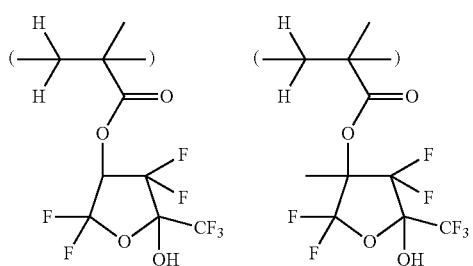
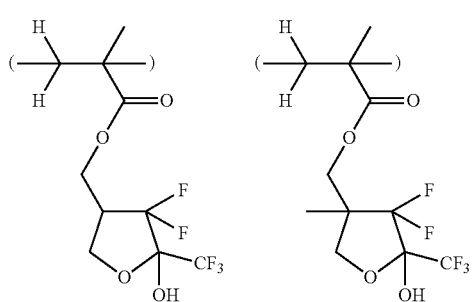
-continued
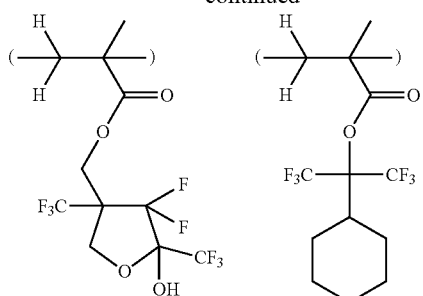
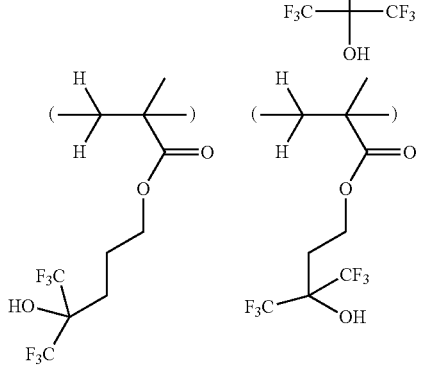
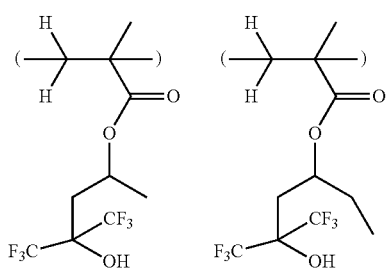
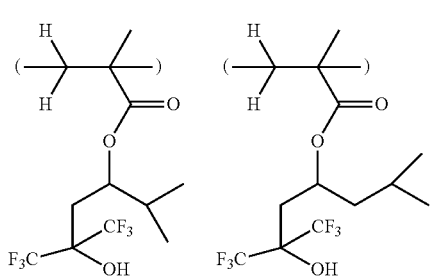
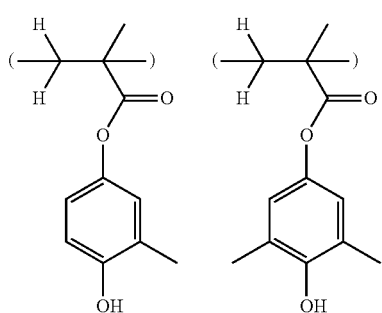

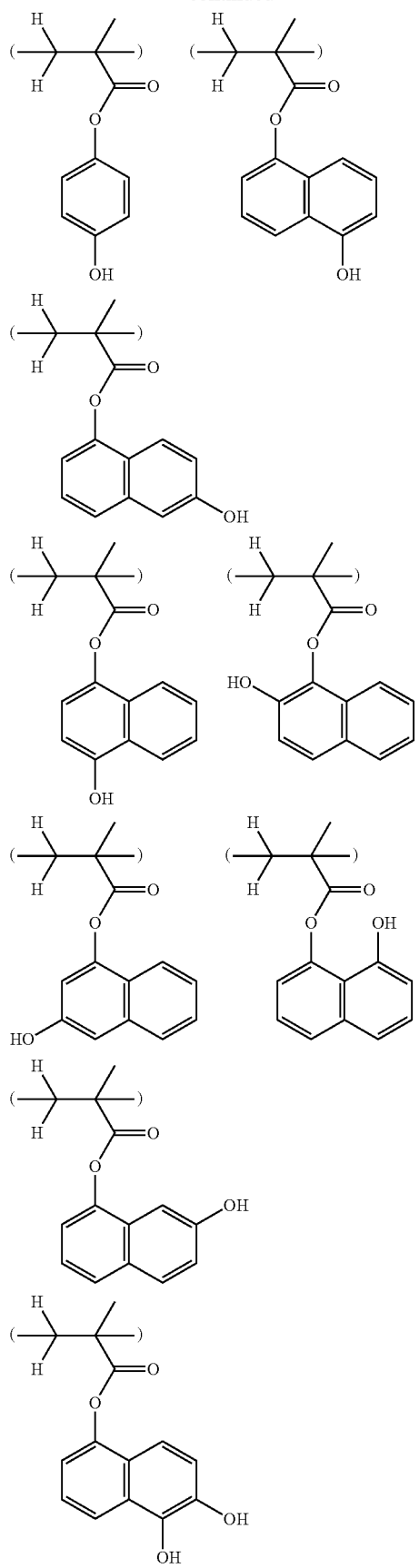
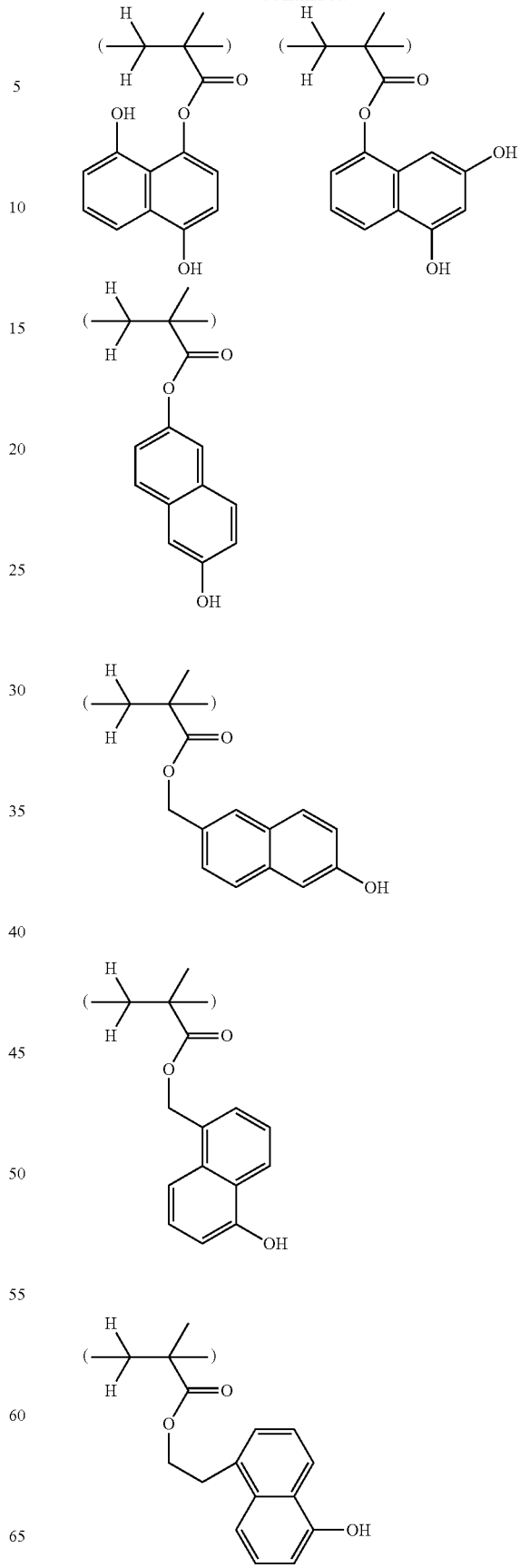

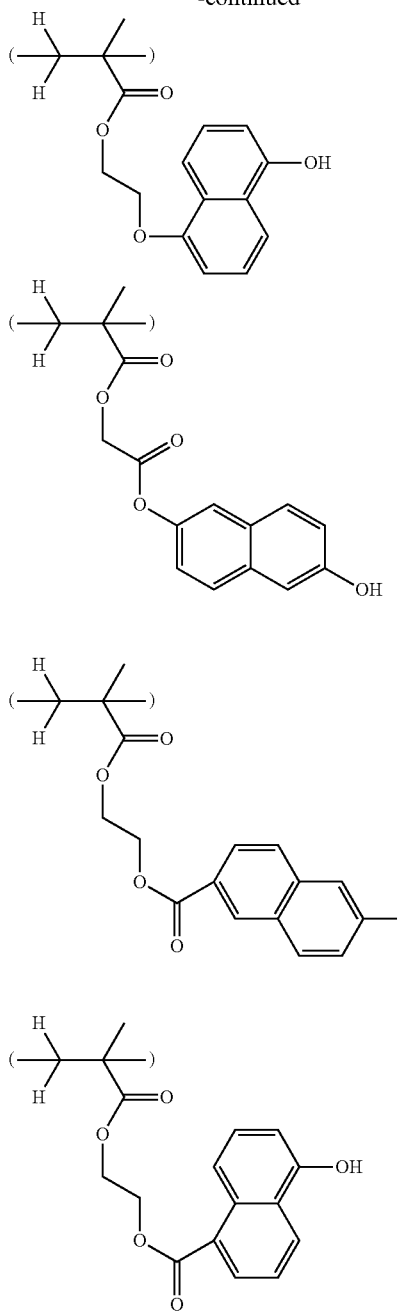

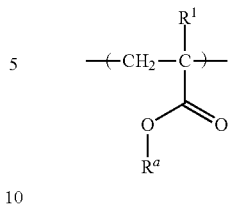

(1a)

Herein $R^1$ is as defined above, and $R^a$ is a straight, branched or cyclic $C_1$-$C_{20}$ monovalent hydrocarbon group which may be substituted with or separated by a heteroatom, with the proviso that $R^a$ has one to four substituent groups of the general formula (1b).

—$OR^b$ (1b)

In formula (1b), $R^b$ is an acid labile group, and the broken line denotes a valence bond.

Illustrative, non-limiting examples of the recurring units having formula (1a) are shown below.

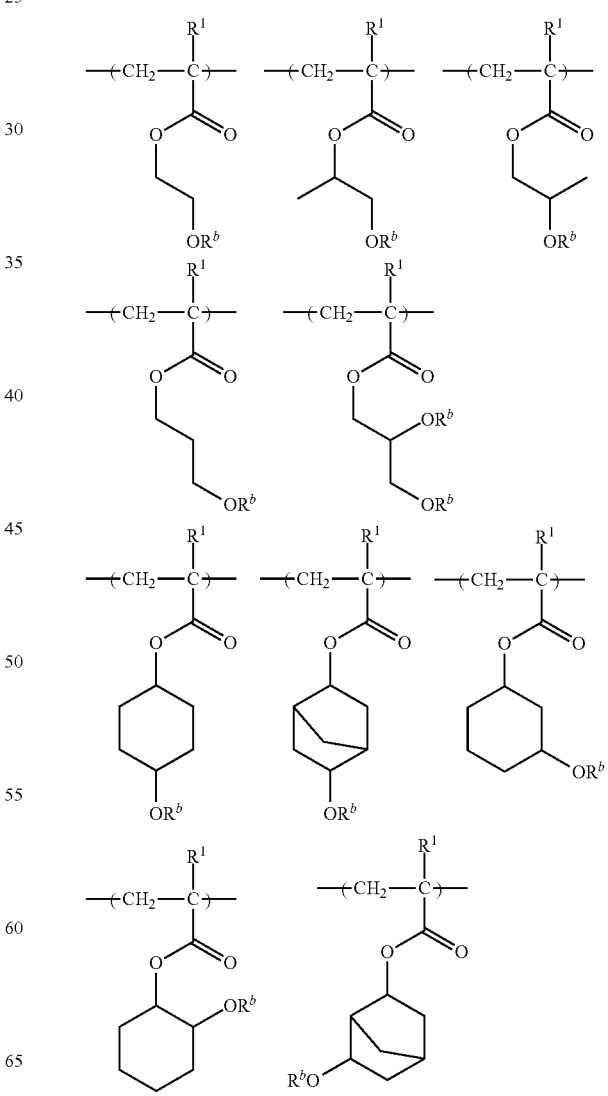

Of the recurring units having formula (2), those units having a lactone ring as the polar group are most preferred.

While the polymer serving as a base resin in the resist composition is characterized by comprising recurring units of formula (1) and recurring units of formula (2) as mentioned above, it may have further copolymerized therein recurring units of a structure having a hydroxyl group protected with an acid labile group. The recurring units having a hydroxyl group protected with an acid labile group are not particularly limited as long as the unit has one, two or more structures having a hydroxyl group protected with a protective group, which is decomposed under the action of acid to generate a hydroxyl group. The recurring units of a structure having the general formula (1a) are preferred.

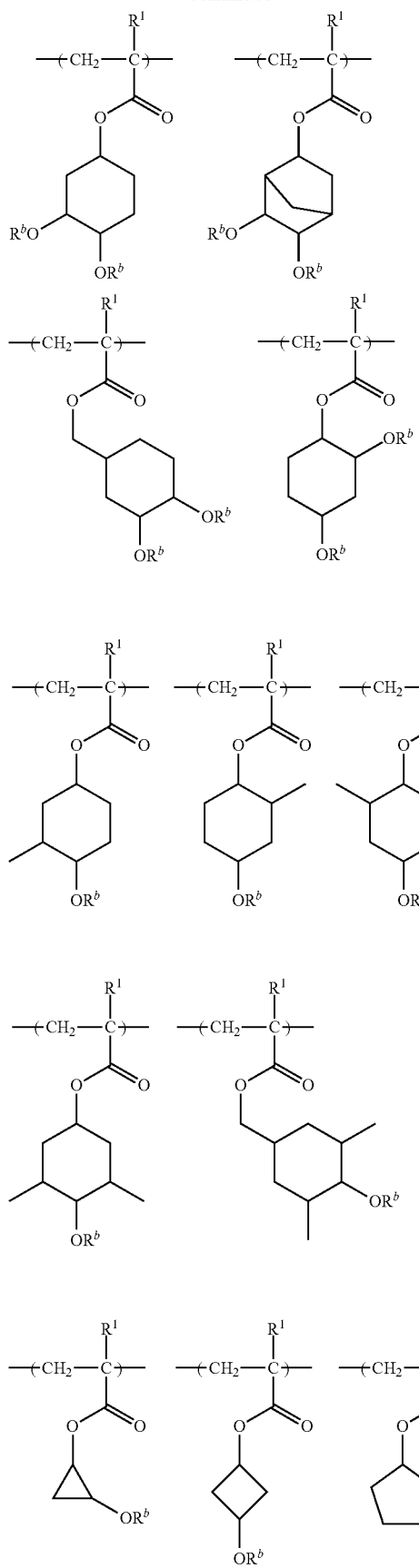
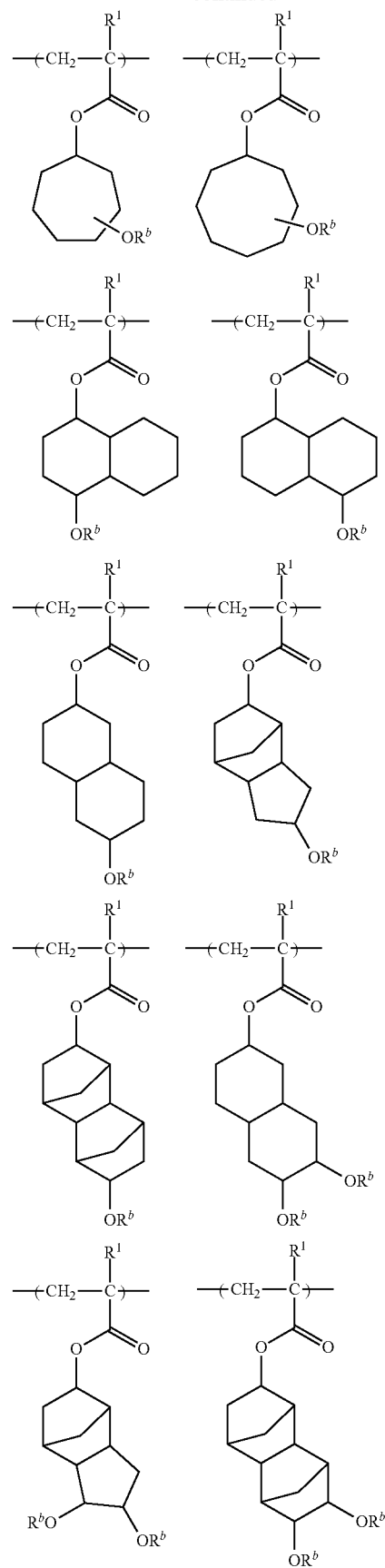

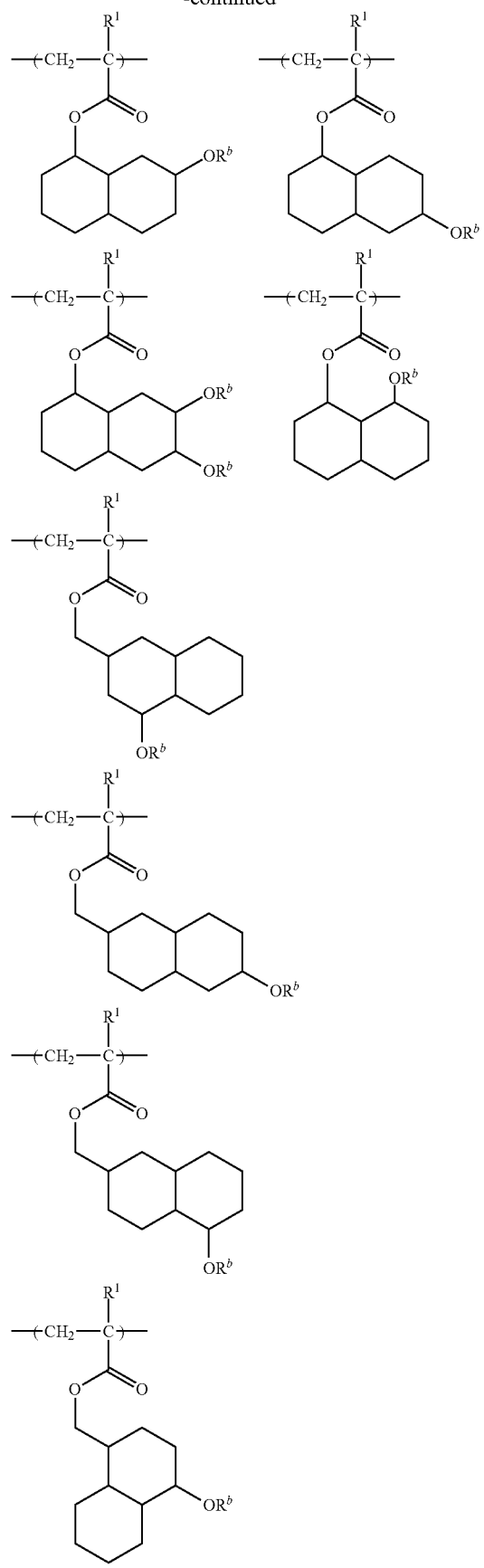
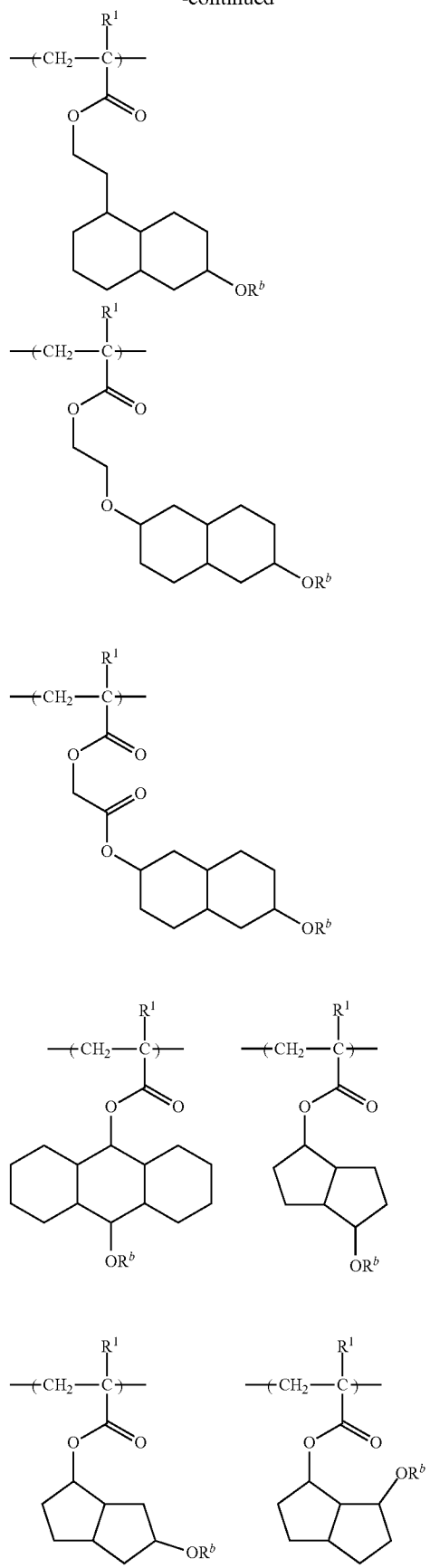

-continued
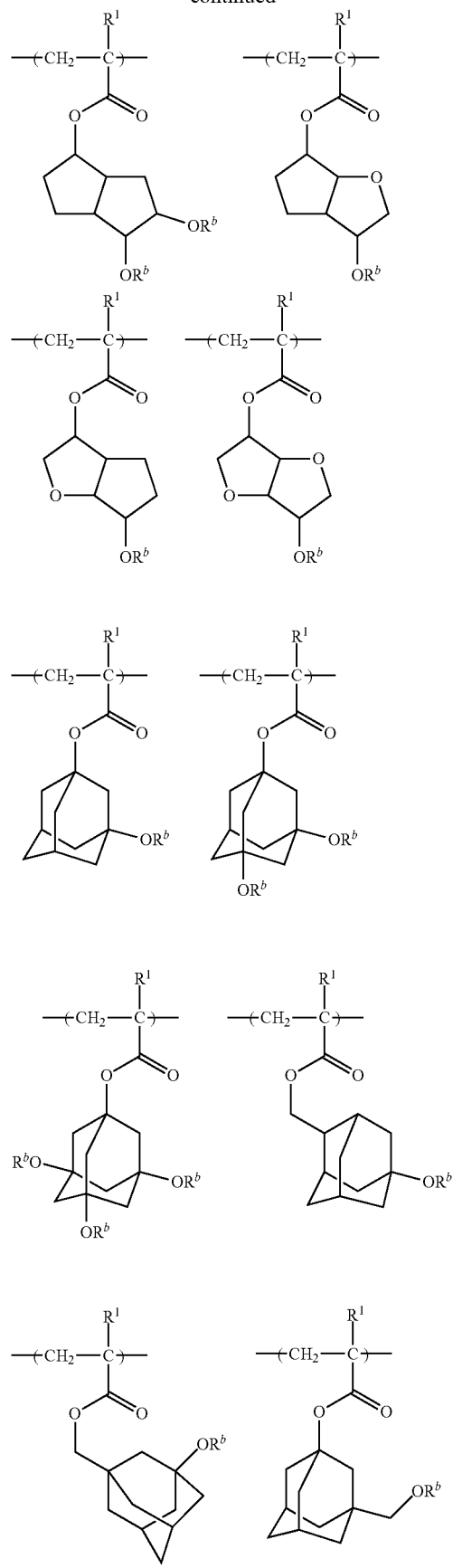
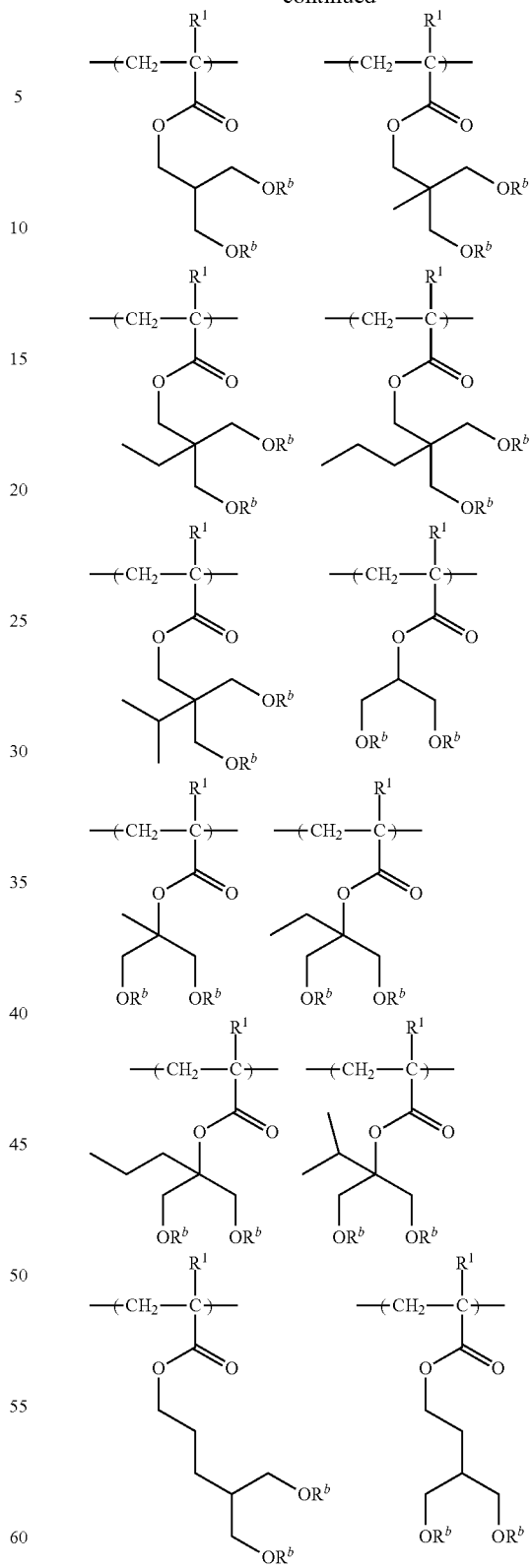
Herein $R^1$ and $R^b$ are as defined above.
For the acid labile group $R^b$ in formula (1b), its structure is not particularly limited as long as it is deprotected under the action of acid to generate a hydroxyl group. Suitable structures include an acetal structure, a ketal structure, and alkoxycarbonyl groups. Exemplary structures are shown below.

Of the acid labile groups $R^b$ in formula (1b), preferred are alkoxymethyl groups having the general formula (1c).

In formula (1c), $R^c$ is a straight, branched or cyclic $C_1$-$C_{15}$ monovalent hydrocarbon group.

Illustrative, non-limiting examples of the acid labile group having formula (1c) are given below.

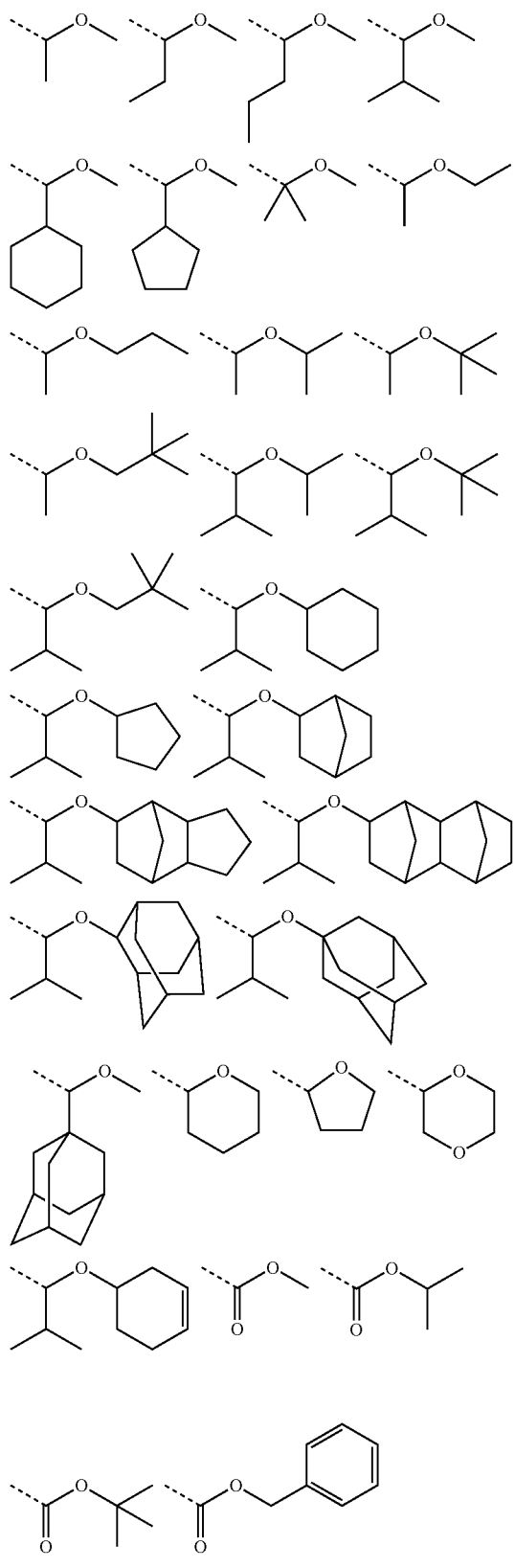

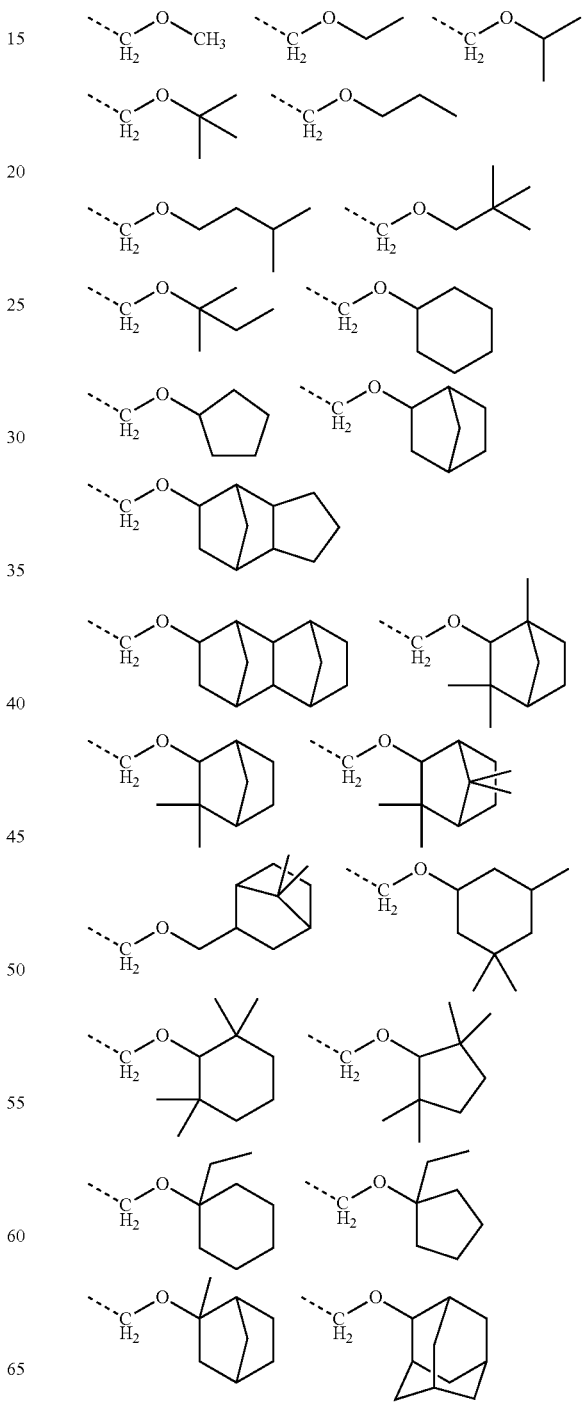

-continued
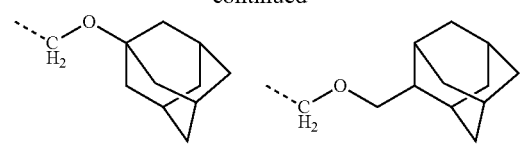
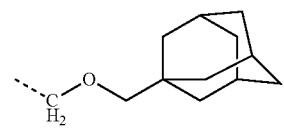
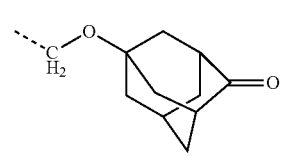
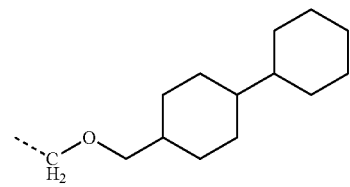
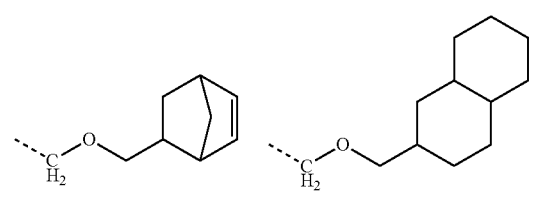
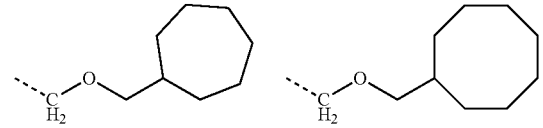
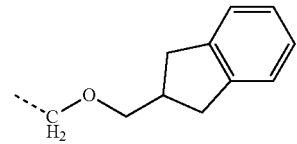
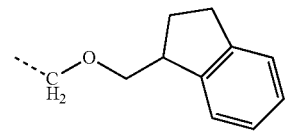
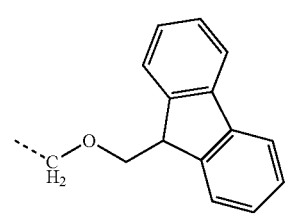
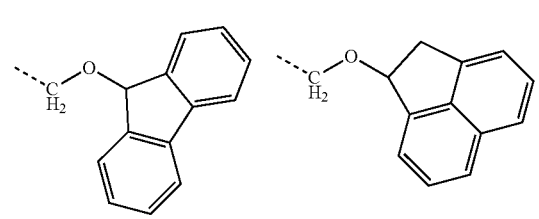
-continued
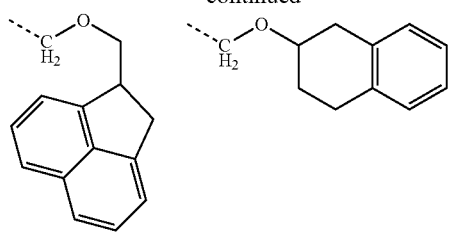
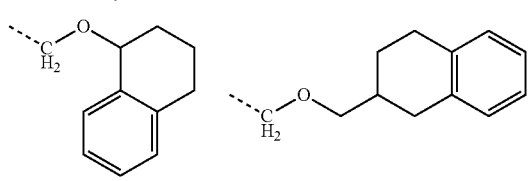
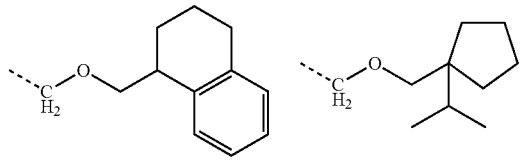
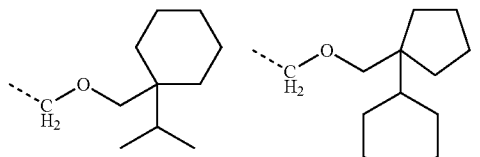
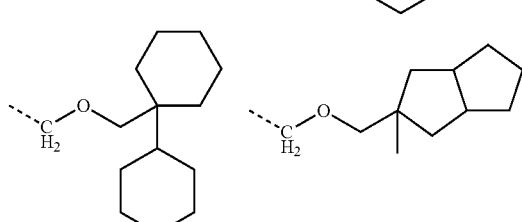
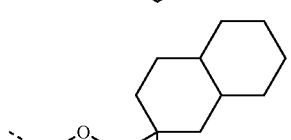
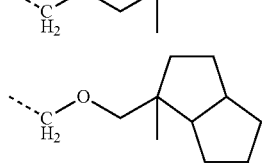
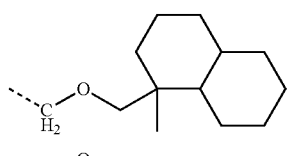
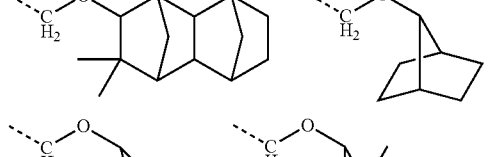
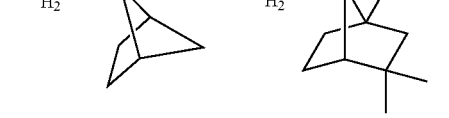

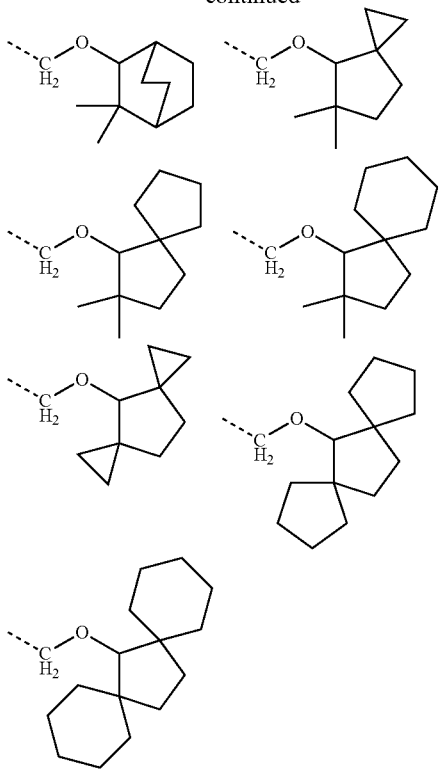

In addition to the foregoing units, the polymer may further comprise other recurring units derived from monomers, for example, substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo[6.2.1.1$^{3,6}$.0$^{2,7}$]dodecene derivatives, unsaturated acid anhydrides such as itaconic anhydride, and other monomers. Also, hydrogenated products of ring-opening metathesis polymerization (ROMP) polymers as described in JP-A 2003-066612 may be used.

The polymer generally has a weight average molecular weight (Mw) of 1,000 to 500,000, and preferably 3,000 to 100,000, as measured by gel permeation chromatography (GPC) using polystyrene standards. Outside the range, there may result an extreme drop of etch resistance, and a drop of resolution due to difficulty to gain a dissolution rate difference before and after exposure.

One exemplary method of synthesizing the polymer is by dissolving one or more unsaturated bond-bearing monomers in an organic solvent, adding a radical initiator, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomers may be kept as such, or the product may be protected or partially protected after polymerization.

While the polymer comprises recurring units derived from monomers, the molar fractions of respective units preferably fall in the following range (mol %), but are not limited thereto.

(I) 1 to 50 mol %, preferably 5 to 40 mol %, and more preferably 10 to 30 mol % of constituent units of at least one type having formula (1), (II) 50 to 99 mol %, preferably 60 to 95 mol %, and more preferably 70 to 90 mol % of constituent units of at least one type having formula (2), (III) 0 to 80 mol %, preferably 0 to 70 mol %, and more preferably 0 to 50 mol % of constituent units of at least one type derived from a monomer having formula (1a) or another monomer(s).

Photoacid Generator

The resist composition essentially contains a photoacid generator having the general formula (3).

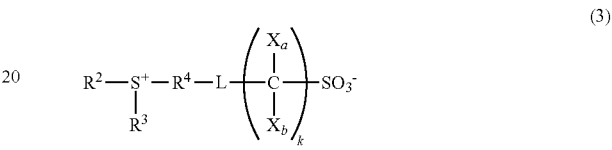

Herein $R^2$ and $R^3$ are each independently a straight, branched or cyclic $C_1$-$C_{20}$ monovalent hydrocarbon group, typically alkyl, alkenyl, aryl or aralkyl group, which may be substituted with or separated by a heteroatom. Suitable alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Suitable alkenyl groups include vinyl, allyl, propenyl, butenyl, hexenyl, and cyclohexenyl. Suitable oxoalkyl groups include 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include phenyl, naphthyl, thienyl, 4-hydroxyphenyl, alkoxyphenyl groups such as 4-methoxyphenyl, 3-methoxyphenyl, 2-methoxyphenyl, 4-ethoxyphenyl, 4-tert-butoxyphenyl, and 3-tert-butoxyphenyl, alkylphenyl groups such as 2-methylphenyl, 3-methylphenyl, 4-methylphenyl, 4-ethylphenyl, 4-tert-butylphenyl, 4-n-butylphenyl, and 2,4-dimethylphenyl, alkylnaphthyl groups such as methylnaphthyl and ethylnaphthyl, alkoxynaphthyl groups such as methoxynaphthyl, ethoxynaphthyl, n-propoxynaphthyl and n-butoxynaphthyl, dialkylnaphthyl groups such as dimethylnaphthyl and diethylnaphthyl, and dialkoxynaphthyl groups such as dimethoxynaphthyl and diethoxynaphthyl. Suitable aralkyl groups include benzyl, 1-phenylethyl and 2-phenylethyl. Suitable aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. A pair of $R^2$ and $R^3$ may bond together to form a ring with the sulfur atom in the formula, with exemplary rings shown below.

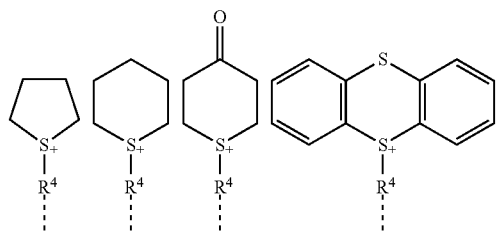

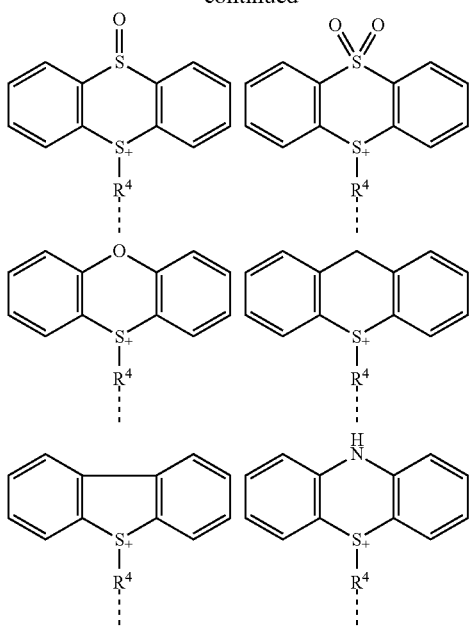

In formula (3), R⁴ is a straight, branched or cyclic $C_1$-$C_{20}$ divalent hydrocarbon group which may be substituted with or separated by a heteroatom. Suitable groups include linear alkane diyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; saturated cyclic hydrocarbon groups such as cyclopentane-diyl, cyclohexane-diyl, norbornane-diyl and adamantane-diyl; and unsaturated cyclic hydrocarbon groups such as phenylene and naphthylene. Also included are substituted forms of the foregoing groups in which at least one hydrogen is replaced by an alkyl group (e.g., methyl, ethyl, propyl, n-butyl, or tert-butyl). Also such groups may be substituted with a heteroatom such as oxygen, sulfur, nitrogen or halogen atom to form a hydroxyl, cyano, carbonyl, ether bond, ester bond, sulfonic acid ester bond, carbonate bond, lactone ring, sultone ring, carboxylic anhydride or haloalkyl. Also a pair of R² and R⁴ may bond together to form a ring with the sulfur atom in the formula, with exemplary rings shown below.

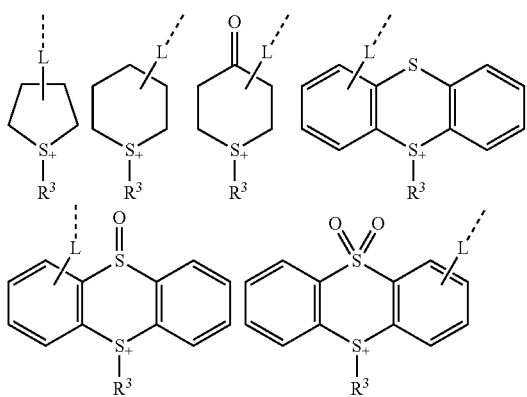

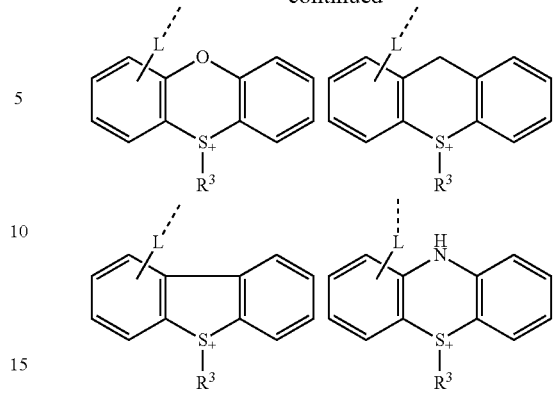

In formula (3), L is a single bond or a straight, branched or cyclic $C_1$-$C_{20}$ divalent hydrocarbon group which may be substituted with or separated by a heteroatom. Examples of the divalent hydrocarbon group L include linear alkane diyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; saturated cyclic hydrocarbon groups such as cyclopentane-diyl, cyclohexane-diyl, norbornane-diyl and adamantane-diyl; and unsaturated cyclic hydrocarbon groups such as phenylene and naphthylene. Also included are substituted forms of the foregoing groups in which at least one hydrogen is replaced by an alkyl group (e.g., methyl, ethyl, propyl, n-butyl, or tert-butyl). Also such groups may be substituted with a heteroatom such as oxygen, sulfur, nitrogen or halogen atom to form a hydroxyl, cyano, carbonyl, ether bond, ester bond, sulfonic acid ester bond, carbonate bond, lactone ring, sultone ring, carboxylic anhydride or haloalkyl.

In formula (3), Xa and Xb are each independently hydrogen, fluorine or trifluoromethyl, and k is an integer of 1 to 4.

Preferably, the photoacid generator of formula (3) has the general formula (4).

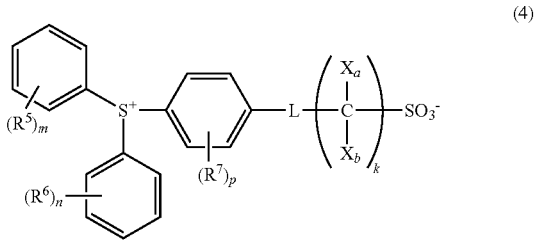

(4)

In formula (4), R⁵, R⁶ and R⁷ are each independently hydrogen, or a straight, branched or cyclic $C_1$-$C_{20}$ monovalent hydrocarbon group which may be separated by a heteroatom. Suitable monovalent hydrocarbon groups include methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0²,⁶]decanyl, and adamantyl. Also included are substituted forms of the foregoing groups in which one or more hydrogen is replaced by a heteroatom such as oxygen, sulfur, nitrogen or halogen atom, or which are separated by a heteroatom such as oxygen, sulfur or nitrogen, to form a hydroxyl, cyano, carbonyl, ether bond, ester bond, sulfonic acid ester bond, carbonate bond, lactone ring, sultone ring, carboxylic anhydride or haloalkyl. Inter alia, methyl, methoxy, tert-butyl and tert-butoxy are preferred.

In formula (4), m and n each are an integer of 0 to 5, preferably 0 or 1; p is an integer of 0 to 4, preferably 0 or 2. L, Xa, xb, and k are as defined and illustrated previously.

More preferably, the photoacid generator of formula (3) or (4) has the general formula (5).

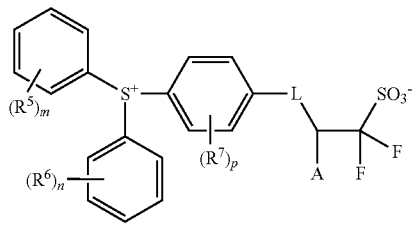

(5)

In formula (5), A is hydrogen or trifluoromethyl, $R^5$, $R^6$, $R^7$, m, n, p, and L are as defined and illustrated previously.

Illustrative, non-limiting examples of the photoacid generator having formulae (3) to (5) are shown below.

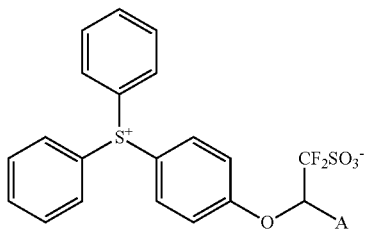

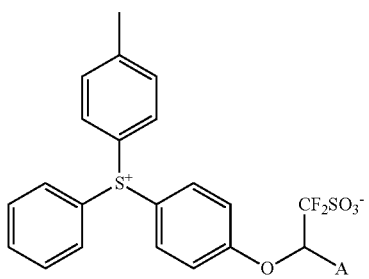

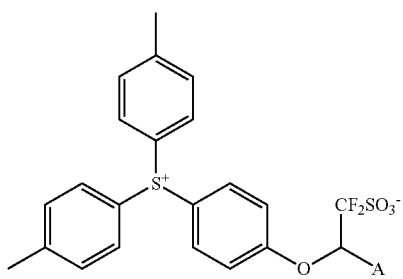

-continued

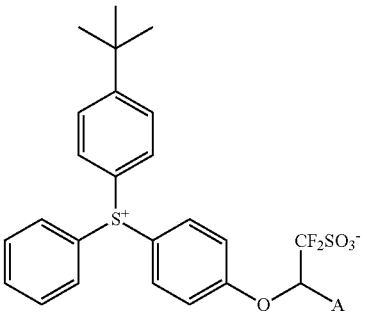

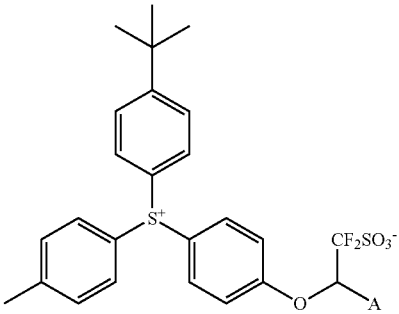

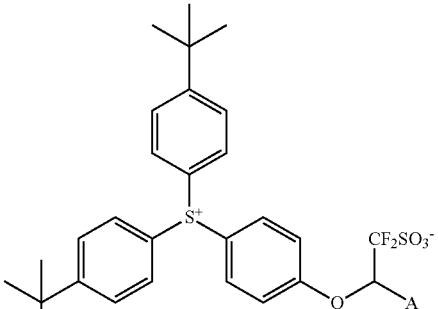

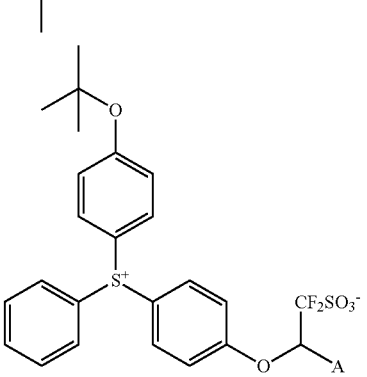

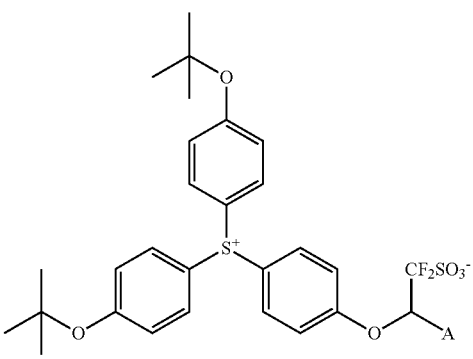

69
-continued
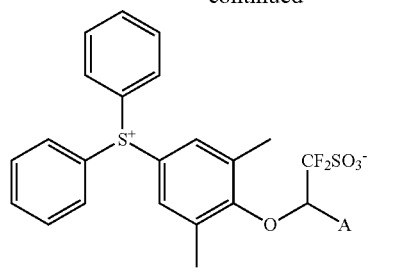
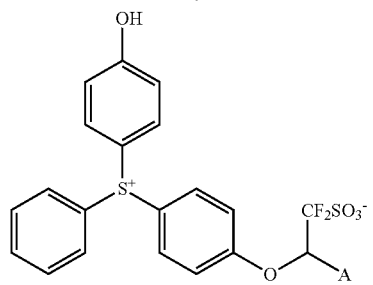
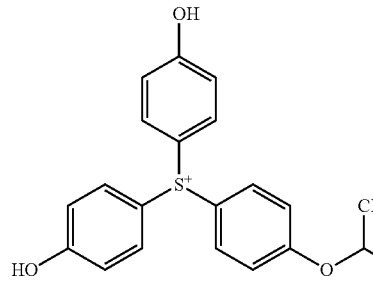
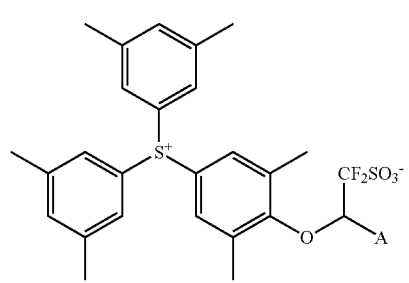
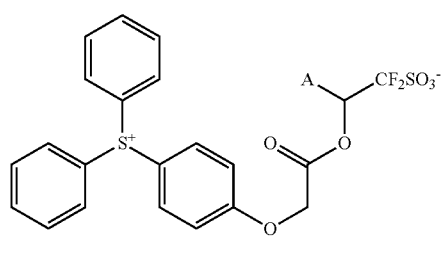
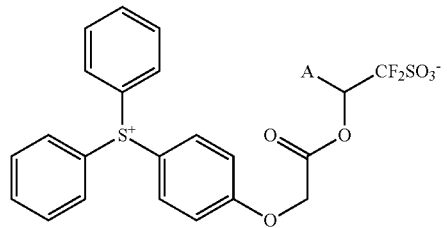
70
-continued
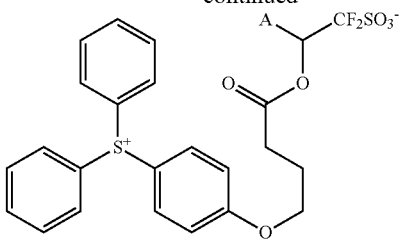
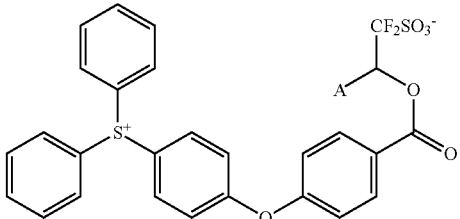
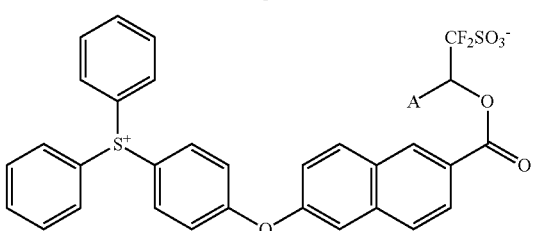
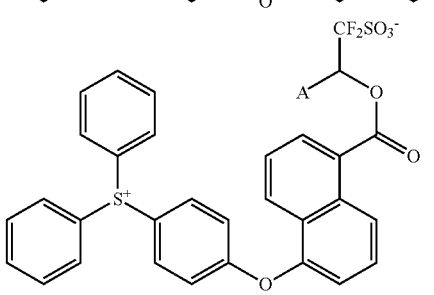
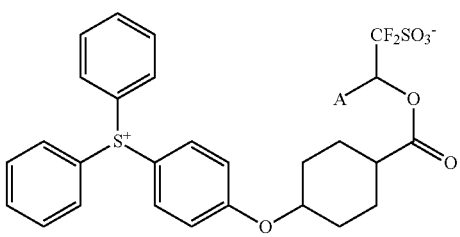
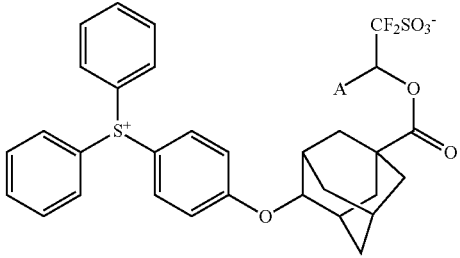
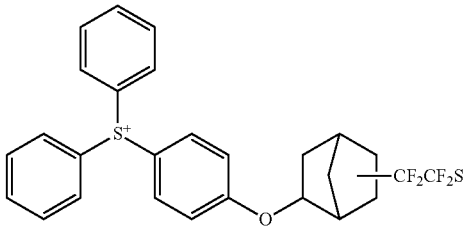

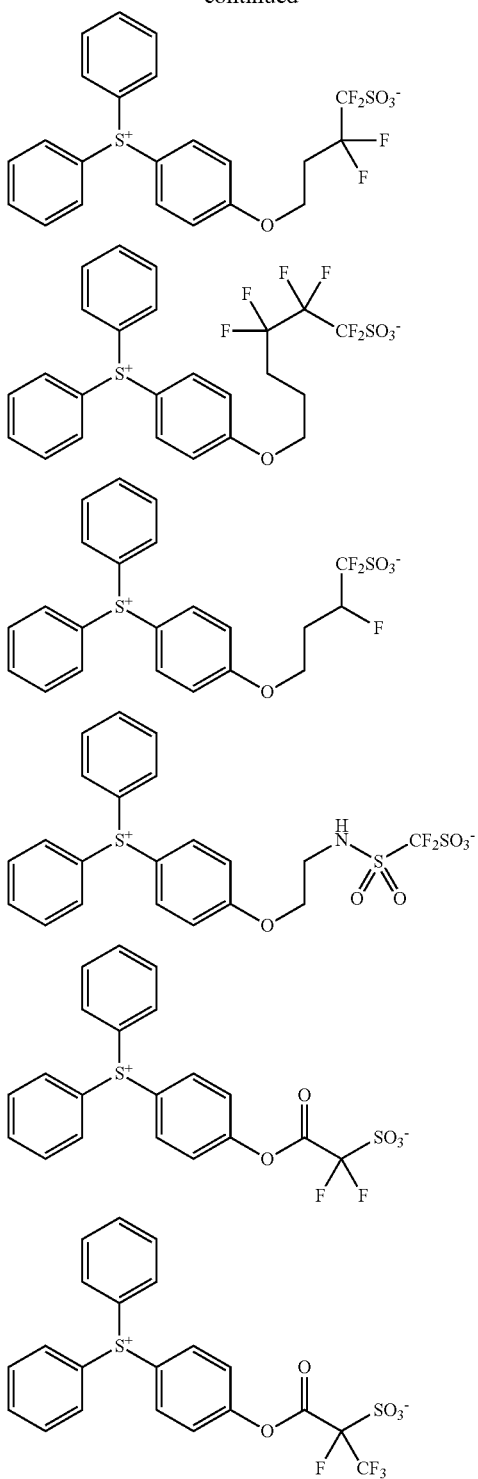

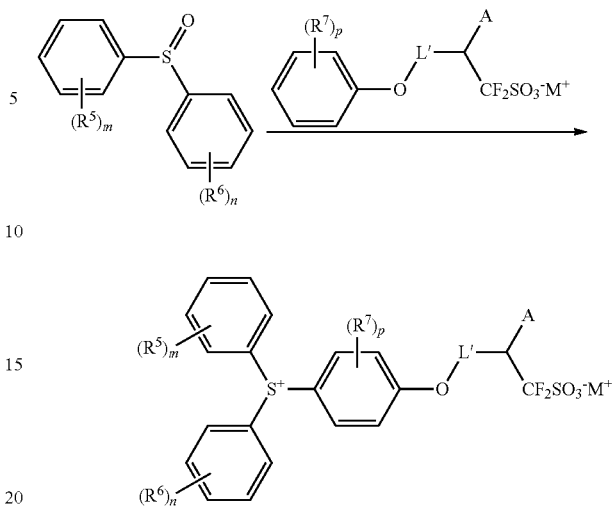

Herein $R^5$, $R^6$, $R^7$, m, n, p, and A are as defined above. L' is a single bond or a straight, branched or cyclic $C_1$-$C_{20}$ divalent hydrocarbon group which may be substituted with or separated by a heteroatom, examples of which are the same as described for the divalent hydrocarbon group L in formula (3). $M^+$ is an alkali metal ion such as sodium or potassium ion, ammonium ion, or proton. In this reaction, methanesulfonic acid-diphosphorus pentoxide or the like may be used as the acid catalyst.

Another route is by nucleophilic displacement reaction of a 4-fluorophenyldiphenylsulfonium compound with a sulfoalcohol. The reaction scheme is outlined below.

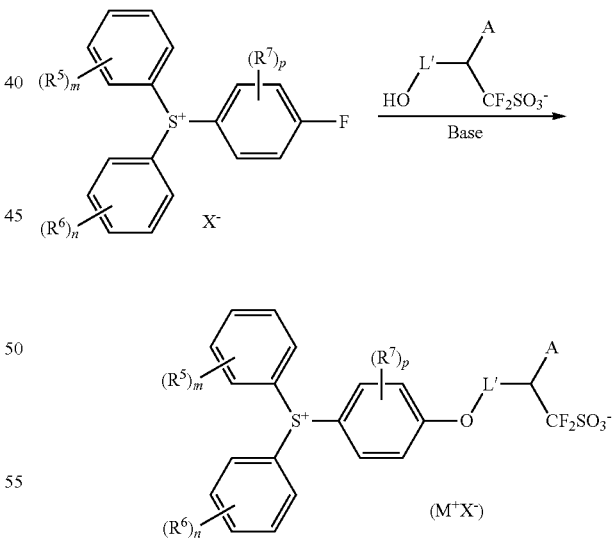

Herein $R^5$, $R^6$, $R^7$, L', m, n, p, A, and $M^+$ are as defined above. $X^-$ is a chloride, bromide, iodide, methylsulfate or p-toluenesulfonate ion. Although reference is made to the 4-fluorophenyldiphenylsulfonium compound, similar reaction is possible with any 4-halophenyldiphenylsulfonium compounds.

In conjunction with the nucleophilic displacement reaction, synthesis via intramolecular reaction according to the following scheme is also possible.

Herein A is hydrogen or trifluoromethyl.

Described below is the synthesis of the photoacid generator according to the invention. Reference is made to the synthesis of the photoacid generator having formula (5) as a typical example. While there are several synthesis routes, one typical route is by reaction of a sulfoalkyloxybenzene or sulfoaryloxybenzene with a diaryl sulfoxide in the presence of an acid catalyst. The reaction scheme is outlined below.

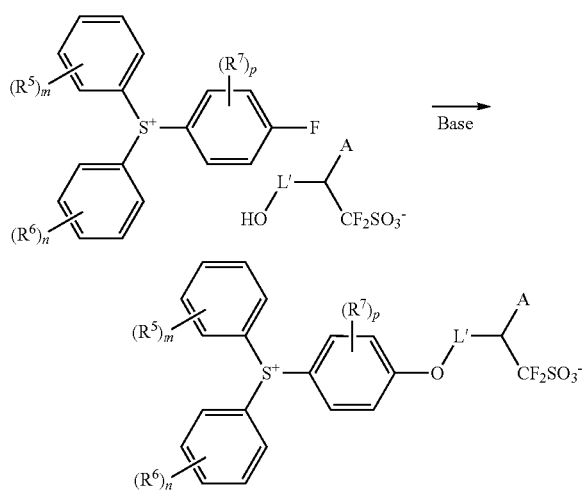

Herein $R^5$, $R^6$, $R^7$, L', m, n, p, and A are as defined above.

As still further synthesis routes, the photoacid generator according to the invention, specifically photoacid generator having formula (3), (4) or (5) may be synthesized by utilizing addition reaction of a hydrogensulfite ion to a sulfonium salt having terminal olefin, or reaction of a corresponding halide with a sulfur compound. These reaction schemes are outlined below.

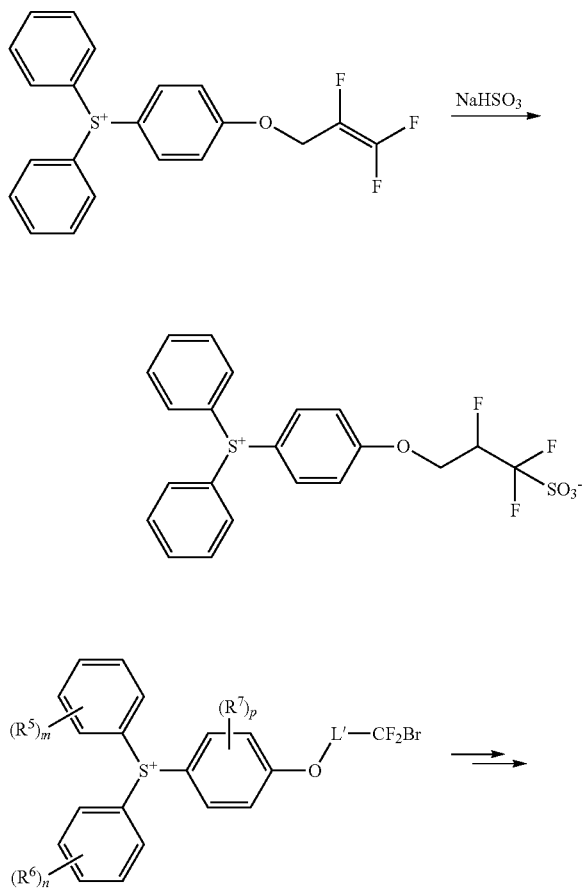

Herein $R^5$, $R^6$, $R^7$, L', m, n, and p are as defined above.

The synthesis routes described above are merely exemplary, and the method of preparing the photoacid generator for use in the resist composition of the invention is not limited thereto.

As described above, the resist composition is characterized by comprising the polymer comprising recurring units of formulae (1) and (2) and the photoacid generator of formula (3). In the composition, the photoacid generator of formula (3) is preferably present in an amount of 0.1 to 50 parts, more preferably 0.1 to 30 parts by weight per 100 parts by weight of the polymer or base resin.

The organic solvent development process using a conventional positive photoresist composition provides a smaller difference in dissolution rate between exposed and unexposed regions than the alkaline development process, that is, is short of dissolution contrast. Since the short dissolution contrast leads to difficult dissolution of the resist film surface layer, DOF is likely to decline due to closure of a trench or hole pattern. By contrast, when the resist composition of the invention is used, a film thickness loss in the exposed region after organic solvent development is small. That is, the dissolution of the exposed region in organic solvent developer is significantly restrained. Then a pattern of a high contrast can be formed. Although this mechanism is not well understood, it is believed that not only the polymer, but also the photoacid generator contribute to the enhancement of dissolution rate difference between the exposed and unexposed regions.

The photoacid generator according to the invention has cation and anion moieties in a common molecule, that is, a betaine structure. On acid generation, it forms a salt compound between molecules or when another photoacid generator is co-present, forms a salt compound with the other photoacid generator, indicating a possibility that the photoacid generator becomes an apparently giant compound. As a result, the acid-generated area is significantly reduced in dissolution, whereby dissolution contrast is improved. The above reason indicates a behavior of acid diffusion being suppressed, leading to improvements in MEF and CDU. As opposed to the prior art knowledge that a tradeoff relationship between DOF and MEF results from an ambivalence between resolving ability and acid diffusion control, the resist composition of the invention is quite advantageous in that both DOF and MEF are improved at the same time.

Resist Composition

One embodiment of the invention is a resist composition comprising (A) a polymer comprising recurring units of formula (1) and recurring units of formula (2), which is also referred to as base resin, and (B) a photoacid generator of formula (3) as essential components. Optionally, the resist composition may further comprise (C) a quencher, (D) an organic solvent, (E) a photoacid generator other than the sulfonium salt of formula (3), (F) a surfactant which is insoluble or substantially insoluble in water and soluble in alkaline developer, and/or a surfactant which is insoluble or substantially insoluble in water and alkaline developer (hydrophobic resin), and (G) an organic acid derivative and/or fluorinated alcohol.

(C) Quencher

The quencher (C) may be added to the resist composition. As used herein, the quencher refers to a compound capable of suppressing the rate of diffusion when the acid generated by the PAG diffuses within the resist film. Suitable quenchers include primary, secondary and tertiary amine compounds, specifically amine compounds having a hydroxyl, ether, ester, lactone, cyano or sulfonate group, as described in JP-A 2008-111103, paragraphs [0146] to [0164] (U.S. Pat. No. 7,537,880), and compounds having primary or secondary amine protected as a carbamate group, as described in JP 3790649.

The quencher may be used alone or in admixture of two or more. An appropriate amount of the quencher is 0.001 to 12 parts, preferably 0.01 to 8 parts by weight, per 100 parts by weight of the base resin. The inclusion of quencher facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile. The inclusion of quencher is also effective for improving adhesion to the substrate.

Onium salts such as sulfonium salts, iodonium salts and ammonium salts of sulfonic acids which are not fluorinated at α-position as described in US 20080153030 (JP-A 2008-158339) and similar onium salts of carboxylic acid as described in JP 3991462 may be used as the quencher, provided that the counter anion is a conjugated base of weak acid. As used herein, the weak acid indicates an acidity insufficient to deprotect an acid labile group from an acid labile group-containing unit. The above onium salt functions as a quencher when used in combination with an onium salt type photoacid generator having a conjugated base of a strong acid, typically a sulfonic acid which is fluorinated at α-position as the counter anion.

In a system using a mixture of an onium salt capable of generating a strong acid (e.g., α-position fluorinated sulfonic acid) and an onium salt capable of generating a weak acid (e.g., α-position non-fluorinated sulfonic acid or carboxylic acid), if the strong acid generated from the photoacid generator upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If a photoacid generator capable of generating a strong acid is an onium salt, an exchange from the strong acid generated upon exposure to high-energy radiation to a weak acid as above can take place, but it never happens that the weak acid generated upon exposure to high-energy radiation collides with the unreacted onium salt capable of generating a strong acid to induce a salt exchange. This is because of a likelihood of an onium cation forming an ion pair with a stronger acid anion.

(D) Organic Solvent

Component (D) may be any organic solvent as long as the polymer, photoacid generator, quencher and other additives are soluble therein. Examples of the organic solvent are described in JP-A 2008-111103, paragraphs [0144] to [0145] (U.S. Pat. No. 7,537,880). Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Where an acid labile group of acetal form is used, a high-boiling alcohol solvent such as diethylene glycol, propylene glycol, glycerol, 1,4-butane diol or 1,3-butane diol may be added for accelerating deprotection reaction of acetal. Of the above organic solvents, it is recommended to use 1-ethoxy-2-propanol, PGMEA, cyclohexanone, γ-butyrolactone, and mixtures thereof because the acid generator is most soluble therein.

An appropriate amount of the organic solvent used is 200 to 5,000 parts, more preferably 400 to 3,000 parts by weight per 100 parts by weight of the base resin.

(E) Other Photoacid Generator

A photoacid generator other than the sulfonium salt of formula (3) may be used as component (E) in the resist composition. The PAG used herein may be any compound capable of generating an acid upon exposure to high-energy radiation including UV, DUV, EB, EUV, x-ray, excimer laser, γ-ray, and synchrotron radiation. Suitable PAGs include sulfonium salts, iodonium salts, sulfonyldiazomethane, N-sulfonyloxydicarboxyimide, O-arylsulfonyloxime, and O-alkylsulfonyloxime generators. The acid generators may be used alone or in admixture of two or more.

Sulfonium salts are salts of sulfonium cations with sulfonates, bis(substituted alkylsulfonyl)imides and tris(substituted alkylsulfonyl)methides. Suitable sulfonium cations include those cations having the general formula (6).

$$S^+(R^{33}R^{44}R^{55}) \qquad (6)$$

Herein $R^{33}$, $R^{44}$ and $R^{55}$ are each independently a substituted or unsubstituted, straight, branched or cyclic $C_1$-$C_{10}$ alkyl, alkenyl or oxoalkyl group or a substituted or unsubstituted $C_6$-$C_{18}$ aryl, aralkyl or aryloxoalkyl group, or any two of $R^{33}$, $R^{44}$ and $R^{55}$ may bond together to form a ring with the sulfur atom in the formula.

Of the groups represented by $R^{33}$, $R^{44}$ and $R^{55}$, suitable alkyl groups include methyl, ethyl, n-propyl, isopropyl, n-butyl, tert-butyl, cyclopropyl, cyclopentyl, cyclohexyl, cyclopropylmethyl, 4-methylcyclohexyl, cyclohexylmethyl, norbornyl, and adamantyl. Suitable alkenyl groups include vinyl, allyl, propenyl, butenyl, hexenyl, and cyclohexenyl. Suitable oxoalkyl groups include 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include phenyl, naphthyl and thienyl, hydroxyphenyl groups such as 4-hydroxyphenyl, alkoxyphenyl groups such as 4-methoxyphenyl, 3-methoxyphenyl, 2-methoxyphenyl, 4-ethoxyphenyl, 4-tert-butoxyphenyl, and 3-tert-butoxyphenyl, alkylphenyl groups such as 2-methylphenyl, 3-methylphenyl, 4-methylphenyl, 4-ethylphenyl, 4-tert-butylphenyl, 4-n-butylphenyl, and 2,4-dimethylphenyl, alkylnaphthyl groups such as methylnaphthyl and ethylnaphthyl, alkoxynaphthyl groups such as methoxynaphthyl and ethoxynaphthyl, dialkylnaphthyl groups such as dimethylnaphthyl and diethylnaphthyl, and dialkoxynaphthyl groups such as dimethoxynaphthyl and diethoxynaphthyl. Suitable aralkyl groups include benzyl, 1-phenylethyl, and 2-phenylethyl. Suitable aryloxoalkyl groups are 2-aryl-2-oxoethyl groups including 2-phenyl-2-oxoethyl, 2-(1-naphthyl)-2-oxoethyl, and 2-(2-naphthyl)-2-oxoethyl. In these hydrocarbon groups, one or more hydrogen atoms may be substituted by fluorine or hydroxyl.

Alternatively, any two of $R^{33}$, $R^{44}$ and $R^{55}$ bond together to form a ring with the sulfur atom in the formula. Exemplary ring structures are given below.

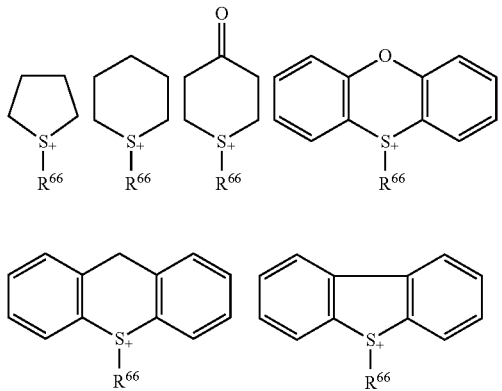

Herein $R^{66}$ is as defined and illustrated for $R^{33}$, $R^{44}$ and $R^{55}$.

As the anion of the sulfonium salt, exemplary sulfonates include trifluoromethanesulfonate, pentafluoroethanesulfonate, heptafluoropropanesulfonate, nonafluorobutanesulfonate, tridecafluorohexanesulfonate, 2,2,2-trifluoroethanesulfonate, pentafluorobenzenesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[6.2.1.1$^{3,6}$.0$^{2,7}$]dodec-3-en-8-yl)ethanesulfonate, 2-benzoyloxy-1,1,3,3,3-pentafluoropropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate. Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide. A typical tris(substituted alkylsulfonyl)methide is tris(trifluoromethylsulfonyl)methide. Sulfonium salts based on combination of the foregoing examples are included.

Examples of the iodonium salt, N-sulfonyloxydicarboxyimide, O-arylsulfonyloxime, and O-alkylsulfonyloxime (or oximesulfonate) acid generators are described in JP-A 2009-269953 (U.S. Pat. No. 8,114,571).

Preferred examples of the other PAG include triphenylsulfonium nonafluorobutanesulfonate, triphenylsulfonium bis(trifluoromethylsulfonyl)imide, triphenylsulfonium perfluoro(1,3-propylenebissulfonyl)imide, triphenylsulfonium tris(trifluoromethanesulfonyl)methide, N-nonafluorobutanesulfonyloxy-1,8-naphthalenedicarboxyimide, 2-(2,2,3,3,4,4-hexafluoro-1-(nonafluorobutylsulfonyloxyimino)butyl)fluorene, and 2-(2,2,3,3,4,4,5,5-octafluoro-1-(nonafluorobutylsulfonyloxyimino)pentyl)fluorene.

The preferred structure of PAG includes compounds having the general formula (P1).

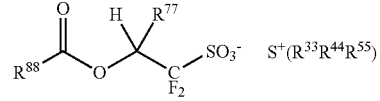

Herein $R^{77}$ is hydrogen or trifluoromethyl, $R^{88}$ is a $C_1$-$C_{30}$ alkyl, alkenyl or aralkyl group which may contain a heteroatom, $R^{33}$, $R^{44}$ and $R^{55}$ are as defined above.

In formula (P1), $R^{88}$ is a $C_1$-$C_{30}$ alkyl, alkenyl or aralkyl group optionally containing a heteroatom. Suitable heteroatoms contained in $R^{88}$ include oxygen, nitrogen, sulfur and halogen atoms, with oxygen being preferred. The $C_1$-$C_{30}$ alkyl, alkenyl or aralkyl group of $R^{88}$ may be straight, branched or cyclic while it is preferred for achieving a high resolution sufficient to form a fine size pattern that these groups have 6 to 30 carbon atoms. It is undesirable that $R^{88}$ be aryl because the resulting resist pattern may have less smooth sidewalls. Exemplary groups of $R^{88}$ include, but are not limited to, methyl, ethyl, propyl, isopropyl, butyl, isobutyl, s-butyl, tert-butyl, pentyl, neopentyl, cyclopentyl, hexyl, cyclohexyl, 3-cyclohexenyl, heptyl, 2-ethylhexyl, nonyl, undecyl, tridecyl, pentadecyl, heptadecyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl, eicosyl, allyl, benzyl, diphenylmethyl, tetrahydrofuryl, methoxymethyl, ethoxymethyl, methylthiomethyl, acetamidomethyl, trifluoromethyl, (2-methoxyethoxy)methyl, acetoxymethyl, 2-carboxy-1-cyclohexyl, 2-oxopropyl, 4-oxo-1-adamantyl, and 3-oxocyclohexyl.

With respect to the synthesis of the sulfonium salt having formula (P1), reference may be made to JP-A 2007-145797, 2008-106045, 2009-007327, and 2009-258695, for example.

Also useful are the sulfonium salts described in JP-A 2010-215608, 2012-041320, 2012-106986, and 2012-153644.

Illustrative examples of the preferred PAG are given below.

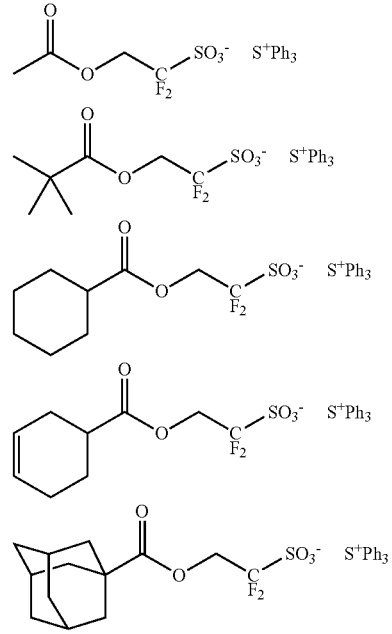

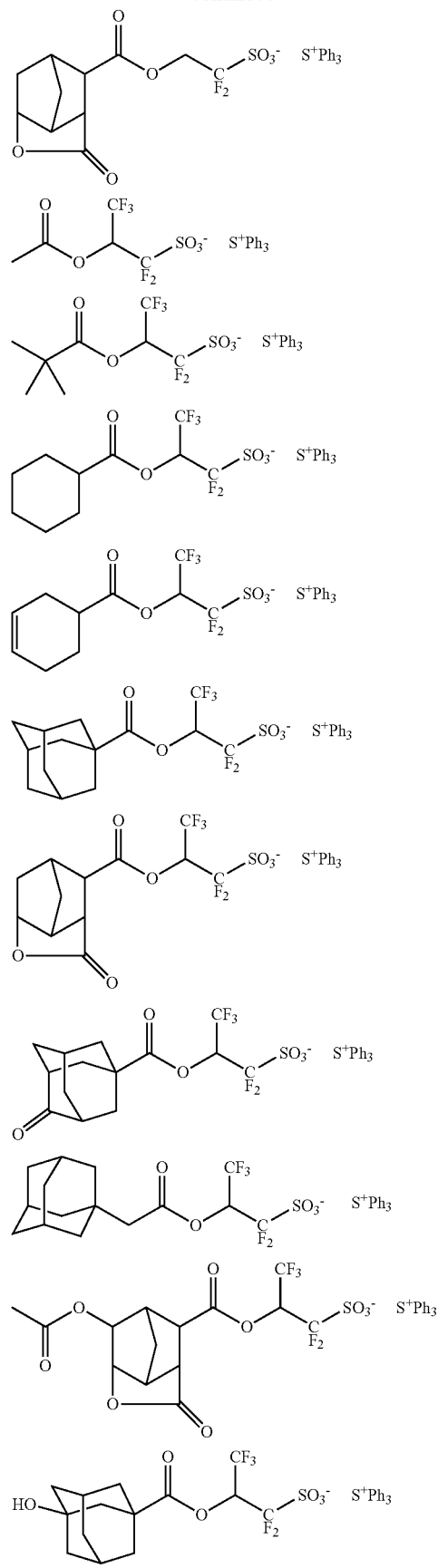
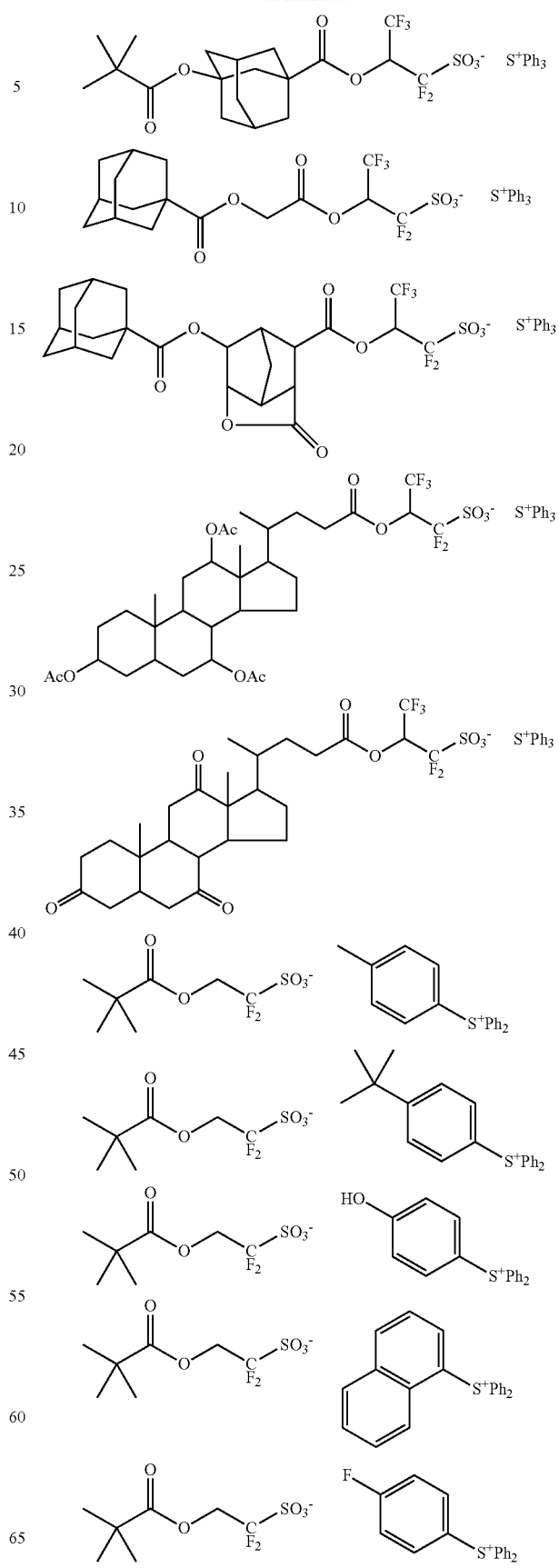

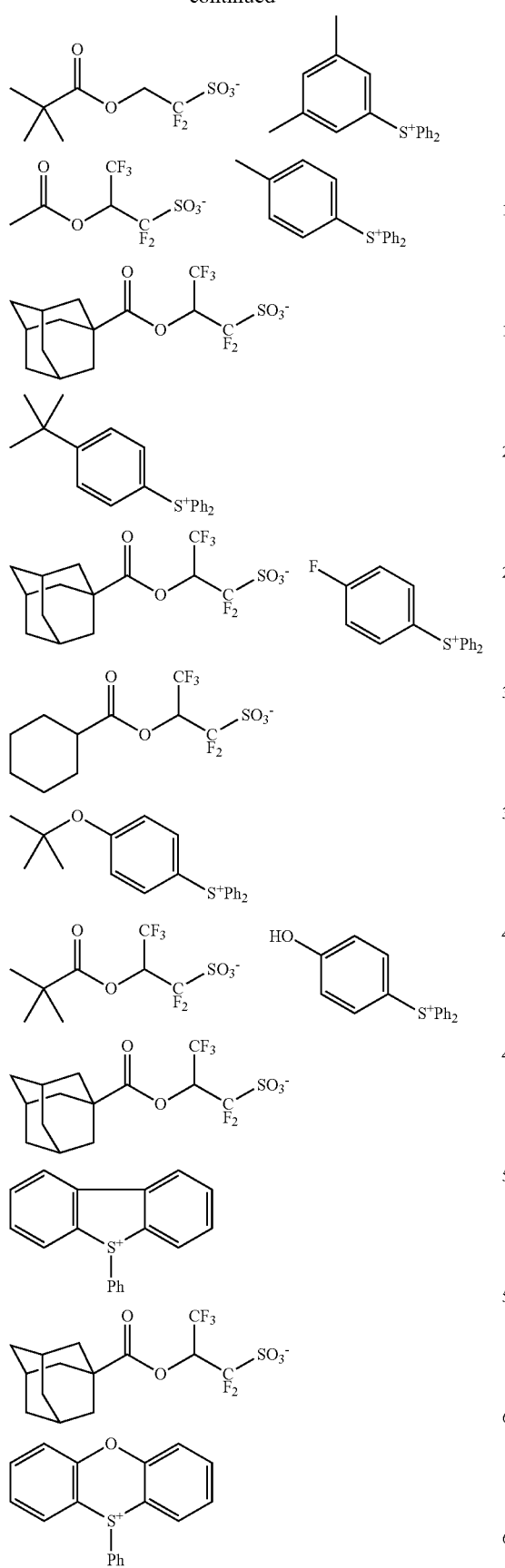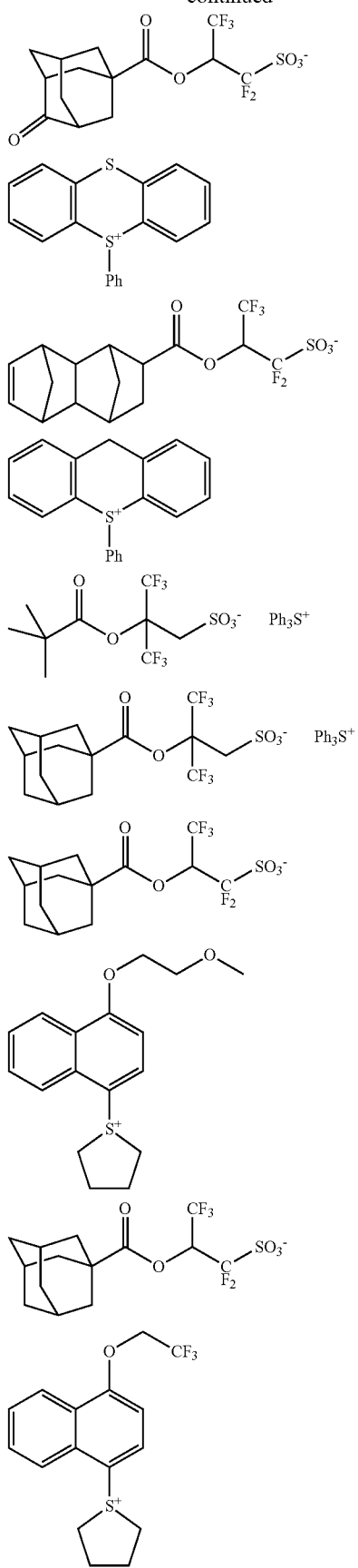

-continued

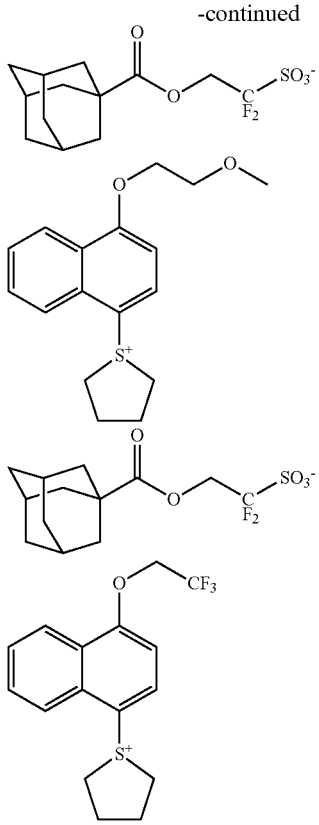

Herein Ac stands for acetyl and Ph stands for phenyl.

An appropriate amount of the PAG (E) added is 0 to 40 parts by weight, and if used, 0.1 to 40 parts, and more preferably 0.1 to 20 parts by weight per 100 parts by weight of the polymer as base resin. Too high a proportion of the PAG may give rise to problems such as degraded resolution and foreign particles during development and resist film stripping.

Another useful PAG is a compound having a nitrogen-containing substituent group. This compound functions as a quencher in the unexposed region, but as a so-called photo-degradable base in the exposed region because it loses the quencher function in the exposed region due to neutralization thereof with the acid generated by itself. Using a photo-degradable base, the contrast between exposed and unexposed regions can be further enhanced. With respect to the photo-degradable base, reference may be made to JP-A 2009-109595 and 2012-046501, for example.

Where the acid labile group (such as acetal) is sensitive to acid, the acid for deprotecting the protective group need not necessarily be a strong acid such as α-position fluorinated sulfonic acid, imidic acid or methide acid, and deprotection reaction can take place even with α-position non-fluorinated sulfonic acid. There are a number of photoacid generators capable of generating α-position non-fluorinated sulfonic acid. Preferred examples include the compounds listed in JP-A 2010-155824, paragraphs [0019] to [0036] and JP-A 2010-215608, paragraphs [0047] to [0082].

(F) Surfactant

Component (F) is a surfactant which is insoluble or substantially insoluble in water and soluble in alkaline developer, and/or a surfactant which is insoluble or substantially insoluble in water and alkaline developer (hydrophobic resin). The surfactant (F) may be added to the resist composition. Reference should be made to those compounds defined as component (S) in JP-A 2010-215608 and JP-A 2011-016746.

While many examples of the surfactant which is insoluble or substantially insoluble in water and alkaline developer are described in these patent documents, preferred examples are FC-4430, Surflon S-381, Surfynol E1004, KH-20 and KH-30, which may be used alone or in admixture. Partially fluorinated oxetane ring-opened polymers having the structural formula (surf-1) are also useful.

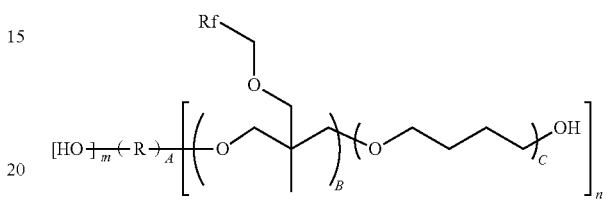

(surf-1)

It is provided herein that R, Rf, A, B, C, m, and n are applied to only formula (surf-1), independent of their descriptions other than for the surfactant. R is a di- to tetra-valent $C_2$-$C_5$ aliphatic group. Exemplary divalent groups include ethylene, 1,4-butylene, 1,2-propylene, 2,2-dimethyl-1,3-propylene and 1,5-pentylene. Exemplary tri- and tetra-valent groups are shown below.

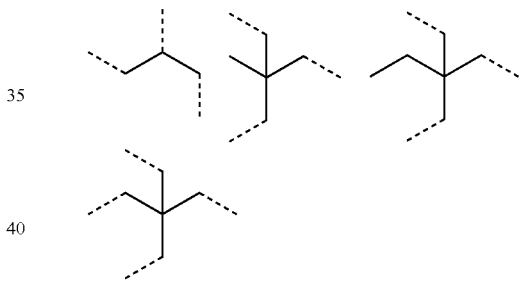

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl, and preferably trifluoromethyl. The letter m is an integer of 0 to 3, n is an integer of 1 to 4, and the sum of m and n, which represents the valence of R, is an integer of 2 to 4. A is equal to 1, B is an integer of 2 to 25, and C is an integer of 0 to 10. Preferably, B is an integer of 4 to 20, and C is 0 or 1. Note that the above structural formula does not prescribe the arrangement of respective constituent units while they may be arranged either in blocks or randomly. For the preparation of surfactants in the form of partially fluorinated oxetane ring-opened polymers, reference should be made to U.S. Pat. No. 5,650,483, for example.

The surfactant which is insoluble or substantially insoluble in water and soluble in alkaline developer is useful when ArF immersion lithography is applied to the resist composition in the absence of a resist protective film. In this embodiment, the surfactant has a propensity to segregate on the resist surface after spin coating for achieving a function of minimizing water penetration or leaching. The surfactant is also effective for preventing water-soluble components from being leached out of the resist film for minimizing any damage to the exposure tool. The surfactant becomes solubilized during alkaline development following exposure and PEB, and thus forms few or no foreign particles which become defects. The preferred surfactant is a polymeric surfactant which is insoluble or substantially insoluble in water, but soluble in alkaline developer, also referred to as "hydrophobic resin" in this sense, and especially which is water repellent and enhances water slippage. Suitable polymeric surfactants are shown below.

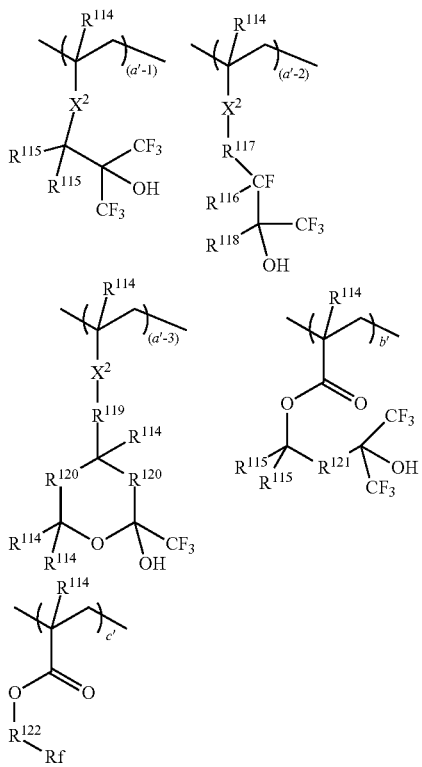

Herein $R^{114}$ is each independently hydrogen, fluorine, methyl or trifluoromethyl. $R^{115}$ is each independently hydrogen or a straight, branched or cyclic $C_1$-$C_{20}$ alkyl or fluoroalkyl group, or two $R^{115}$ in a common monomer may bond together to form a ring with the carbon atom to which they are attached, and in this event, they together represent a straight, branched or cyclic $C_2$-$C_{20}$ alkylene or fluoroalkylene group. $R^{116}$ is fluorine or hydrogen, or $R^{116}$ may bond with $R^{117}$ to form a non-aromatic ring of 3 to 10 carbon atoms in total with the carbon atom to which they are attached. $R^{117}$ is a straight, branched or cyclic $C_1$-$C_6$ alkylene group in which at least one hydrogen atom may be substituted by a fluorine atom. $R^{118}$ is a straight or branched $C_1$-$C_{10}$ alkyl group in which at least one hydrogen atom is substituted by a fluorine atom. Alternatively, $R^{117}$ and $R^{118}$ may bond together to form a non-aromatic ring with the carbon atoms to which they are attached. In this event, $R^{117}$, $R^{118}$ and the carbon atoms to which they are attached together represent a trivalent organic group of 2 to 12 carbon atoms in total. $R^{119}$ is a single bond or a $C_1$-$C_4$ alkylene. $R^{120}$ is each independently a single bond, —O—, or —$CR^{114}R^{114}$—. $R^{121}$ is a straight or branched $C_1$-$C_4$ alkylene group, or may bond with $R^{115}$ within a common monomer to form a $C_3$-$C_6$ non-aromatic ring with the carbon atom to which they are attached. $R^{122}$ is 1,2-ethylene, 1,3-propylene, or 1,4-butylene. Rf is a linear perfluoroalkyl group of 3 to 6 carbon atoms, typically 3H-perfluoropropyl, 4H-perfluorobutyl, 5H-perfluoropentyl, or 6H-perfluorohexyl. $X^2$ is each independently —C(=O)—O—, —O—, or —C(=O)—$R^{123}$—C(=O)—O—. $R^{123}$ is a straight, branched or cyclic $C_1$-$C_{10}$ alkylene group. The subscripts are in the range: $0 \leq (a'-1) < 1$, $0 \leq (a'-2) < 1$, $0 \leq (a'-3) < 1$, $0 < (a'-1)+(a'-2)+(a'-3) < 1$, $0 \leq b' < 1$, $0 \leq c' < 1$, and $0 < (a'-1)+(a'-2)+(a'-3)+b'+c' \leq 1$.

Examples of these units are shown below.

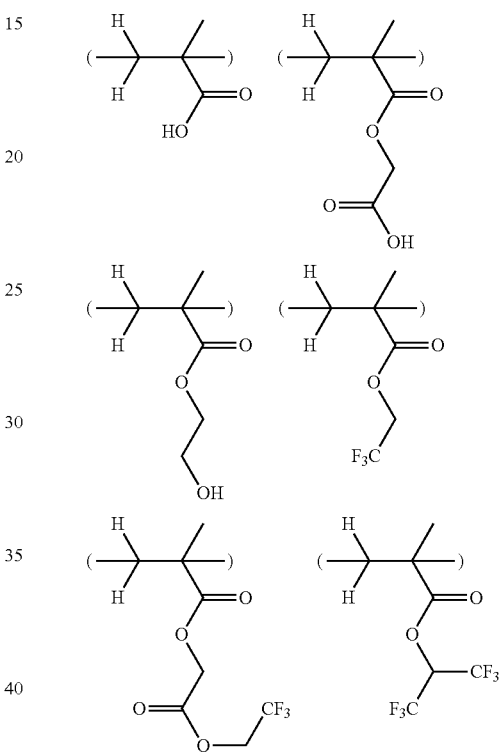

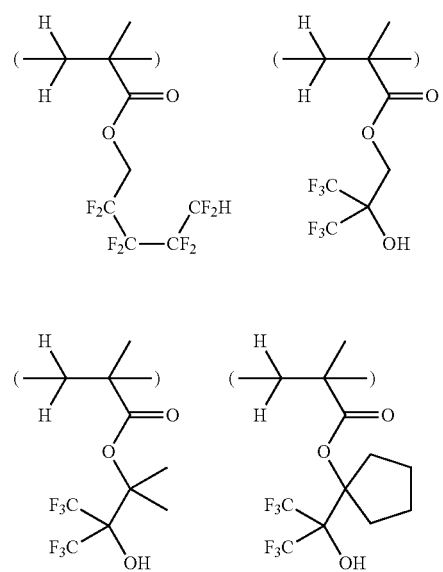

-continued
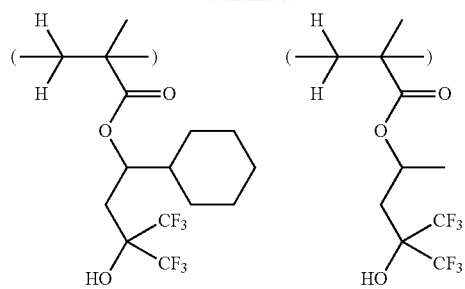
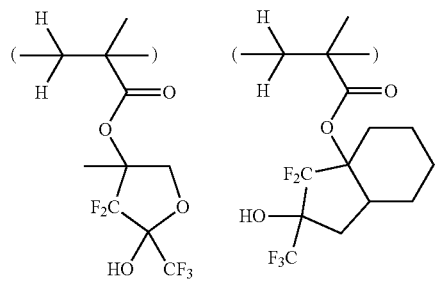
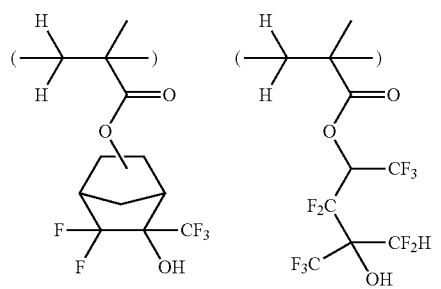
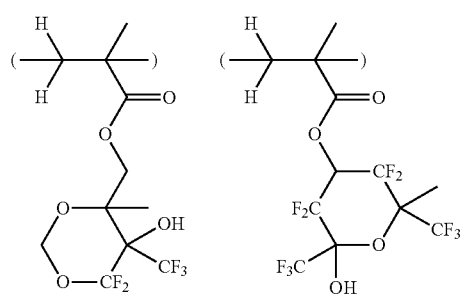
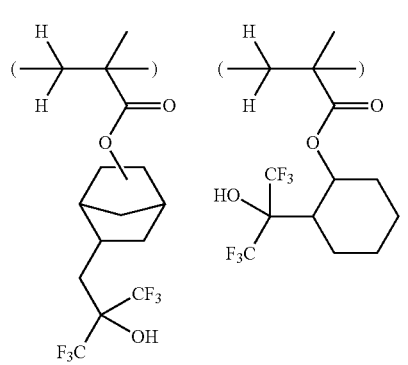
-continued
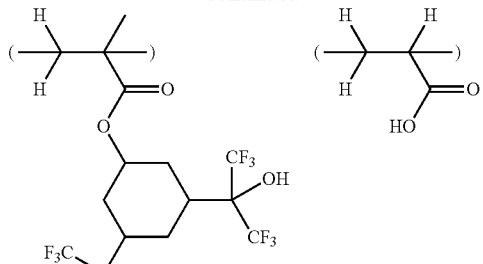
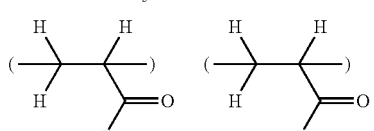
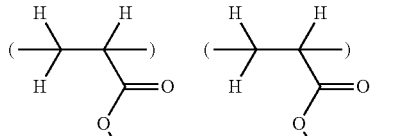
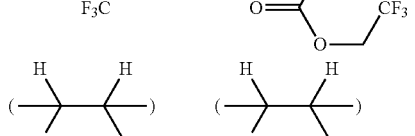
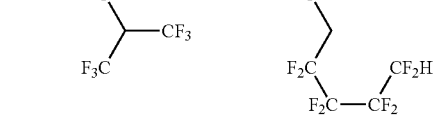
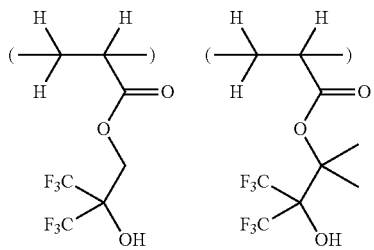
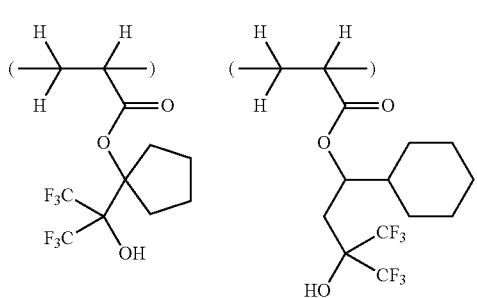

-continued

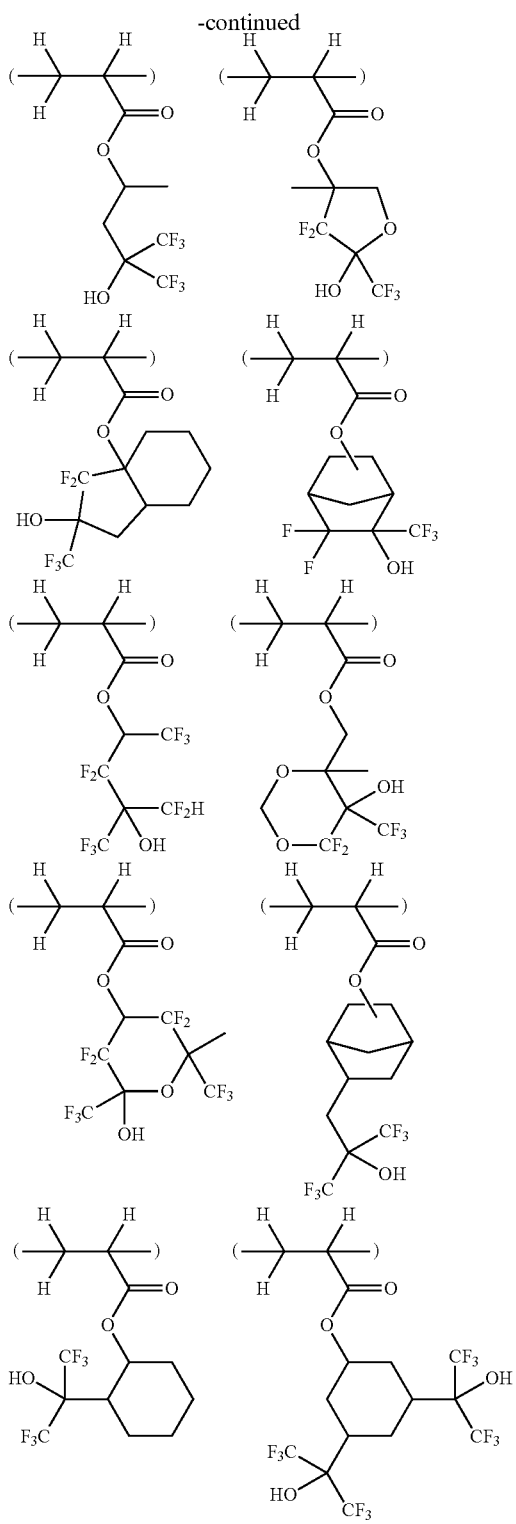

For the surfactant which is insoluble or substantially insoluble in water and soluble in alkaline developer, reference may be made to JP-A 2008-122932, 2010-134012, 2010-107695, 2009-276363, 2009-192784, 2009-191151, 2009-098638, 2010-250105, and 2011-042789.

The polymeric surfactant preferably has a Mw of 1,000 to 50,000, more preferably 2,000 to 20,000 as measured by GPC versus polystyrene standards. A surfactant with a Mw outside the range may be less effective for surface modification and cause development defects. The polymeric surfactant is preferably formulated in an amount of 0.001 to 20 parts, and more preferably 0.01 to 10 parts by weight per 100 parts by weight of the base resin. Reference should also be made to JP-A 2010-215608.

To the resist composition, a compound which is decomposed with an acid to generate another acid, that is, acid amplifier compound may be added. For these compounds, reference should be made to JP-A 2009-269953 and 2010-215608. In the resist composition, an appropriate amount of the acid amplifier compound is up to 2 parts, and especially up to 1 part by weight per 100 parts by weight of the base resin. Excessive amounts of the acid amplifier compound make diffusion control difficult, leading to degradation of resolution and pattern profile.

Optionally, an organic acid derivative or a compound having a Mw of up to 3,000 which changes its solubility in alkaline developer under the action of an acid, also referred to as dissolution inhibitor, may be added. Reference may be made to JP-A 2009-269953 and 2010-215608.

Process

Another embodiment of the invention is a pattern forming process comprising the steps of coating a resist composition onto a substrate, prebaking the resist composition to form a resist film, exposing a selected region of the resist film to high-energy radiation, baking (PEB), and developing the exposed resist film with an organic solvent developer so that the unexposed region of resist film is dissolved and the exposed region of resist film is left, thereby forming a negative tone resist pattern such as a hole or trench pattern.

FIGS. 1A to 1C illustrate the pattern forming process of the invention. First, the resist composition is coated on a substrate to form a resist film thereon. Specifically, a resist film 40 of a resist composition is formed on a processable substrate 20 disposed on a substrate 10 directly or via an intermediate intervening layer 30 as shown in FIG. 1A. The resist film preferably has a thickness of 10 to 1,000 nm and more preferably 20 to 500 nm. Prior to exposure, the resist film is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer 30 includes hard masks of $SiO_2$, SiN, SiON or p-Si, an undercoat in the form of carbon film, a silicon-containing intermediate film, and an organic antireflective coating.

Next comes exposure depicted at 50 in FIG. 1B. For the exposure, preference is given to high-energy radiation having a wavelength of 140 to 250 nm, EUV having a wavelength of 13.5 nm, and EB, and especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. The immersion lithography involves exposing the prebaked resist film to light through a projection lens, with pure water or liquid introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a solution of a polymer having 1,1,1,3,3,3-hexafluoro-2-propanol residues which is insoluble in water, but soluble in alcohol or similar solvents not attacking the resist film, in a solvent selected from alcohols of at least 4 carbon atoms, ethers of 8 to 12 carbon atoms, and mixtures thereof. The protective film-forming composition used herein may be based on a polymer comprising recurring units derived from a monomer having a 1,1,1,3,3,3-hexafluoro-2-propanol residue. While the protective film must dissolve in the organic solvent developer, the polymer comprising recurring units derived from a monomer having a 1,1,1,3,3,3-hexafluoro-2-propanol residue dissolves in organic solvent developers. In particular, protective film-forming materials having 1,1,1,3,3,3-hexafluoro-2-propanol residues as described in JP-A 2007-025634 and JP-A 2008-003569 readily dissolve in organic solvent developers.

The other embodiment of the invention is a process for forming a pattern by applying a resist composition (as defined herein) onto a substrate, baking the composition to form a resist film, forming a protective film on the resist film, exposing the resist film to high-energy radiation to define exposed and unexposed regions, PEB, and applying an organic solvent to the coated substrate to form a negative pattern wherein the unexposed region of resist film and the protective film are dissolved and the exposed region of resist film is not dissolved.

Exposure is preferably performed in an exposure dose of about 1 to 200 mJ/cm$^2$, more preferably about 10 to 100 mJ/cm$^2$. This is followed by baking (PEB) on a hot plate at 60 to 150° C. for 1 to 5 minutes, preferably at 80 to 120° C. for 1 to 3 minutes.

Thereafter the exposed resist film is developed in a developer consisting of an organic solvent for 0.1 to 3 minutes, preferably 0.5 to 2 minutes by any conventional techniques such as dip, puddle and spray techniques. In this way, the unexposed region of resist film was dissolved away, leaving a negative resist pattern 40 on the substrate 10 as shown in FIG. 1C. The developer used herein is preferably selected from among ketones such as 2-octanone, 2-nonanone, 2-heptanone, 3-heptanone, 4-heptanone, 2-hexanone, 3-hexanone, diisobutyl ketone, methylcyclohexanone, acetophenone, and methylacetophenone, and esters such as propyl acetate, butyl acetate, isobutyl acetate, amyl acetate, butenyl acetate, isoamyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof. One or more of these solvents may be used as the developer.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents.

Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. The solvents may be used alone or in admixture. Besides the foregoing solvents, aromatic solvents may be used, for example, toluene, xylene, ethylbenzene, isopropylbenzene, tert-butylbenzene and mesitylene. Rinsing is effective for minimizing the risks of resist pattern collapse and defect formation. However, rinsing is not essential. If rinsing is omitted, the amount of solvent used may be reduced.

EXAMPLE

Examples of the invention are given below by way of illustration and not by way of limitation. The abbreviation "pbw" is parts by weight. Me stands for methyl, THF for tetrahydrofuran, DMF for dimethylformamide, MIBK for methyl isobutyl ketone. For all polymers, Mw and Mn are determined by GPC versus polystyrene standards using THF solvent.

Synthesis Example 1

Synthesis of PAG

PAGs used in Examples were synthesized in accordance with the formulation shown below.

Synthesis Example 1-1

Synthesis of 4-(1,1,3,3,3-pentafluoro-1-sulfonatopropan-2-yloxy)phenyldiphenylsulfonium (PAG-1)

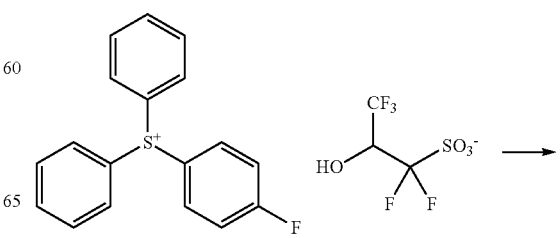

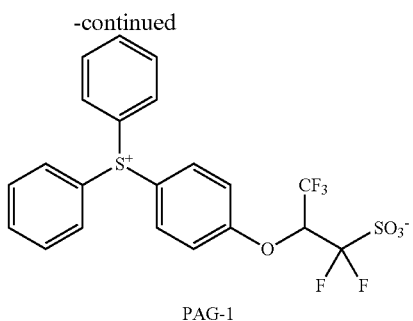

PAG-1

In 1,200 g of THF was dissolved 153 g of 4-fluorophenyldiphenylsulfonium 1,1,3,3,3-pentafluoro-2-hydroxypropane-1-sulfonate which had been synthesized by the method of JP-A 2012-107151 (US 20120129103). Under ice cooling, this solution was added dropwise to a mixture of 7.2 g of sodium hydride and 1,200 g of THF. The reaction solution was aged overnight, after which 1,200 g of 1 wt % hydrochloric acid was added to quench the reaction. The reaction solution was concentrated to remove THF. To the concentrate, 1,000 g of MIBK and 125 g of methanol were added, after which the organic layer was separated. The organic layer was washed with a mixture of 800 g of 2 wt % hydrochloric acid and 90 g of methanol, further washed 5 times with 900 g of 10 wt % methanol in water, and concentrated. To the concentrate, 200 g of acetone and 600 g of diisopropyl ether were added for crystallization. The resulting crystals were collected by filtration and dried in vacuum, obtaining 112 g of the target compound, 4-(1,1,3,3,3-pentafluoro-1-sulfonatopropan-2-yloxy)phenyldiphenylsulfonium as while crystals. Yield 76%.

Figure 3:
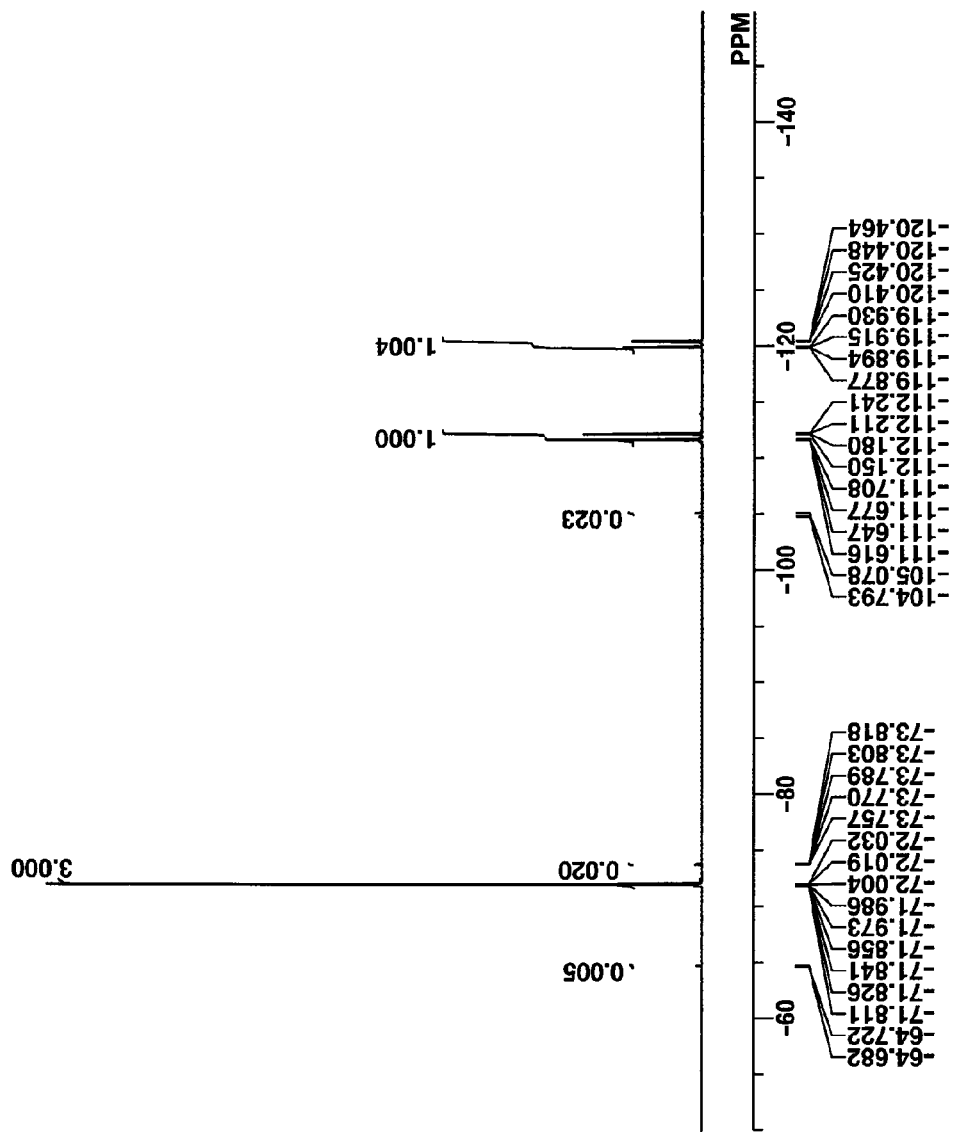

The target compound was analyzed by spectroscopy. The nuclear magnetic resonance spectra, $^1$H-NMR and $^{19}$F-NMR/DMSO-d$_6$ are shown in FIGS. 2 and 3, respectively. Note that in $^1$H-NMR, traces of residual solvents (diisopropyl ether, MIBK, water) were observed. The data of infrared spectroscopy and liquid chromatography/mass spectrometry are also shown.

IR spectrum (KBr)

3444, 1587, 1492, 1477, 1448, 1247, 1186, 1162, 1118, 1070, 997, 883, 836, 750, 684, 642, 524 cm$^{-1}$

LC-MS

Positive [M+H]$^+$ 491

Synthesis Example 1-2

Synthesis of bis(4-tert-butylphenyl) sulfoxide (PAG Intermediate 1)

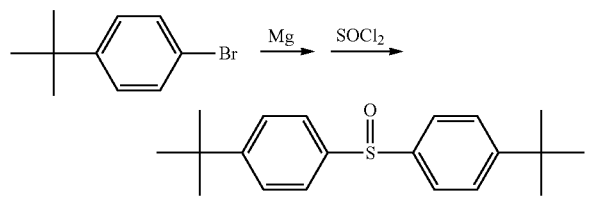

Under ice cooling, a mixture of 60 g thionyl chloride and 60 g THF was added dropwise to a Grignard reagent prepared from 213 g of 1-bromo-4-tert-butylbenzene. The reaction solution was aged for 30 minutes, after which under ice cooling, 730 g of 5 wt % hydrochloric acid was added dropwise to quench the reaction. Methylene chloride (1,000 g) was added to the reaction solution, from which the organic layer was separated. The organic layer was washed with water and concentrated in vacuum. Hexane was added to the concentrate for recrystallization. The resulting crystals were collected by filtration and dried in vacuum, obtaining 92 g of the target compound, bis(4-tert-butylphenyl) sulfoxide as white crystals. Yield 58%.

Synthesis Example 1-3

Synthesis of bis(4-tert-butylphenyl)(4-fluorophenyl)-sulfonium bromide (PAG Intermediate 2)

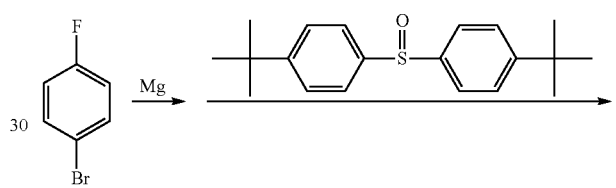

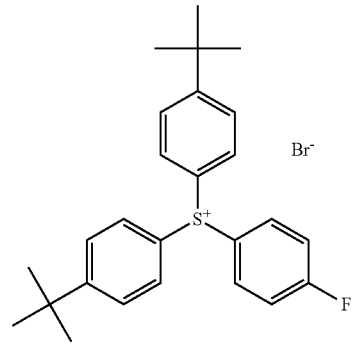

To a Grignard reagent prepared from 79 g of 1-bromo-4-fluorobenzene, 47 g of bis(4-tert-butylphenyl) sulfoxide obtained in Synthesis Example 1-2 and 150 g of methylene chloride were added. Under ice cooling, 49 g of trimethylsilyl chloride was added dropwise. The reaction solution was aged for 30 minutes, after which 105 g of 5 wt % dilute hydrochloric acid was added dropwise to quench the reaction. The organic layer was separated and concentrated in vacuum. Diisopropyl ether was added to the concentrate for recrystallization. The resulting crystals were collected by filtration and dried in vacuum, obtaining 68 g of the target compound, bis(4-tert-butylphenyl)(4-fluorophenyl)sulfonium bromide as white crystals. Yield 96%.

Synthesis Example 1-4

Synthesis of bis(4-tert-butylphenyl)(4-fluorophenyl)-sulfonium 1,1,3,3,3-pentafluoro-2-hydroxypropane-1-sulfonate (PAG Intermediate 3)

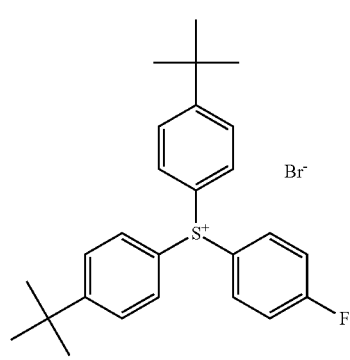

+

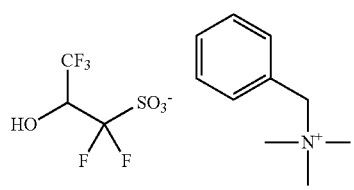

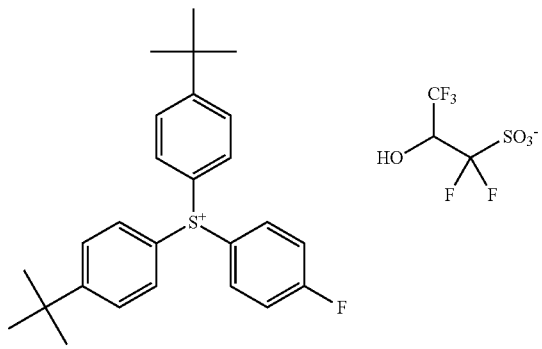

A mixture of 13 g of benzyltrimethylammonium 1,1,3,3,3-pentafluoro-2-hydroxypropane-1-sulfonate synthesized according to the method of JP-A 2012-107151, 14 g of bis(4-tert-butylphenyl)(4-fluorophenyl)sulfonium bromide obtained in Synthesis Example 1-3, 70 g of methylene chloride, and 30 g of deionized water was stirred for 30 minutes. The organic layer was separated, washed with water, and concentrated in vacuum. MIBK (100 g) was added to the concentrate, followed by vacuum concentration again. The residue was dissolved in methanol, after which diisopropyl ether was added for recrystallization. The resulting crystals were collected by filtration and dried in vacuum, obtaining 15 g of the target compound, bis(4-tert-butylphenyl)(4-fluorophenyl)sulfonium 1,1,3,3,3-pentafluoro-2-hydroxypropane-1-sulfonate as white crystals. Yield 80%.

Synthesis Example 1-5

Synthesis of bis(4-tert-butylphenyl){4-(1,1,3,3,3-pentafluoro-1-sulfonatopropan-2-yloxy)phenyl}sulfonium (PAG-2)

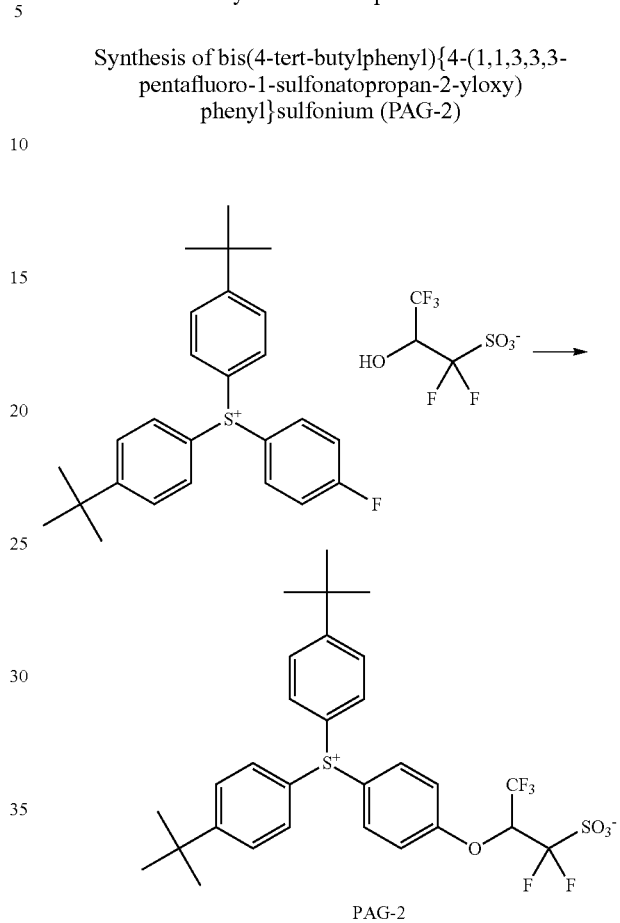

PAG-2

In 50 g of THF was dissolved 6.2 g of bis(4-tert-butylphenyl)(4-fluorophenyl)sulfonium 1,1,3,3,3-pentafluoro-2-hydroxypropane-1-sulfonate obtained in Synthesis Example 1-4. Under ice cooling, this solution was added dropwise to a mixture of 0.24 g sodium hydride and 30 g THF. The mixture was stirred overnight, after which 100 g of MIBK and 20 g of methanol were added, and 50 g of 5 wt % hydrochloric acid was added to quench the reaction. The organic layer was separated, washed with water, and concentrated. To the concentrate, 20 g of acetone and 50 g of diisopropyl ether were added for crystallization. The resulting crystals were collected by filtration and dried in vacuum, obtaining 5.5 g of the target compound, bis(4-tert-butylphenyl){4-(1,1,3,3,3-pentafluoro-1-sulfonatopropan-2-yloxy}phenyl}sulfonium as white crystals. Yield 90%.

Figure 4:
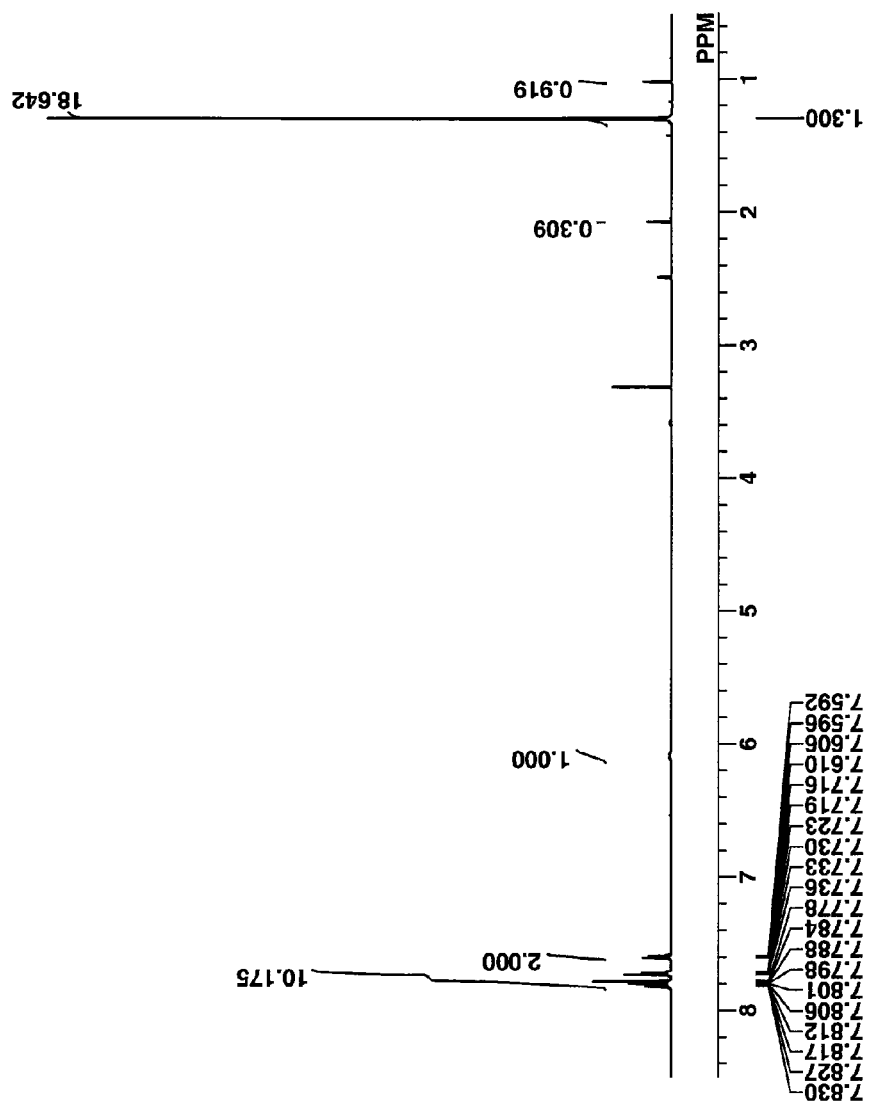
FIGS. 4 and 5 are diagrams showing $^1$H-NMR and $^{19}$F-NMR/DMSO-$d_6$ of PAG-2 in Synthesis Example 1-5.
Figure 5:
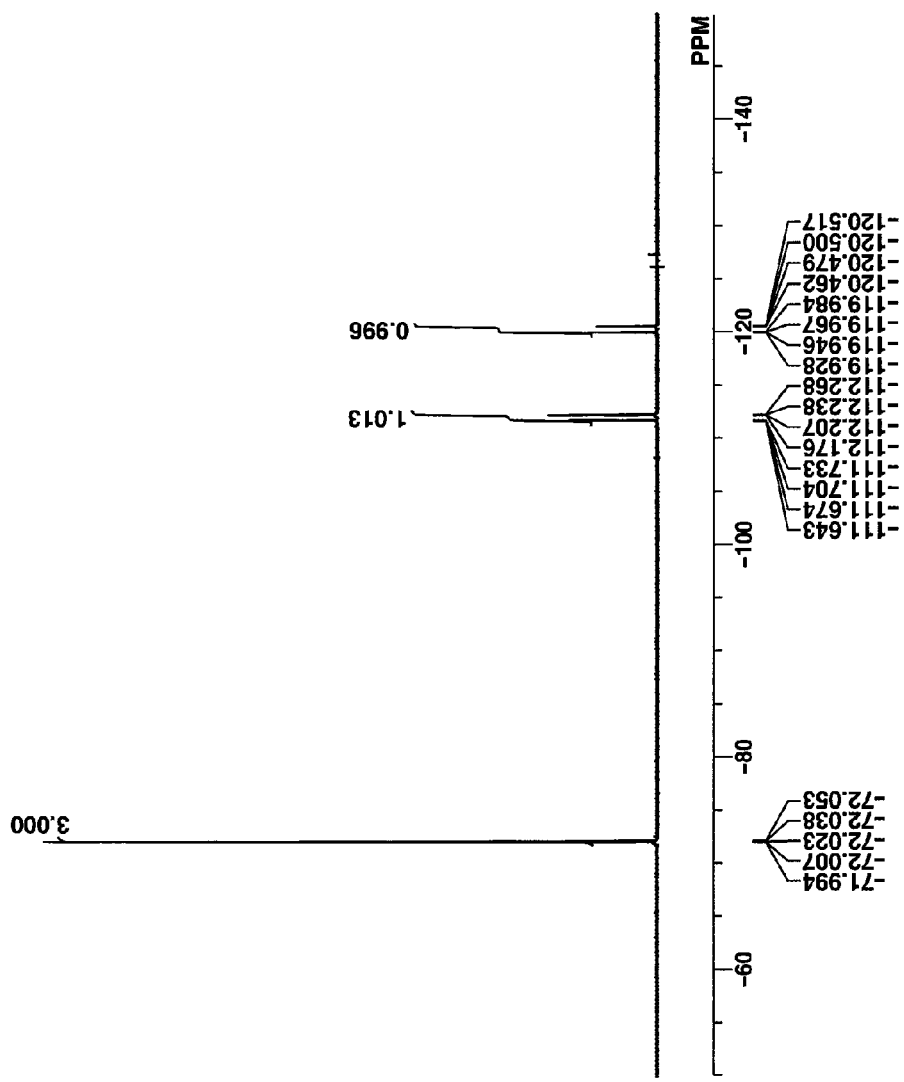

The target compound was analyzed by spectroscopy. The NMR spectra, $^1$H- and $^{19}$F-NMR/DMSO-d$_6$ are shown in FIGS. 4 and 5, respectively. Note that in $^1$H-NMR, traces of residual solvents (diisopropyl ether, water) were observed. The data of IR spectroscopy and LC-MS are also shown.

IR spectrum (D-ATR)

2963, 1588, 1489, 1398, 1366, 1248, 1217, 1185, 1157, 1113, 1084, 1073, 1007, 882, 840, 643, 625 cm$^{-1}$

LC-MS

Positive [M+H]$^+$ 603

Synthesis Example 6

Synthesis of benzyltrimethylammonium 2-(3-chloropropyl)-1,1-difluoroethanesulfonate (PAG Intermediate 4)

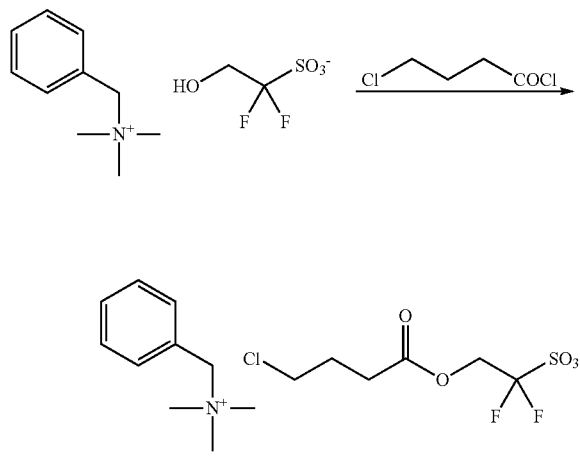

In 60 g of methylene chloride were dissolved 16 g of benzyltrimethylammonium 1,1-difluoro-2-hydroxyethanesulfonate which had been prepared with reference to the synthesis of triphenylsulfonium 1,1-difluoro-2-hydroxyethanesulfonate described in JP-A 2009-258695 (U.S. Pat. No. 8,114,570), 7.6 g of triethylamine, and 0.6 g of 4-dimethylaminopyridine. Under ice cooling, a mixture of 8.5 g chlorobutyryl chloride and 20 g methylene chloride was added dropwise to this solution, followed by 4 hours of stirring. At the end of stirring, 50 g of 5 wt % dilute hydrochloric acid was added to quench the reaction. The organic layer was separated, washed with water, and concentrated in vacuum. To the concentrate, 100 g of MIBK was added. This was concentrated in vacuum again. The residue was washed with diisopropyl ether, obtaining 15 g of the target compound, benzyltrimethylammonium 2-(3-chloropropyl)-1,1-difluoroethanesulfonate as oily matter. Yield 74%.

Synthesis Example 1-7

Synthesis of (4-hydroxyphenyl)diphenylsulfonium p-toluenesulfonate (PAG Intermediate 5)

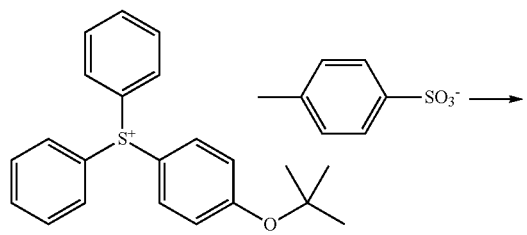

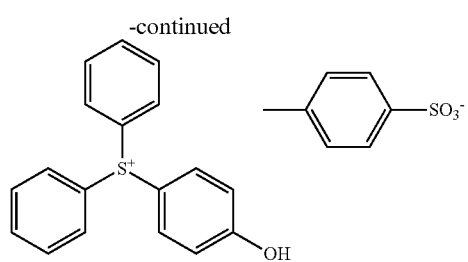

A mixture of 25 g of (4-tert-butyloxyphenyl)diphenylsulfonium p-toluenesulfonate, 0.5 g of p-toluenesulfonic acid monohydrate, and 75 g of methanol was stirred at 80° C. for 5 hours. The reaction solution was cooled to room temperature and concentrated in vacuum, to which 100 g of methylene chloride and 50 g of deionized water were added. The organic layer was separated, washed with water, and concentrated in vacuum. To the concentrate, 100 g of MIBK was added. This was concentrated in vacuum again, obtaining 24 g of the target compound, (4-hydroxyphenyl)diphenylsulfonium p-toluenesulfonate as oily matter. Yield 96%.

Synthesis Example 1-8

Synthesis of (4-hydroxyphenyl)diphenylsulfonium 2-(3-chloropropyl)-1,1-difluoroethanesulfonate (PAG Intermediate 6)

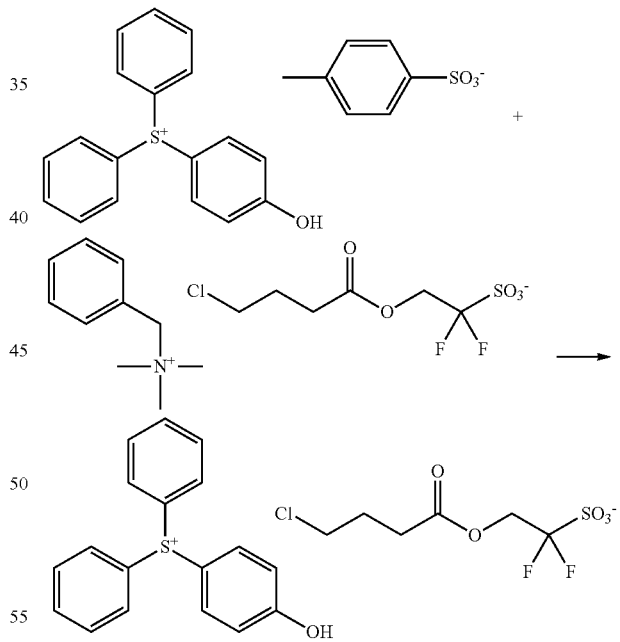

A mixture of 9.1 g of benzyltrimethylammonium 2-(3-chloropropyl)-1,1-difluoroethanesulfonate obtained in Synthesis Example 1-6, 9.9 g of (4-hydroxyphenyl)diphenylsulfonium p-toluenesulfonate obtained in Synthesis Example 1-7, 50 g of methylene chloride, and 40 g of deionized water was stirred at room temperature overnight. To the solution were added 100 g of MIBK and 10 g of methanol. The organic layer was separated, washed with water, and concentrated in vacuum. The residue was washed with diisopropyl ether, obtaining 11 g of the target compound, (4-hydroxyphenyl)

diphenylsulfonium 2-(3-chloropropyl)-1,1-difluoroethanesulfonate as oily matter. Yield 86%.

Synthesis Example 1-9

Synthesis of 4-(1,1-difluoro-1-sulfonatoethan-2-yloxy)-phenyldiphenylsulfonium (PAG-3)

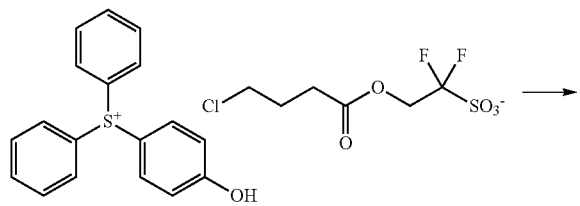

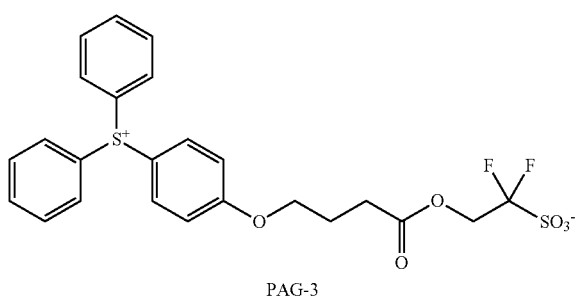

PAG-3

A mixture of 4.4 g of (4-hydroxyphenyl)diphenylsulfonium 2-(3-chloropropyl)-1,1-difluoroethanesulfonate obtained in Synthesis Example 1-8, 1.1 g of potassium carbonate, and 20 g of DMF was stirred at 90° C. for 3 hours. The reaction solution was cooled to room temperature, after which 50 g of 5 wt % dilute hydrochloric acid was added to quench the reaction. To the solution, 150 g of methylene chloride was added. The organic layer was separated, washed with water, and concentrated in vacuum. To the concentrate, 100 g of MIBK was added. This was concentrated in vacuum again. The residue was purified by column chromatography and recrystallized from diisopropyl ether. The resulting crystals were collected by filtration and dried in vacuum, obtaining 1.5 g of the target compound, 4-(1,1-difluoro-1-sulfonatoethan-2-yloxy)phenyldiphenylsulfonium as white crystals. Yield 37%.

Figure 6:
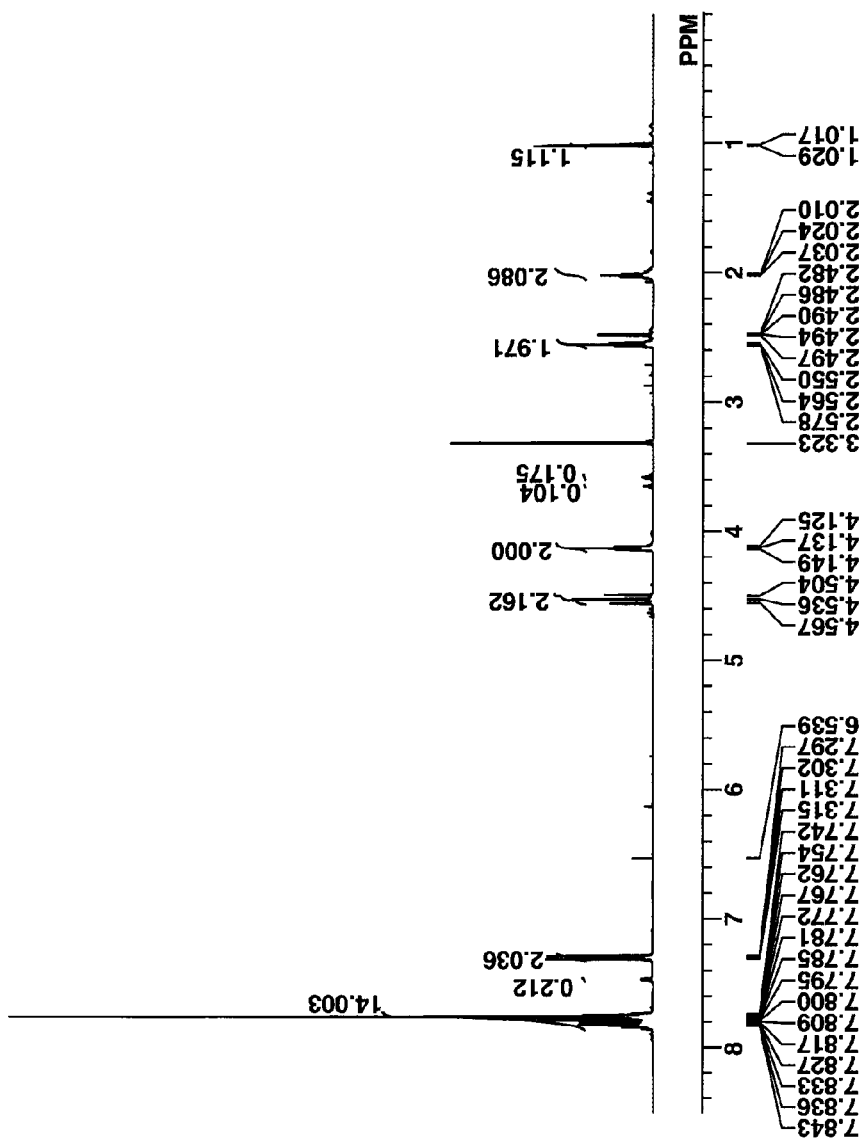
FIGS. 6 and 7 are diagrams showing $^1$H-NMR and $^{19}$F-NMR/DMSO-$d_6$ of PAG-3 in Synthesis Example 1-9.
Figure 7:
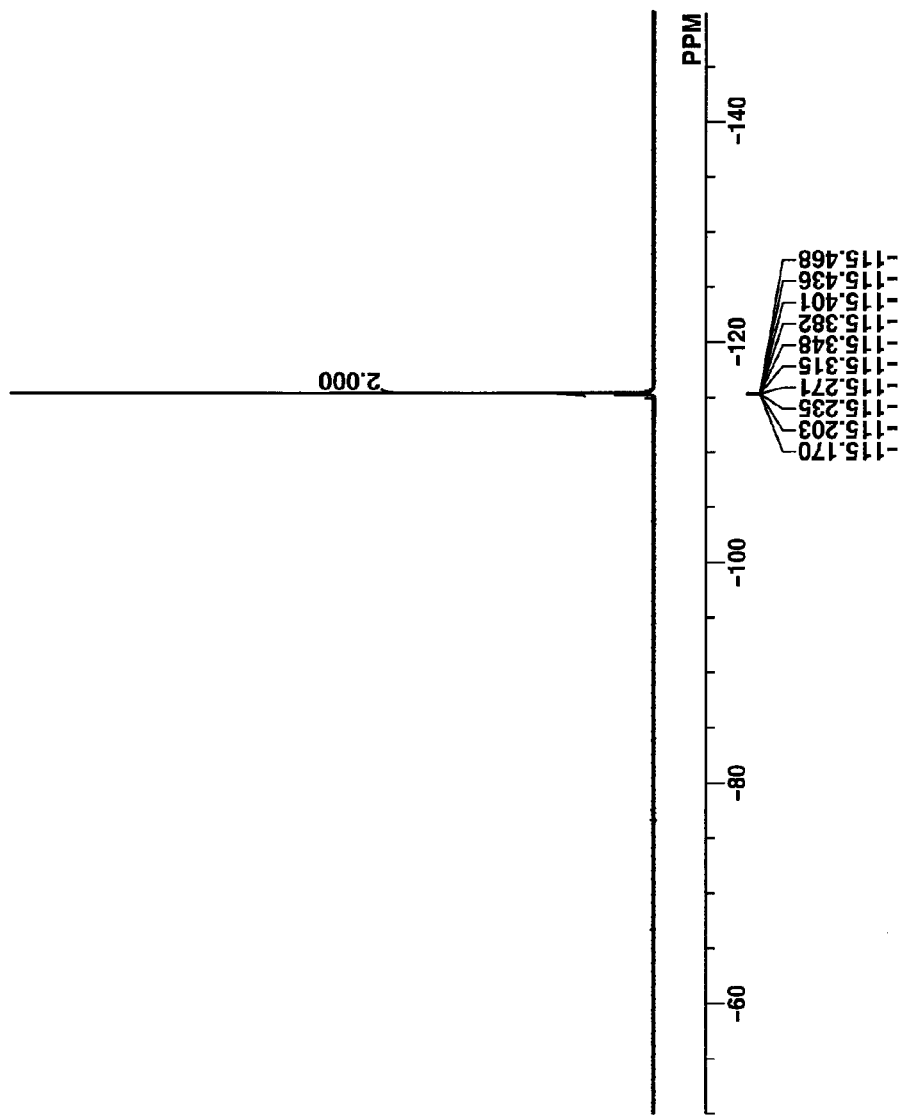

The target compound was analyzed by spectroscopy. The NMR spectra, $^1$H- and $^{19}$F-NMR/DMSO-$d_6$ are shown in FIGS. 6 and 7, respectively. Note that in $^1$H-NMR, traces of residual solvents (diisopropyl ether, water) were observed. The data of LC-MS are also shown.
LC-MS
Positive [M+H]$^+$ 509

Synthesis Example 1-10

Synthesis of 4-tert-butylphenyl phenyl sulfoxide (PAG Intermediate 7)

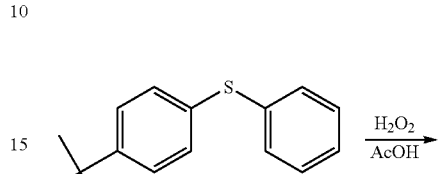

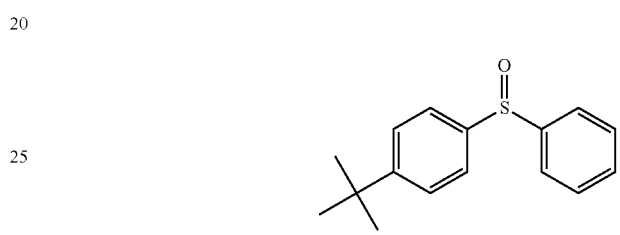

In 160 g of acetic acid was dissolved 27.4 g of 4-tert-butylphenyl phenyl sulfide which had been synthesized according to the well-known formulation. While the solution was maintained at an internal temperature of 30° C., 9 g of 35 wt % aqueous hydrogen peroxide was added dropwise. The reaction solution was aged at room temperature for 18 hours, after which under ice cooling, a mixture of 1 g sodium thiosulfate pentahydrate and 50 g water was added dropwise to quench the reaction. The solution was combined with 200 g of toluene, 100 g of ethyl acetate, and 100 g of water. The organic layer was separated, washed with water, and concentrated in vacuum. This was followed by crystallization from hexane, filtration, and drying. There was obtained 25.4 g of the target compound, 4-tert-butylphenyl phenyl sulfoxide as white crystals. Yield 98%.

Synthesis Example 1-11

Synthesis of 4-tert-butylphenyl-(4-fluorophenyl)-phenylsulfonium 1,1,3,3,3-pentafluoro-2-hydroxypropane-1-sulfonate (PAG Intermediate 8)

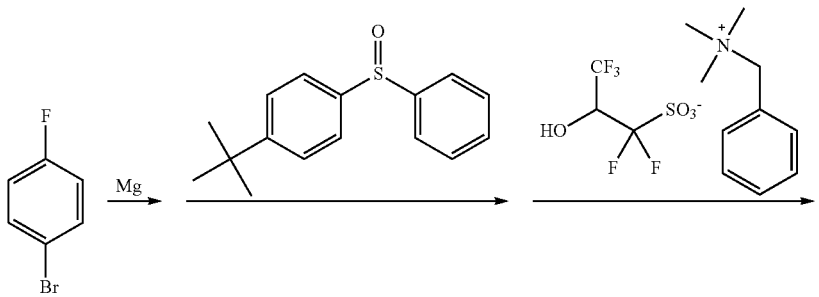

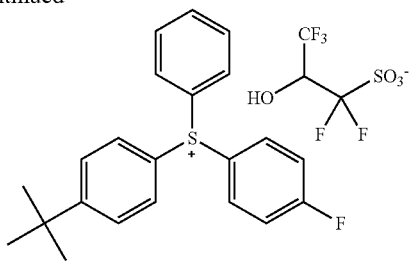

To a Grignard reagent prepared from 21 g of 1-bromo-4-fluorobenzene, 10.3 g of 4-tert-butylphenyl phenyl sulfoxide obtained in Synthesis Example 1-10 and 30 g of methylene chloride were added. The contents were stirred for 10 minutes. Under ice cooling, 13.1 g of trimethylsilyl chloride was added dropwise to the solution, which was aged for 30 minutes. To the reaction solution, 55 g of 4 wt % dilute hydrochloric acid was added to quench the reaction, and the organic layer was separated. To the organic layer, 15.2 g of benzyltrimethylammonium 1,1,3,3,3-pentafluoro-2-hydroxypropane-1-sulfonate, which had been synthesized according to the method of JP-A 2012-107151, and 50 g of water were added. After thorough stirring, the organic layer was separated, washed with water, and concentrated in vacuum. The concentrate was combined with 100 g of MIBK, from which water was azeotroped off. To the residue, 100 g of diisopropyl ether was added for crystallization. The resulting crystals were collected by filtration and dried, obtaining 10.5 g of the target compound, 4-tert-butylphenyl-(4-fluorophenyl)-phenylsulfonium 1,1,3,3,3-pentafluoro-2-hydroxypropane-1-sulfonate as white crystals. Yield 93%.

Synthesis Example 1-12

Synthesis of 4-tert-butylphenyl-[4-(1,1,3,3-pentafluoro-1-sulfonatopropan-2-yloxy)phenyl]-phenyl-sulfonium (PAG-4)

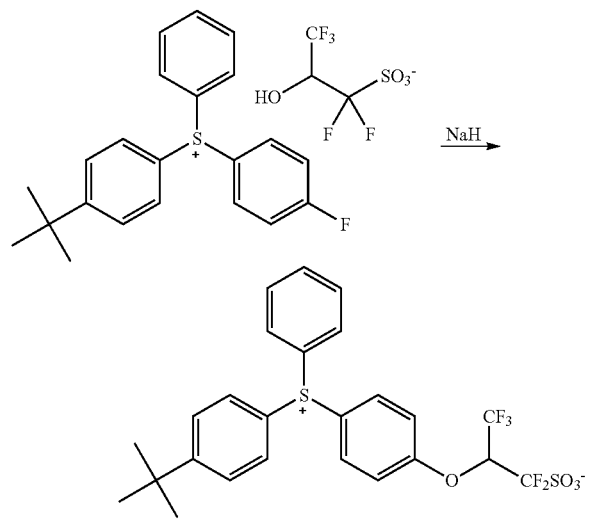

In 20 g of THF was dissolved 10.5 g of 4-tert-butylphenyl-(4-fluorophenyl)-phenylsulfonium 1,1,3,3,3-pentafluoro-2-hydroxypropane-1-sulfonate obtained in Synthesis Example 1-11. Under ice cooling, this solution was added dropwise to a mixture of 0.5 g sodium hydride and 20 g THF, followed by overnight stirring. Under ice cooling, 30 g of 5 wt % dilute hydrochloric acid was added dropwise to quench the reaction. The reaction solution was combined with 100 g of MIBK and 10 g of methanol. The organic layer was separated, washed with water, and concentrated in vacuum. To the concentrate, 15 g of acetone and 100 g of diisopropyl ether were added for crystallization. The resulting crystals were collected by filtration and dried in vacuum, obtaining 5.1 g of the target compound, 4-tert-butylphenyl-[4-(1,1,3,3,3-pentafluoro-1-sulfonatopropan-2-yloxy)phenyl]-phenylsulfonium as white crystals. Yield 93%.

Figure 8:
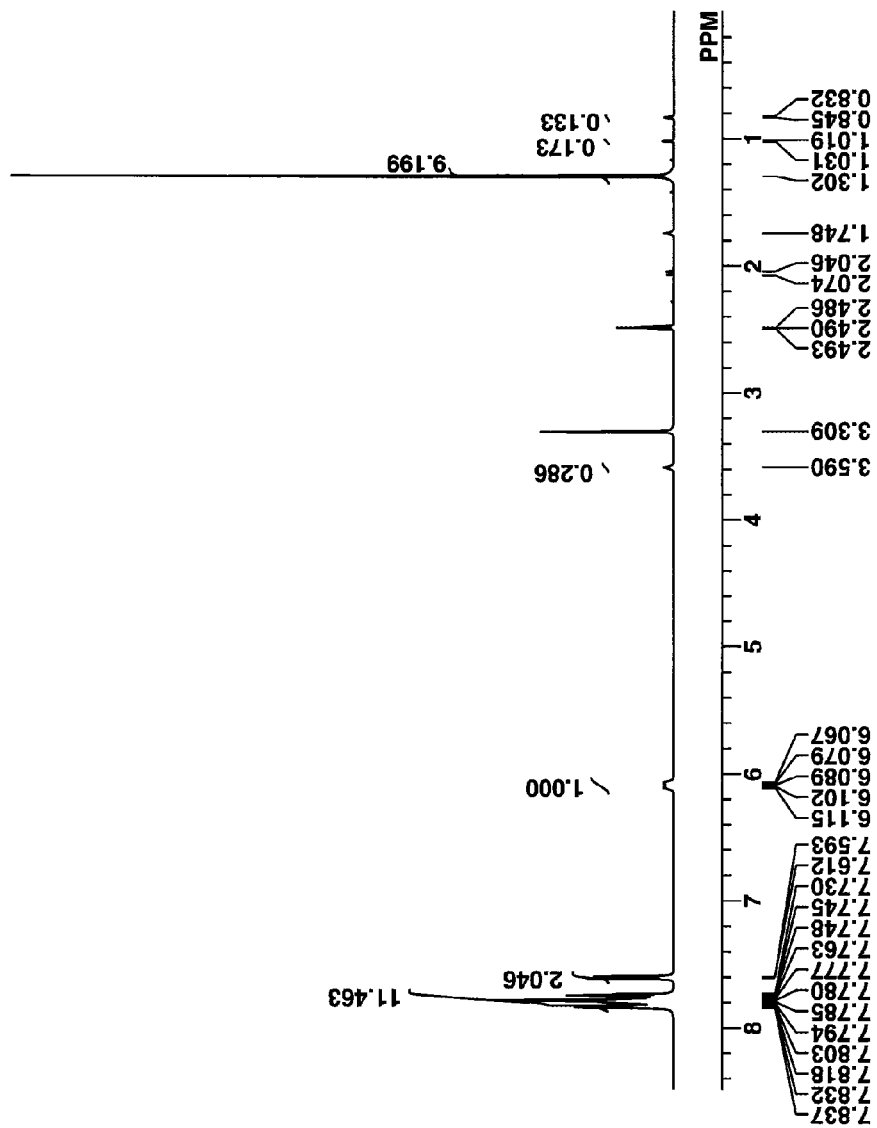
FIGS. 8 and 9 are diagrams showing $^1$H-NMR and $^{19}$F-NMR/DMSO-$d_6$ of PAG-4 in Synthesis Example 1-12.
Figure 9:
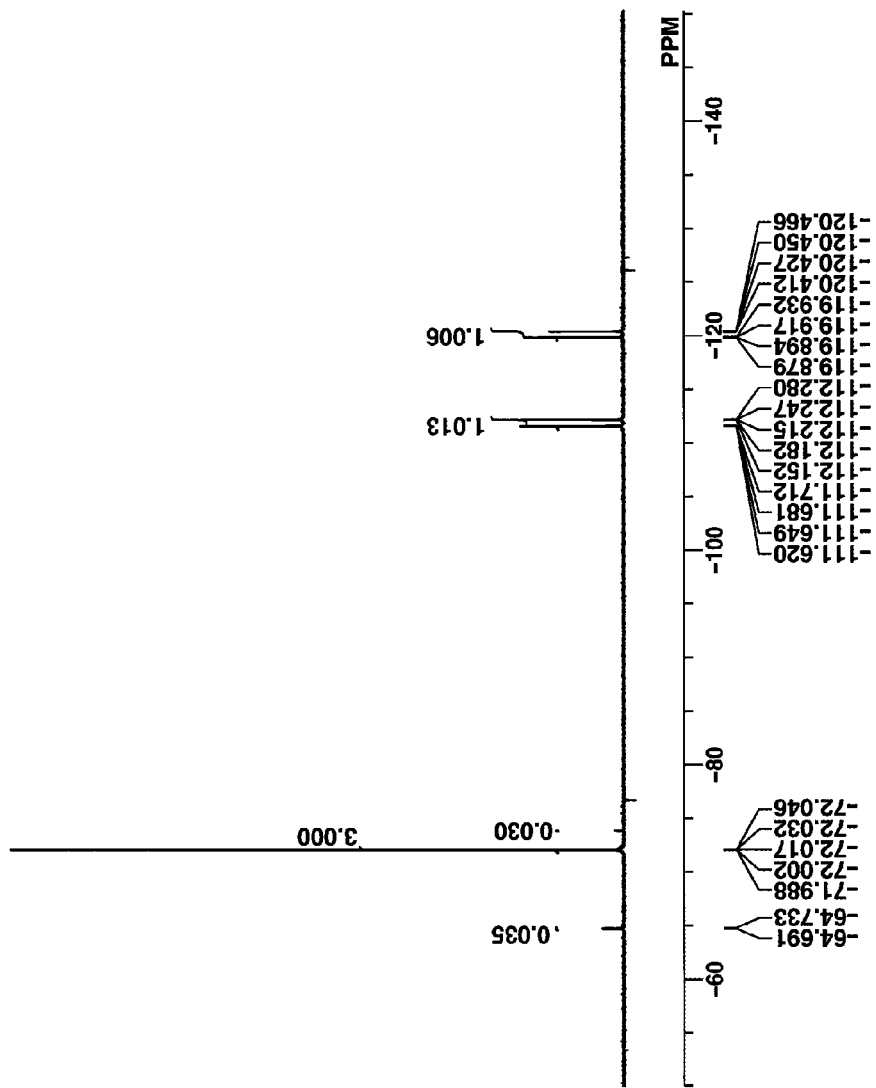

The target compound was analyzed by spectroscopy. The NMR spectra, $^1$H- and $^{19}$F-NMR/DMSO-$d_6$ are shown in FIGS. 8 and 9, respectively. Note that in $^1$H-NMR, traces of residual solvents (diisopropyl ether, MIBK, water) were observed. The data of IR spectroscopy and LC-MS are also shown.

IR spectrum (D-ATR)
3096, 2960, 2905, 1582, 1491, 1450, 1411, 1360, 1339, 1266, 1245, 1184, 1122, 1089, 990, 882, 835, 755, 689, 641, 586 cm$^{-1}$ LC-MS
Positive [M+H]$^+$ 547

Synthesis Example 1-13

Synthesis of phenyl 4-(2,2,2-trifluoroethoxy)phenyl sulfide (PAG Intermediate 9)

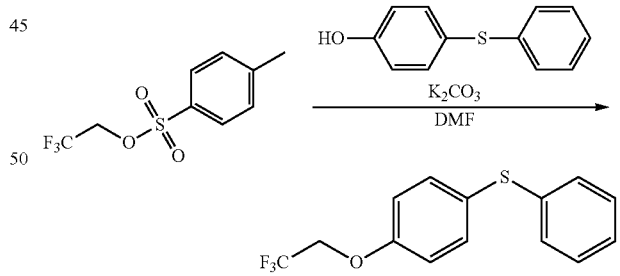

A solution was obtained by combining 20.2 g of 4-hydroxyphenyl phenyl sulfide which had been synthesized according to the well-known formulation, 15.3 g of 2,2,2-trifluoroethyl p-toluenesulfonate, 12.4 g of potassium carbonate, and 80 g of DMF. The solution was aged at 100° C. for 16 hours. The aged solution was cooled to room temperature, to which 50 g of water was added to quench the reaction. To the solution, 200 g of toluene was added for extraction. The organic layer was separated, and washed with 100 g of 5 wt % sodium hydroxide aqueous solution and water in sequence. On subsequent concentration in vacuum, 16.4 g of the target compound, phenyl 4-(2,2,2-trifluoroethoxy)phenyl sulfide was obtained as oily matter. Yield 96%.

Synthesis Example 1-14

Synthesis of phenyl 4-(2,2,2-trifluoroethoxy)phenyl sulfoxide (PAG Intermediate 10)

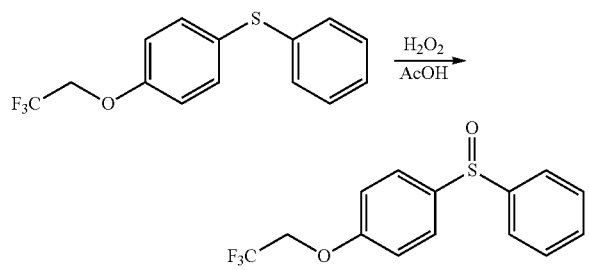

In 120 g of acetic acid was dissolved 17.1 g of phenyl 4-(2,2,2-trifluoroethoxy)phenyl sulfide obtained in Synthesis Example 1-13. While the solution was maintained at an internal temperature of 30° C., 5.8 g of 35 wt % aqueous hydrogen peroxide was added dropwise. The reaction solution was aged at room temperature for 18 hours, after which under ice cooling, a mixture of 0.5 g sodium thiosulfate pentahydrate and 15 g water was added dropwise to quench the reaction. The solution was combined with 100 g of toluene, 50 g of ethyl acetate, and 50 g of water. The organic layer was separated, washed with water, and concentrated in vacuum. This was followed by crystallization from hexane, filtration, and drying. There was obtained 17.9 g of the target compound, phenyl 4-(2,2,2-trifluoroethoxy)phenyl sulfoxide as white crystals. Yield 99%.

Synthesis Example 1-15

Synthesis of (4-fluorophenyl)-phenyl-[4-(2,2,2-trifluoroethoxy)phenyl]sulfonium 1,1,3,3,3-pentafluoro-2-hydroxypropane-1-sulfonate (PAG Intermediate 11)

To a Grignard reagent prepared from 8.8 g of 1-bromo-4-fluorobenzene, 6 g of phenyl 4-(2,2,2-trifluoro-ethoxy)phenyl sulfoxide obtained in Synthesis Example 1-14 and 40 g of methylene chloride were added. The contents were stirred for 10 minutes. Under ice cooling, 6.5 g of trimethylsilyl chloride was added dropwise to the solution, which was aged for 30 minutes. To the reaction solution, 100 g of 4 wt % dilute hydrochloric acid was added to quench the reaction, and the organic layer was separated. To the organic layer, 8.4 g of benzyltrimethylammonium 1,1,3,3,3-pentafluoro-2-hydroxypropane-1-sulfonate, which had been synthesized according to the method of JP-A 2012-107151, and 50 g of water were added. After thorough stirring, the organic layer was separated, washed with water, and concentrated in vacuum. The concentrate was combined with 100 g of MIBK, from which water was azeotroped off. To the residue, 100 g of diisopropyl ether was added for crystallization. The resulting crystals were collected by filtration and dried, obtaining 11.2 g of the target compound, (4-fluorophenyl)-phenyl-[4-(2,2,2-trifluoroethoxy)phenyl]-sulfonium 1,1,3,3,3-pentafluoro-2-hydroxypropane-1-sulfonate as white crystals. Yield 92%.

Synthesis Example 1-16

Synthesis of 4-(1,1,3,3,3-pentafluoro-1-sulfonatopropan-2-yloxy)phenyl-phenyl-[4-(2,2,2-trifluoroethoxy)phenyl]-sulfonium (PAG-5)

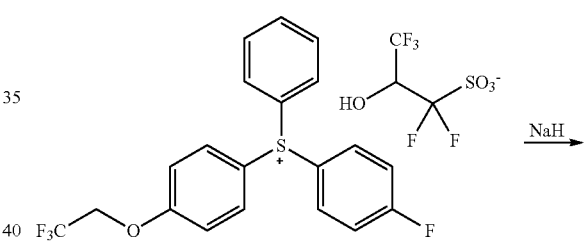

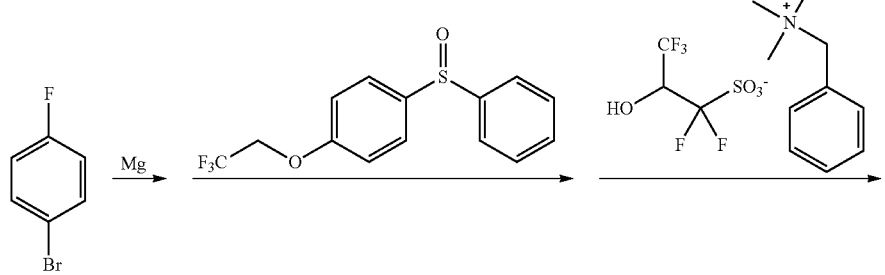

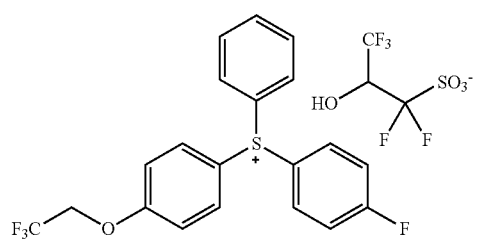

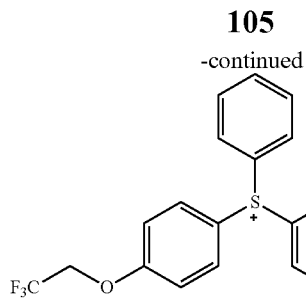

In 15 g of THF was dissolved 3 g of (4-fluorophenyl)-phenyl-[4-(2,2,2-trifluoroethoxy)phenyl]-sulfonium 1,1,3,3,3-pentafluoro-2-hydroxypropane-1-sulfonate obtained in Synthesis Example 1-15. Under ice cooling, this solution was added dropwise to a mixture of 0.2 g sodium hydride and 15 g THF, followed by overnight stirring. Under ice cooling, 30 g of water was added dropwise to quench the reaction. The reaction solution was combined with 100 g of MIBK and 10 g of methanol, from which the organic layer was separated. The organic layer was washed with water and concentrated in vacuum. To the concentrate, 15 g of acetone and 150 g of diisopropyl ether were added for crystallization. The resulting crystals were collected by filtration and dried in vacuum, obtaining 2.6 g of the target compound, 4-(1,1,3,3,3-pentafluoro-1-sulfonatopropan-2-yloxy)phenyl-phenyl-[4-(2,2,2-trifluoroethoxy)phenyl]sulfonium as white crystals. Yield 88%.

Figure 10:
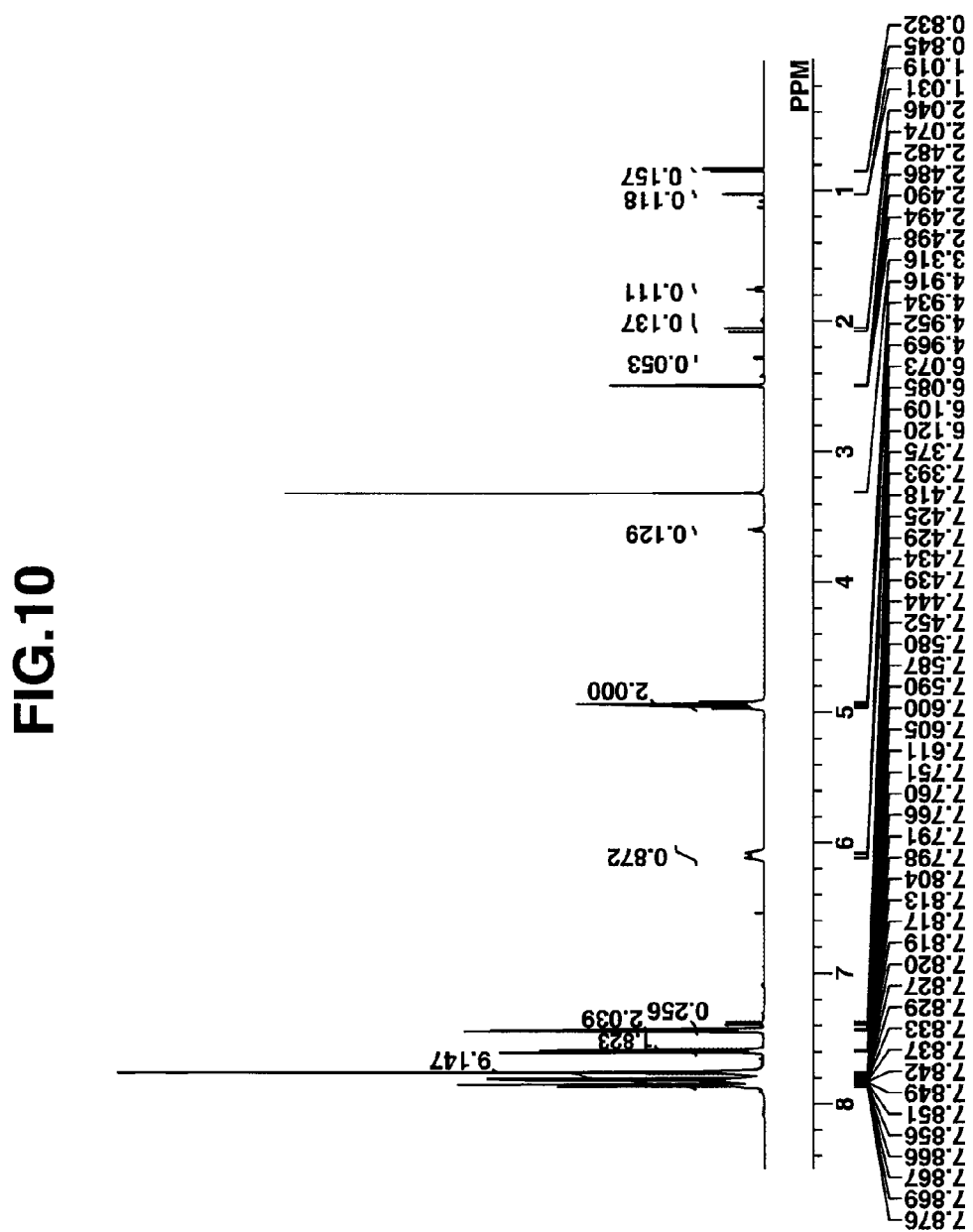
FIGS. 10 and 11 are diagrams showing $^1$H-NMR and $^{19}$F-NMR/DMSO-$d_6$ of PAG-5 in Synthesis Example 1-16.
Figure 11:
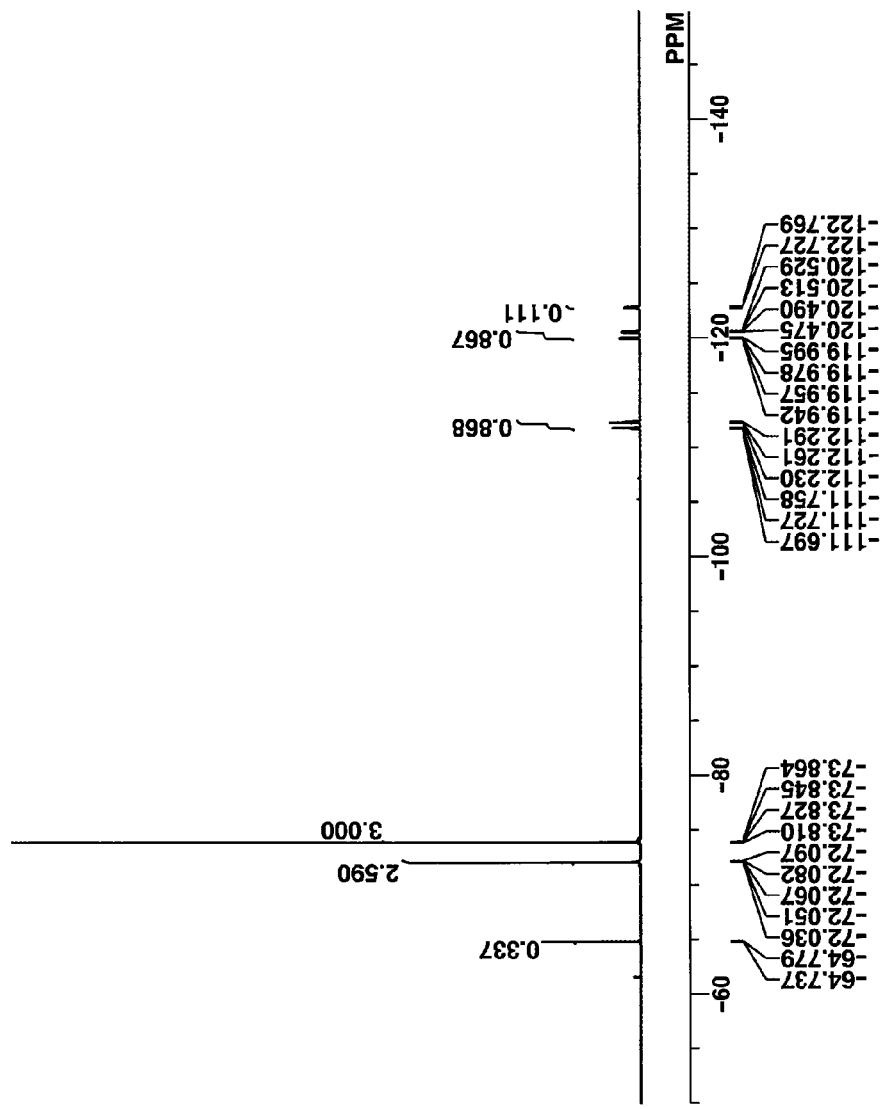

The target compound was analyzed by spectroscopy. The NMR spectra, $^1$H- and $^{19}$F-NMR/DMSO-$d_6$ are shown in FIGS. 10 and 11, respectively. Note that in $^1$H-NMR, traces of residual solvents (diisopropyl ether, MIBK, water) were observed. The data of IR spectroscopy and LC-MS are also shown.

IR spectrum (D-ATR)
3099, 1589, 1496, 1458, 1450, 1417, 1374, 1330, 1295, 1264, 1248, 1189, 1167, 1123, 1068, 981, 887, 867, 833, 751, 687, 641, 584 cm$^{-1}$ LC-MS
Positive [M+H]$^+$ 589

Synthesis Example 1-17

Synthesis of bis(4-butoxyphenyl) sulfide (PAG Intermediate 12)

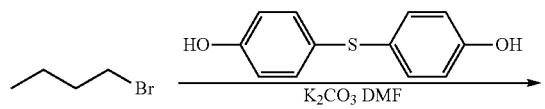

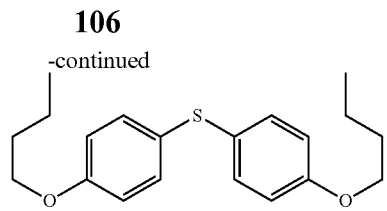

A solution was prepared by combining 107 g of bromobutane, 76 g of bis(4-hydroxyphenyl) sulfide, 108 g of potassium carbonate, and 230 g of DMF. The solution was aged at 90° C. for 16 hours. The aged solution was cooled to room temperature, to which 600 g of water was added to quench the reaction. To the solution was added 300 g of toluene. The organic layer was separated, washed with water, and concentrated in vacuum, obtaining 114 g of the target compound, bis(4-butoxyphenyl) sulfide as amorphous solid. Yield 99%.

Synthesis Example 1-18

Synthesis of bis(4-butoxyphenyl) sulfoxide (PAG Intermediate 13)

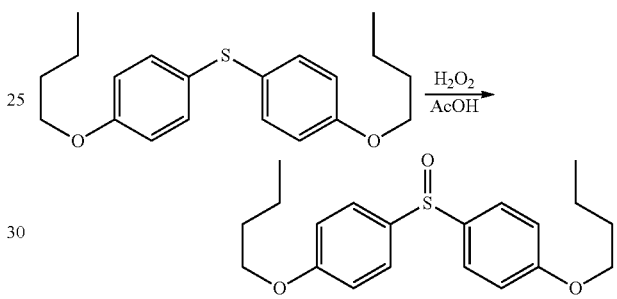

In 200 g of acetic acid was dissolved 30 g of bis(4-butoxyphenyl) sulfide obtained in Synthesis Example 1-17. While the solution was maintained at an internal temperature of 30° C., 8.8 g of 35 wt % aqueous hydrogen peroxide was added dropwise. The reaction solution was aged at room temperature for 12 hours, after which under ice cooling, a mixture of 0.9 g sodium thiosulfate pentahydrate and 30 g water was added dropwise to quench the reaction. The solution was combined with 200 g of methylene chloride and 50 g of water for extraction. The organic layer was separated, washed with water, and concentrated in vacuum. On subsequent purification by silica gel chromatography, 28 g of the target compound, bis(4-butoxyphenyl) sulfoxide was obtained as amorphous solid. Yield 90%.

Synthesis Example 1-19

Synthesis of bis(4-butoxyphenyl)-(4-fluorophenyl)-sulfonium 1,1,3,3,3-pentafluoro-2-hydroxypropane-1-sulfonate (PAG Intermediate 14)

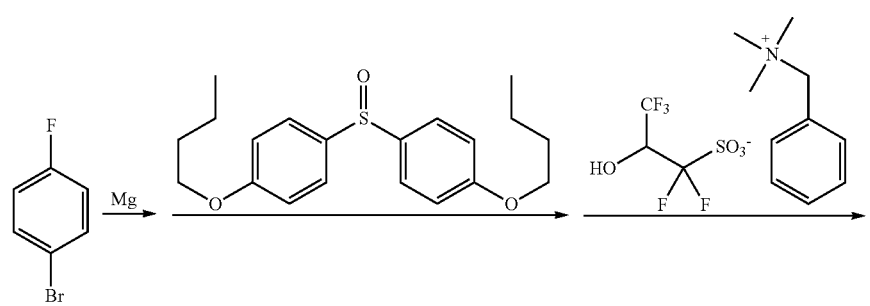

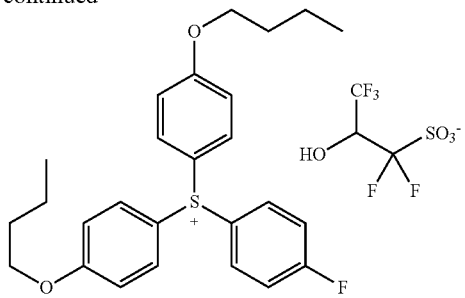

To a Grignard reagent prepared from 21 g of 1-bromo-4-fluorobenzene, 28 g of bis(4-butoxyphenyl) sulfoxide obtained in Synthesis Example 1-18 and 30 g of methylene chloride were added. The contents were stirred for 10 minutes. Under ice cooling, 13 g of trimethylsilyl chloride was added dropwise to the solution, which was aged for 1 hour. To the reaction solution, 100 g of 5 wt % dilute hydrochloric acid was added to quench the reaction, and the water layer was separated. To the water layer, 4.2 g of benzyltrimethylammonium 1,1,3,3,3-pentafluoro-2-hydroxypropane-1-sulfonate, which had been synthesized according to the method of JP-A 2012-107151, and 40 g of methylene chloride were added. After thorough stirring, the organic layer was separated, washed with water, and concentrated in vacuum. The residue was dissolved in 10 g of THF. The solution was combined with 80 g of diisopropyl ether and stirred. The supernatant was removed. The residue was concentrated in vacuum, obtaining 6.3 g of the target compound, bis(4-butoxyphenyl)-(4-fluorophenyl)sulfonium 1,1,3,3,3-pentafluoro-2-hydroxypropane-1-sulfonate as oily matter. Yield 95%.

Synthesis Example 1-20

Synthesis of bis(4-butoxyphenyl)-[4-(1,1,3,3,3-pentafluoro-1-sulfonatopropan-2-yloxy)phenyl]sulfonium (PAG-6)

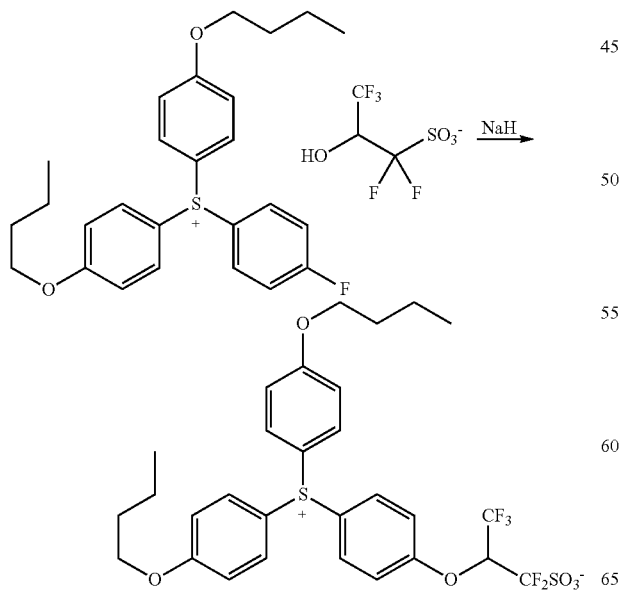

In 15 g of THF was dissolved 3.4 g of bis(4-butoxyphenyl)-(4-fluorophenyl)sulfonium 1,1,3,3,3-pentafluoro-2-hydroxypropane-1-sulfonate obtained in Synthesis Example 1-19. Under ice cooling, this solution was added dropwise to a mixture of 0.2 g sodium hydride and 15 g THF, followed by overnight stirring. Under ice cooling, 20 g of 5 wt % dilute hydrochloric acid was added dropwise to quench the reaction. The reaction solution was combined with 50 g of MIBK and 5 g of methanol, followed by decantation and washing with 20 g of water. The organic layer was separated and concentrated in vacuum. To the concentrate, 5 g of acetone and 50 g of diisopropyl ether were added for crystallization. The resulting crystals were collected by filtration and dried in vacuum, obtaining 3 g of the target compound, bis(4-butoxyphenyl)-[4-(1,1,3,3,3-pentafluoro-1-sulfonatopropan-2-yloxy)phenyl]sulfonium as white crystals. Yield 95%.

Figure 12:
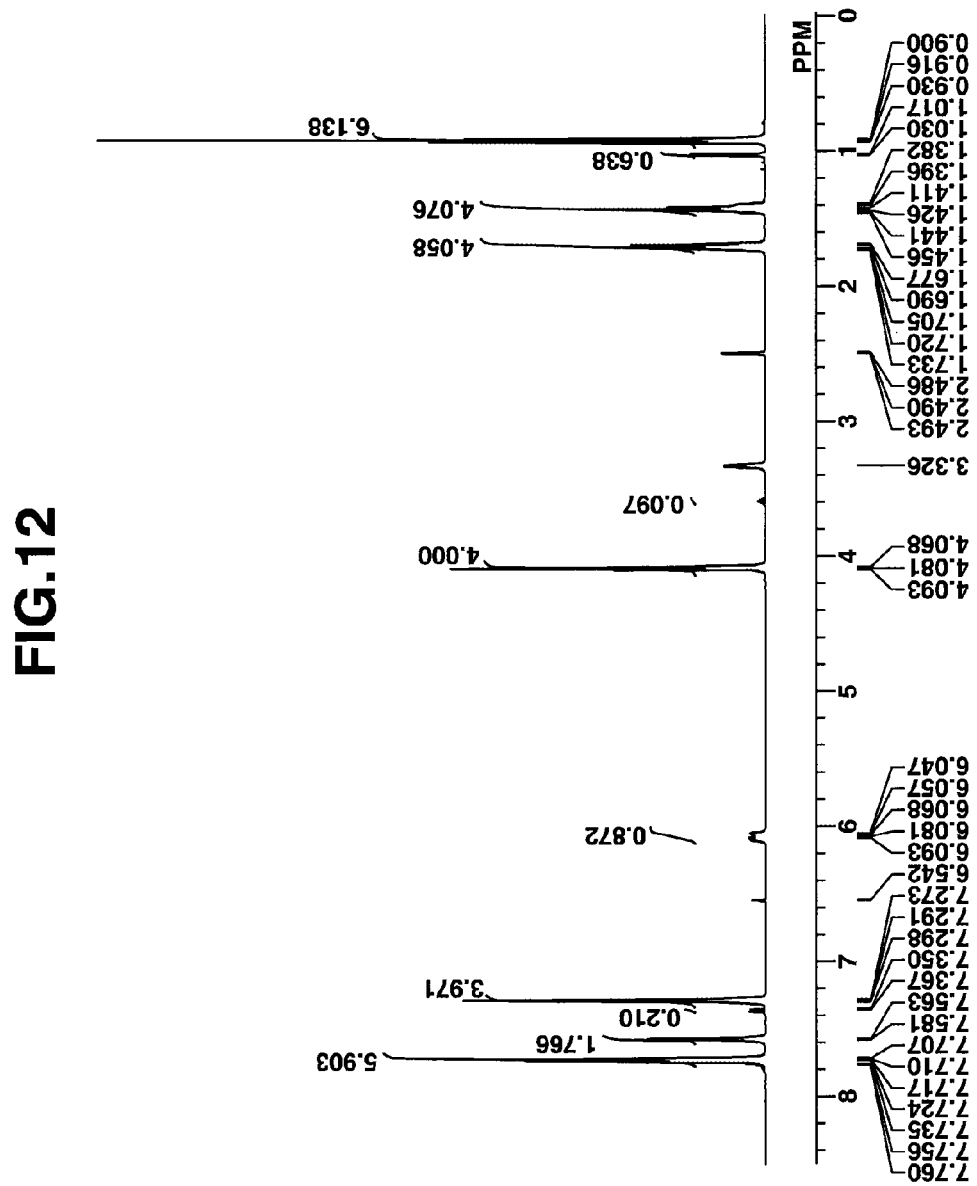
FIGS. 12 and 13 are diagrams showing $^1$H-NMR and $^{19}$F-NMR/DMSO-$d_6$ of PAG-6 in Synthesis Example 1-20.
Figure 13:
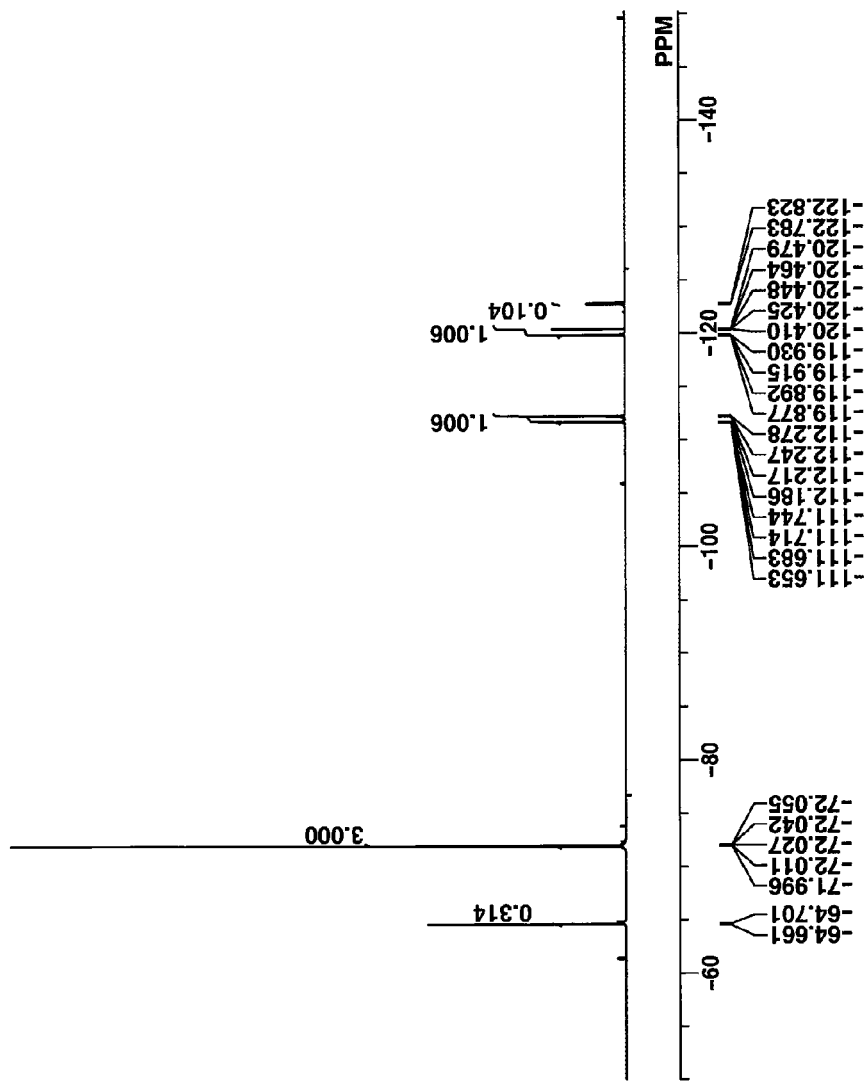

The target compound was analyzed by spectroscopy. The NMR spectra, $^1$H- and $^{19}$F-NMR/DMSO-$d_6$ are shown in FIGS. 12 and 13, respectively. Note that in $^1$H-NMR, traces of residual solvents (diisopropyl ether, MIBK, water) were observed. The data of IR spectroscopy and LC-MS are also shown.

IR spectrum (D-ATR)

3097, 2960, 2936, 1587, 1493, 1468, 1417, 1310, 1242, 1177, 1122, 1070, 991, 966, 883, 830, 640, 582 cm$^{-1}$

LC-MS

Positive [M+H]$^+$ 635

Synthesis Example 1-21

Synthesis of (4-hexyloxyphenyl) phenyl sulfide (PAG Intermediate 15)

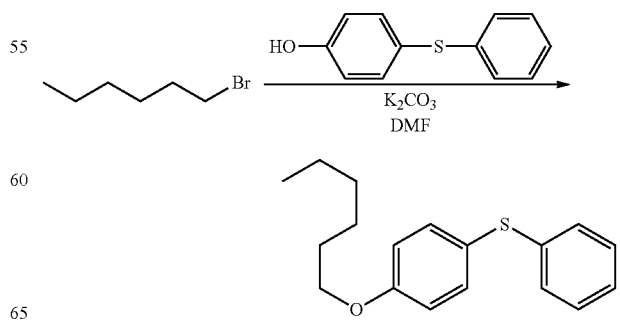

A solution was prepared by combining 15 g of (4-hydroxyphenyl) phenyl sulfide which had been synthesized according to the well-known formulation, 11 g of 1-bromohexane, 9 g of potassium carbonate, and 30 g of DMF. The solution was aged at 80° C. for 16 hours. The aged solution was cooled to room temperature, to which 30 g of water was added to quench the reaction. To the solution, 50 g of toluene was added for extraction. The organic layer was separated and washed with sodium hydroxide aqueous solution and water in sequence. On subsequent concentration in vacuum, 16 g of the target compound, (4-hexyloxyphenyl) phenyl sulfide was obtained as oily matter. Yield 90%.

Synthesis Example 1-22

Synthesis of (4-hexyloxyphenyl) phenyl sulfoxide (PAG Intermediate 16)

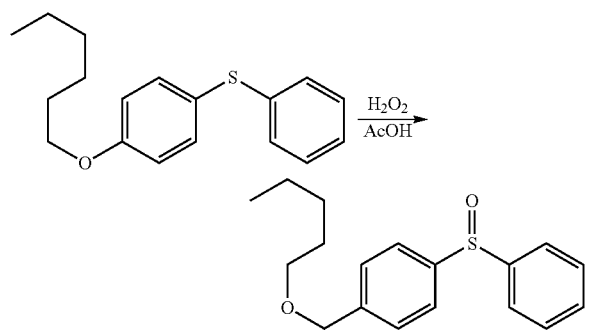

In 100 g of acetic acid was dissolved 15 g of (4-hexyloxyphenyl) phenyl sulfide obtained in Synthesis Example 1-21. While the solution was maintained at an internal temperature of 30° C., 5.1 g of 35 wt % aqueous hydrogen peroxide was added dropwise. The reaction solution was aged at room temperature for 18 hours, after which under ice cooling, a mixture of 1.3 g sodium thiosulfate pentahydrate and 15 g water was added dropwise to quench the reaction. The solution was combined with 100 g of methylene chloride and 20 g of water for extraction. The organic layer was separated, washed with water, and concentrated in vacuum, obtaining 14 g of the target compound, (4-hexyloxyphenyl) phenyl sulfoxide as amorphous solid. Yield 95%.

Synthesis Example 1-23

Synthesis of (4-fluorophenyl)-(4-hexyloxyphenyl)-phenylsulfonium 1,1,3,3,3-pentafluoro-2-hydroxypropane-1-sulfonate (PAG Intermediate 17)

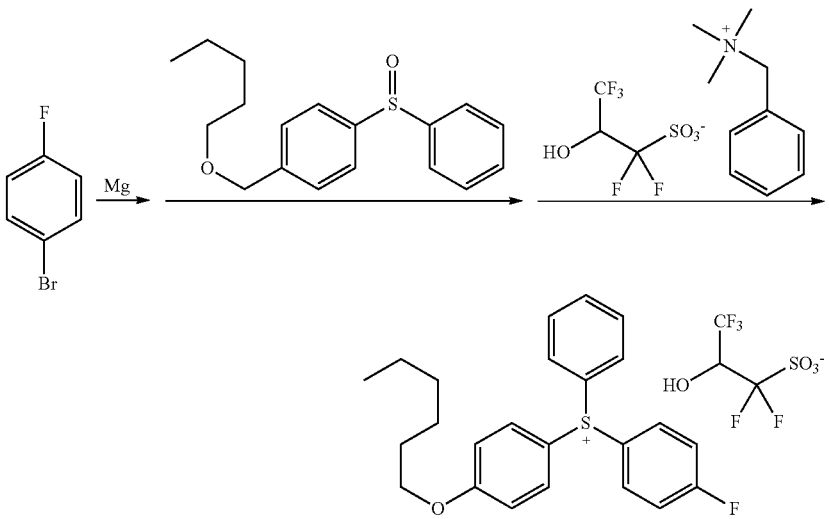

To a Grignard reagent prepared from 12 g of 1-bromo-4-fluorobenzene, 6.9 g of (4-hexyloxyphenyl) phenyl sulfoxide obtained in Synthesis Example 1-22 and 10 g of methylene chloride were added. The contents were stirred for 10 minutes. Under ice cooling, 7.5 g of trimethylsilyl chloride was added dropwise to the solution, which was aged for 30 minutes. To the reaction solution, 20 g of 4 wt % dilute hydrochloric acid was added to quench the reaction, and the water layer was separated. To the water layer, 10 g of benzyltrimethylammonium 1,1,3,3,3-pentafluoro-2-hydroxypropane-1-sulfonate, which had been synthesized according to the method of JP-A 2012-107151, and 60 g of methylene chloride were added. After thorough stirring, the organic layer was separated, washed with water, and concentrated in vacuum. The residue was dissolved in 10 g of THF. The solution was combined with 90 g of diisopropyl ether and stirred. The supernatant was removed. The residue was concentrated in vacuum, obtaining 12 g of the target compound, (4-fluorophenyl)-(4-hexyloxyphenyl)-phenylsulfonium 1,1,3,3,3-pentafluoro-2-hydroxypropane-1-sulfonate as oily matter. Yield 86%.

Synthesis Example 1-24

Synthesis of (4-hexyloxyphenyl)-[4-(1,1,3,3,3-pentafluoro-1-sulfonatopropan-2-yloxy)phenyl]phenylsulfonium (PAG-7)

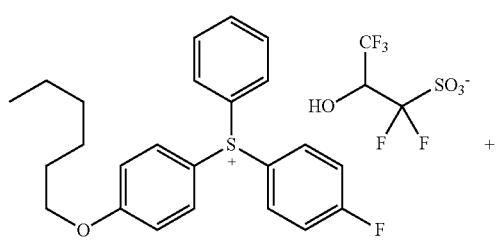

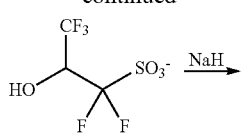

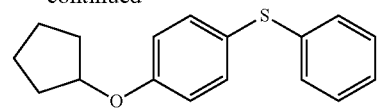

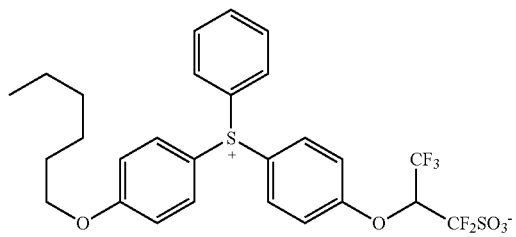

In 20 g of THF was dissolved 5 g of (4-fluorophenyl)-(4-hexyloxyphenyl)-phenylsulfonium 1,1,3,3,3-pentafluoro-2-hydroxypropane-1-sulfonate obtained in Synthesis Example 1-23. Under ice cooling, this solution was added dropwise to a mixture of 0.35 g sodium hydride and 20 g THF, followed by overnight stirring. Under ice cooling, 20 g of water was added dropwise to quench the reaction. The reaction solution was combined with 50 g of methylene chloride for extraction. The organic layer was separated, washed with water. It was combined with 10 g of MIBK and concentrated in vacuum. To the concentrate, 10 g of acetone and 50 g of diisopropyl ether were added for crystallization. The resulting crystals were collected by filtration and dried in vacuum, obtaining 4.5 g of the target compound, (4-hexyloxyphenyl)-[4-(1,1,3,3,3-pentafluoro-1-sulfonatopropan-2-yloxy)phenyl]-phenylsulfonium as white crystals. Yield 93%.

Figure 14:
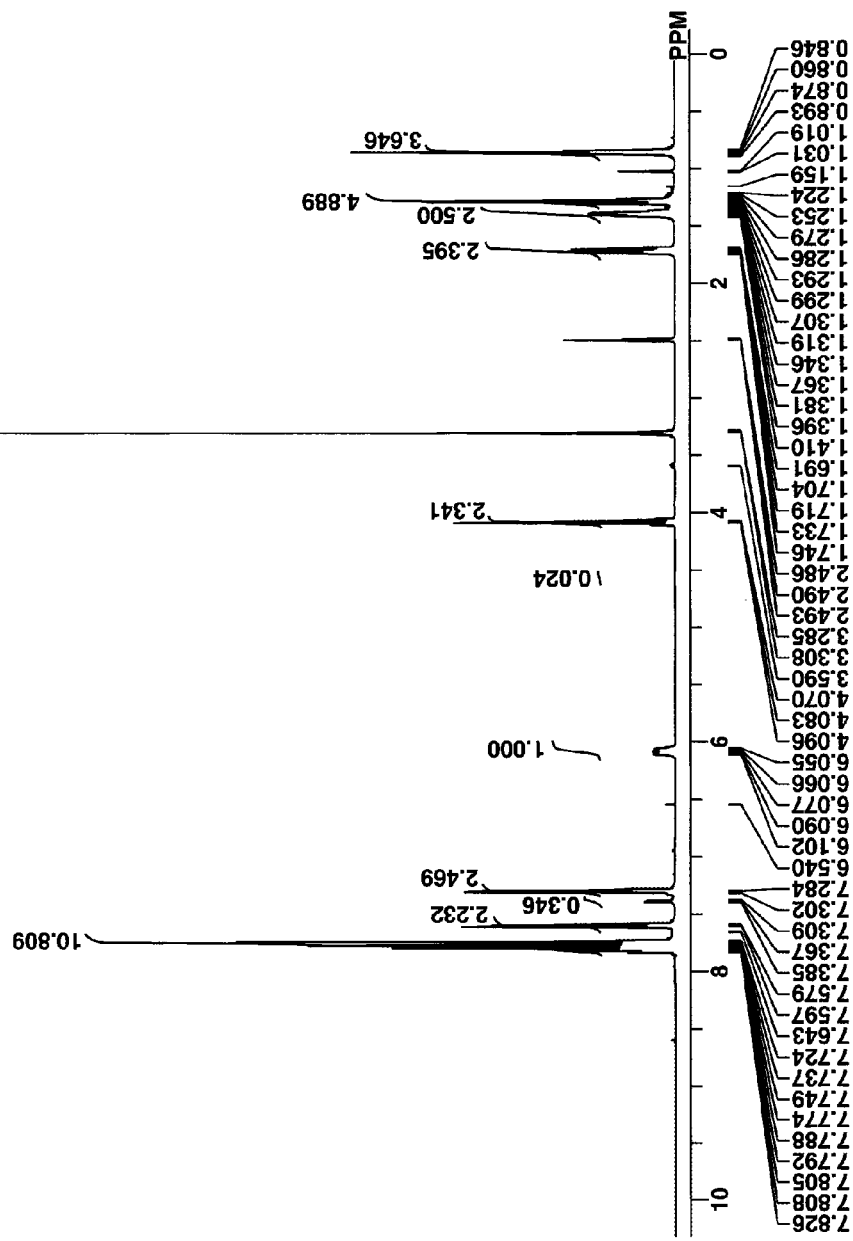
FIGS. 14 and 15 are diagrams showing $^1$H-NMR and $^{19}$F-NMR/DMSO-$d_6$ of PAG-7 in Synthesis Example 1-24.
Figure 15:
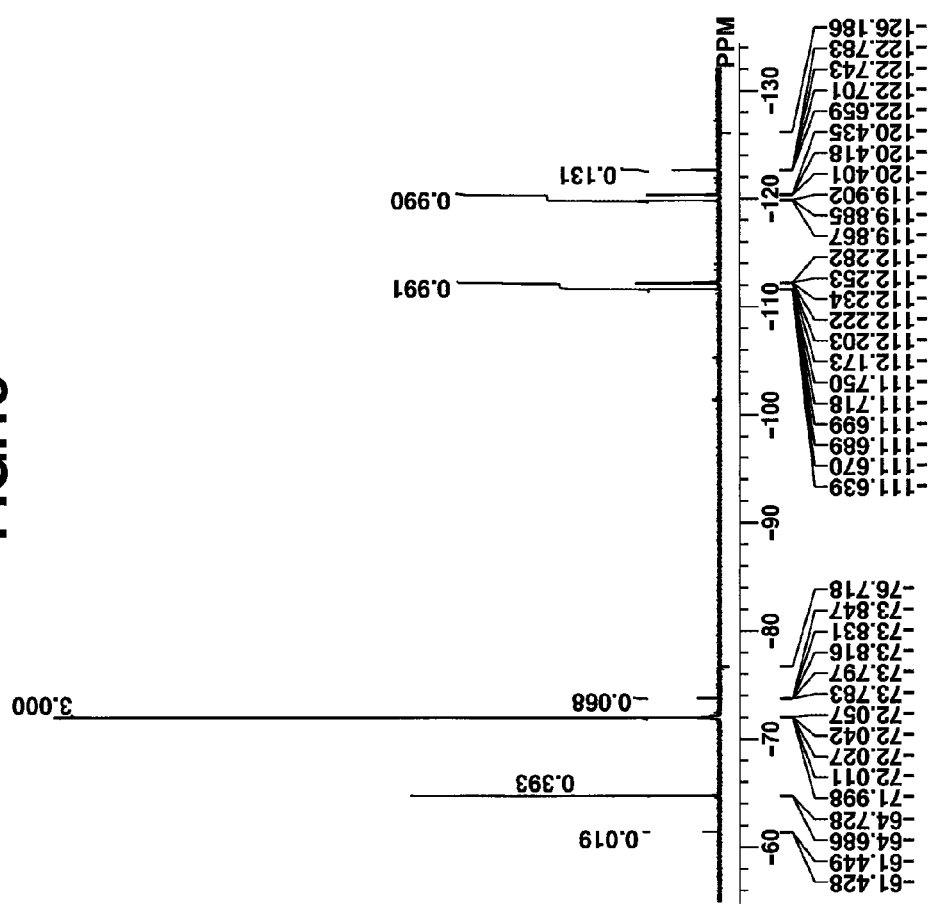

The target compound was analyzed by spectroscopy. The NMR spectra, $^1$H- and $^{19}$F-NMR/DMSO-$d_6$ are shown in FIGS. 14 and 15, respectively. Note that in $^1$H-NMR, traces of residual solvents (diisopropyl ether, water) were observed. The data of IR spectroscopy and LC-MS are also shown.

IR spectrum (D-ATR)

3097, 2933, 2860, 1588, 1494, 1476, 1447, 1417, 1367, 1310, 1244, 1179, 1121, 1073, 1046, 997, 935, 884, 834, 751, 685, 642, 584, 573 cm$^{-1}$

LC-MS

Positive [M+H]$^+$ 591

Synthesis Example 1-25

Synthesis of 4-cyclopentyloxyphenyl phenyl sulfide (PAG Intermediate 18)

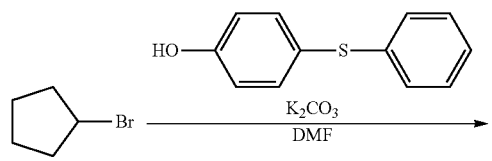

A solution was prepared by combining 11.3 g of 4-hydroxyphenyl phenyl sulfide which had been synthesized according to the well-known formulation, 8.2 g of bromocyclopentane, 7.6 g of potassium carbonate, and 40 g of DMF. The solution was aged at 80° C. for 16 hours. The aged solution was cooled to room temperature, to which 100 g of 5 wt % dilute hydrochloric acid was added to quench the reaction. To the solution, 150 g of toluene was added for extraction. The organic layer was separated and washed with water. It was combined with 5 wt % sodium hydroxide aqueous solution. The organic layer was separated and washed with water again. On subsequent concentration in vacuum, 13.8 g of the target compound, 4-cyclopentyloxyphenyl phenyl sulfide was obtained as oily matter. Yield 100%.

Synthesis Example 1-26

Synthesis of 4-cyclopentyloxyphenyl phenyl sulfoxide (PAG Intermediate 19)

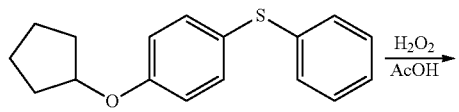

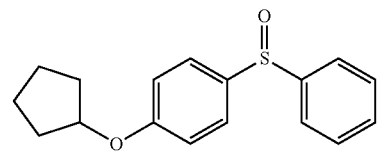

In 100 g of acetic acid was dissolved 13.8 g of 4-cyclopentyloxyphenyl phenyl sulfide obtained in Synthesis Example 1-25. While the solution was maintained at an internal temperature of 30° C., 4.8 g of 35 wt % aqueous hydrogen peroxide was added dropwise. The reaction solution was aged at room temperature for 18 hours, after which under ice cooling, a mixture of 0.5 g sodium thiosulfate pentahydrate and 15 g water was added dropwise to quench the reaction. The solution was combined with 100 g of toluene, 50 g of ethyl acetate, and 50 g of water. The organic layer was separated, washed with water, and concentrated in vacuum. This was followed by crystallization from hexane, filtration and drying, obtaining 13.5 g of the target compound, 4-cyclopentyloxyphenyl phenyl sulfoxide as white crystals. Yield 96%.

Synthesis Example 1-27

Synthesis of (4-cyclopentyloxyphenyl)-(4-fluorophenyl)-phenylsulfonium 1,1,3,3,3-pentafluoro-2-hydroxypropane-1-sulfonate (PAG Intermediate 20)

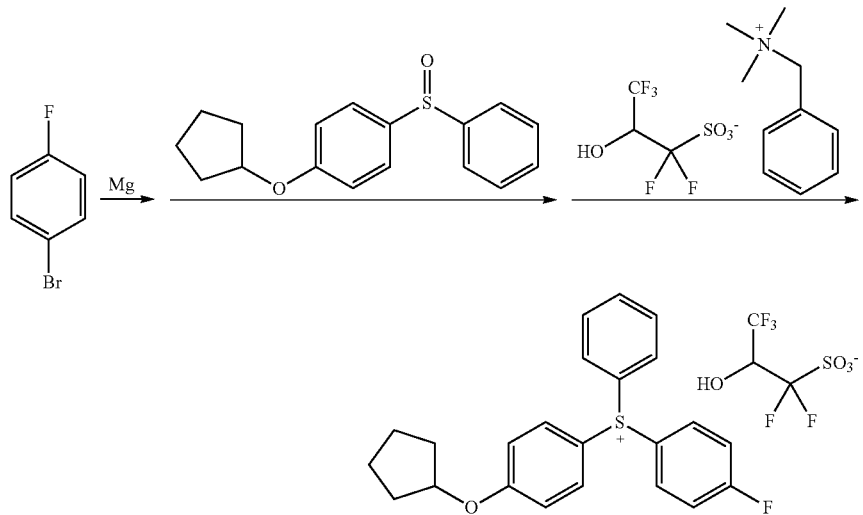

To a Grignard reagent prepared from 21 g of 1-bromo-4-fluorobenzene, 10.9 g of 4-cyclopentyloxyphenyl phenyl sulfoxide obtained in Synthesis Example 1-26 and 60 g of methylene chloride were added. The contents were stirred for 10 minutes. Under ice cooling, 13.1 g of trimethylsilyl chloride was added dropwise to the solution, which was aged for 30 minutes. To the reaction solution, 55 g of 4 wt % dilute hydrochloric acid was added to quench the reaction, and the water layer was separated. To the water layer, 115.2 g of benzyltrimethylammonium 1,1,3,3,3-pentafluoro-2-hydroxypropane-1-sulfonate, which had been synthesized according to the method of JP-A 2012-107151, and 50 g of methylene chloride were added. After thorough stirring, the organic layer was separated, washed with water, and concentrated in vacuum. The residue was dissolved in 30 g of THF. The solution was combined with 100 g of diisopropyl ether and stirred. The supernatant was removed. The residue was concentrated in vacuum, obtaining 18.9 g of the target compound, (4-cyclopentyloxyphenyl)-(4-fluorophenyl)-phenylsulfonium 1,1,3,3,3-pentafluoro-2-hydroxypropane-1-sulfonate as oily matter. Yield 84%.

Synthesis Example 1-28

Synthesis of (4-cyclopentyloxyphenyl)-[4-(1,1,3,3,3-pentafluoro-1-sulfonatopropan-2-yloxy)phenyl]phenylsulfonium (PAG-8)

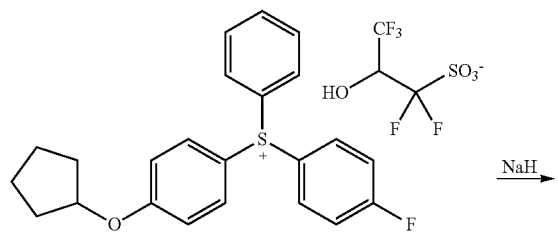

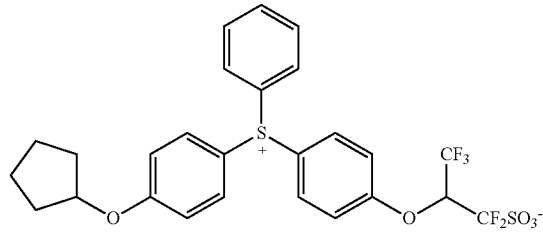

In 30 g of THF was dissolved 9.1 g of (4-cyclopentyloxyphenyl)-(4-fluorophenyl)-phenylsulfonium 1,1,3,3,3-pentafluoro-2-hydroxypropane-1-sulfonate obtained in Synthesis Example 1-27. Under ice cooling, this solution was added dropwise to a mixture of 0.7 g sodium hydride and 30 g THF, followed by overnight stirring. Under ice cooling, 30 g of water was added dropwise to quench the reaction. The reaction solution was combined with 100 g of MIBK and 10 g of methanol. The organic layer was separated, washed with water, and concentrated in vacuum. To the concentrate, 15 g of acetone and 300 g of diisopropyl ether were added for crystallization. The resulting crystals were collected by filtration and dried in vacuum, obtaining 7.8 g of the target compound, (4-cyclopentyloxyphenyl)-[4-(1,1,3,3,3-pentafluoro-1-sulfonatopropan-2-yloxy)phenyl]-phenylsulfonium as white crystals. Yield 90%.

Figure 16:
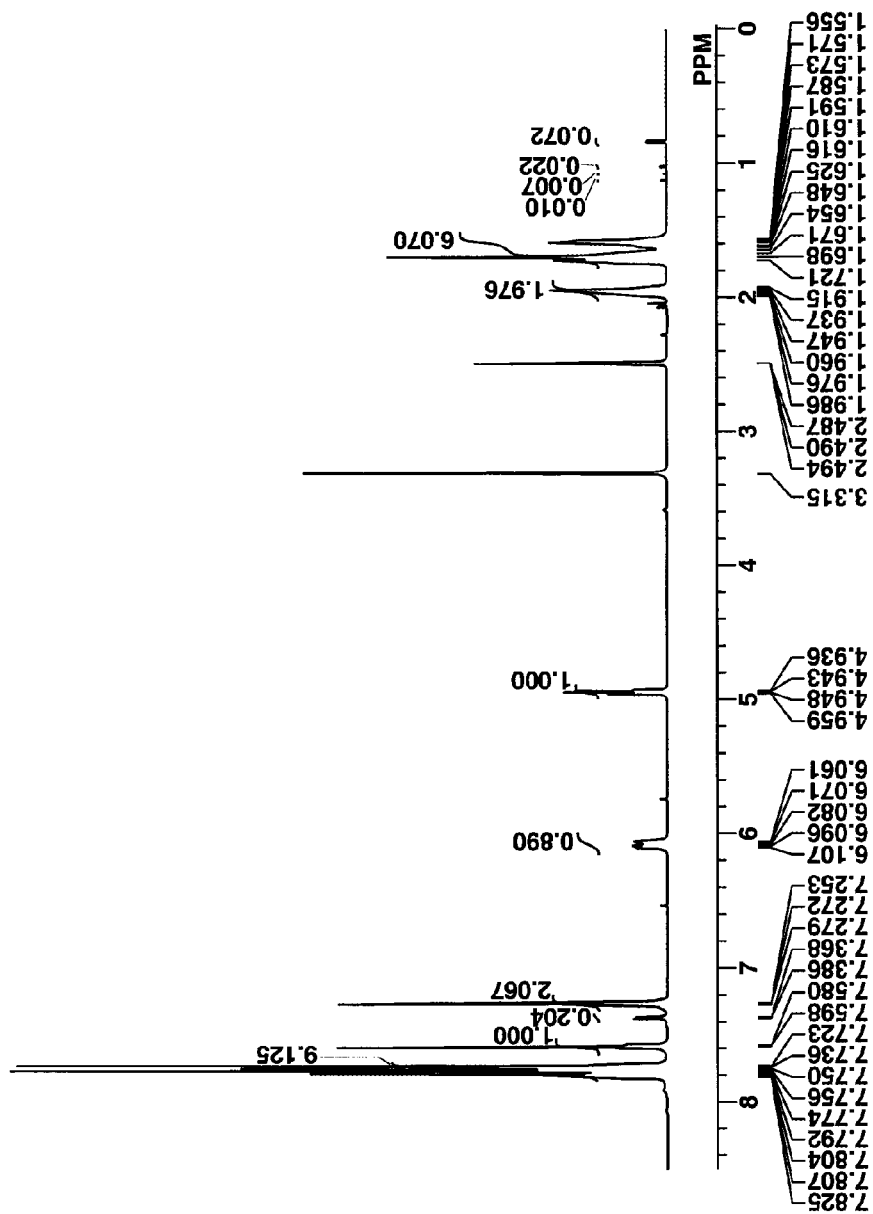
FIGS. 16 and 17 are diagrams showing $^1$H-NMR and $^{19}$F-NMR/DMSO-$d_6$ of PAG-8 in Synthesis Example 1-28.
Figure 17:
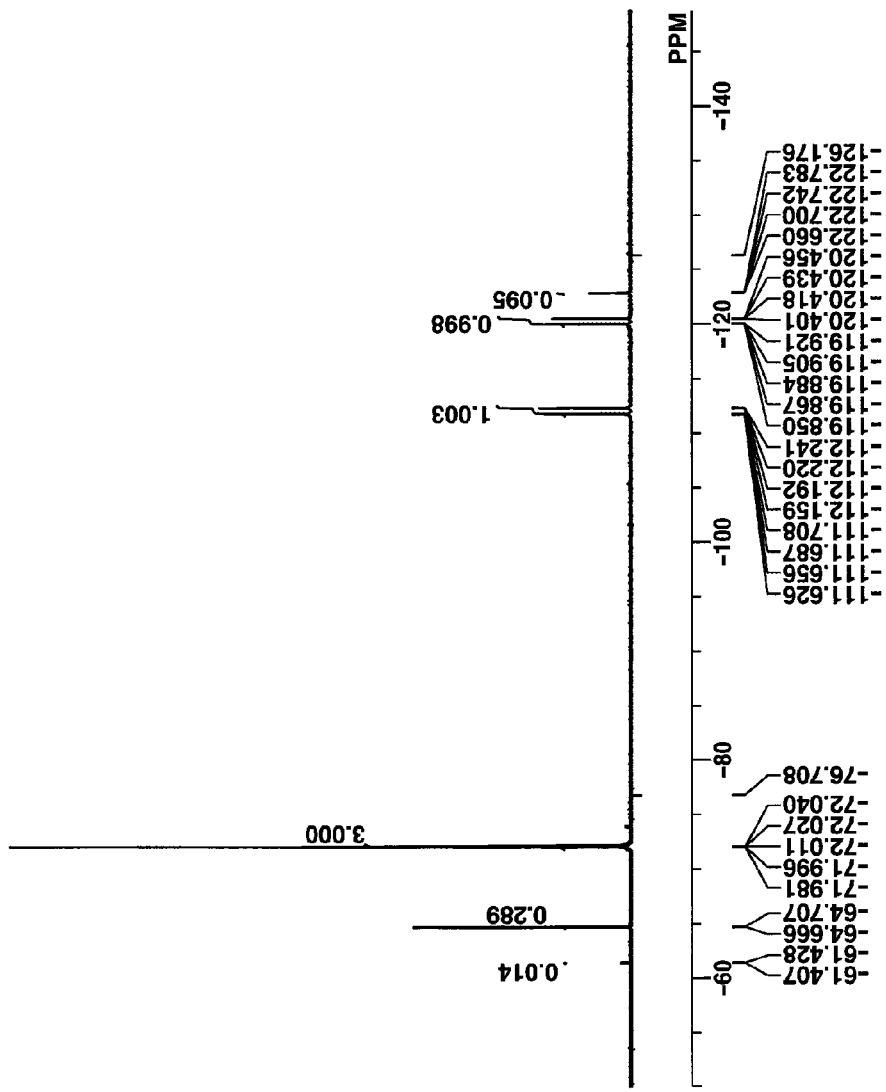

The target compound was analyzed by spectroscopy. The NMR spectra, $^1$H- and $^{19}$F-NMR/DMSO-$d_6$ are shown in FIGS. 16 and 17, respectively. Note that in $^1$H-NMR, traces of residual solvents (diisopropyl ether, MIBK, water) were observed. The data of IR spectroscopy and LC-MS are also shown.

IR spectrum (D-ATR)
3092, 2963, 2877, 1585, 1491, 1448, 1418, 1371, 1305, 1274, 1245, 1213, 1178, 1119, 1077, 1167, 990, 975, 886, 838, 750, 686, 669, 640, 583 cm$^{-1}$ LC-MS
Positive [M+H]$^+$ 575

Synthesis Example 1-29

Synthesis of 4-(2-methoxyethoxy)phenyl phenyl sulfide (PAG Intermediate 21)

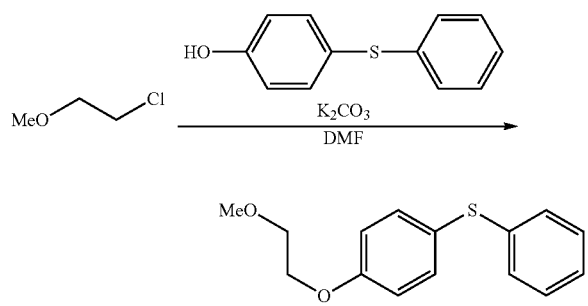

A solution was prepared by combining 10 g of 4-hydroxyphenyl phenyl sulfide which had been synthesized according to the well-known formulation, 5 g of 2-chloroethyl methyl ether, 7.4 g of potassium carbonate, and 20 g of DMF. The solution was aged at 80° C. for 16 hours. The aged solution was cooled to room temperature, to which 20 g of water was added to quench the reaction. To the solution, 40 g of toluene was added for extraction. The organic layer was separated and washed with sodium hydroxide aqueous solution and water in sequence. The organic layer was concentrated in vacuum, obtaining 13 g of the target compound, 4-(2-methoxyethoxy)phenyl phenyl sulfide as oily matter. Yield 93%.

Synthesis Example 1-30

Synthesis of 4-(2-methoxyethoxy)phenyl phenyl sulfoxide (PAG Intermediate 22)

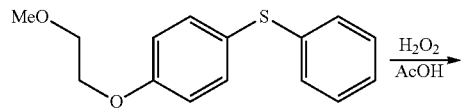

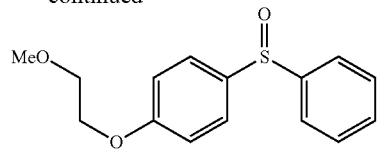

In 85 g of acetic acid was dissolved 12 g of 4-(2-methoxyethoxy)phenyl phenyl sulfide obtained in Synthesis Example 1-29. While the solution was maintained at an internal temperature of 30° C., 4.5 g of 35 wt % aqueous hydrogen peroxide was added dropwise. The reaction solution was aged at room temperature for 18 hours, after which under ice cooling, a mixture of 1.2 g sodium thiosulfate pentahydrate and 15 g water was added dropwise to quench the reaction. The solution was combined with 80 g of methylene chloride and 40 g of water for extraction. The organic layer was separated, washed with water, and concentrated in vacuum. On subsequent crystallization from ethyl acetate/hexane, 11 g of the target compound, 4-(2-methoxyethoxy)phenyl phenyl sulfoxide was obtained as white crystals. Yield 86%.

Synthesis Example 1-31

Synthesis of (4-fluorophenyl)-[4-(2-methoxyethoxy)phenyl]-phenylsulfonium 1,1,3,3,3-pentafluoro-2-hydroxypropane-1-sulfonate (PAG Intermediate 23)

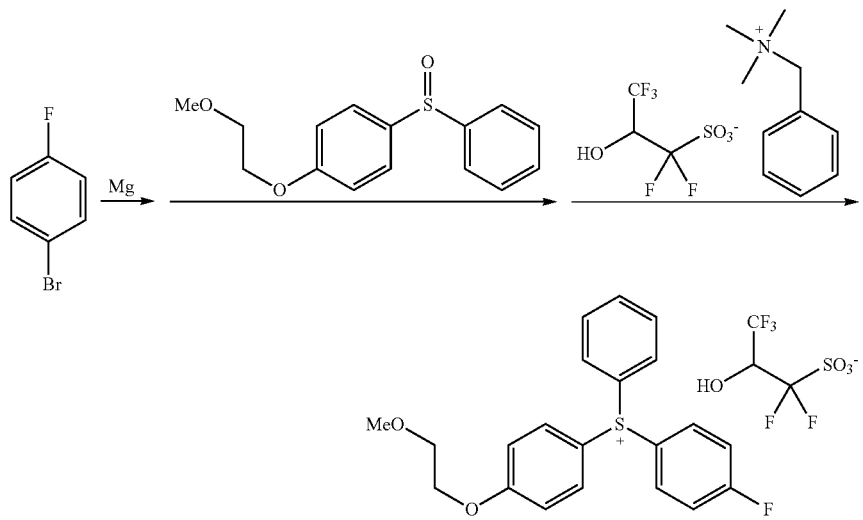

To a Grignard reagent prepared from 9.5 g of 1-bromo-4-fluorobenzene, 5 g of 4-(2-methoxyethoxy)phenyl phenyl sulfoxide obtained in Synthesis Example 1-30 and 10 g of methylene chloride were added. The contents were stirred for 10 minutes. Under ice cooling, 6 g of trimethylsilyl chloride was added dropwise to the solution, which was aged for 30 minutes. To the reaction solution, 30 g of 4 wt % dilute hydrochloric acid was added to quench the reaction, and the water layer was separated. To the water layer, 8 g of benzyltrimethylammonium 1,1,3,3,3-pentafluoro-2-hydroxypropane-1-sulfonate, which had been synthesized according to the method of JP-A 2012-107151, and 100 g of methylene chloride were added. After thorough stirring, the organic layer was separated, washed with water, and concentrated in vacuum. The residue was dissolved in 10 g of THF. The solution was combined with 100 g of diisopropyl ether and stirred. The supernatant was removed. The residue was concentrated in vacuum, obtaining 9 g of the target compound, (4-fluorophenyl)-[4-(2-methoxyethoxy)phenyl)]-phenylsulfonium 1,1,3,3,3-pentafluoro-2-hydroxypropane-1-sulfonate as oily matter. Yield 87%.

Synthesis Example 1-32

Synthesis of [4-(2-methoxyethoxy)phenyl]-[4-(1,1,3,3,3-pentafluoro-1-sulfonatopropan-2-yloxy)phenyl]-phenylsulfonium (PAG-9)

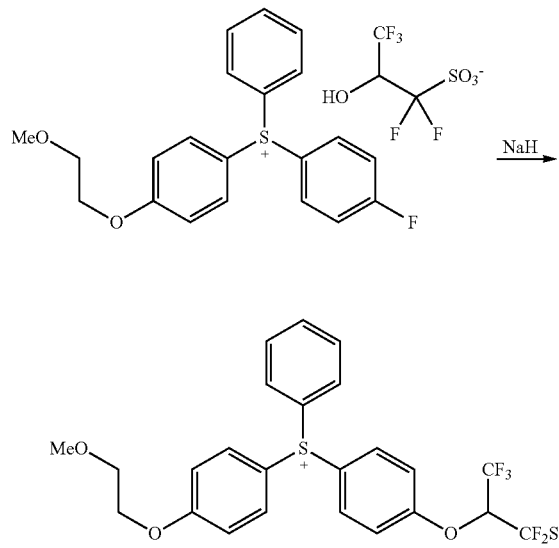

In 20 g of THF was dissolved 6.3 g of (4-fluorophenyl)-[4-(2-methoxyethoxy)phenyl]-phenylsulfonium 1,1,3,3,3-pentafluoro-2-hydroxypropane-1-sulfonate obtained in Synthesis Example 1-31. Under ice cooling, this solution was added dropwise to a mixture of 0.5 g sodium hydride and 20 g THF, followed by overnight stirring. Under ice cooling, 20 g of water was added dropwise to quench the reaction. The reaction solution was combined with 50 g of methylene chloride for extraction. The organic layer was separated and washed with water. It was combined with 10 g of MIBK and concentrated in vacuum. To the concentrate, 10 g of acetone and 50 g of diisopropyl ether were added for crystallization. The resulting crystals were collected by filtration and dried in vacuum, obtaining 5 g of the target compound, [4-(2-methoxyethoxy)phenyl]-[4-(1,1,3,3,3-pentafluoro-1-sulfonatopropan-2-yloxy)phenyl]-phenylsulfonium as white crystals. Yield 82%.

Figure 18:
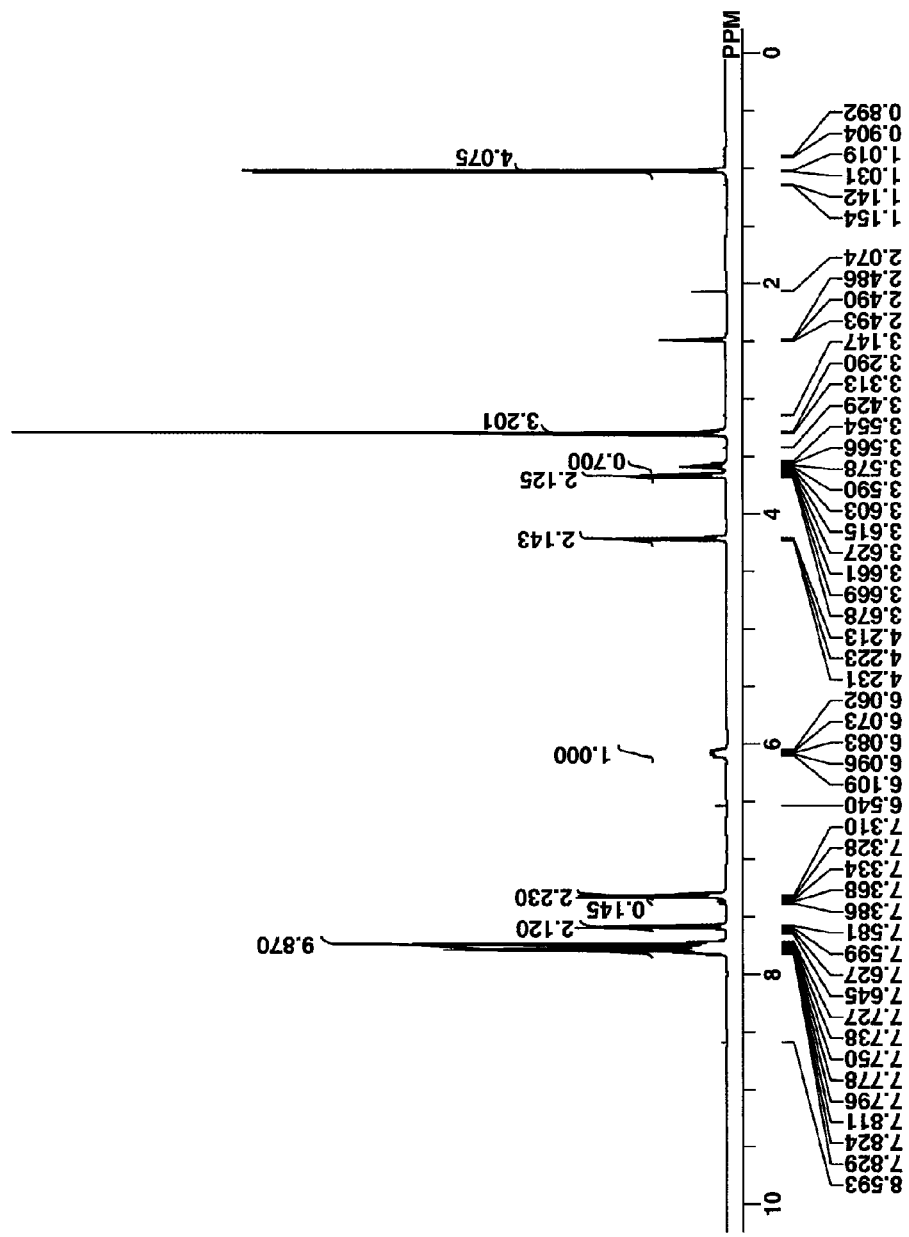
FIGS. 18 and 19 are diagrams showing $^1$H-NMR and $^{19}$F-NMR/DMSO-$d_6$ of PAG-9 in Synthesis Example 1-32.
Figure 19:
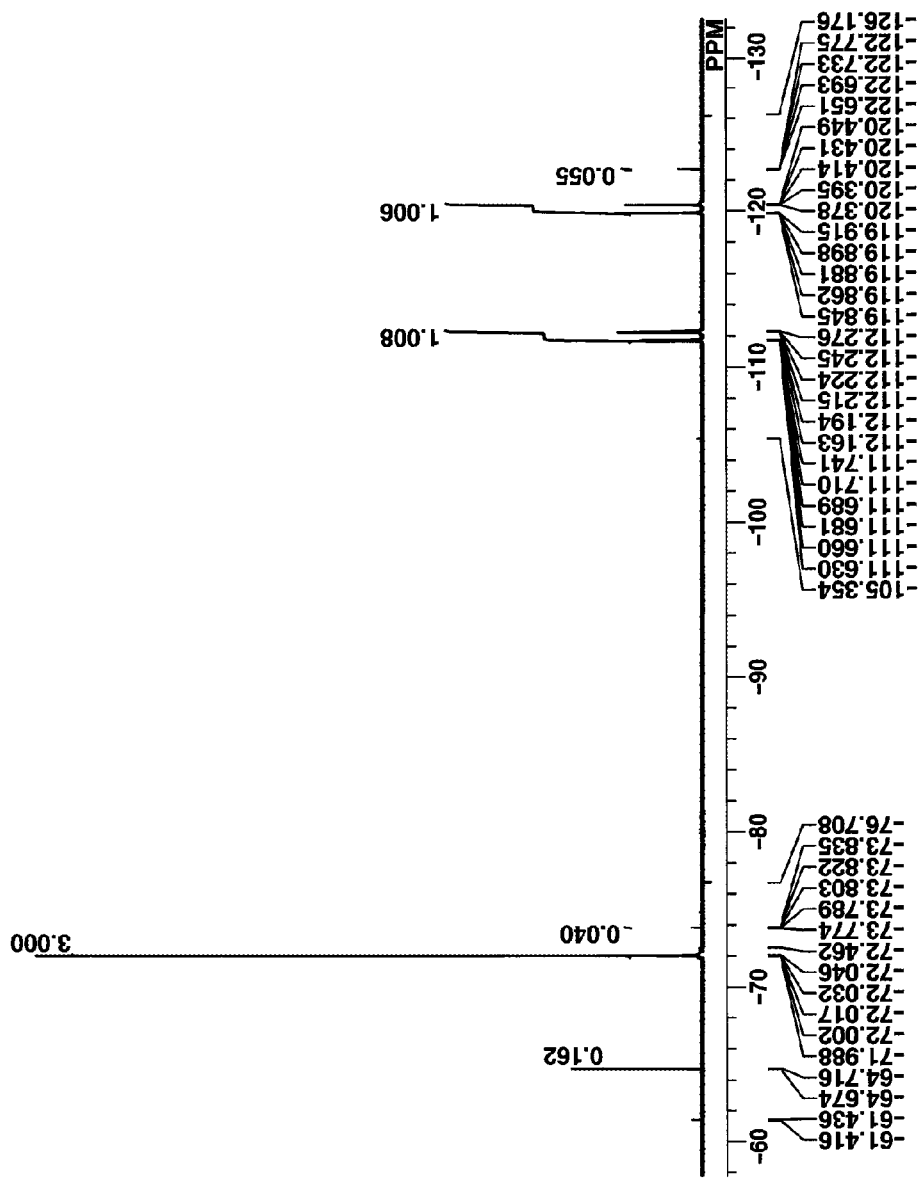

The target compound was analyzed by spectroscopy. The NMR spectra, $^1$H- and $^{19}$F-NMR/DMSO-$d_6$ are shown in FIGS. 18 and 19, respectively. Note that in $^1$H-NMR, traces of residual solvents (diisopropyl ether, water) were observed. The data of IR spectroscopy and LC-MS are also shown.

IR spectrum (D-ATR)

3098, 2973, 2933, 2892, 1588, 1494, 1448, 1417, 1369, 1311, 1245, 1182, 1125, 1073, 992, 923, 884, 834, 752, 685, 642, 584 cm$^{-1}$

LC-MS

Positive [M+H]$^+$ 565

Synthesis Example 1-33

Synthesis of bis[4-(2-methoxyethoxy)phenyl]sulfide (PAG Intermediate 24)

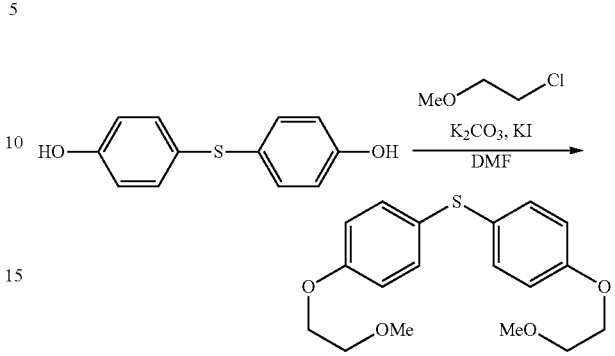

A solution was prepared by combining 25.0 g of bis(4-hydroxyphenyl) sulfide, 20.7 g of 2-chloroethyl methyl ether, 31.7 g of potassium carbonate, 3.62 g of potassium iodide, and 50 g of DMF. The solution was aged at 80° C. for 1 week. Under ice cooling, 50 g of water was added to the solution to quench the reaction. To the solution, 50 g of toluene and 50 g of hexane were added. The organic layer was separated and washed with water. On subsequent concentration in vacuum, 28.5 g of the target compound, bis[4-(2-methoxy-ethoxy)phenyl]sulfide was obtained as oily matter. Yield 74%.

Synthesis Example 1-34

Synthesis of bis[4-(2-methoxyethoxy)phenyl]sulfoxide (PAG Intermediate 25)

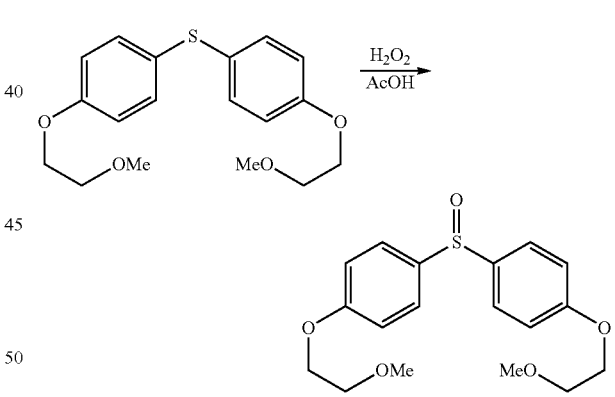

In 200 g of acetic acid was dissolved 28.5 g of bis[4-(2-methoxyethoxy)phenyl]sulfide obtained in Synthesis Example 1-33. While the solution was maintained at an internal temperature of 40° C., 7.87 g of 35 wt % aqueous hydrogen peroxide was added dropwise. The reaction solution was aged at room temperature for 15 hours, after which under ice cooling, a mixture of 2.0 g sodium thiosulfate pentahydrate and 10 g water was added dropwise to quench the reaction. The solution was concentrated in vacuum and combined with 100 g of toluene, 50 g of ethyl acetate and 50 g of water. The organic layer was separated, washed with water, and concentrated in vacuum. The concentrate was crystallized from 20 g of ethyl acetate and 300 g of hexane, obtaining 27.8 g of the target compound, bis[4-(2-methoxy-ethoxy)phenyl]sulfoxide as white crystals. Yield 91%.

Synthesis Example 1-35

Synthesis of (4-fluorophenyl)-bis[4-(2-methoxy-ethoxy)-phenyl]sulfonium 1,1,3,3,3-pentafluoro-2-hydroxypropane-1-sulfonate (PAG Intermediate 26)

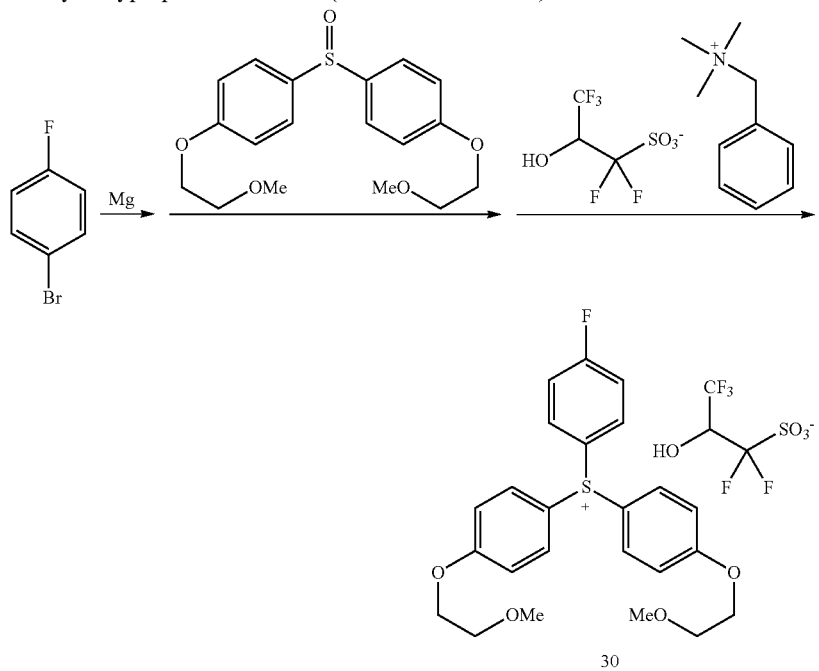

To a Grignard reagent prepared from 198 g of 1-bromo-4-fluorobenzene, 27.8 g of bis[4-(2-methoxyethoxy)-phenyl] sulfoxide obtained in Synthesis Example 1-34 and 40 g of methylene chloride were added. The contents were stirred for 30 minutes. Under ice cooling, 24.1 g of trimethylsilyl chloride was added dropwise to the solution, which was aged for 30 minutes. To the reaction solution, 13.2 g of 20 wt % hydrochloric acid and 100 g of water were added to quench the reaction, and the water layer was separated. To the water layer, 30.8 g of benzyltrimethylammonium 1,1,3,3,3-pentafluoro-2-hydroxypropane-1-sulfonate, which had been synthesized according to the method of JP-A 2012-107151, and 100 g of methylene chloride were added. After thorough stirring, the organic layer was separated, washed with water, and concentrated in vacuum. The residue was dissolved in 20 g of THF. The solution was combined with 200 g of diisopropyl ether and stirred. The supernatant was removed. The residue was concentrated in vacuum, obtaining 42.4 g of the target compound, (4-fluorophenyl)-bis[4-(2-methoxyethoxy)phenyl]sulfonium 1,1,3,3,3-pentafluoro-2-hydroxypropane-1-sulfonate as oily matter. Yield 87%.

Synthesis Example 1-36

Synthesis of bis[4-(2-methoxyethoxy)phenyl]-[4-(1,1,3,3,3-pentafluoro-1-sulfonatopropan-2-yloxy)phenyl]sulfonium (PAG-10)

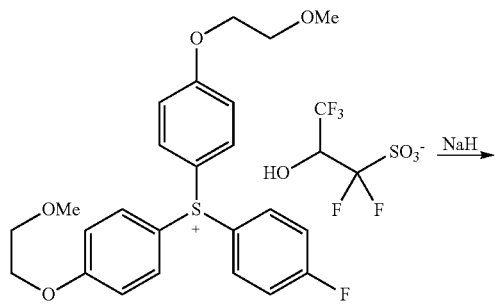

In 50 g of THF was dissolved 23.5 g of (4-fluorophenyl)-bis[4-(2-methoxyethoxy)phenyl]sulfonium 1,1,3,3,3-pentafluoro-2-hydroxypropane-1-sulfonate obtained in Synthesis Example 1-35. Under ice cooling, this solution was added dropwise to a mixture of 1.6 g sodium hydride and 50 g THF, followed by overnight stirring. Under ice cooling, 100 g of water was added dropwise to quench the reaction. The reaction solution was combined with 200 g of MIBK. The organic layer was separated and washed with 100 g of 5 wt % dilute hydrochloric acid and 50 g of water in sequence. The organic layer was separated and concentrated in vacuum. To the concentrate, 20 g of acetone and 200 g of diisopropyl ether were added for crystallization. The resulting crystals were collected by filtration and dried in vacuum, obtaining 20.8 g of the target compound, bis[4-(2-methoxyethoxy)-phenyl]-[4-(1,1,3,3,3-pentafluoro-1-sulfonatopropan-2-yloxy)-phenyl] sulfonium as white crystals. Yield 93%.

Figure 20:
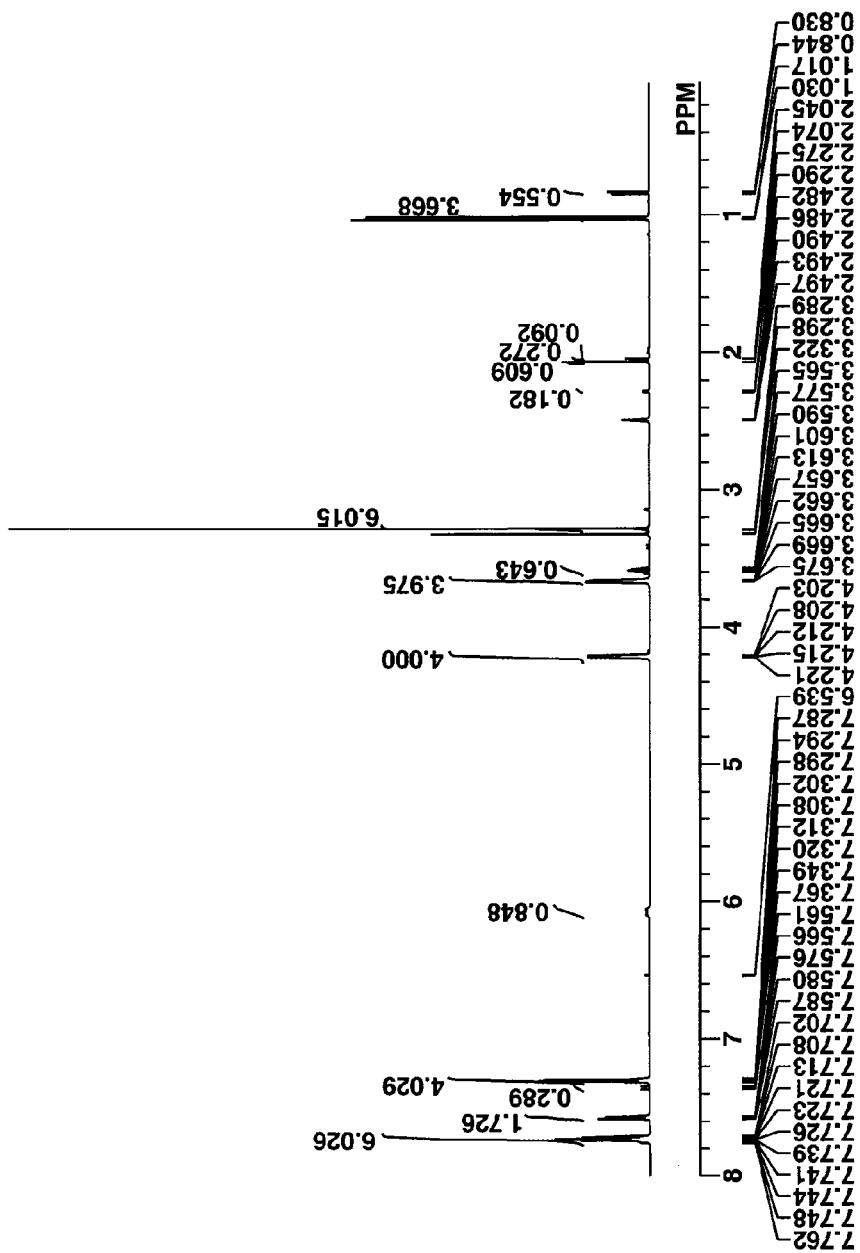
FIGS. 20 and 21 are diagrams showing $^1$H-NMR and $^{19}$F-NMR/DMSO-$d_6$ of PAG-10 in Synthesis Example 1-36.
Figure 21:
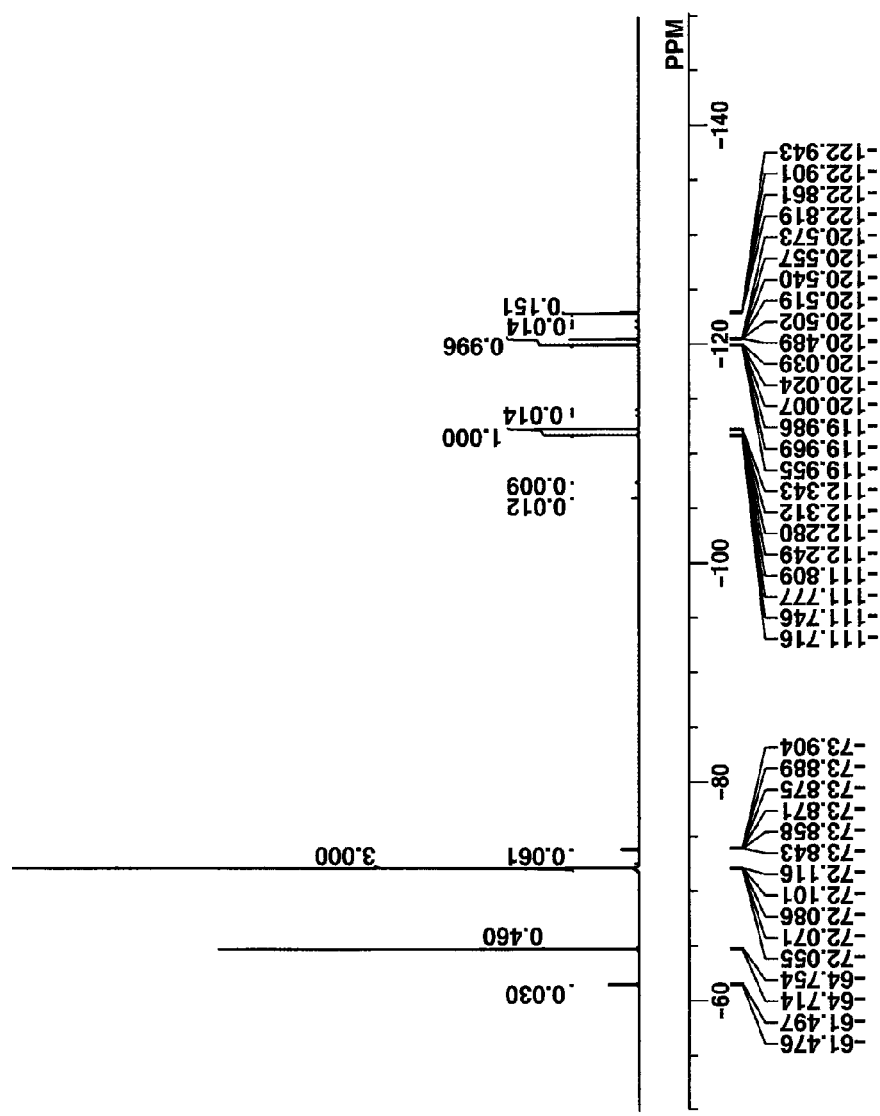

The target compound was analyzed by spectroscopy. The NMR spectra, $^1$H- and $^{19}$F-NMR/DMSO-$d_6$ are shown in FIGS. 20 and 21, respectively. Note that in $^1$H-NMR, traces of residual solvents (diisopropyl ether, MIBK, water) were observed. The data of IR spectroscopy and LC-MS are also shown.

IR spectrum (D-ATR)
3096, 2932, 2889, 1709, 1588, 1494, 1453, 1417, 1369, 1342, 1311, 1245, 1180, 1126, 1075, 1047, 991, 923, 884, 833, 641, 584, 555 cm$^{-1}$
LC-MS
Positive [M+H]$^+$ 639

Synthesis Example 1-37

Synthesis of 2-(2-methoxyethoxy)ethyl p-toluenesulfonate (PAG Intermediate 27)

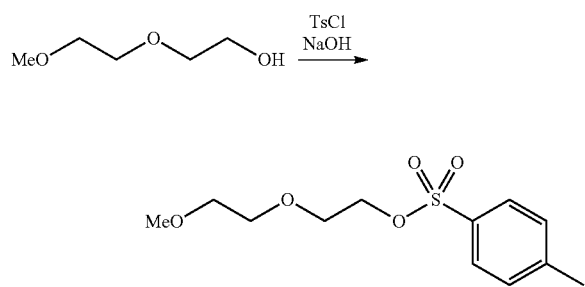

Under ice cooling, a mixture of 515 g of p-toluenesulfonyl chloride and 500 ml of THF was added dropwise to a mixture of 295 g of 2-(2-methoxyethoxy)ethanol, 589 g of 25 wt % NaOH aqueous solution, and 2,500 ml of THF. The reaction solution was aged for 1.5 hours, after which 1,500 ml of water was added to quench the reaction. The organic layer was separated and concentrated in vacuum. The concentrate was dissolved in a mixture of 660 ml toluene and 330 ml hexane, and washed with water. The organic layer was concentrated in vacuum, obtaining 684.74 g of the target compound, 2-(2-methoxyethoxy)ethyl p-toluenesulfonate as oily matter. Yield 97%.

Synthesis Example 1-38

Synthesis of 4-[2-(2-methoxyethoxy)ethoxy]phenyl sulfide (PAG Intermediate 28)

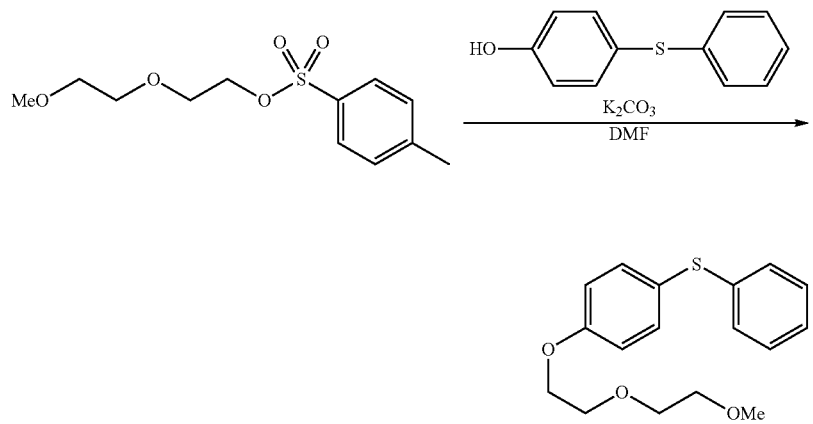

A solution was prepared by combining 107.4 g of 2-(2-methoxyethoxy)ethyl p-toluenesulfonate obtained in Synthesis Example 1-37, 92.3 g of 4-hydroxyphenyl phenyl sulfide, 54.1 g of potassium carbonate, and 220 g of DMF. The solution was aged at 90° C. for 16 hours. The solution was cooled to room temperature, after which 300 g of water was added to quench the reaction. The solution was combined with 200 g of toluene and 200 g of hexane. The organic layer was separated, washed with water, and concentrated in vacuum, obtaining 109.3 g of the target compound, 4-[2-(2-methoxyethoxy)ethoxy]phenyl phenyl sulfide as oily matter. Yield 92%.

Synthesis Example 1-39

Synthesis of 4-[2-(2-methoxyethoxy)ethoxy]phenyl phenyl sulfoxide (PAG Intermediate 29)

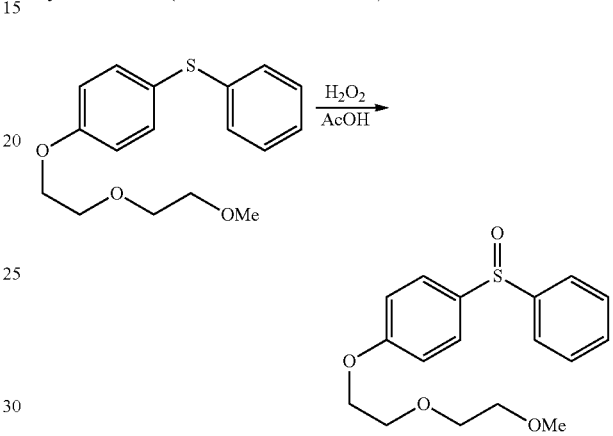

In 770 g of acetic acid was dissolved 109.3 g of 4-[2-(2-methoxyethoxy)ethoxy]phenyl phenyl sulfide obtained in Synthesis Example 1-38. While the solution was maintained at an internal temperature of 30° C., 34.5 g of 35 wt % aqueous hydrogen peroxide was added dropwise. The reaction solution was aged at room temperature for 18 hours, after which under ice cooling, a mixture of 8.8 g sodium thiosulfate pentahydrate and 80 g water was added dropwise to quench the reaction. The solution was combined with 200 g of toluene, 200 g of ethyl acetate and 200 g of water. The organic layer was separated, washed with water, and concentrated in vacuum, obtaining 112.9 g of the target compound, 4-[2-(2-methoxyethoxy)ethoxy]phenyl phenyl sulfoxide as oily matter. Yield 92%.

Synthesis Example 1-40

Synthesis of (4-fluorophenyl)-[4-{2-(2-methoxyethoxy)-ethoxy}phenyl]-phenylsulfonium 1,1,3,3,3-pentafluoro-2-hydroxypropane-1-sulfonate (PAG Intermediate 30)

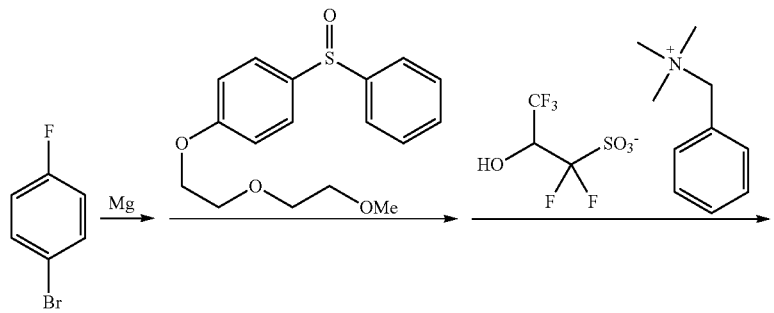

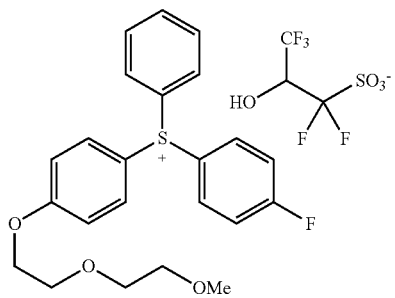

To a Grignard reagent prepared from 175 g of 1-bromo-4-fluorobenzene, 112.9 g of 4-[2-(2-methoxyethoxy)-ethoxy]phenyl phenyl sulfoxide obtained in Synthesis Example 1-39 and 150 g of methylene chloride were added. The contents were stirred for 10 minutes. Under ice cooling, 108.6 g of trimethylsilyl chloride was added dropwise to the solution, which was aged for 1 hour. To the reaction solution, 312 g of 4 wt % dilute hydrochloric acid was added to quench the reaction, and the water layer was separated. To the water layer, 136.9 g of benzyltrimethylammonium 1,1,3,3,3-pentafluoro-2-hydroxypropane-1-sulfonate, which had been synthesized according to the method of JP-A 2012-107151, and 500 g of methylene chloride were added. After thorough stirring, the organic layer was separated, washed with water, and concentrated in vacuum. The residue was dissolved in 100 g of THF. The solution was combined with 1,000 g of diisopropyl ether and stirred. The supernatant was removed. The residue was concentrated in vacuum, obtaining 181.1 g of the target compound, (4-fluorophenyl)-[4-{2-(2-methoxyethoxy)ethoxy}phenyl]-phenylsulfonium 1,1,3,3,3-pentafluoro-2-hydroxypropane-1-sulfonate as oily matter. Yield 87%.

Synthesis Example 1-41

Synthesis of 4-[2-(2-methoxyethoxy)ethoxy]phenyl-[4-(1,1,3,3,3-pentafluoro-1-sulfonatopropan-2-yloxy)phenyl]-phenylsulfonium (PAG-11)

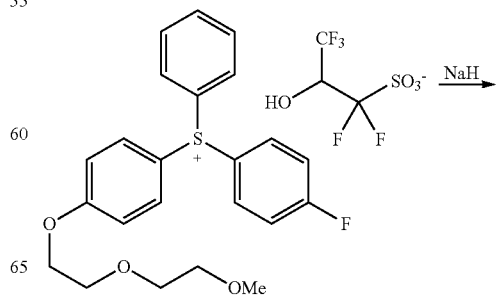

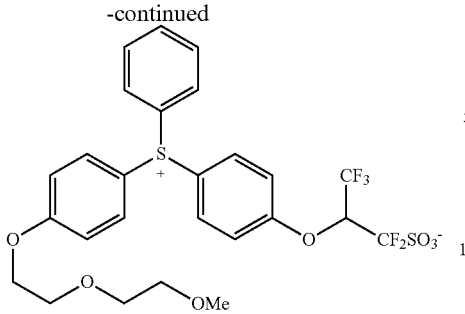

In 420 g of THF was dissolved 150 g of (4-fluorophenyl)-[4-{2-(2-methoxyethoxy)ethoxy}phenyl]-phenylsulfonium 1,1,3,3,3-pentafluoro-2-hydroxypropane-1-sulfonate obtained in Synthesis Example 1-40. Under ice cooling, this solution was added dropwise to a mixture of 10.3 g sodium hydride and 420 g THF, followed by overnight stirring. Under ice cooling, 400 g of water was added dropwise to quench the reaction. The reaction solution was combined with 700 g of MIBK. The organic layer was separated and washed with water. The organic layer was separated and concentrated in vacuum. To the residue, 600 g of methylene chloride and 150 g of water were added. The organic layer was separated, washed with water, and concentrated in vacuum. To the concentrate, 300 g of methylene chloride and 3,500 g of diisopropyl ether were added for crystallization. The resulting crystals were collected by filtration and dried in vacuum, obtaining 136.7 g of the target compound, 4-[2-(2-methoxyethoxy)ethoxy]phenyl-[4-(1,1,3,3,3-pentafluoro-1-sulfonatopropan-2-yloxy)phenyl]-phenylsulfonium as white crystals. Yield 81%.

Figure 22:
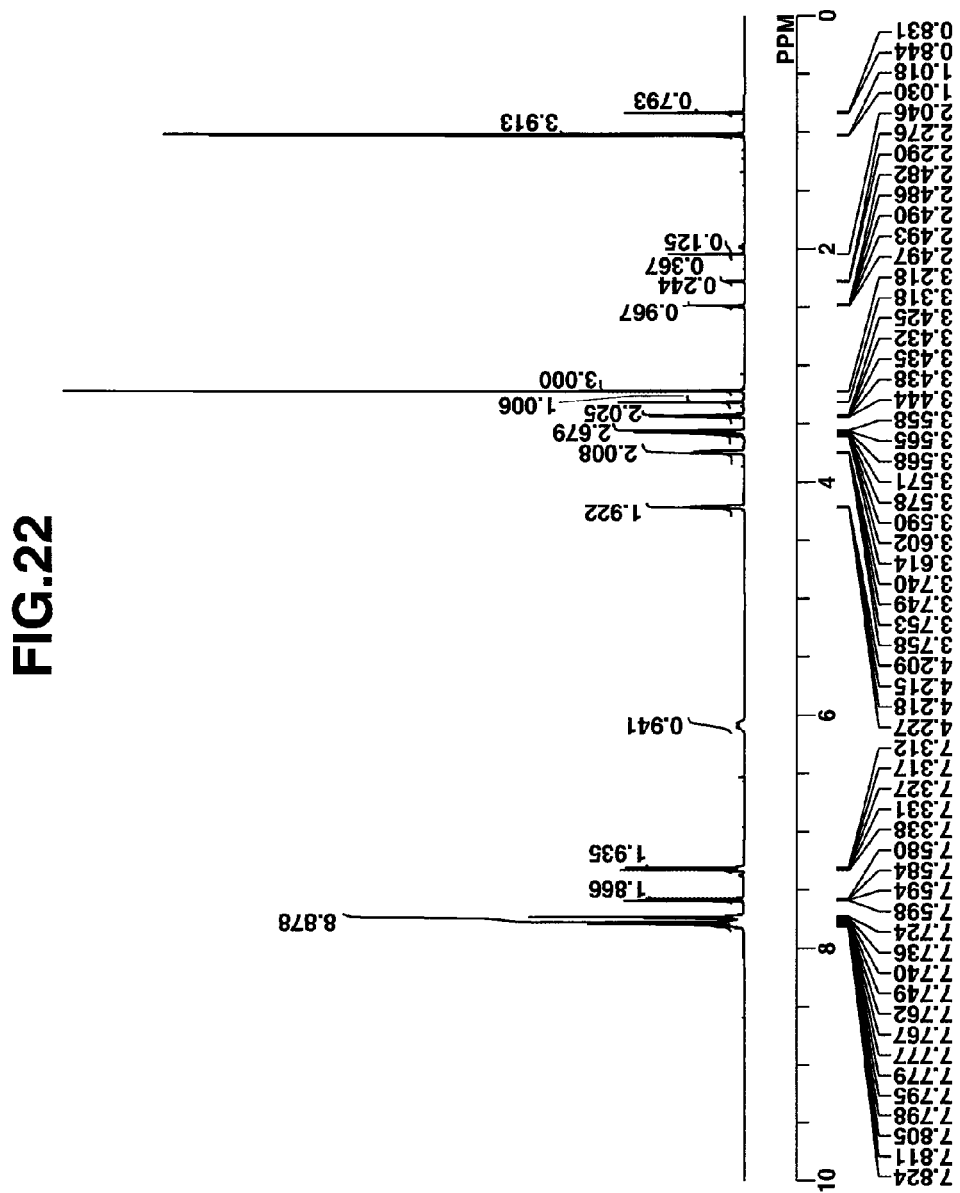
FIGS. 22 and 23 are diagrams showing $^1$H-NMR and $^{19}$F-NMR/DMSO-$d_6$ of PAG-11 in Synthesis Example 1-41.
Figure 23:
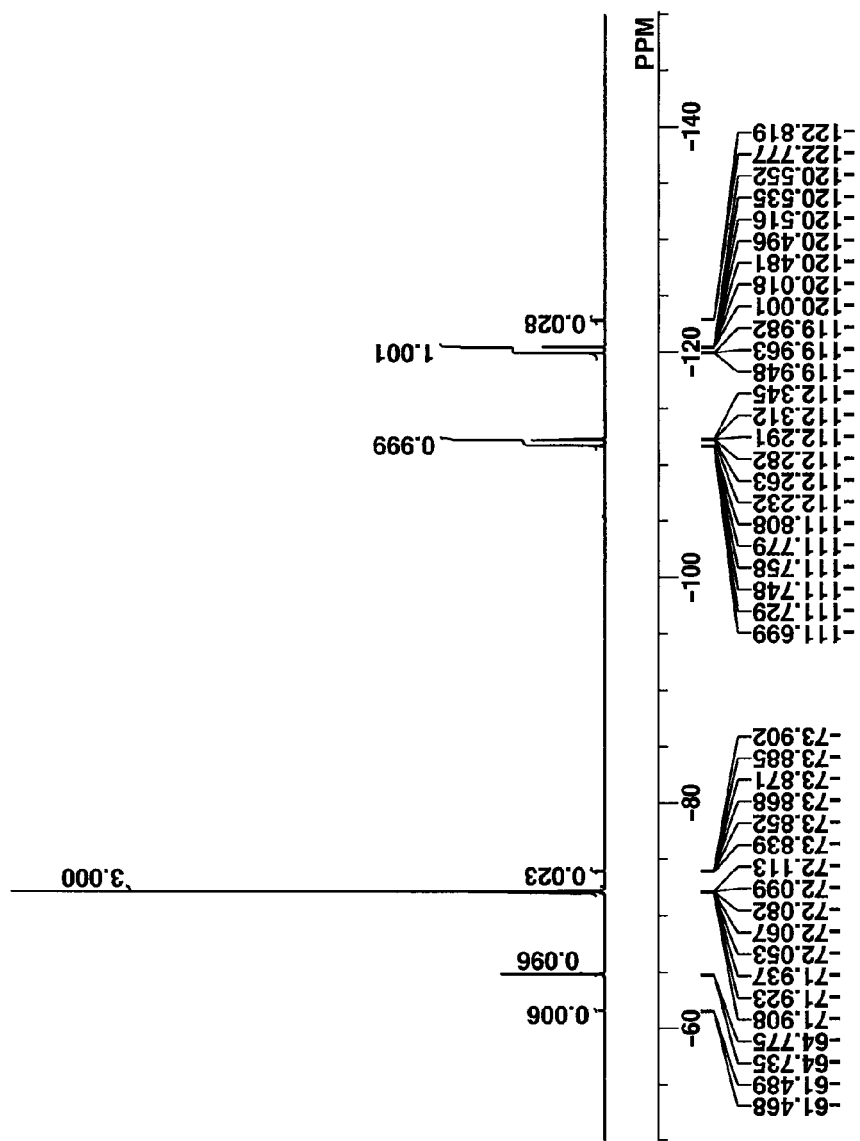

The target compound was analyzed by spectroscopy. The NMR spectra, $^1$H- and $^{19}$F-NMR/DMSO-$d_6$ are shown in FIGS. 22 and 23, respectively. Note that in $^1$H-NMR, traces of residual solvents (diisopropyl ether, MIBK, water) were observed. The data of IR spectroscopy and LC-MS are also shown.

IR spectrum (D-ATR)
3098, 2927, 1587, 1494, 1448, 1417, 1367, 1311, 1245, 1181, 1110, 1075, 991, 925, 883, 835, 752, 685, 641, 582 cm$^{-1}$ LC-MS
Positive [M+H]$^+$ 609

Synthesis Example 1-42

Synthesis of
bis[4-[2-(2-methoxyethoxy)ethoxy]phenyl]sulfide
(PAG Intermediate 31)

A solution was prepared by combining 41.1 g of 2-(2-methoxyethoxy)ethyl p-toluenesulfonate obtained in Synthesis Example 1-37, 13.8 g of bis(4-hydroxyphenyl) sulfide, 18.3 g of potassium carbonate, and 120 g of DMF. The solution was aged at 90° C. for 16 hours. The solution was cooled to room temperature, after which 20 g of water was added to quench the reaction. The solution was combined with 150 g of toluene. The organic layer was separated, washed with water, and concentrated in vacuum, obtaining 26.6 g of the target compound, bis[4-[2-(2-methoxyethoxy)ethoxy]phenyl]sulfide as oily matter. Yield 99%.

Synthesis Example 1-43

Synthesis of
bis[4-[2-(2-methoxyethoxy)ethoxy]phenyl]sulfoxide
(PAG Intermediate 32)

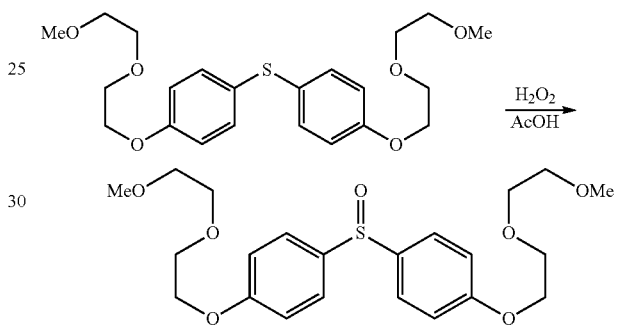

In 200 g of acetic acid was dissolved 26.6 g of bis[4-[2-(2-methoxyethoxy)ethoxy]phenyl]sulfide obtained in Synthesis Example 1-42. While the solution was maintained at an internal temperature of 30° C., 6.4 g of 35 wt % aqueous hydrogen peroxide was added dropwise. The reaction solution was aged at room temperature for 12 hours, after which under ice cooling, a mixture of 0.5 g sodium thiosulfate pentahydrate and 20 g water was added dropwise to quench the reaction. The solution was combined with 200 g of toluene and 100 g of water. The organic layer was separated, washed with water, and concentrated in vacuum, obtaining 26.1 g of the target compound, bis[4-[2-(2-methoxyethoxy)ethoxy]phenyl]sulfoxide as oily matter. Yield 95%.

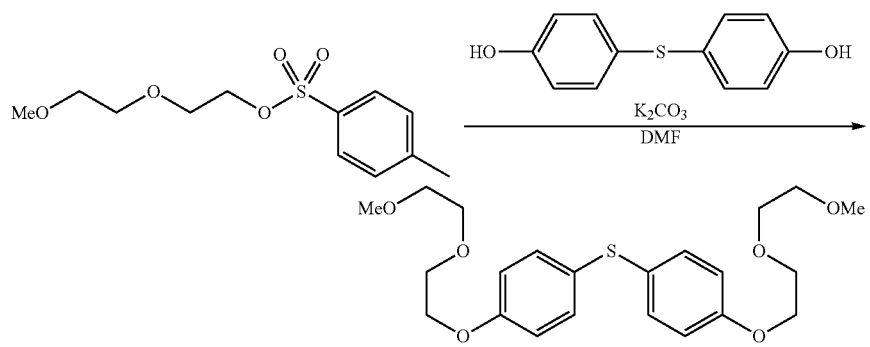

Synthesis Example 1-44

Synthesis of (4-fluorophenyl)-bis[4-{2-(2-methoxy-ethoxy)-ethoxy}phenyl]sulfonium 1,1,3,3,3-pentafluoro-2-hydroxypropane-1-sulfonate (PAG Intermediate 33)

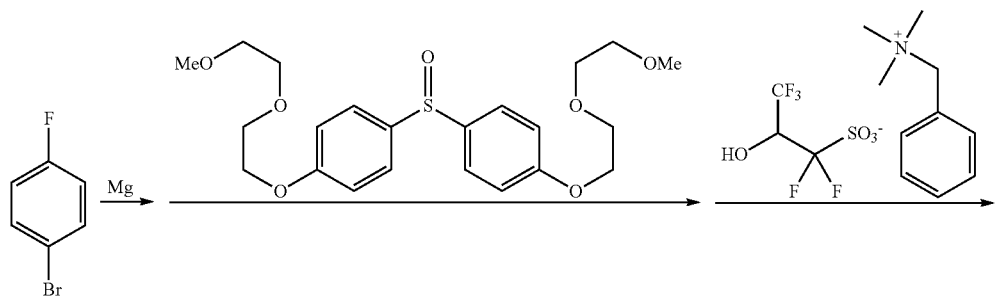

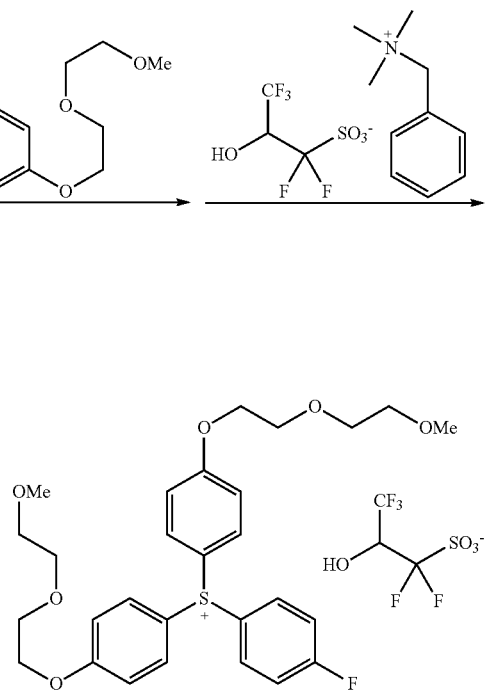

To a Grignard reagent prepared from 31.5 g of 1-bromo-4-fluorobenzene, 26.1 g of bis[4-[2-(2-methoxyethoxy)-ethoxy]phenyl]sulfoxide obtained in Synthesis Example 1-43 and 75 g of methylene chloride were added. The contents were stirred for 10 minutes. Under ice cooling, 19.5 g of trimethylsilyl chloride was added dropwise to the solution, which was aged for 1 hour. To the reaction solution, 100 g of 5 wt % dilute hydrochloric acid was added to quench the reaction, and the water layer was separated. To the water layer, 22.8 g of benzyltrimethylammonium 1,1,3,3,3-pentafluoro-2-hydroxypropane-1-sulfonate, which had been synthesized according to the method of JP-A 2012-107151, and 200 g of methylene chloride were added. After thorough stirring, the organic layer was separated, washed with water, and concentrated in vacuum. The residue was dissolved in 40 g of THF. The solution was combined with 200 g of diisopropyl ether and stirred. The supernatant was removed. The residue was concentrated in vacuum, obtaining 39.2 g of the target compound, (4-fluorophenyl)-bis[4-{2-(2-methoxy-ethoxy)ethoxy}-phenyl]sulfonium 1,1,3,3,3-pentafluoro-2-hydroxypropane-1-sulfonate as oily matter. Yield 86%.

Synthesis Example 1-45

Synthesis of bis[4-[2-(2-methoxyethoxy)ethoxy]phenyl]-[4-(1,1,3,3,3-pentafluoro-1-sulfonatopropan-2-yloxy)phenyl]-sulfonium (PAG-12)

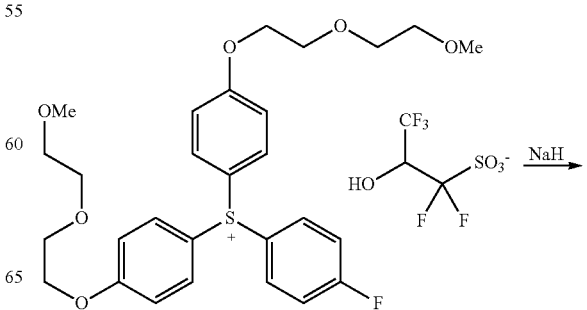

-continued

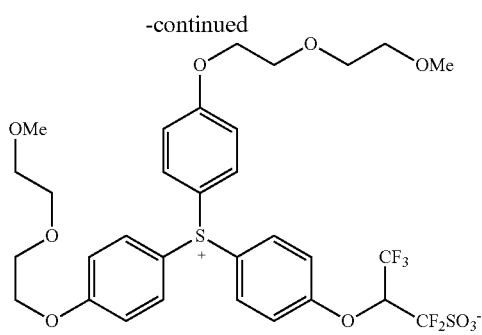

In 280 g of THF was dissolved 39.2 g of (4-fluorophenyl)-bis[4-{2-(2-methoxyethoxy)ethoxy}phenyl]-sulfonium 1,1,3,3,3-pentafluoro-2-hydroxypropane-1-sulfonate obtained in Synthesis Example 1-44. Under ice cooling, this solution was added dropwise to a mixture of 2.4 g sodium hydride and 280 g THF, followed by overnight stirring. Under ice cooling, 100 g of water was added dropwise to quench the reaction. The reaction solution was combined with 700 g of MIBK. The organic layer was separated and washed with 200 g of 5 wt % dilute hydrochloric acid and 200 g of water in sequence. The organic layer was separated and concentrated in vacuum. To the concentrate, 500 g of diisopropyl ether was added for crystallization. The resulting crystals were collected by filtration and dried in vacuum, obtaining 34.9 g of the target compound, bis[4-[2-(2-methoxyethoxy)ethoxy]-phenyl]-[4-(1,1,3,3,3-pentafluoro-1-sulfonatopropan-2-yloxy)-phenyl] sulfonium as white crystals. Yield 93%.

Figure 24:
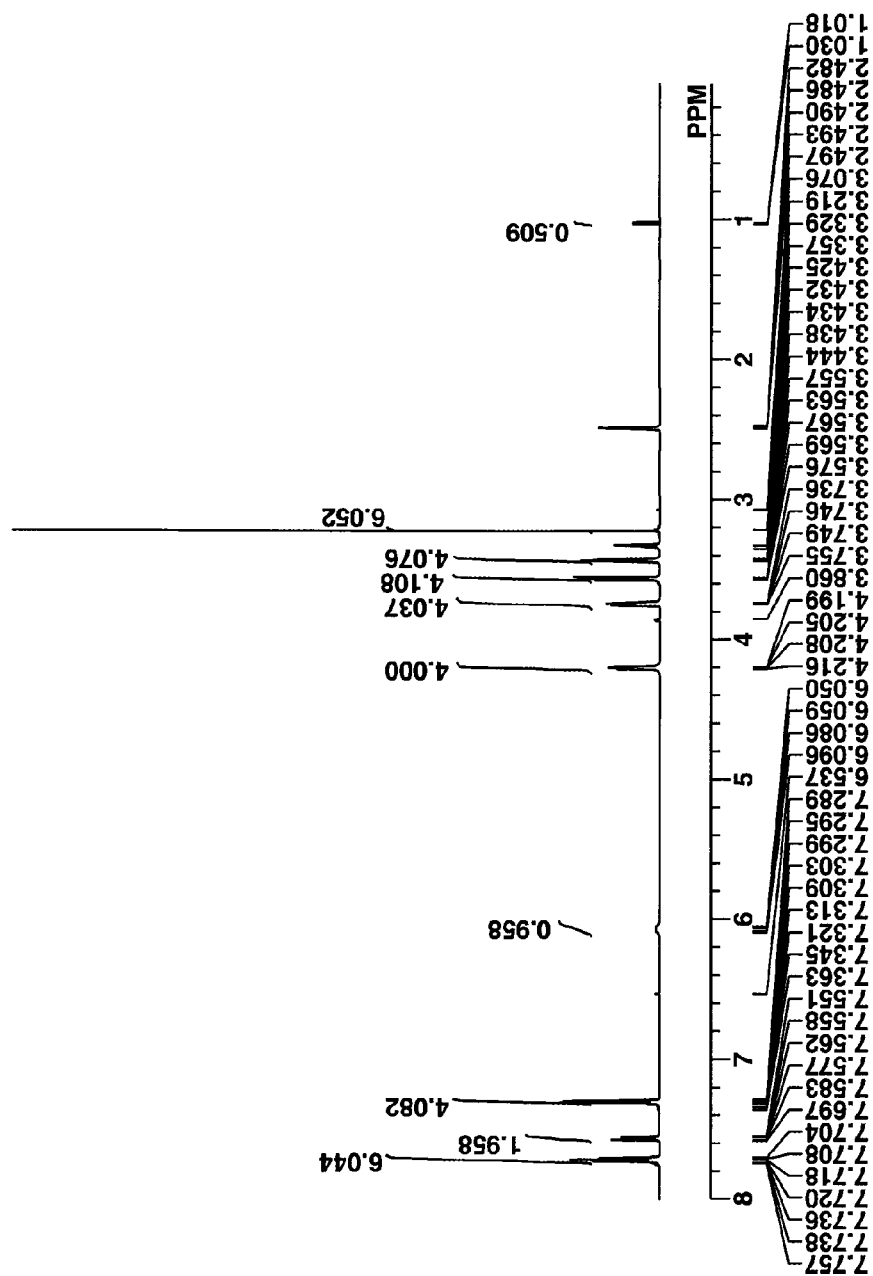
FIGS. 24 and 25 are diagrams showing $^1$H-NMR and $^{19}$F-NMR/DMSO-$d_6$ of PAG-12 in Synthesis Example 1-45.
Figure 25:
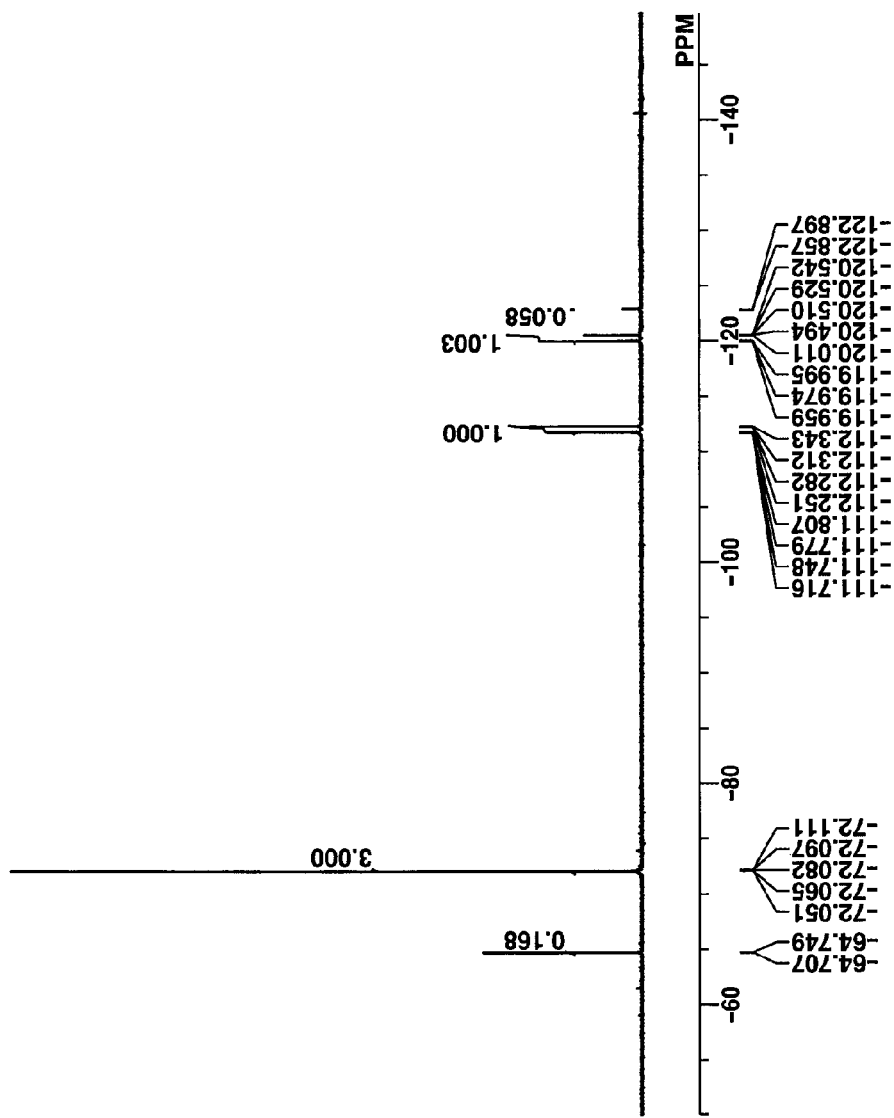

The target compound was analyzed by spectroscopy. The NMR spectra, $^1$H- and $^{19}$F-NMR/DMSO-$d_6$ are shown in FIGS. 24 and 25, respectively. Note that in $^1$H-NMR, traces of residual solvents (diisopropyl ether, MIBK, water) were observed. The data of IR spectroscopy and LC-MS are also shown.

IR spectrum (D-ATR)
3096, 2880, 1587, 1493, 1452, 1417, 1356, 1309, 1241, 1179, 1107, 1075, 990, 925, 883, 833, 710, 640, 577, 554 cm$^{-1}$ LC-MS
Positive [M+H]$^+$ 727

Synthesis Example 1-46

Synthesis of bis(3,5-dimethylphenyl) sulfoxide (PAG Intermediate 34)

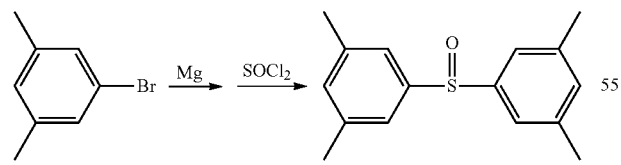

Under ice cooling, a mixture of 16 g thionyl chloride and 32 g THF was added dropwise to a Grignard reagent which had been prepared from 50 g of 1-bromo-3,5-dimethylbenzene. The reaction solution was aged for 30 minutes, after which under ice cooling, 130 g of 3 wt % hydrochloric acid was added dropwise to quench the reaction. The reaction solution was combined with 150 g of toluene. The organic layer was separated, washed with water and concentrated in vacuum. To the residue, hexane was added for crystallization. The resulting crystals were collected by filtration and dried in vacuum, obtaining 21 g of the target compound, bis(3,5-dimethylphenyl) sulfoxide as white crystals. Yield 60%.

Synthesis Example 1-47

Synthesis of bis(3,5-dimethylphenyl)-(4-fluorophenyl)-sulfonium bromide (PAG Intermediate 35)

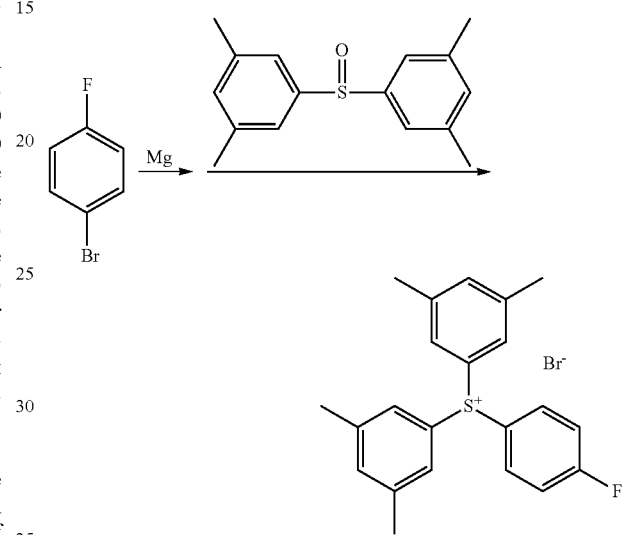

To a Grignard reagent prepared from 79 g of 1-bromo-4-fluorobenzene, 13 g of bis(3,5-dimethylphenyl) sulfoxide obtained in Synthesis Example 1-46 and 50 g of methylene chloride were added. Under ice cooling, 16 g of trimethylsilyl chloride was added dropwise to the solution, which was aged for 30 minutes. To the reaction solution, 50 g of 3 wt % dilute hydrochloric acid was added to quench the reaction. The organic layer was separated. Without further purification, it was ready for use in the subsequent reaction.

Synthesis Example 1-48

Synthesis of bis(3,5-dimethylphenyl)-(4-fluorophenyl)-sulfonium 1,1,3,3,3-pentafluoro-2-hydroxypropane-1-sulfonate (PAG Intermediate 36)

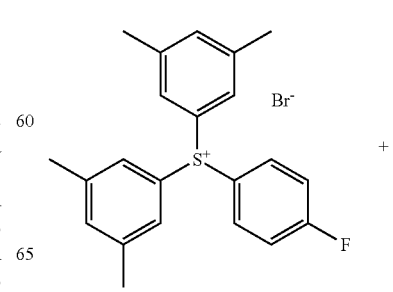

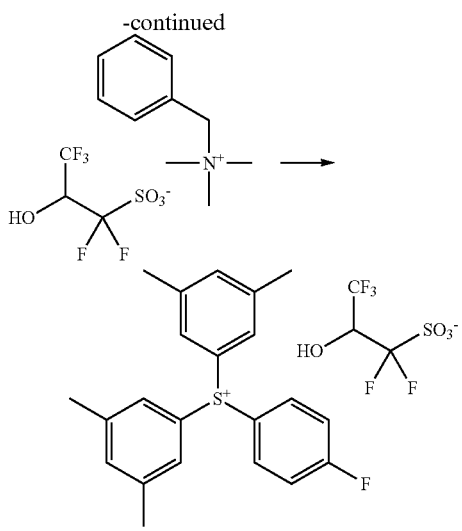

A mixture of 21 g of benzyltrimethylammonium 1,1,3,3,3-pentafluoro-2-hydroxypropane-1-sulfonate synthesized according to the method of JP-A 2012-107151, the solution containing bis(3,5-dimethylphenyl)-(4-fluorophenyl)-sulfonium bromide obtained in Synthesis Example 1-47, 30 g of methylene chloride, and 50 g of deionized water was stirred for 30 minutes. The organic layer was separated, washed with water, and concentrated in vacuum. To the residue, diisopropyl ether was added for recrystallization. The resulting crystals were collected by filtration and dried in vacuum, obtaining 26 g of the target compound, bis(3,5-dimethylphenyl)-(4-fluorophenyl)sulfonium 1,1,3,3,3-pentafluoro-2-hydroxypropane-1-sulfonate as white crystals. Yield 92%.

Synthesis Example 1-49

Synthesis of bis(3,5-dimethylphenyl)-[4-(1,1,3,3,3-pentafluoro-1-sulfonatopropan-2-yloxy)phenyl]sulfonium (PAG 13)

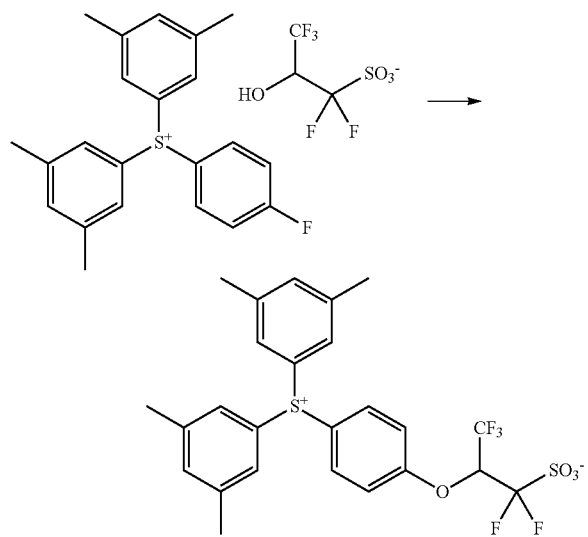

Sodium hydride, 1.7 g, was added to a mixture of 22 g of bis(3,5-dimethylphenyl)-(4-fluorophenyl)sulfonium 1,1,3,3,3-pentafluoro-2-hydroxypropane-1-sulfonate obtained in Synthesis Example 1-48 and 360 g of THF, followed by overnight stirring. The reaction mixture was combined with 300 g of water, followed by filtration. The solids were recovered, and dissolved in 250 g of methylene chloride. This was followed by water washing and concentration. To the residue, diisopropyl ether was added for crystallization. The resulting crystals were collected by filtration and dried in vacuum, obtaining 13 g of the target compound, bis(3,5-dimethylphenyl)-[4-(1,1,3,3,3-pentafluoro-1-sulfonatopropan-2-yloxy)phenyl]sulfonium as white crystals. Yield 61%.

Figure 26:
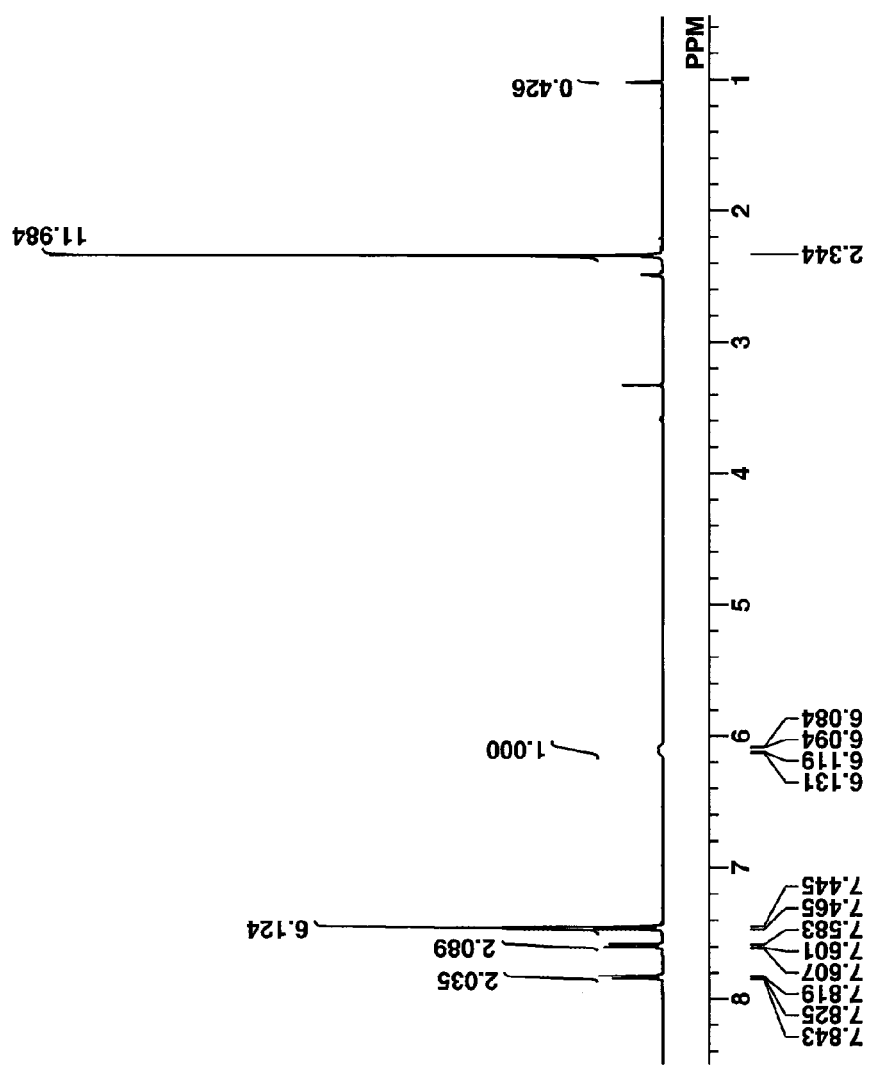
FIGS. 26 and 27 are diagrams showing $^1$H-NMR and $^{19}$F-NMR/DMSO-$d_6$ of PAG-13 in Synthesis Example 1-49.
Figure 27:
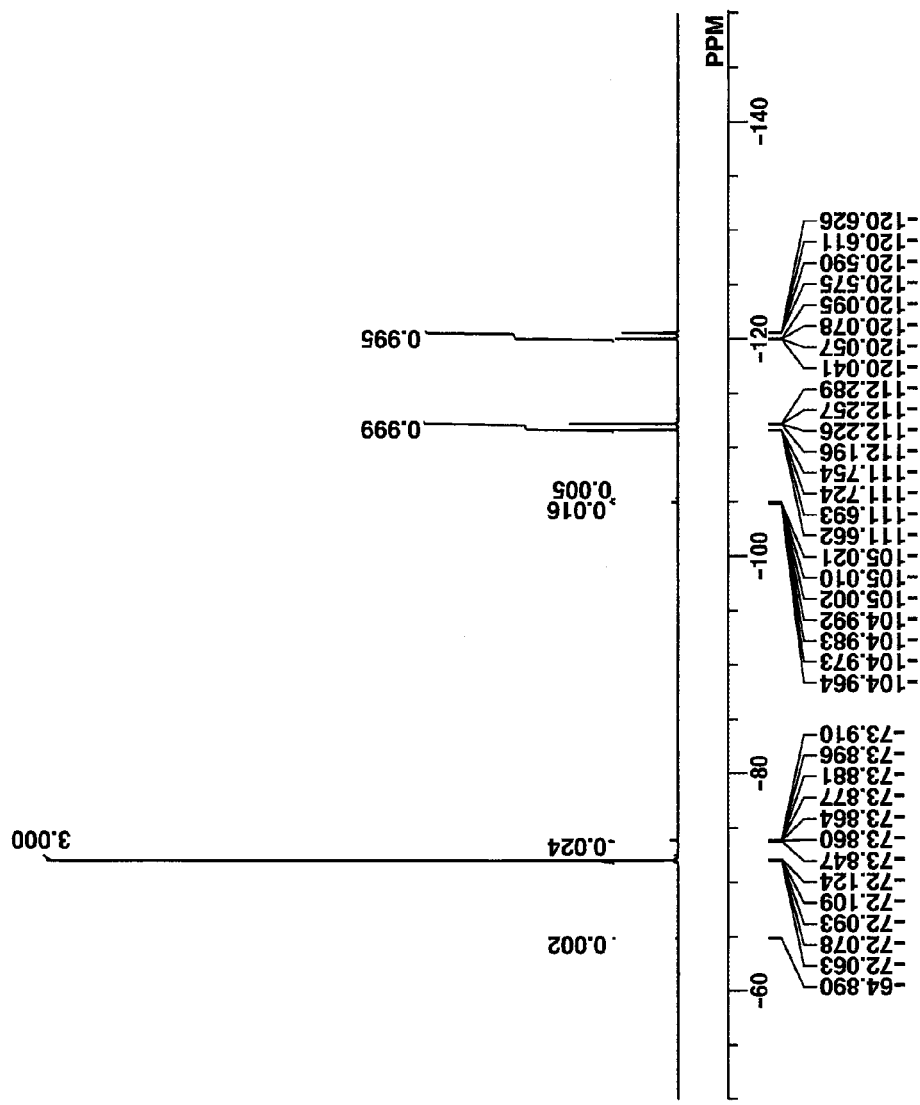

The target compound was analyzed by spectroscopy. The NMR spectra, $^1$H- and $^{19}$F-NMR/DMSO-$d_6$ are shown in FIGS. 26 and 27, respectively. Note that in $^1$H-NMR, traces of residual solvents (diisopropyl ether, water) were observed.

LC-MS
Positive [M+H]$^+$ 547

Synthesis Example 2

Polymers for use in resist compositions were synthesized by the following method.

Synthesis Example 2-1

Synthesis of Polymer P-1

Under a nitrogen blanket, a flask was charged with 22 g of 1-tert-butylcyclopentyl methacrylate, 17 g of 2-oxotetrahydrofuran-3-yl methacrylate, 0.48 g of dimethyl 2,2'-azobis(2-methylpropionate) (V-601 by Wako Pure Chemical Industries, Ltd.), 0.41 g of 2-mercaptoethanol, and 50 g of methyl ethyl ketone (MEK) to form a monomer/initiator solution. Another flask under a nitrogen blanket was charged with 23 g of MEK and heated at 80° C. with stirring, after which the monomer/initiator solution was added dropwise over 4 hours. After the completion of dropwise addition, the polymerization solution was continuously stirred for 2 hours while keeping the temperature of 80° C. It was then cooled to room temperature. With vigorous stirring, the polymerization solution was added dropwise to 640 g of methanol where a copolymer precipitated. The copolymer was collected by filtration, washed twice with 240 g of methanol, and vacuum dried at 50° C. for 20 hours, obtaining 36 g of the copolymer in white powder form (designated Polymer P-1). Yield 90%. On GPC analysis, the copolymer had a Mw of 8,755 and a Mw/Mn of 1.94.

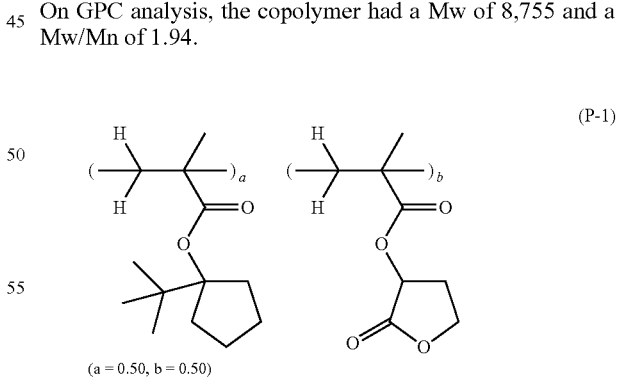

(a = 0.50, b = 0.50)

Synthesis Examples 2-2 to 2-12

Synthesis of Polymers P-2 to P-12

Polymers (Polymers P-2 to P-12) were prepared by the same procedure as in Synthesis Example 2-1 except that the type and amount of monomers used were changed. The compositional proportions of Polymers P-2 to P-12 are shown in Table 1 where values are molar ratios of monomer units incorporated. The structures of units in Table 1 are shown in Tables 2 and 3.

TABLE 1

| Resin | Unit 1 (ratio) | Unit 2 (ratio) | Unit 3 (ratio) | Unit 4 (ratio) |
|---|---|---|---|---|
| P-1 | A-1 (0.50) | B-1 (0.50) | — | — |
| P-2 | A-1 (0.40) | B-1 (0.50) | B-3 (0.10) | — |
| P-3 | A-1 (0.50) | B-2 (0.20) | B-3 (0.20) | B-5 (0.10) |
| P-4 | A-2 (0.40) | B-1 (0.60) | — | — |
| P-5 | A-2 (0.40) | B-2 (0.60) | — | — |
| P-6 | A-2 (0.20) | A-3 (0.30) | B-1 (0.40) | B-5 (0.10) |
| P-7 | A-2 (0.20) | A-3 (0.30) | B-2 (0.40) | B-5 (0.10) |
| P-8 | A-1 (0.25) | A-2 (0.25) | B-3 (0.40) | B-5 (0.10) |
| P-9 | A-1 (0.20) | A-2 (0.25) | B-1 (0.35) | B-3 (0.20) |
| P-10 | A-3 (0.25) | A-5 (0.25) | B-1 (0.35) | B-5 (0.15) |
| P-11 | A-4 (0.50) | B-4 (0.50) | — | — |
| P-12 | A-6 (0.35) | B-3 (0.65) | — | — |

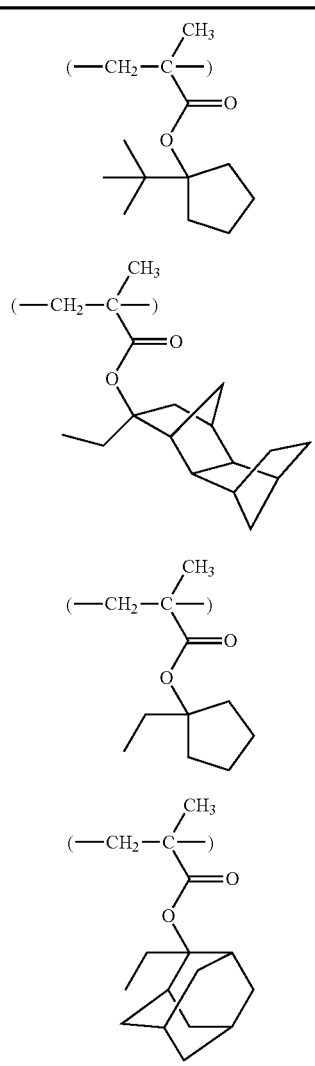

TABLE 2

TABLE 2-continued

TABLE 3

TABLE 3-continued

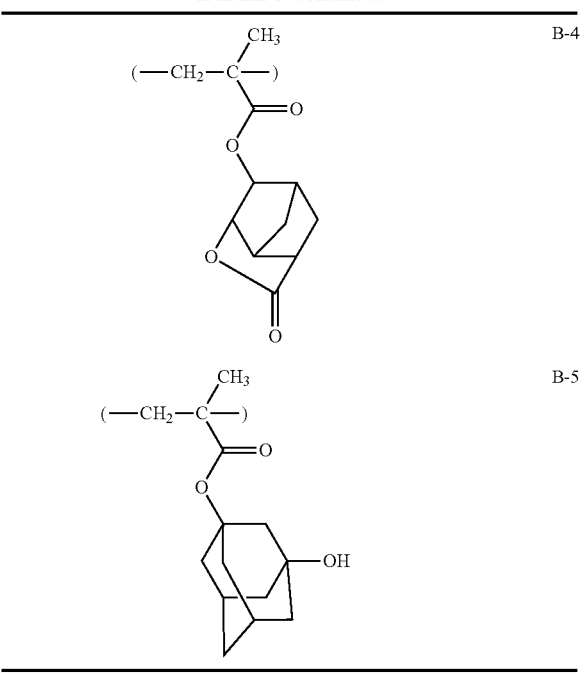

B-4

B-5

Examples 1-1 to 1-30 and Comparative Examples 1-1 to 1-3

Preparation of Resist Composition

A resist composition in solution form was prepared by dissolving the sulfonium salt and the polymer obtained in Synthesis Examples, and other components in a solvent in accordance with the formulation of Table 4, and filtering through a Teflon® filter with a pore size of 0.2 μm. The solvent contained 0.01 wt % of Surfactant A (Omnova Solutions, Inc.).

The other components in Table 4 including Quencher Q-1, solvent, alkali-soluble surfactant SF-1, and sulfonium salts PAG-A to PAG-E (other than the synthesized sulfonium salts) are identified below.

Q-1: 2-(4-morpholinyl)ethyl octadecanoate
PGMEA: propylene glycol monomethyl ether acetate
GBL: gamma-butyrolactone
PAG-A: triphenylsulfonium 2-(adamantane-1-carbonyloxy)-1,1,3,3,3-pentafluoropropane-1-sulfonate (see JP-A 2007-145797 or U.S. Pat. No. 7,511,169)
PAG-B: triphenylsulfonium 2-(adamantane-1-carbonyloxy)-3,3,3-trifluoro-2-trifluoromethylpropane-1-sulfonate (see JP-A 2010-215608 or U.S. Pat. No. 8,283,104)
PAG-C: triphenylsulfonium 2-(adamantane-1-carbonyloxy)-ethanesulfonate (see JP-A 2010-155824 or U.S. Pat. No. 8,394,570)
PAG-D: 4-(2-methoxyethoxy)naphthalene-1-tetrahydrothiophenium 2-(adamantane-1-carbonyloxy)-1,1,3,3,3-pentafluoropropanesulfonate (see JP-A 2012-041320 or U.S. Pat. No. 8,535,869)
PAG-E: triphenylsulfonium benzoate
Alkali-soluble surfactant SF-1:
  poly(2,2,3,3,4,4,4-heptafluoro-1-isobutyl-1-butyl methacrylate/9-(2,2,2-trifluoro-1-trifluoroethyloxycarbonyl)-4-oxatricyclo[4.2.1.0$^{3,7}$]nonan-5-on-2-yl methacrylate)

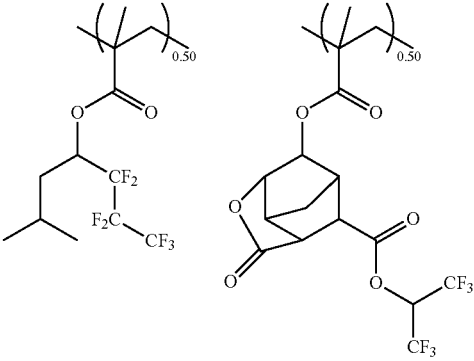

SF-1

Mw=7,700
Mw/Mn=1.82

Surfactant A:
  3-methyl-3-(2,2,2-trifluoroethoxymethyl)oxetane/tetrahydrofuran/2,2-dimethyl-1,3-propane diol copolymer (Omnova Solutions, Inc.)

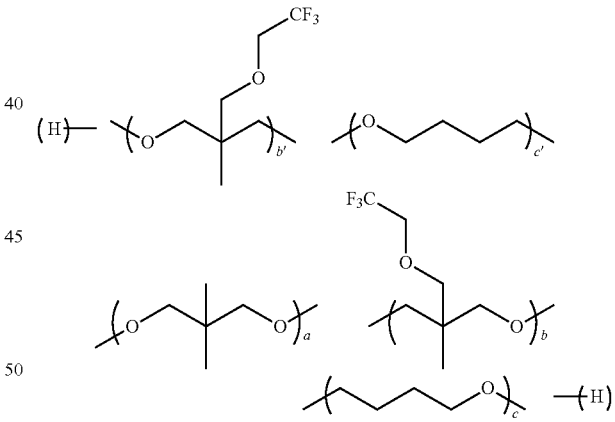

a:(b+b'):(c+c')=1:4-7:0.01-1 (molar ratio)
Mw=1,500

TABLE 4

|  |  | Resist | Resin (pbw) | PAG (pbw) | Quencher (pbw) | Surfactant (pbw) | Solvent 1 (pbw) | Solvent 2 (pbw) |
|---|---|---|---|---|---|---|---|---|
| Example | 1-1 | R-1 | P-1 (80) | PAG-1 (5.7) PAG-C (3.2) | — | SF-1 (3.0) | PGMEA (1,536) | GBL (384) |
|  | 1-2 | R-2 | P-1 (80) | PAG-2 (6.0) PAG-C (3.2) | — | SF-1 (3.0) | PGMEA (1,536) | GBL (384) |

TABLE 4-continued

|  |  | Resist | Resin (pbw) | PAG (pbw) | Quencher (pbw) | Surfactant (pbw) | Solvent 1 (pbw) | Solvent 2 (pbw) |
|---|---|---|---|---|---|---|---|---|
|  | 1-3 | R-3 | P-1 (80) | PAG-3 (5.7) PAG-C (3.2) | — | SF-1 (3.0) | PGMEA (1,536) | GBL (384) |
|  | 1-4 | R-4 | P-2 (80) | PAG-1 (5.7) PAG-C (3.2) | — | SF-1 (3.0) | PGMEA (1,536) | GBL (384) |
|  | 1-5 | R-5 | P-3 (80) | PAG-1 (5.7) PAG-C (3.2) | — | SF-1 (3.0) | PGMEA (1,536) | GBL (384) |
|  | 1-6 | R-6 | P-4 (80) | PAG-1 (5.7) PAG-C (3.2) | — | SF-1 (3.0) | PGMEA (1,536) | GBL (384) |
|  | 1-7 | R-7 | P-5 (80) | PAG-1 (5.7) PAG-C (3.2) | — | SF-1 (3.0) | PGMEA (1,536) | GBL (384) |
|  | 1-8 | R-8 | P-6 (80) | PAG-1 (5.7) PAG-C (3.2) | — | SF-1 (3.0) | PGMEA (1,536) | GBL (384) |
|  | 1-9 | R-9 | P-7 (80) | PAG-1 (5.7) PAG-C (3.2) | — | SF-1 (3.0) | PGMEA (1,536) | GBL (384) |
|  | 1-10 | R-10 | P-8 (80) | PAG-1 (5.7) PAG-C (3.2) | — | SF-1 (3.0) | PGMEA (1,536) | GBL (384) |
|  | 1-11 | R-11 | P-9 (80) | PAG-1 (5.7) PAG-C (3.2) | — | SF-1 (3.0) | PGMEA (1,536) | GBL (384) |
|  | 1-12 | R-12 | P-9 (80) | PAG-1 (3.8) PAG-A (5.2) | Q-1 (1.7) | SF-1 (3.0) | PGMEA (1,536) | GBL (384) |
|  | 1-13 | R-13 | P-9 (80) | PAG-1 (1.9) PAG-B (6.6) | Q-1 (0.5) | SF-1 (3.0) | PGMEA (1,536) | GBL (384) |
|  | 1-14 | R-14 | P-10 (80) | PAG-1 (5.7) PAG-C (3.2) | — | SF-1 (3.0) | PGMEA (1,536) | GBL (384) |
|  | 1-15 | R-15 | P-11 (80) | PAG-1 (5.7) PAG-C (3.2) | — | SF-1 (3.0) | PGMEA (1,536) | GBL (384) |
|  | 1-16 | R-16 | P-12 (80) | PAG-1 (5.7) PAG-C (3.2) | — | SF-1 (3.0) | PGMEA (1,536) | GBL (384) |
|  | 1-17 | R-17 | P-1 (80) | PAG-1 (9.0) | Q-1 (1.7) | SF-1 (3.0) | PGMEA (1,536) | GBL (384) |
|  | 1-18 | R-18 | P-1 (80) | PAG-2 (10.0) | Q-1 (1.7) | SF-1 (3.0) | PGMEA (1,536) | GBL (384) |
|  | 1-19 | R-19 | P-1 (80) | PAG-1 (3.8) PAG-D (7.2) | — | SF-1 (3.0) | PGMEA (1,536) | GBL (384) |
|  | 1-20 | R-20 | P-1 (80) | PAG-1 (5.7) PAG-E (3.2) | — | SF-1 (3.0) | PGMEA (1,536) | GBL (384) |
|  | 1-21 | R-21 | P-1 (80) | PAG-4 (5.4) PAG-C (3.2) | — | SF-1 (3.0) | PGMEA (1,536) | GBL (384) |
|  | 1-22 | R-22 | P-1 (80) | PAG-5 (5.9) PAG-C (3.2) | — | SF-1 (3.0) | PGMEA (1,536) | GBL (384) |
|  | 1-23 | R-23 | P-1 (80) | PAG-6 (6.3) PAG-C (3.2) | — | SF-1 (3.0) | PGMEA (1,536) | GBL (384) |
|  | 1-24 | R-24 | P-1 (80) | PAG-7 (5.9) PAG-C (3.2) | — | SF-1 (3.0) | PGMEA (1,536) | GBL (384) |
|  | 1-25 | R-25 | P-1 (80) | PAG-8 (5.7) PAG-C (3.2) | — | SF-1 (3.0) | PGMEA (1,536) | GBL (384) |
|  | 1-26 | R-26 | P-1 (80) | PAG-9 (5.6) PAG-C (3.2) | — | SF-1 (3.0) | PGMEA (1,536) | GBL (384) |
|  | 1-27 | R-27 | P-1 (80) | PAG-10 (6.4) PAG-C (3.2) | — | SF-1 (3.0) | PGMEA (1,536) | GBL (384) |
|  | 1-28 | R-28 | P-1 (80) | PAG-11 (6.1) PAG-C (3.2) | — | SF-1 (3.0) | PGMEA (1,536) | GBL (384) |
|  | 1-29 | R-29 | P-1 (80) | PAG-12 (7.2) PAG-C (3.2) | — | SF-1 (3.0) | PGMEA (1,536) | GBL (384) |
|  | 1-30 | R-30 | P-1 (80) | PAG-13 (5.4) PAG-C (3.2) | — | SF-1 (3.0) | PGMEA (1,536) | GBL (384) |
| Comparative Example | 1-1 | R-31 | P-1 (80) | PAG-A (7.6) | Q-1 (1.7) | SF-1 (3.0) | PGMEA (1,536) | GBL (384) |
|  | 1-2 | R-32 | P-1 (80) | PAG-B (10.5) | Q-1 (0.5) | SF-1 (3.0) | PGMEA (1,536) | GBL (384) |
|  | 1-3 | R-33 | P-1 (80) | PAG-A (7.6) PAG-C (3.2) | — | SF-1 (3.0) | PGMEA (1,536) | GBL (384) |

Examples 2-1 to 2-4 and Comparative Examples 2-1 to 2-3

ArF Lithography Patterning Test 1

Evaluation of Film Thickness Loss

An antireflective coating solution (ARC-29A by Nissan Chemical Industries Co., Ltd.) was coated onto a silicon wafer and baked to form an ARC film of 80 nm thick. The resist solution in Table 4 was spin coated onto the ARC film and baked on a hot plate at 100° C. for 60 seconds to form a resist film of 100 nm thick.

Using an ArF excimer laser scanner NSR-305B (Nikon Corp., NA 0.68, σ 0.73), the resist film was open-frame exposed in a dose of 50 mJ/cm$^2$. The exposed resist film was baked (PEB) at 90° C. for 60 seconds and puddle developed in butyl acetate developer for 60 seconds. The film thickness was measured after PEB and after organic solvent development. The difference is reported as film thickness loss. The results are shown in Table 5.

TABLE 5

|  | Resist |  | Film thickness loss (nm) |
|---|---|---|---|
| Example | 2-1 | R-1 | 8.6 |
|  | 2-2 | R-2 | 14.0 |
|  | 2-3 | R-3 | 7.9 |
|  | 2-4 | R-17 | 7.5 |
| Comparative Example | 2-1 | R-31 | 22.5 |
|  | 2-2 | R-32 | 20.7 |
|  | 2-3 | R-33 | 21.2 |

It is evident from Table 5 that the resist compositions within the scope of the invention experience a minimal film thickness loss in the exposed region before and after organic solvent development.

Examples 3-1 to 3-30 and Comparative Examples 3-1 to 3-3

ArF Lithography Patterning Test 2

Evaluation of Hole Pattern

On a substrate, a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition in Table 4 was spin coated, then baked on a hot plate at 100° C. for 60 seconds to form a resist film of 100 nm thick.

Using an ArF excimer laser immersion lithography stepper NSR-610C (Nikon Corp., NA 1.30, σ 0.98/0.78, dipole opening 20 deg., azimuthally polarized illumination), first exposure was performed through a 6% halftone phase shift mask bearing an array of X-direction lines with a pitch of 80 nm and a line width of 40 nm (on-wafer size) by compliant dipole illumination. Next, second exposure was performed through a 6% halftone phase shift mask bearing an array of Y-direction lines with a pitch of 80 nm and a line width of 40 nm (on-wafer size) by compliant dipole illumination. After the exposure, the wafer was baked (PEB) for 60 seconds and developed. Specifically, butyl acetate was injected from a development nozzle while the wafer was spun at 30 rpm for 3 seconds, which was followed by stationary puddle development for 27 seconds. A hole pattern was formed by solvent development.

Evaluation of Sensitivity

The resist pattern was observed under an electron microscope. The exposure dose (mJ/cm$^2$) which forms a hole pattern having a hole diameter of 40 nm at a pitch of 80 nm is optimum dose (Eop).

Evaluation of Critical Dimension Uniformity (CDU)

The diameter of 50 discrete holes within the same exposure shot at the optimum dose was measured, from which a size variation 3σ value (nm) was computed and reported as CDU. A smaller value of CDU indicates better dimensional control and is preferable.

Evaluation of Mask Error Factor (MEF)

A pattern was formed by exposure in the optimum dose (determined in the sensitivity evaluation) through the mask with the pitch fixed and the line width varied. MEF was calculated from variations of the mask line width and the pattern space width according to the following equation:

MEF=(pattern space width)/(mask line width)−b wherein b is a constant. A value closer to unity (1) indicates better performance.

Evaluation of Depth-of-focus (DOF) Margin

The hole size at the optimum dose was measured under TDSEM (S-9380 by Hitachi High-Technologies Ltd.). The depth (μm) over which focus was changed that could form a resist pattern with a hole size of 40±5 nm was determined and reported as DOF. A larger value indicates a smaller change of pattern size with a change of DOF and hence, better DOF margin.

The results are shown in Table 6.

TABLE 6

|  |  | Resist | Eop (mJ/cm$^2$) | CDU (nm) | MEF | DOF (nm) |
|---|---|---|---|---|---|---|
| Example | 3-1 | R-1 | 38 | 3.4 | 3.4 | 100 |
|  | 3-2 | R-2 | 44 | 3.4 | 3.1 | 80 |
|  | 3-3 | R-3 | 38 | 3.8 | 3.7 | 80 |
|  | 3-4 | R-4 | 40 | 3.6 | 3.3 | 100 |
|  | 3-5 | R-5 | 41 | 3.5 | 3.2 | 100 |
|  | 3-6 | R-6 | 39 | 3.5 | 3.4 | 100 |
|  | 3-7 | R-7 | 40 | 3.4 | 3.5 | 100 |
|  | 3-8 | R-8 | 42 | 3.7 | 3.3 | 100 |
|  | 3-9 | R-9 | 43 | 3.7 | 3.4 | 100 |
|  | 3-10 | R-10 | 38 | 3.8 | 3.2 | 100 |
|  | 3-11 | R-11 | 38 | 3.5 | 3.3 | 100 |
|  | 3-12 | R-12 | 36 | 3.7 | 3.6 | 100 |
|  | 3-13 | R-13 | 40 | 3.4 | 3.4 | 100 |
|  | 3-14 | R-14 | 42 | 3.8 | 3.7 | 80 |
|  | 3-15 | R-15 | 39 | 3.7 | 3.6 | 100 |
|  | 3-16 | R-16 | 39 | 3.8 | 3.8 | 80 |
|  | 3-17 | R-17 | 41 | 3.8 | 3.2 | 80 |
|  | 3-18 | R-18 | 43 | 3.9 | 3.1 | 80 |
|  | 3-19 | R-19 | 39 | 3.4 | 3.7 | 100 |
|  | 3-20 | R-20 | 39 | 3.5 | 3.8 | 80 |
|  | 3-21 | R-21 | 40 | 3.7 | 3.4 | 100 |
|  | 3-22 | R-22 | 41 | 3.7 | 3.5 | 100 |
|  | 3-23 | R-23 | 44 | 3.9 | 3.8 | 80 |
|  | 3-24 | R-24 | 41 | 3.8 | 3.7 | 80 |
|  | 3-25 | R-25 | 42 | 3.7 | 3.7 | 100 |
|  | 3-26 | R-26 | 42 | 3.6 | 3.6 | 100 |
|  | 3-27 | R-27 | 44 | 3.8 | 3.8 | 80 |
|  | 3-28 | R-28 | 41 | 3.6 | 3.6 | 100 |
|  | 3-29 | R-29 | 43 | 3.7 | 3.8 | 80 |
|  | 3-30 | R-30 | 39 | 3.5 | 3.8 | 80 |
| Comparative Example | 3-1 | R-31 | 34 | 5.0 | 4.3 | 60 |
|  | 3-2 | R-32 | 43 | 4.5 | 4.0 | 60 |
|  | 3-3 | R-33 | 36 | 4.7 | 4.2 | 60 |

It is evident from Table 6 that when the resist compositions within the scope of the invention are processed by lithography and developed in an organic solvent, the resulting patterns are improved in CDU, MEF and DOF.

Examples 4-1 to 4-30 and Comparative Examples 4-1 to 4-3

ArF Lithography Patterning Test 3

Evaluation of Line-and-space Pattern and Trench Pattern

On a substrate, a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition (R-1 to R-30) or comparative resist composition (R-31 to R-33) shown in Table 4 was spin coated, then baked on a hot plate at 100° C. for 60 seconds to form a resist film of 100 nm thick. Using an ArF excimer laser immersion lithography scanner NSR-610C (Nikon Corp., NA 1.30, σ 0.98/0.78, 4/5 annular illumination), pattern exposure was performed through Mask A or B described below.

Mask A is a 6% halftone phase shift mask bearing a line pattern with a pitch of 100 nm and a line width of 50 nm (on-wafer size). After exposure through Mask A, the wafer was baked (PEB) for 60 seconds and developed. Specifically, butyl acetate was injected from a development nozzle while the wafer was spun at 30 rpm for 3 seconds, which was followed by stationary puddle development for 27 seconds. As a result, the unexposed regions which had been masked with Mask A were dissolved in the developer, that is, image reversal took place to form a line-and-space (L/S) pattern with a space width of 50 nm and a pitch of 100 nm.

Mask B is a 6% halftone phase shift mask bearing a line pattern with a pitch of 200 nm and a line width of 45 nm (on-wafer size). After exposure through Mask B, the wafer was baked (PEB) for 60 seconds and developed. Specifically, butyl acetate was injected from a development nozzle while the wafer was spun at 30 rpm for 3 seconds, which was followed by stationary puddle development for 27 seconds. As a result, the unexposed regions which had been masked with Mask B were dissolved in the developer, that is, image reversal took place to form an isolated space pattern (referred to as "trench pattern", hereinafter) with a space width of 45 nm and a pitch of 200 nm.

Evaluation of Sensitivity

As an index of sensitivity, the optimum dose (Eop, mJ/cm$^2$) which provided an L/S pattern with a space width of 50 nm and a pitch of 100 nm on exposure through Mask A was determined.

Evaluation of Exposure Latitude (EL)

The exposure dose which provided an L/S pattern with a space width of 50 nm±10% (i.e., 45 nm to 55 nm) on exposure through Mask A was determined. EL (%) is calculated from the exposure doses according to the following equation:

EL (%)=(|E1−E2+/Eop)×100 wherein E1 is an exposure dose which provides an L/S pattern with a space width of 45 nm and a pitch of 100 nm, E2 is an exposure dose which provides an L/S pattern with a space width of 55 nm and a pitch of 100 nm, and Eop is the optimum exposure dose which provides an L/S pattern with a space width of 50 nm and a pitch of 100 nm.

Evaluation of Line Width Roughness (LWR)

An L/S pattern was formed by exposure in the optimum dose (determined in the sensitivity evaluation) through Mask A. By observation under TDSEM S-9380 (Hitachi Hitechnologies, Ltd.), the space width was measured at longitudinally spaced apart 10 points, from which a 3-fold value (3σ) of standard deviation (σ) was determined and reported as LWR. A smaller value of 3σ indicates a pattern having a lower roughness and more uniform space width.

Evaluation of Mask Error Factor (MEF)

An L/S pattern was formed by exposure in the optimum dose (determined in the sensitivity evaluation) through Mask A with the pitch fixed and the line width varied. MEF was calculated from variations of the mask line width and the pattern space width according to the following equation:

MEF=(pattern space width)/(mask line width)−b wherein b is a constant. A value closer to unity (1) indicates better performance.

Evaluation of Depth-of-ocus (DOE) Margin

The exposure dose and DOF which ensured to form a trench pattern with a space width of 35 nm on exposure through Mask B were defined as the optimum exposure dose and the optimum DOF, respectively. The depth (μm) over which focus was changed that could form a resist pattern with a space width of 35 nm±10% (i.e., 31.5 nm to 38.5 nm) was determined and reported as DOF. A larger value indicates a smaller change of pattern size with a change of DOF and hence, better DOF margin.

The results are shown in Table 7.

TABLE 7

| | | Resist | Eop (mJ/cm$^2$) | EL (%) | LWR (nm) | MEF | DOF (nm) |
|---|---|---|---|---|---|---|---|
| Example | 4-1 | R-1 | 28 | 17 | 3.1 | 2.2 | 160 |
| | 4-2 | R-2 | 34 | 19 | 3.4 | 1.9 | 140 |
| | 4-3 | R-3 | 27 | 15 | 3.6 | 2.5 | 130 |
| | 4-4 | R-4 | 30 | 17 | 3.2 | 2.2 | 150 |
| | 4-5 | R-5 | 31 | 16 | 3.3 | 2.2 | 160 |
| | 4-6 | R-6 | 29 | 17 | 3.3 | 2.4 | 160 |
| | 4-7 | R-7 | 29 | 18 | 3.4 | 2.3 | 170 |
| | 4-8 | R-8 | 31 | 18 | 3.1 | 2.3 | 140 |
| | 4-9 | R-9 | 30 | 17 | 3.2 | 2.2 | 160 |
| | 4-10 | R-10 | 28 | 18 | 3.4 | 2.1 | 150 |
| | 4-11 | R-11 | 29 | 17 | 3.3 | 2.2 | 160 |
| | 4-12 | R-12 | 27 | 16 | 3.5 | 2.4 | 160 |
| | 4-13 | R-13 | 29 | 16 | 3.5 | 2.3 | 150 |
| | 4-14 | R-14 | 33 | 19 | 3.4 | 2.1 | 140 |
| | 4-15 | R-15 | 29 | 17 | 3.3 | 2.4 | 160 |
| | 4-16 | R-16 | 27 | 15 | 3.7 | 2.5 | 160 |
| | 4-17 | R-17 | 29 | 18 | 3.4 | 2.2 | 150 |
| | 4-18 | R-18 | 33 | 19 | 3.5 | 2.1 | 140 |
| | 4-19 | R-19 | 29 | 16 | 3.1 | 2.3 | 160 |
| | 4-20 | R-20 | 28 | 15 | 3.4 | 2.4 | 150 |
| | 4-21 | R-21 | 30 | 18 | 3.3 | 2.1 | 160 |
| | 4-22 | R-22 | 31 | 17 | 3.3 | 2.2 | 150 |
| | 4-23 | R-23 | 34 | 15 | 3.5 | 2.4 | 130 |
| | 4-24 | R-24 | 31 | 16 | 3.4 | 2.3 | 140 |
| | 4-25 | R-25 | 32 | 16 | 3.4 | 2.3 | 130 |
| | 4-26 | R-26 | 32 | 17 | 3.3 | 2.2 | 150 |
| | 4-27 | R-27 | 34 | 16 | 3.5 | 2.4 | 140 |
| | 4-28 | R-28 | 31 | 17 | 3.2 | 2.2 | 150 |
| | 4-29 | R-29 | 33 | 15 | 3.4 | 2.4 | 130 |
| | 4-30 | R-30 | 29 | 17 | 3.3 | 2.1 | 160 |
| Comparative Example | 4-1 | R-31 | 24 | 10 | 5.4 | 4.5 | 80 |
| | 4-2 | R-32 | 32 | 12 | 4.8 | 4.3 | 70 |
| | 4-3 | R-33 | 26 | 11 | 4.7 | 4.6 | 80 |

As seen from the results of Table 7, the resist compositions within the scope of the invention form negative patterns via organic solvent development with the advantages of hole size uniformity, improved exposure latitude, LWR and MEF of L/S patterns, and improved DOF margin of trench patterns. The compositions are advantageously applicable to the organic solvent development process.

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims.

Japanese Patent Application No. 2013-093764 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A process for forming a pattern, comprising the steps of applying a resist composition comprising (A) a polymer and (B) a photoacid generator onto a substrate, baking the composition to form a resist film, exposing the resist film to high-energy radiation to define exposed and unexposed regions, baking, and applying an organic solvent developer to form a negative pattern wherein the unexposed region of resist film is dissolved and the exposed region of resist film is not dissolved, said polymer (A) comprising recurring units of the general formula (1) and recurring units of the general formula (2):

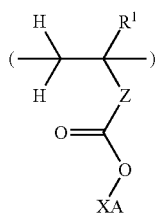

(1)

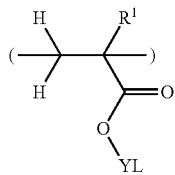

(2)

wherein $R^1$ is hydrogen, fluorine, methyl or trifluoromethyl, Z is a single bond, phenylene, naphthylene, or (backbone)-C(=O)—O—Z'—, Z' is a straight, branched or cyclic $C_1$-$C_{10}$ alkylene group which may contain a hydroxyl moiety, ether bond, ester bond or lactone ring, or a phenylene or naphthylene group, XA is an acid labile group, YL is hydrogen or a polar group having at least one structure selected from the group consisting of hydroxyl, cyano, carbonyl, carboxyl, ether bond, ester bond, sulfonic acid ester bond, carbonate, lactone ring, sultone ring and carboxylic anhydride, said photoacid generator (B) having the general formula (3):

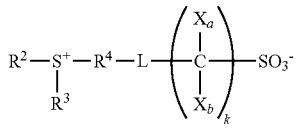

(3)

wherein $R^2$ and $R^3$ are each independently a straight, branched or cyclic $C_1$-$C_{20}$ monovalent hydrocarbon group which may be substituted with or separated by a heteroatom, $R^4$ is a straight, branched or cyclic $C_1$-$C_{20}$ divalent hydrocarbon group which may be substituted with or separated by a heteroatom, or a pair of $R^2$ and $R^3$, or $R^2$ and $R^4$ may bond together to form a ring with the sulfur atom, L is a single bond or a straight, branched or cyclic $C_1$-$C_{20}$ divalent hydrocarbon group which may be substituted with or separated by a heteroatom, Xa and Xb are each independently hydrogen, fluorine or trifluoromethyl, and k is an integer of 1 to 4.

2. The process of claim 1 wherein said photoacid generator of formula (3) has the general formula (4):

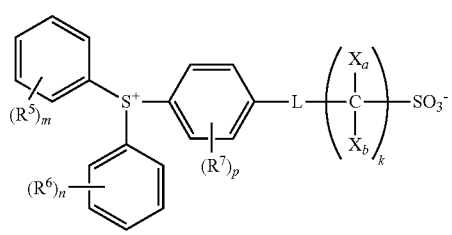

(4)

wherein $R^5$, $R^6$ and $R^7$ are each independently hydrogen, or a straight, branched or cyclic $C_1$-$C_{20}$ monovalent hydrocarbon group which may be separated by a heteroatom, m and n each are an integer of 0 to 5, p is an integer of 0 to 4, L, Xa, Xb, and k are as defined above.

3. The process of claim 2 wherein said photoacid generator of formula (4) has the general formula (5):

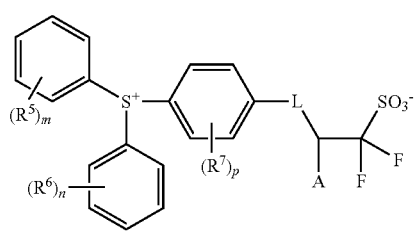

(5)

wherein A is hydrogen or trifluoromethyl, $R^5$, $R^6$, $R^7$, m, n, p, and L are as defined above.

4. The process of claim 3 wherein the step of exposing the resist film to high-energy radiation includes KrF excimer laser lithography of wavelength 248 nm, ArF excimer laser lithography of wavelength 193 nm, EUV lithography of wavelength 13.5 nm or EB lithography.

5. The process of claim 2 wherein the step of exposing the resist film to high-energy radiation includes KrF excimer laser lithography of wavelength 248 nm, ArF excimer laser lithography of wavelength 193 nm, EUV lithography of wavelength 13.5 nm or EB lithography.

6. The process of claim 1 wherein the resist composition further comprises another photoacid generator.

7. The process of claim 6 wherein the step of exposing the resist film to high-energy radiation includes KrF excimer laser lithography of wavelength 248 nm, ArF excimer laser lithography of wavelength 193 nm, EUV lithography of wavelength 13.5 nm or EB lithography.

8. The process of claim 1 wherein the resist composition further comprises a quencher.

9. The process of claim 8 wherein the step of exposing the resist film to high-energy radiation includes KrF excimer laser lithography of wavelength 248 nm, ArF excimer laser lithography of wavelength 193 nm, EUV lithography of wavelength 13.5 nm or EB lithography.

10. The process of claim 1 wherein the resist composition further comprises a surfactant which is insoluble in water and soluble in alkaline developer.

11. The process of claim 10 wherein the step of exposing the resist film to high-energy radiation includes KrF excimer laser lithography of wavelength 248 nm, ArF excimer laser lithography of wavelength 193 nm, EUV lithography of wavelength 13.5 nm or EB lithography.

12. The process of claim 1 wherein the developer comprises at least one organic solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

13. The process of claim 12 wherein the step of exposing the resist film to high-energy radiation includes KrF excimer laser lithography of wavelength 248 nm, ArF excimer laser lithography of wavelength 193 nm, EUV lithography of wavelength 13.5 nm or EB lithography.

14. The process of claim 1 wherein the step of exposing the resist film to high-energy radiation includes KrF excimer laser lithography of wavelength 248 nm, ArF excimer laser lithography of wavelength 193 nm, EUV lithography of wavelength 13.5 nm or EB lithography.

15. The process of claim 14 wherein the exposure step includes immersion lithography with a liquid having a refractive index of at least 1.0 held between the resist film and a projection lens.

16. The process of claim 15, further comprising the step of coating a protective film on the resist film, and the exposure step includes immersion lithography with the liquid held between the protective film and the projection lens.

\* \* \* \* \*